US011839152B2

(12) United States Patent
Jang et al.

(10) Patent No.: US 11,839,152 B2
(45) Date of Patent: Dec. 5, 2023

(54) COMPOUND FOR ORGANIC PHOTOELECTRONIC ELEMENT, ORGANIC PHOTOELECTRONIC ELEMENT, AND DISPLAY DEVICE

(71) Applicant: SAMSUNG SDI CO., LTD., Yongin-si (KR)

(72) Inventors: Yuna Jang, Suwon-si (KR); Dong Min Kang, Suwon-si (KR); Byungku Kim, Suwon-si (KR); Changwoo Kim, Suwon-si (KR); Eun Sun Yu, Suwon-si (KR); Sung-Hyun Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 740 days.

(21) Appl. No.: 16/643,114

(22) PCT Filed: Sep. 10, 2018

(86) PCT No.: PCT/KR2018/010571
§ 371 (c)(1),
(2) Date: Feb. 28, 2020

(87) PCT Pub. No.: WO2019/066304
PCT Pub. Date: Apr. 4, 2019

(65) Prior Publication Data

US 2020/0373497 A1 Nov. 26, 2020

(30) Foreign Application Priority Data

Sep. 27, 2017 (KR) ........................ 10-2017-0125439

(51) Int. Cl.
*C09K 11/02* (2006.01)
*H10K 85/60* (2023.01)
(Continued)

(52) U.S. Cl.
CPC ............ *H10K 85/654* (2023.02); *C09K 11/02* (2013.01); *H10K 85/622* (2023.02);
(Continued)

(58) Field of Classification Search
None
See application file for complete search history.

(56) References Cited

U.S. PATENT DOCUMENTS

2015/0102301 A1 4/2015 Cho et al.
2016/0233436 A1 8/2016 Zeng et al.
(Continued)

FOREIGN PATENT DOCUMENTS

CN 106543152 A 3/2017
CN 106661445 A 5/2017
(Continued)

OTHER PUBLICATIONS

International Search Report dated Mar. 15, 2019 for PCT/KR2018/010571.
Chinese Office and Search Report dated Jan. 20, 2023.

*Primary Examiner* — Robert S Loewe
(74) *Attorney, Agent, or Firm* — Lee IP Law, P.C.

(57) ABSTRACT

The present invention relates to a compound for an organic photoelectronic element, to a composition for an organic photoelectronic element, the composition including the compound for an organic photoelectronic element, to an organic photoelectronic element employing the same, and to a display device.

20 Claims, 2 Drawing Sheets

(51) Int. Cl.

| | |
|---|---|
| *H10K 50/11* | (2023.01) |
| *H10K 50/16* | (2023.01) |
| *H10K 50/18* | (2023.01) |
| *H10K 50/17* | (2023.01) |

(52) U.S. Cl.

CPC ..... *H10K 85/6572* (2023.02); *H10K 85/6574* (2023.02); *H10K 85/6576* (2023.02); *H10K 50/11* (2023.02); *H10K 50/16* (2023.02); *H10K 50/171* (2023.02); *H10K 50/18* (2023.02)

(56) References Cited

U.S. PATENT DOCUMENTS

| | | | | |
|---|---|---|---|---|
| 2017/0084845 | A1 | 3/2017 | Kim et al. | |
| 2019/0237680 | A1* | 8/2019 | Kim | H01L 51/5088 |
| 2020/0136058 | A1* | 4/2020 | Kim | C07D 487/04 |

FOREIGN PATENT DOCUMENTS

| | | | |
|---|---|---|---|
| EP | 3072887 | A1 | 9/2016 |
| JP | 2001-257077 | A | 9/2001 |
| KR | 10-2012-0033017 | A | 4/2012 |
| KR | 10-2014-0018121 | A | 2/2014 |
| KR | 10-2014-0057439 | A | 5/2014 |
| KR | 10-1477614 | B1 | 12/2014 |
| KR | 10-2015-0032061 | A | 3/2015 |
| KR | 10-1579289 | B1 | 12/2015 |
| KR | 10-1595697 | B1 | 2/2016 |
| KR | 10-2016-0029721 | A | 3/2016 |
| KR | 10-2016-0041822 | A | 4/2016 |
| KR | 10-2016-0042920 | A | 4/2016 |
| KR | 10-2016-0099996 | A | 8/2016 |
| KR | 10-2016-0110078 | A | 9/2016 |
| KR | 10-2016-0124284 | A | 10/2016 |
| KR | 10-2017-0096770 | A | 8/2017 |
| KR | 10-2019-0013353 | A | 2/2019 |

* cited by examiner

COMPOUND FOR ORGANIC PHOTOELECTRONIC ELEMENT, ORGANIC PHOTOELECTRONIC ELEMENT, AND DISPLAY DEVICE

CROSS REFERENCE TO RELATED APPLICATIONS

This is the U.S. national phase application based on PCT Application No. PCT/KR2018/010571, filed Sep. 10, 2018, which is based on Korean Patent Application No. 10-2017-0125439, filed Sep. 27, 2017, the entire contents of all of which are hereby incorporated by reference.

TECHNICAL FIELD

A compound for an organic photoelectronic element, an organic photoelectronic element, and a display device are disclosed.

BACKGROUND ART

An organic photoelectronic element (organic optoelectronic diode) is a device that converts electrical energy into photoenergy, and vice versa.

An organic photoelectronic element may be classified as follows in accordance with its driving principles. One is a photoelectric diode where excitons are generated by photoenergy, separated into electrons and holes, and are transferred to different electrodes to generate electrical energy, and the other is a light emitting diode where a voltage or a current is supplied to an electrode to generate photoenergy from electrical energy.

Examples of the organic photoelectronic element include an organic photoelectric device, an organic light emitting diode, an organic solar cell, and an organic photo conductor drum.

Of these, an organic light emitting diode (OLED) has recently drawn attention due to an increase in demand for flat panel displays. The organic light emitting diode is a device converting electrical energy into light by applying current to an organic light emitting material, and has a structure in which an organic layer is disposed between an anode and a cathode. Herein, the organic layer may include an light emitting layer and optionally an auxiliary layer, and the auxiliary layer may include at least one layer selected from, for example a hole injection layer, a hole transport layer, an electron blocking layer, an electron transport layer, an electron injection layer, and a hole blocking layer in order to improve efficiency and stability of an organic light emitting diode.

Performance of an organic light emitting diode may be affected by characteristics of the organic layer, and among them, may be mainly affected by characteristics of an organic material of the organic layer.

Particularly, development for an organic material capable of increasing hole and electron mobility and simultaneously increasing electrochemical stability is needed so that the organic light emitting diode may be applied to a large-sized flat panel display.

DISCLOSURE

Technical Problem

An embodiment provides a compound for an organic photoelectronic element capable of realizing an organic photoelectronic element having high efficiency and long life-span.

Another embodiment provides an organic photoelectronic element including the compound.

Another embodiment provides a display device including the organic photoelectronic element.

Technical Solution

According to an embodiment of the present invention, a compound for an organic photoelectronic element represented by Chemical Formula 1A is provided.

[Chemical Formula 1A]

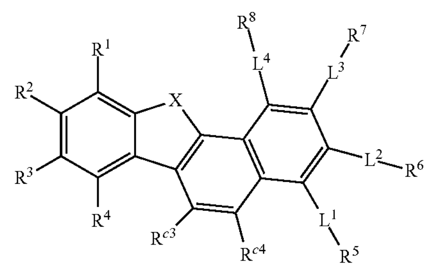

In Chemical Formula 1A,

X is O, S, or $CR^aR^b$, $R^1$ to $R^4$, $R^a$, $R^b$, $R^{c3}$, and $R^{c4}$ are independently hydrogen, deuterium, a cyano group, a substituted or unsubstituted C1 to C30 silyl group, a substituted or unsubstituted C1 to C30 alkyl group, or a substituted or unsubstituted C6 to C30 aryl group, $L^1$ to $L^4$ are independently a single bond, a substituted or unsubstituted C6 to C30 arylene group, or a quinazolinylene group, $R^5$ to $R^8$ are independently hydrogen, deuterium, a cyano group, a substituted or unsubstituted C1 to C30 silyl group, a substituted or unsubstituted C1 to C30 alkyl group, a substituted or unsubstituted C6 to C30 aryl group, or a substituted or unsubstituted C2 to C30 heterocyclic group, and at least one of $L^1$ to $L^4$ is a quinazolinylene group or at least one of $R^5$ to $R^8$ is a substituted or unsubstituted quinazolinyl group, wherein the "substituted" refers to replacement of at least one hydrogen by deuterium, a C1 to C10 alkyl group, a C6 to C30 aryl group, or a C2 to C20 heterocyclic group.

According to another embodiment, an organic photoelectronic element includes an anode and a cathode facing each other and at least one organic layer disposed between the anode and the cathode, wherein the organic layer includes the aforementioned compound for the organic photoelectronic element.

According to another embodiment provides a display device including the organic photoelectronic element.

Advantageous Effects

An organic photoelectronic element having high efficiency and a long life-span may be realized.

MODE FOR INVENTION

Figure 1:
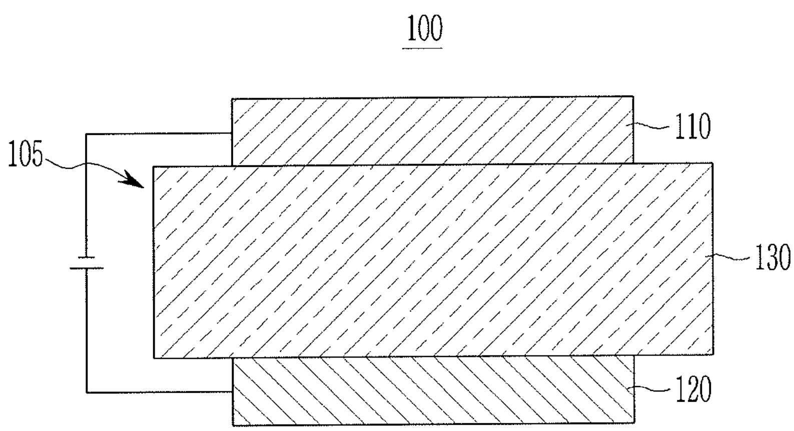
FIGS. 1 and 2 are cross-sectional views illustrating organic light emitting diodes according to embodiments.

Hereinafter, embodiments of the present invention are described in detail. However, these embodiments are exemplary, the present invention is not limited thereto and the present invention is defined by the scope of claims.

In the present specification, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In the chemical formulae of the present specification, unless a specific definition is otherwise provided, hydrogen is boned at the position when a chemical bond is not drawn where supposed to be given.

In one example of the present invention, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, or a C2 to C30 heteroaryl group. In addition, in a specific example of the present invention, the "substituted" refers to replacement of at least one hydrogen of a substituent or a compound by deuterium, a C1 to C20 alkyl group, a C6 to C30 aryl group, or a C2 to C30 heteroaryl group. In addition, in a more specific example of the present invention, the "substituted" refers to replacement of at least one hydrogen of a substituent or a compound by deuterium, a C1 to C5 alkyl group, a phenyl group, a biphenyl group, a terphenyl group, a naphthyl group, a triphenyl group, a fluorenyl group, a fused fluorenyl group, a pyridinyl group, a pyrimidinyl group, a triazinyl group, a quinolinyl group, an isoquinolinyl group, a quinazolinyl group, a quinoxalinyl group, a naphthyridinyl group, a benzofuranpyrimidinyl group, a benzothiophenepyrimidinyl group, a dibenzofuranyl group, a dibenzothiophenyl group, or a carbazolyl group. In addition, in the most specific example of the present invention, the "substituted" refers to replacement of at least one hydrogen of a substituent or a compound by deuterium, a methyl group, an ethyl group, a propanyl group, a butyl group, a phenyl group, a para-biphenyl group, a meta-biphenyl group, an ortho-biphenyl group, a terphenyl group, a fluorenyl group, a fused fluorenyl group, a pyrimidinyl group, a triazinyl group, a quinazolinyl group, a quinoxalinyl group, a naphthyridinyl group, a benzofuranpyrimidinyl group, a benzothiophenepyrimidinyl group, a dibenzofuranyl group, or a dibenzothiophenyl group.

In the present specification, when a definition is not otherwise provided, "hetero" refers to one including one to three heteroatoms selected from N, O, S, P, and Si, and remaining carbons in one functional group.

In the present specification, when a definition is not otherwise provided, "alkyl group" may refer to an aliphatic hydrocarbon group. The alkyl group may be a "saturated alkyl group" without any double bond or triple bond.

The alkyl group may be a C1 to C30 alkyl group. More specifically, the alkyl group may be a C1 to C20 alkyl group or a C1 to C10 alkyl group. For example, a C1 to C4 alkyl group includes 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification, "aryl group" refers to a group including at least one hydrocarbon aromatic moiety, and

- all the elements of the hydrocarbon aromatic moiety have p-orbitals which form conjugation, for example a phenyl group, a naphthyl group, and the like,
- two or more hydrocarbon aromatic moieties may be linked by a sigma bond and may be, for example a biphenyl group, a terphenyl group, a quarterphenyl group, and the like, or
- two or more hydrocarbon aromatic moieties are fused directly or indirectly to provide a non-aromatic fused ring. For example, it may include a fluorenyl group, and the like.

The aryl group may include a monocyclic, polycyclic or fused ring polycyclic (i.e., rings sharing adjacent pairs of carbon atoms) functional group.

In the present specification, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

Specific examples of the heterocyclic group may include a pyridinyl group, a pyrimidinyl group, a pyrazinyl group, a pyridazinyl group, a triazinyl group, a quinolinyl group, an isoquinolinyl group, a quinazolinyl group, quinoxalinyl group, a benzofuranpyrimidinyl group, a benzothiophenepyrimidinyl group, and the like.

More specifically, the substituted or unsubstituted C6 to C30 aryl group and/or the substituted or unsubstituted C2 to C30 heterocyclic group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted azatriphenylenyl group, a substituted or unsubstituted benzofuranpyrimidinyl group, a substituted or unsubstituted benzothiophenepyrimidinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, or a combination thereof, but are not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a compound for an organic photoelectronic element according to an embodiment is described.

The compound for the organic photoelectronic element may be represented by a combination of Chemical Formula 1 and Chemical Formula 2.

[Chemical Formula 1]

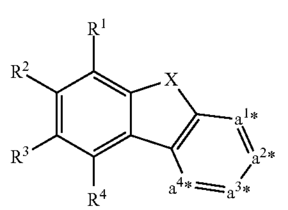

[Chemical Formula 2]

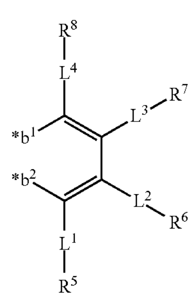

In Chemical Formula 1 and Chemical Formula 2,

X is O, S, or $CR^aR^b$, adjacent two of $a^{1*}$, $a^{2*}$, $a^{3*}$, and $a^{4*}$ are C and binding portions with $*b^1$ and $*b^2$, two of $a^{1*}$, $a^{2*}$, $a^{3*}$, and $a^{4*}$ that are not bound to $*b^1$ and $*b^2$ are independently $CR^c$, $R^1$ to $R^4$, $R^a$, $R^b$, and $R^c$ are independently hydrogen, deuterium, a cyano group, a substituted or unsubstituted C1 to C30 silyl group, a substituted or unsubstituted C1 to C30 alkyl group, or a substituted or unsubstituted C6 to C30 aryl group, $L^1$ to $L^4$ are independently a single bond, a substituted or unsubstituted C6 to C30 arylene group or a quinazolinylene group, $R^5$ to $R^8$ are independently hydrogen, deuterium, a cyano group, a substituted or unsubstituted C1 to C30 silyl group, a substituted or unsubstituted C1 to C30 alkyl group, a substituted or unsubstituted C6 to C30 aryl group, or a substituted or unsubstituted C2 to C30 heterocyclic group, and at least one of $L^1$ to $L^4$ is a quinazolinylene group or at least one of $R^5$ to $R^8$ is a substituted or unsubstituted quinazolinyl group, wherein the "substituted" refers to replacement of at least one hydrogen by deuterium, a C1 to C10 alkyl group, a C6 to C30 aryl group, or a C2 to C20 heterocyclic group.

In an embodiment of the present invention, the compound represented by the combination of Chemical Formula 1 and Chemical Formula 2 according to the fusion point of the additional benzo ring may be represented by, for example, Chemical Formula 1A. The compound represented by Chemical Formula 1A may be a first compound for an organic photoelectronic element described later.

[Chemical Formula 1A]

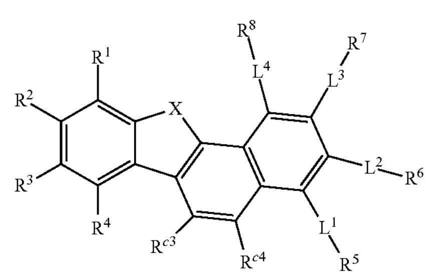

Considering that Chemical Formula 1A has a higher T1 energy level than Chemical Formula 1B by about 0.11 eV or more, and when a substituent is present in the mother moiety, the T1 energy level is further lowered, Chemical Formula 1B may exhibit lower efficiency than Chemical Formula 1A due to the low T1 energy level when it is applied to a green device and a red device.

In addition, considering that Chemical Formula 1A has a higher T1 energy level than Chemical Formula 1C by about 0.27 eV or more, and when a substituent is present in the mother moiety, the T1 energy level is further lowered, Chemical Formula 1C may exhibit lower efficiency than Chemical Formula 1A when it is applied to the green device and the red device.

[Chemical Formula 1B]

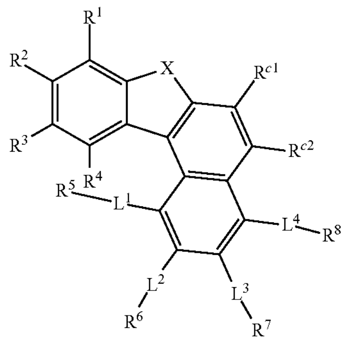

[Chemical Formula 1C]

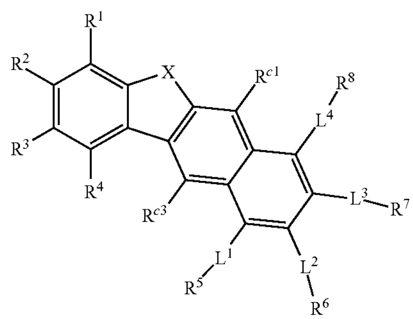

Chemical Formula 1A T1 energy level: 2.700 eV
Chemical Formula 1B T1 energy level: 2.589 eV
Chemical Formula 1C T1 energy level: 2.430 eV In Chemical Formula 1A to Chemical Formula 1C, X, $R^1$ to $R^4$, $L^1$ to $L^4$, and $R^5$ to $R^8$ are the same as described above and $R^{c1}$, $R^{c2}$, $R^{c3}$, and $R^{c4}$ are the same as described above.

In addition, in a specific example of the present invention, the "substituted" refers to replacement of at least one hydrogen by deuterium, a C1 to C4 alkyl group, or a C6 to C18 aryl group, more specifically replacement of at least one hydrogen by deuterium, a C1 to C4 alkyl group, a phenyl group, a para-biphenyl group, a meta-biphenyl group, an ortho-biphenyl group, a terphenyl group, a fluorenyl group, a fused fluorenyl group, a pyrimidinyl group, triazinyl group, a quinazolinyl group, a quinoxalinyl group, a naphthyridinyl group, a benzofuranpyrimidinyl group, a benzothiophenepyrimidinyl group, a dibenzofuranyl group, or a dibenzothiophenyl group.

The compound for the organic photoelectronic element according to the present invention is a material in which at least two N-containing heterocycles are introduced into a fused dibenzofuran, a fused dibenzothiophene, or a fused fluorenyl core, and the at least two N-containing heterocycles may particularly substitute the additionally fused benzo rings, thereby controlling the T1 energy level relatively, in particular the energy level to be suitable for phosphorescent red, which may realize a device having a lowered driving voltage, a long life-span, and high efficiency.

In a specific example embodiment of the present invention, $R^5$ to $R^5$ may independently be hydrogen, deuterium, a substituted or unsubstituted C1 to C30 alkyl group, a substituted or unsubstituted C6 to C30 aryl group, or a substituted or unsubstituted C2 to C30 heterocyclic group, and at least one of $R^5$ to $R^8$ may be a substituted or unsubstituted C2 to C30 heterocyclic group.

In a more specific example embodiment, one of $R^5$ to $R^8$ may be a substituted or unsubstituted quinazolinyl group and the rest may be hydrogen, deuterium, a cyano group, a substituted or unsubstituted C1 to C30 silyl group, a substituted or unsubstituted C1 to C30 alkyl group, or a substituted or unsubstituted C6 to C30 aryl group.

In the most specific example embodiment, $R^5$ may be a substituted or unsubstituted quinazolinyl group and $R^6$ to $R^8$ may independently be hydrogen, deuterium, a substituted or unsubstituted C1 to C30 alkyl group, or a substituted or unsubstituted C6 to C30 aryl group, $R^6$ may be a substituted or unsubstituted quinazolinyl group and $R^5$, $R^7$ and $R^8$ may independently be hydrogen, deuterium, a substituted or unsubstituted C1 to C30 alkyl group, or a substituted or unsubstituted C6 to C30 aryl group, $R^7$ may be a substituted or unsubstituted quinazolinyl group and $R^5$, $R^6$, and $R^8$ may independently be hydrogen, deuterium, a substituted or unsubstituted C1 to C30 alkyl group, or a substituted or unsubstituted C6 to C30 aryl group, or $R^8$ may be a substituted or unsubstituted quinazolinyl group and $R^5$ to $R^7$ may independently be hydrogen, deuterium, a substituted or unsubstituted C1 to C30 alkyl group, or a substituted or unsubstituted C6 to C30 aryl group.

For example, Chemical Formula 1A may be represented by Chemical Formula 1A-a.

[Chemical Formula 1A-a]

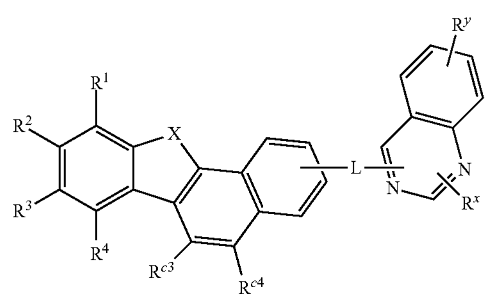

In Chemical Formula 1A-a, X, $R^1$ to $R^4$, and $R^5$ to $R^8$ are the same as described above, $R^{c3}$ and $R^{c4}$ are the same as $R^c$, L is a single bond, a substituted or unsubstituted C6 to C30 arylene group, or a quinazolinylene group, $R^x$ and $R^y$ are independently hydrogen, deuterium, a cyano group, a substituted or unsubstituted C1 to C30 alkyl group, a substituted or unsubstituted C6 to C30 aryl group, or a substituted or unsubstituted C2 to C30 heterocyclic group. For example, $R^x$ may be a substituted or unsubstituted C6 to C30 aryl group or a substituted or unsubstituted C2 to C30 heterocyclic group and $R^y$ may be hydrogen.

In a more specific embodiment, $R^1$ may be hydrogen, and $R^2$ to $R^4$ may independently be hydrogen, deuterium, or a substituted or unsubstituted C1 to C20 alkyl group, and $R^1$ to $R^4$ may be for example all hydrogen.

In one specific embodiment of the present invention, X may be O or S.

Meanwhile, $R^{c1}$ to $R^{c4}$ are the same as the definitions of $R^c$ described above.

In a more specific embodiment of the present invention, $L^1$ to $L^4$ and L may independently be a single bond, a substituted or unsubstituted C6 to C20 arylene group or a quinazolinylene group, for example a single bond, a substituted or unsubstituted phenylene group, or a substituted or unsubstituted biphenylene group.

For example, the phenylene group or biphenylene group may be selected from the linking groups of Group I.

[Group I]

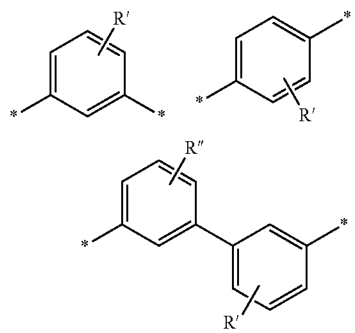

In Group I, R' and R" are independently a hydrogen atom, a substituted or unsubstituted C6 to C30 aryl group, or a substituted or unsubstituted C2 to C30 heterocyclic group.

In Group I, for example, R' and R" may independently be a hydrogen atom, a phenyl group, a biphenyl group, a terphenyl group, a dibenzothiophenyl group, or a dibenzofuranyl group.

For example, Chemical Formula 1A may be represented by one of Chemical Formula 1A-a-1 to Chemical Formula 1A-a-8.

[Chemical Formula 1A-a-1]

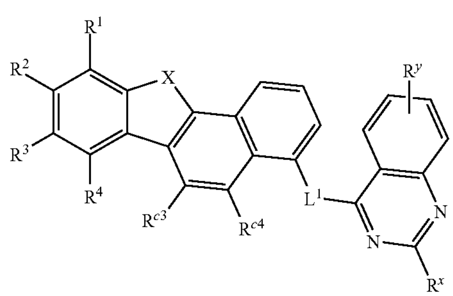

[Chemical Formula 1A-a-2]

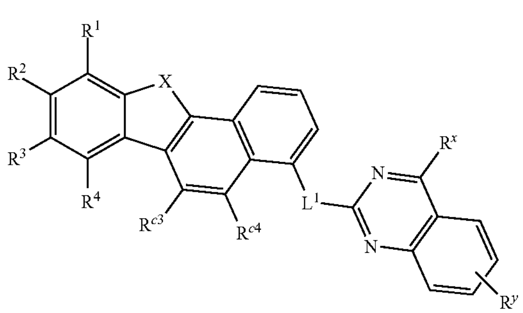

-continued

[Chemical Formula 1A-a-3]

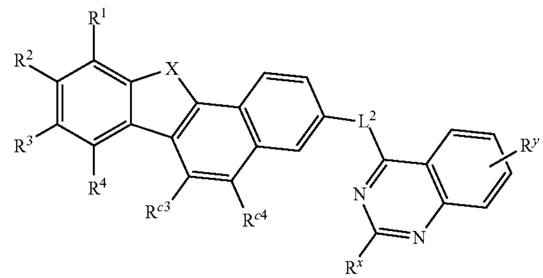

[Chemical Formula 1A-a-4]

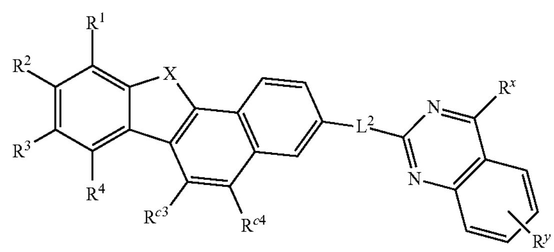

[Chemical Formula 1A-a-5]

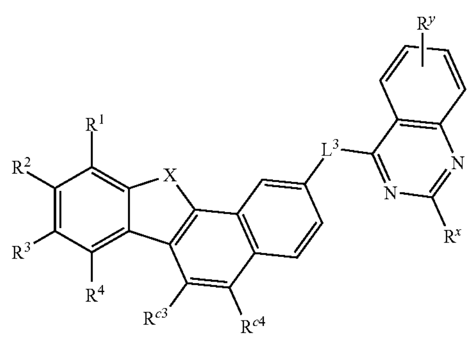

[Chemical Formula 1A-a-6]

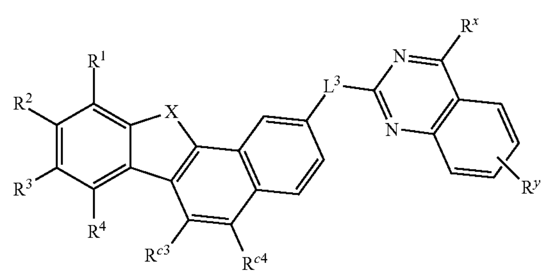

[Chemical Formula 1A-a-7]

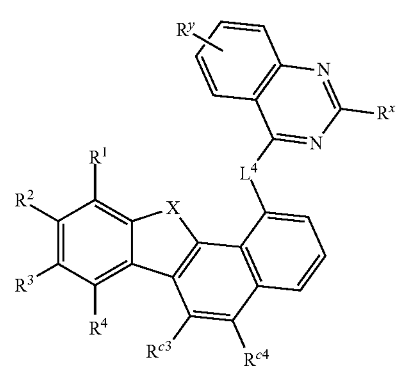

-continued

[Chemical Formula 1A-a-8]

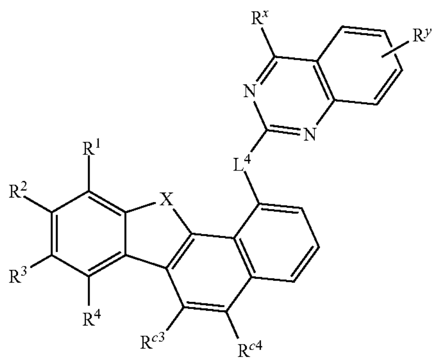

In Chemical Formula 1A-a-1 to Chemical Formula 1A-a-8,

X is O, S, or $CR^aR^b$, $R^1$ to $R^4$, $R^a$, $R^b$, $R^{c3}$, and $R^{c4}$ are independently hydrogen, deuterium, or a substituted or unsubstituted C1 to C30 alkyl group, $L^1$ to $L^4$ are independently a single bond, a substituted or unsubstituted C6 to C30 arylene group, or a quinazolinylene group, and $R^x$ and $R^y$ are independently hydrogen, deuterium, a cyano group, a substituted or unsubstituted C1 to C30 alkyl group, a substituted or unsubstituted C6 to C30 aryl group, or a substituted or unsubstituted C2 to C30 heterocyclic group.

For example, $R^x$ and $R^y$ may independently be hydrogen, deuterium, a cyano group, a substituted or unsubstituted C6 to C30 aryl group, an oxygen-containing C2 to C30 heterocyclic group, or a sulfur-containing C2 to C30 heterocyclic group.

Specifically, $R^x$ may be a substituted or unsubstituted C6 to C30 aryl group, an oxygen-containing C2 to C30 heterocyclic group, or a sulfur-containing C2 to C30 heterocyclic group.

For example, $R^x$ may be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted spirofluorenyl group, a substituted or unsubstituted fluorenyl group, a substituted or unsubstituted dibenzofuranyl group, or a substituted or unsubstituted dibenzothiophenyl group, wherein the "substituted" may refer to a phenyl group substituted, a cyano group substituted, a biphenyl group substituted, or a naphthyl group substituted.

For example, $R^y$ may be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted spirofluorenyl group, a substituted or unsubstituted fluorenyl group, a substituted or unsubstituted dibenzofuranyl group, or a substituted or unsubstituted dibenzothiophenyl group.

More specifically, $R^x$ may be selected from the linking groups of Group II.

[Group II]

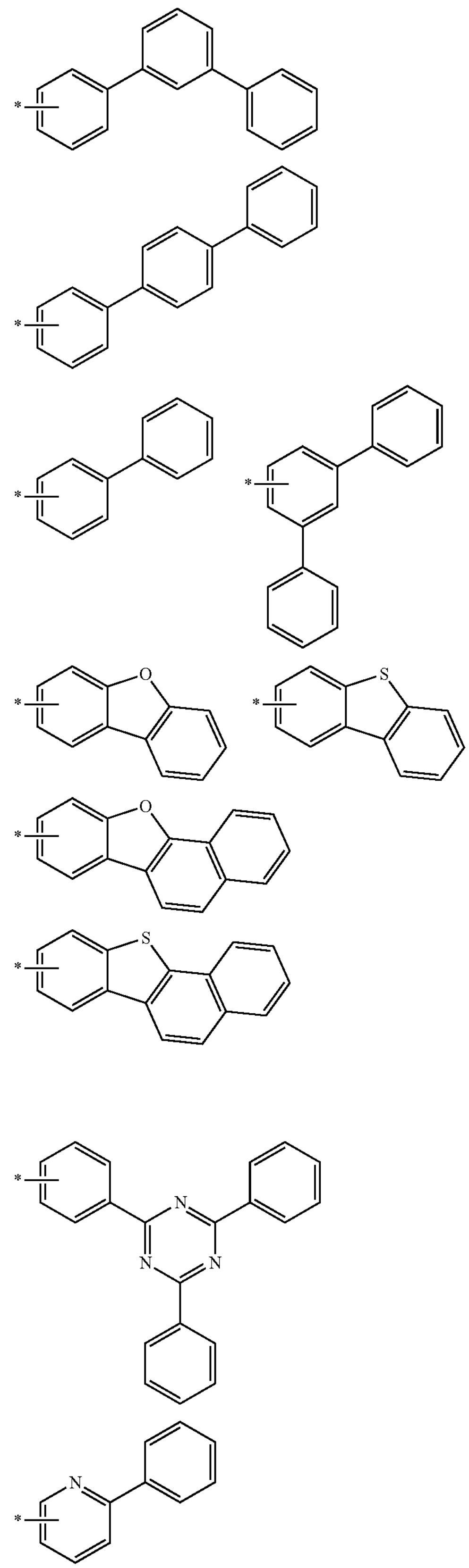

-continued

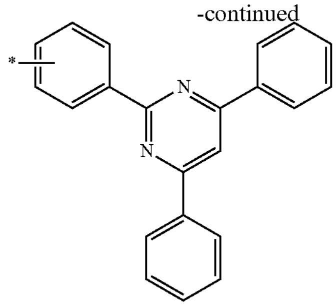

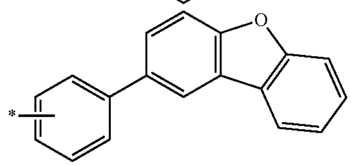

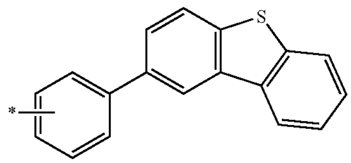

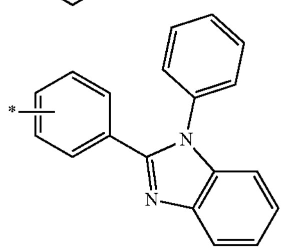

Specifically, $R^y$ may be hydrogen, deuterium, a cyano group, or a substituted or unsubstituted C6 to C30 aryl group.

The compound for the organic photoelectronic element according to the most specific embodiment of the present invention may be represented by Chemical Formula 1A-a-1, Chemical Formula 1A-a-3, Chemical Formula 1A-a-5, or Chemical Formula 1A-a-7, X may be O or S, $R^1$ to $R^4$, $R^{c3}$, and $R^{c4}$ may independently hydrogen, $L^1$ to $L^4$ may independently be a single bond or a substituted or unsubstituted C6 to C30 arylene group, and $R^x$ and $R^y$ may independently be hydrogen, deuterium, a cyano group, a substituted or unsubstituted C6 to C30 aryl group, an oxygen-containing C2 to C30 heterocyclic group, or a sulfur-containing C2 to C30 heterocyclic group.

The compound represented by Chemical Formula 1A-a-1, Chemical Formula 1A-a-3, Chemical Formula 1A-a-5, or Chemical Formula 1A-a-7 has a LUMO cloud of quinazoline that spreads more widely toward the fusion ring (dibenzofuran or the fusion ring between dibenzothiophene and benzene) than the compound represented by Chemical Formula 1A-a-2, Chemical Formula 1A-a-4, Chemical Formula 1A-a-6, or Chemical Formula 1A-a-8, and has properties of a strong electron transport host. Due to the properties of the compound, it may be more suitable for being used as a low driving voltage material having fast electron transport capability, in particular a red material.

The compound (the compound for the first organic photoelectronic element) for the organic photoelectronic element represented by the combination of Chemical Formula 1 and Chemical Formula 2 may be selected from, for example, compounds of Group 1, but is not limited thereto.

[Group 1]

1

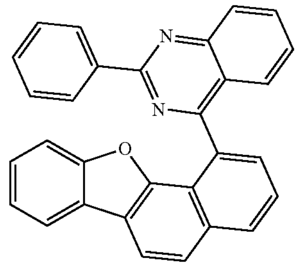

2

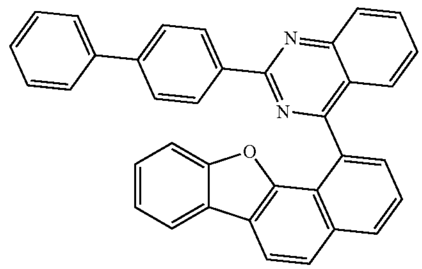

3

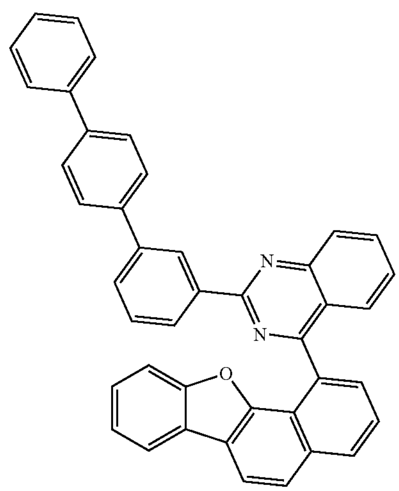

4

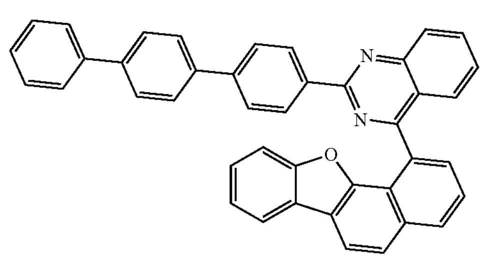

-continued
5
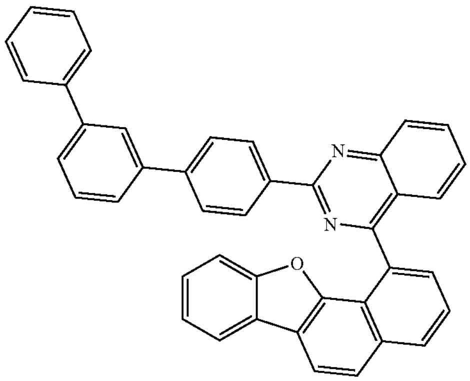
6
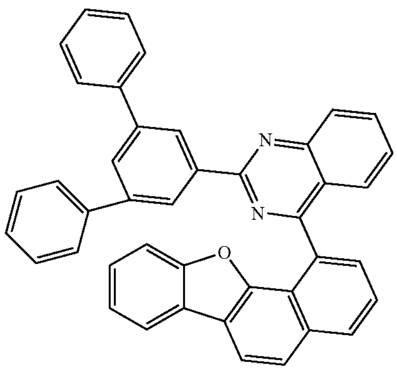
7
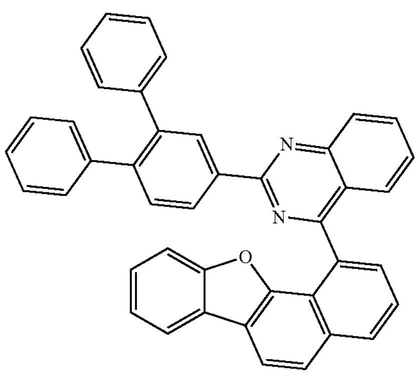
8
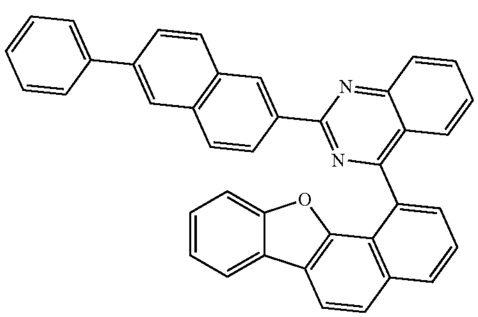
9
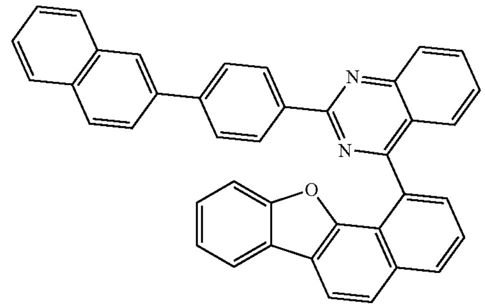
10
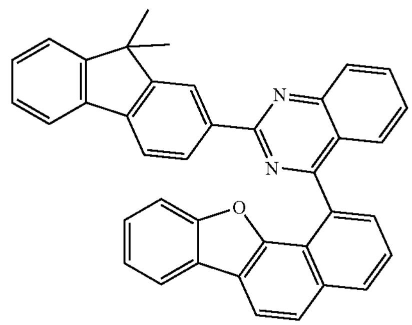
11
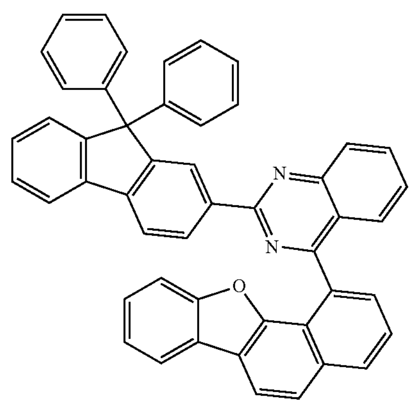
12
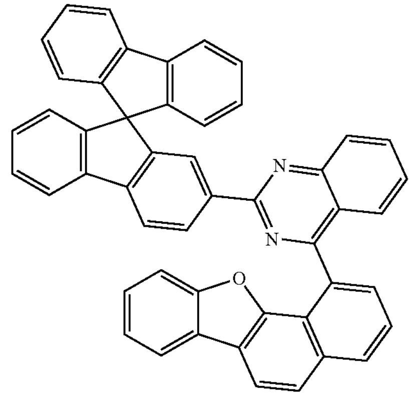

13
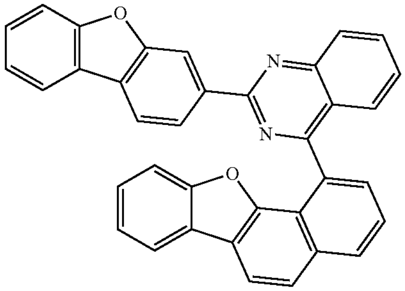
14
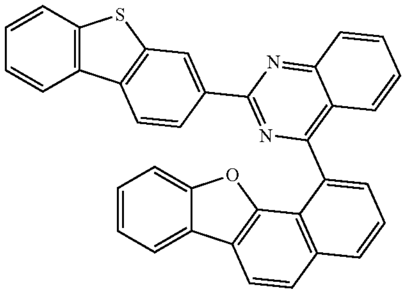
15
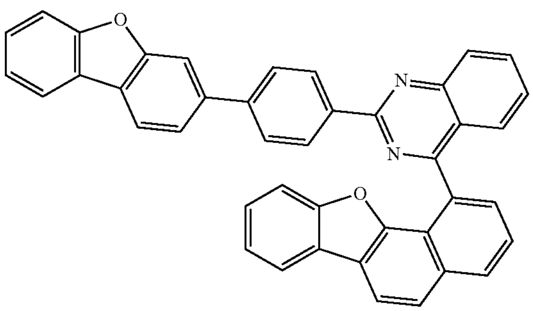
16
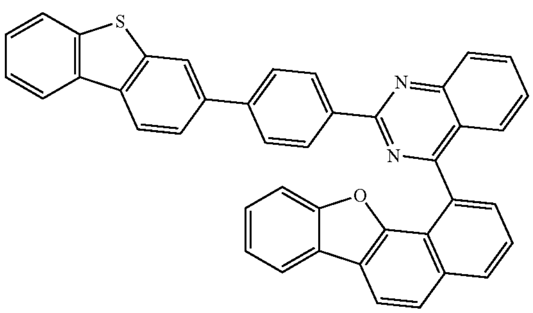
17
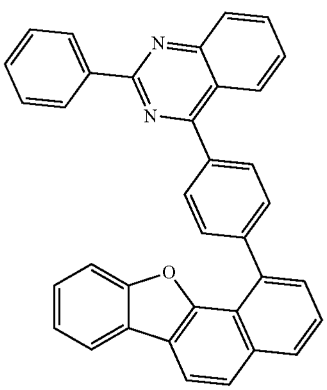
18
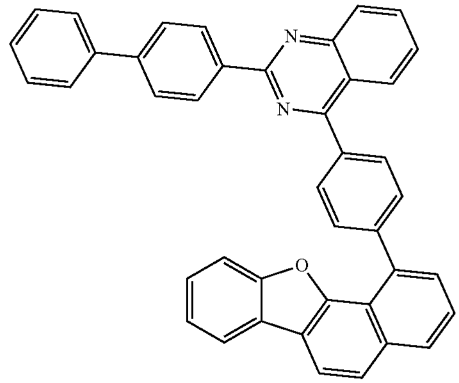
19
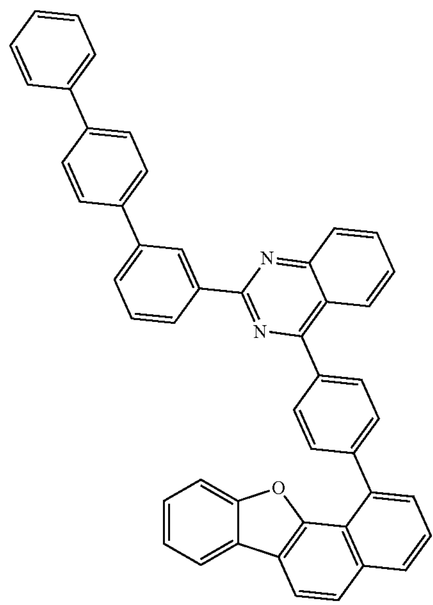
20
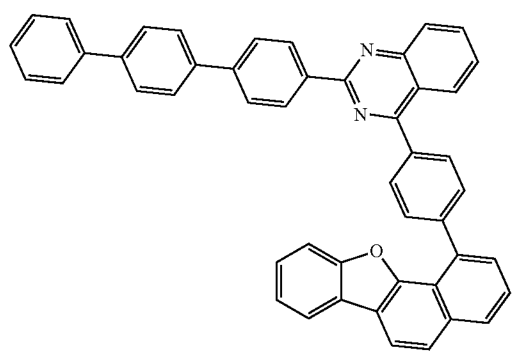

-continued
21
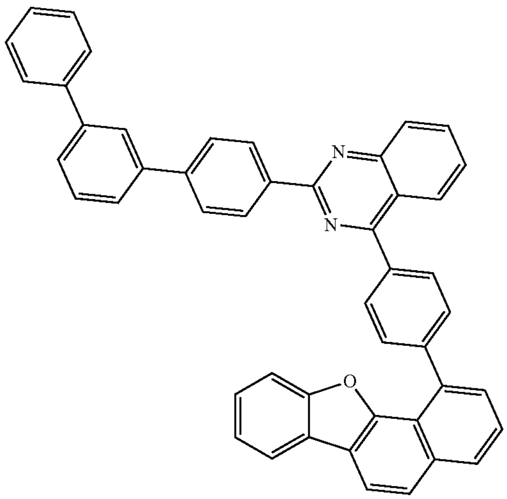
22
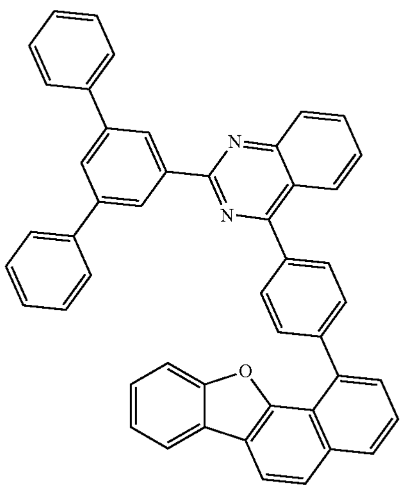
23
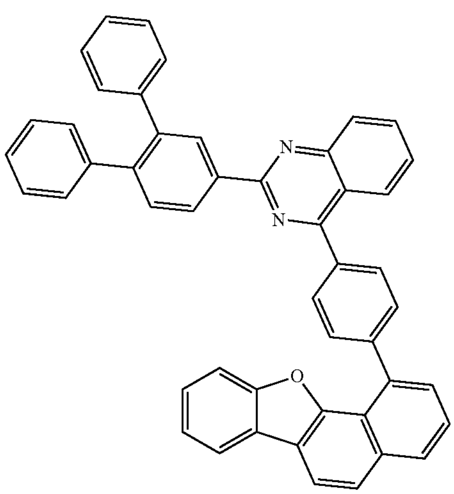
-continued
24
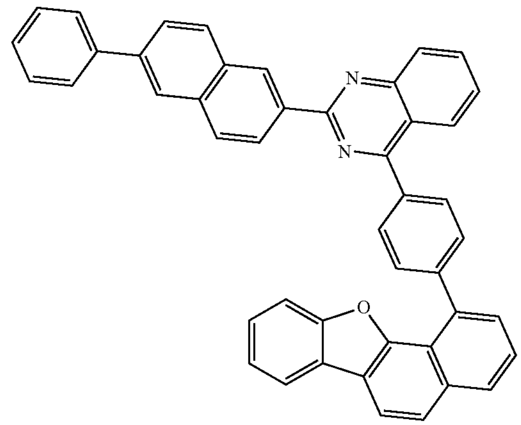
25
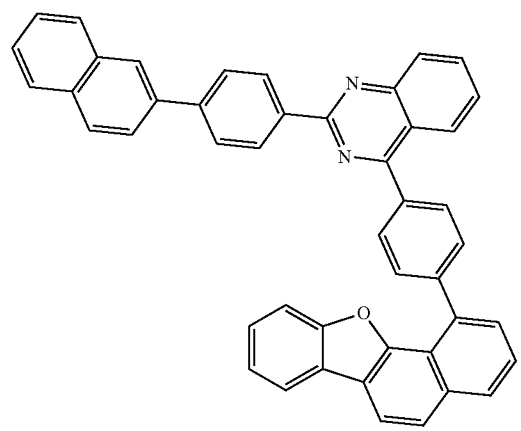
26
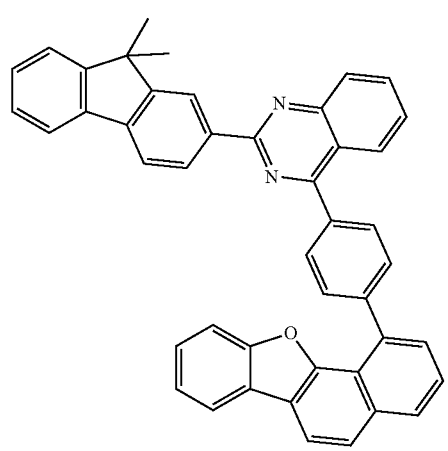

-continued
27
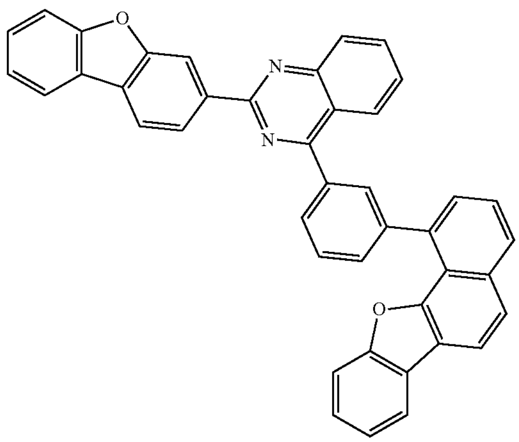
28
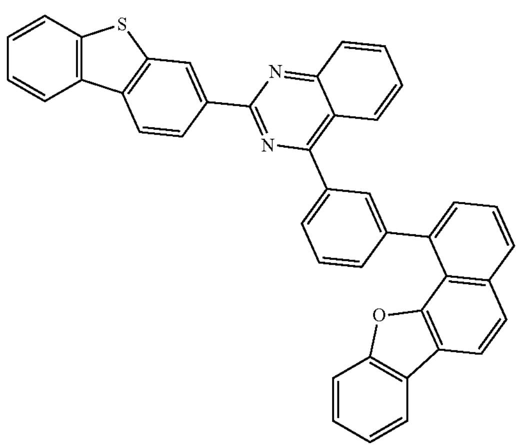
29
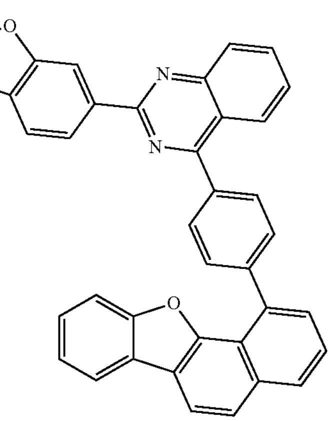
-continued
30
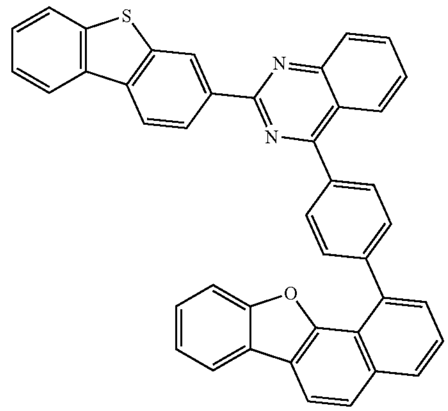
31
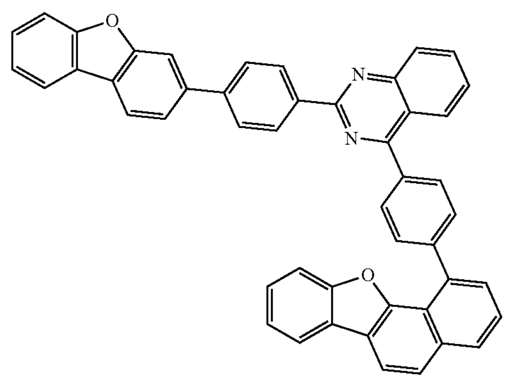
32
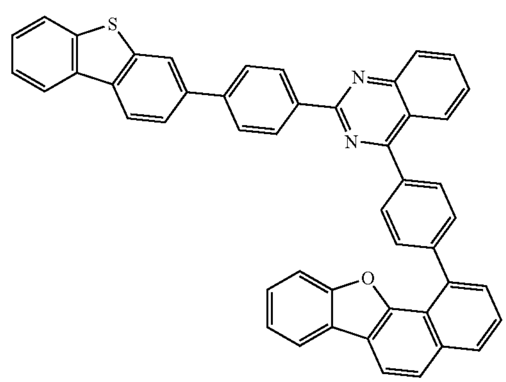
33
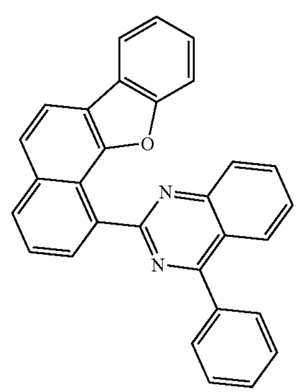

-continued
34
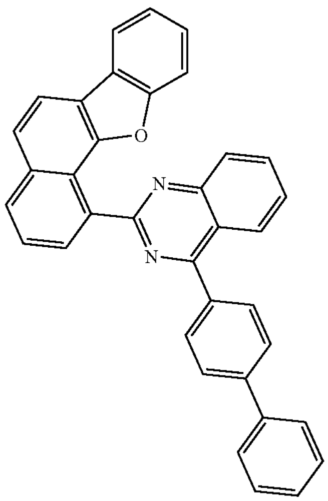
35
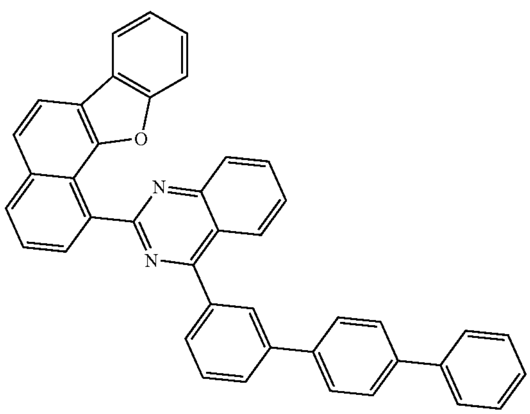
36
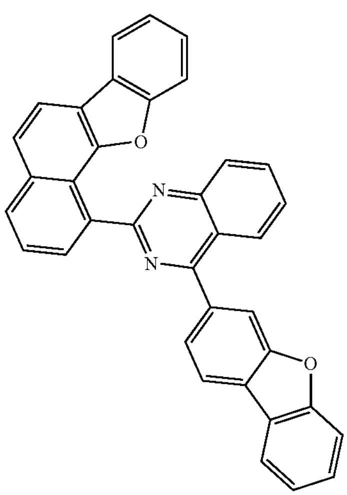
-continued
37
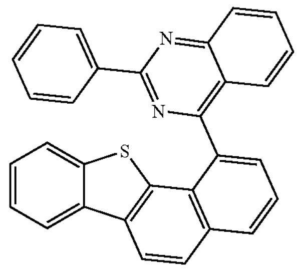
38
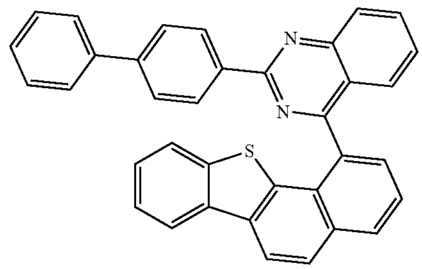
39
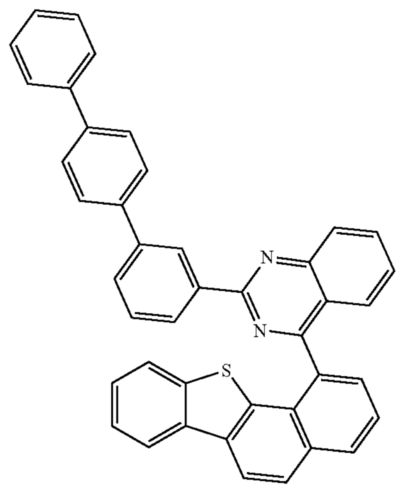
40
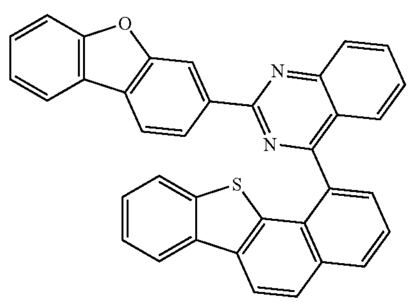
41
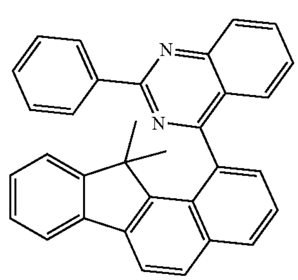

-continued
42
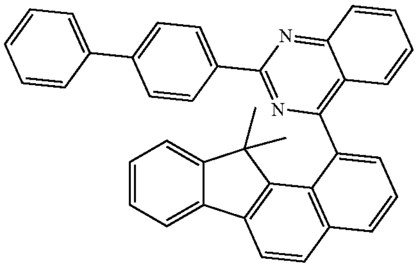
43
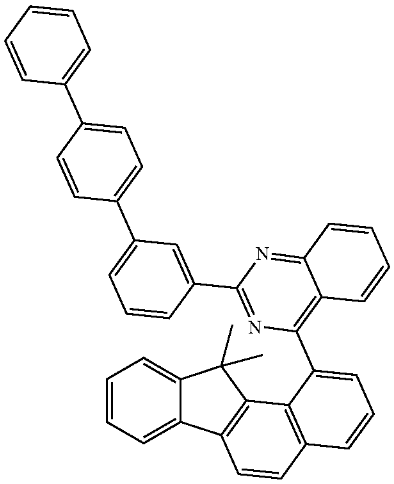
44
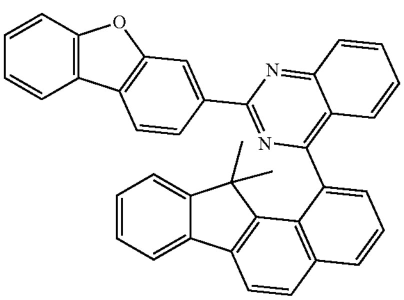
45
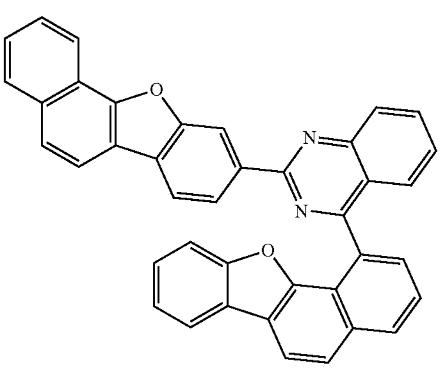
-continued
46
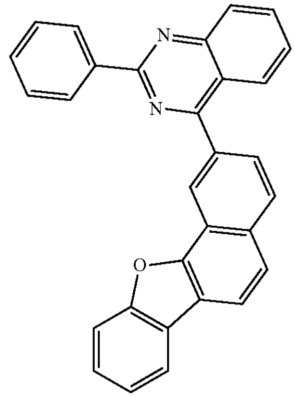
47
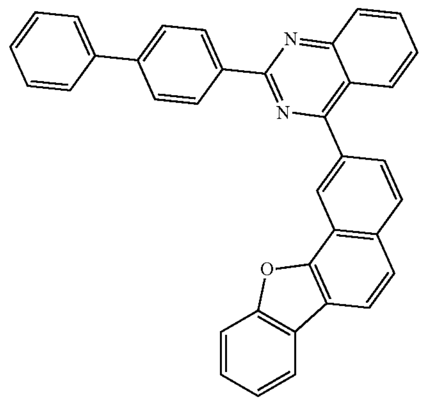
48
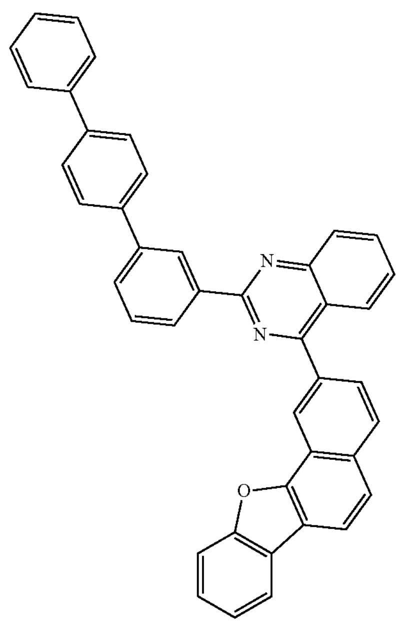

-continued
49
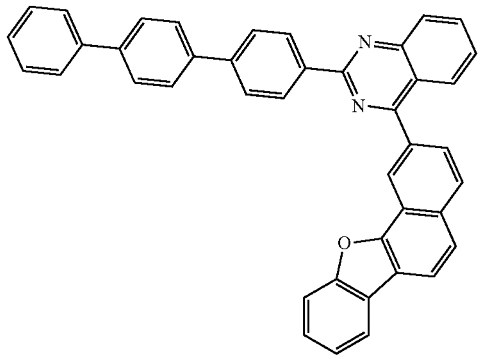
50
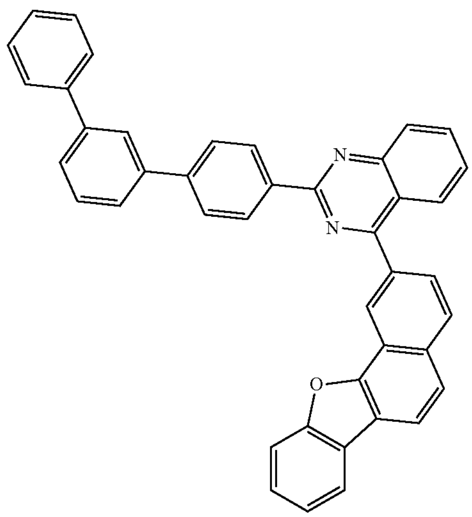
51
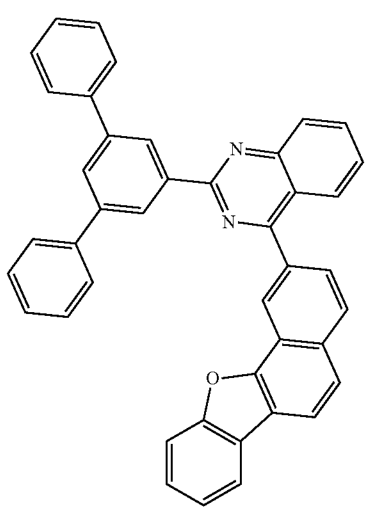
-continued
52
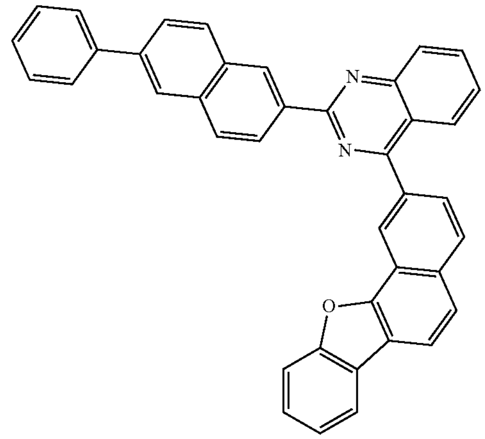
53
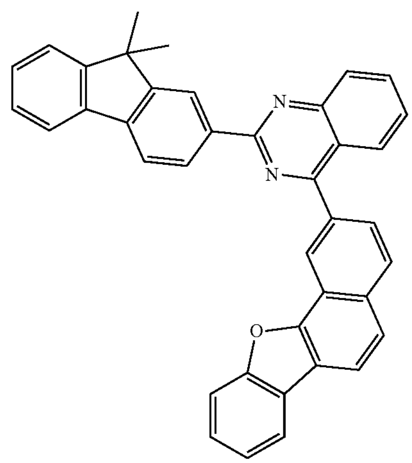
54
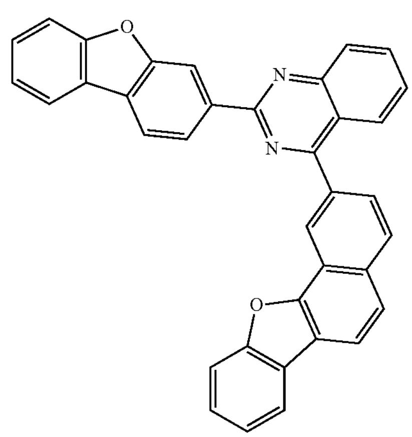

-continued
55
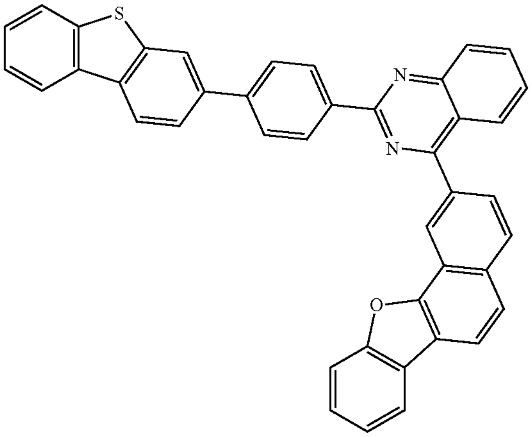
56
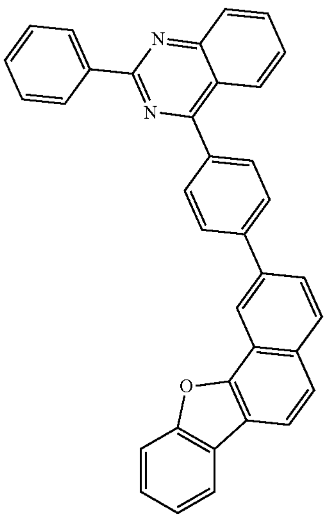
57
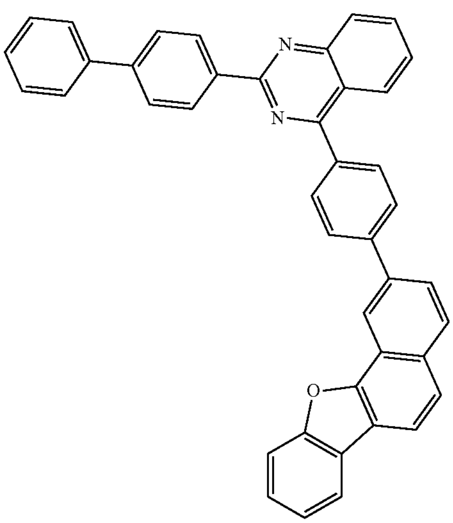
-continued
58
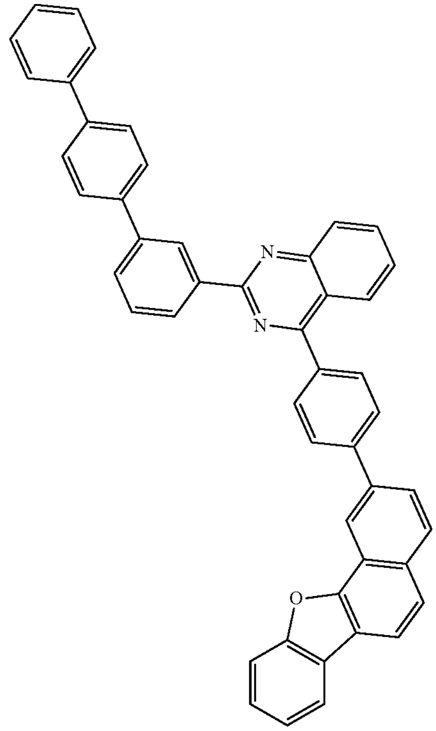
59
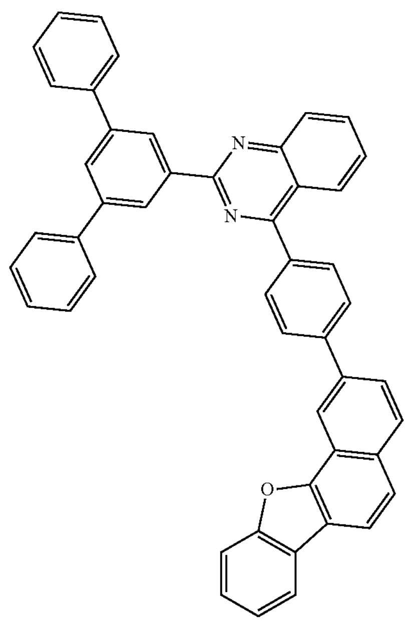

-continued
60
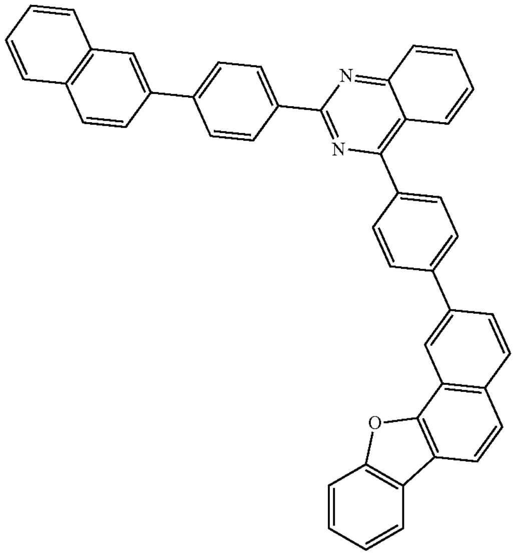
61
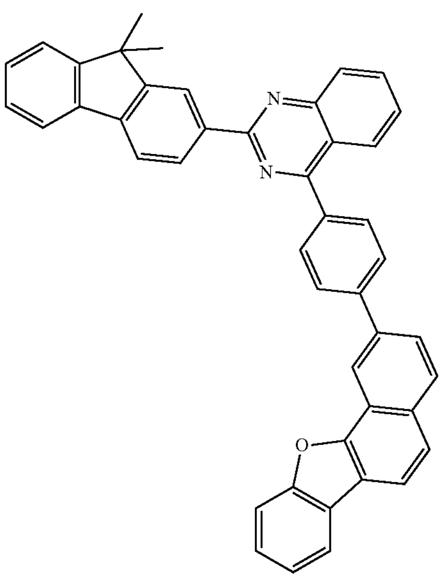
62
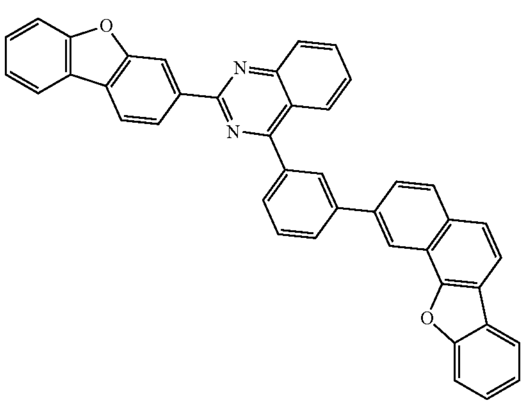
-continued
63
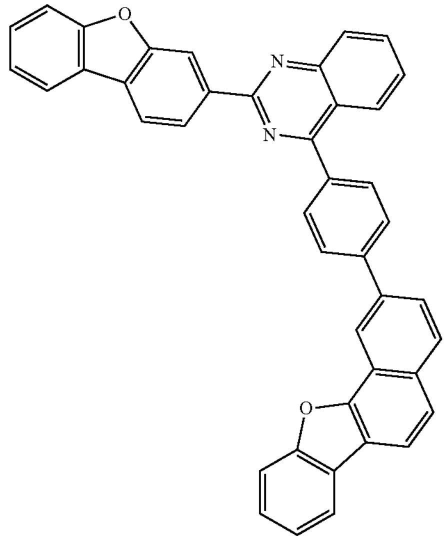
64
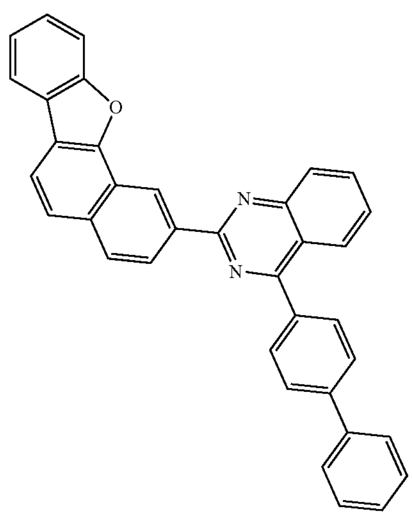
65
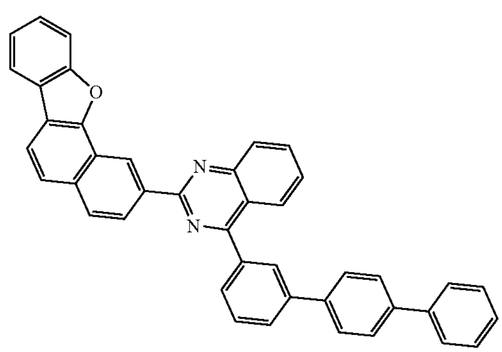

-continued
66
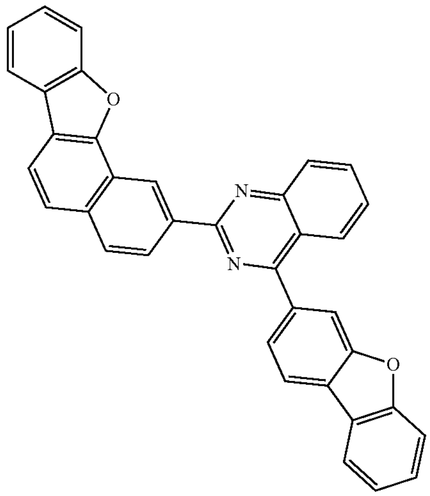
67
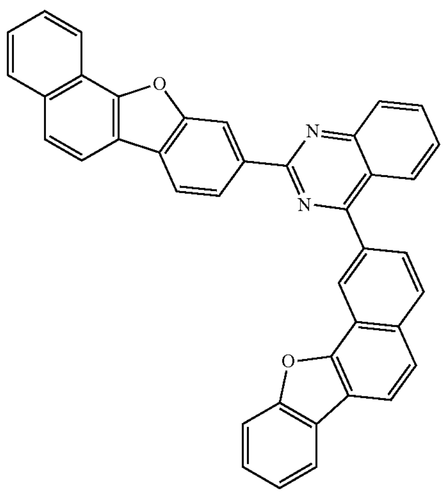
68
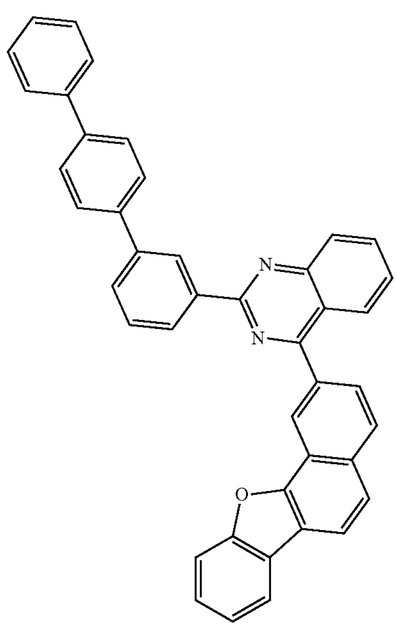
-continued
69
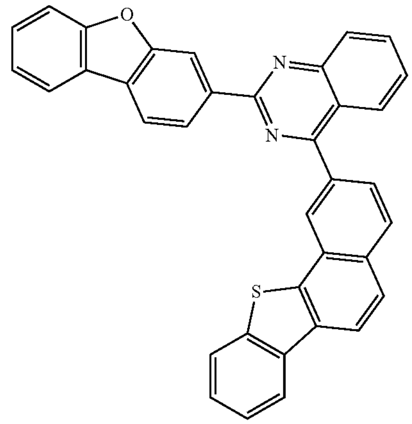
70
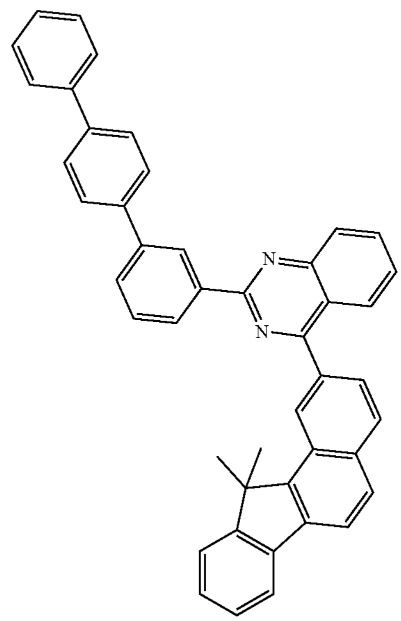
71
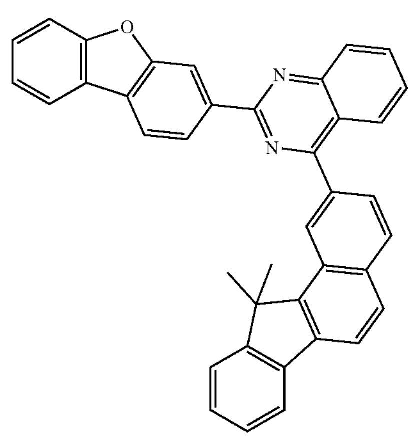

-continued
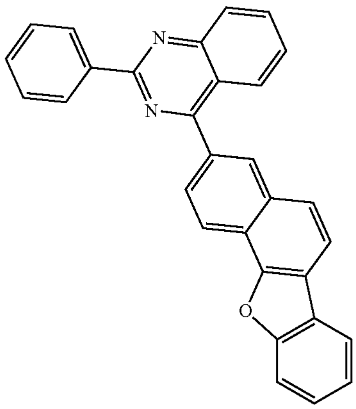
72
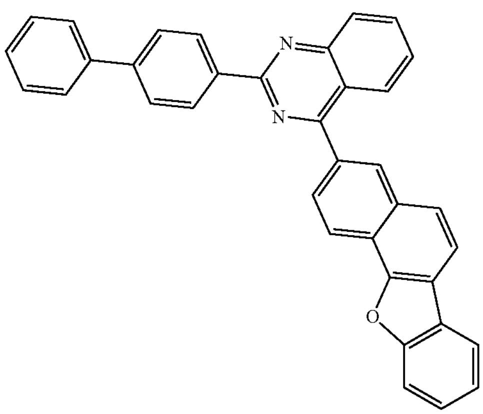
73
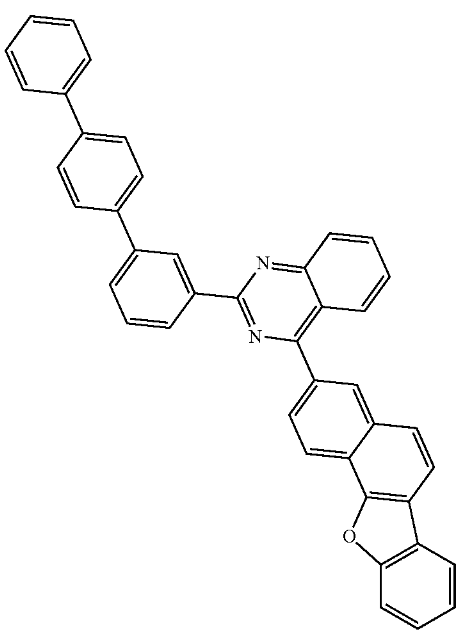
74
-continued
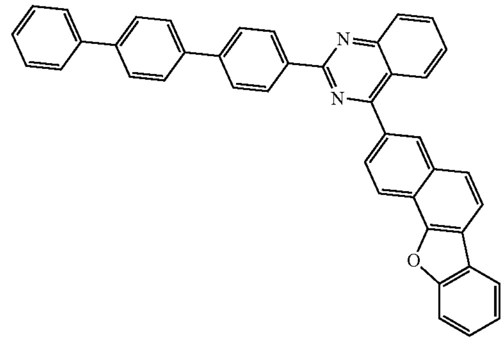
75
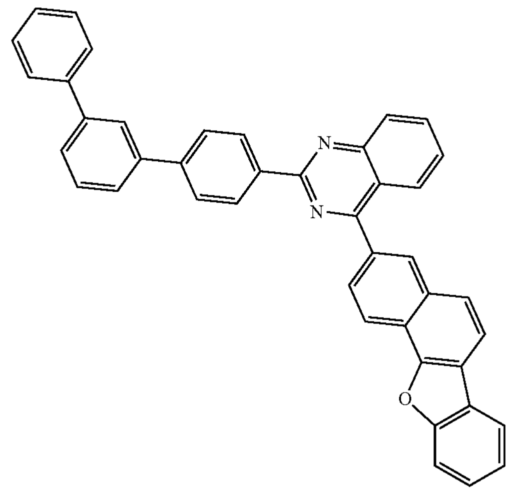
76
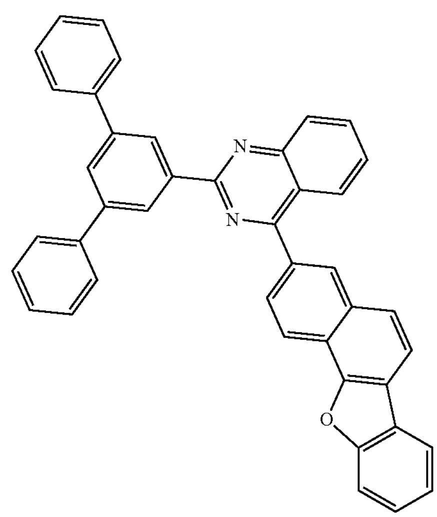
77

78
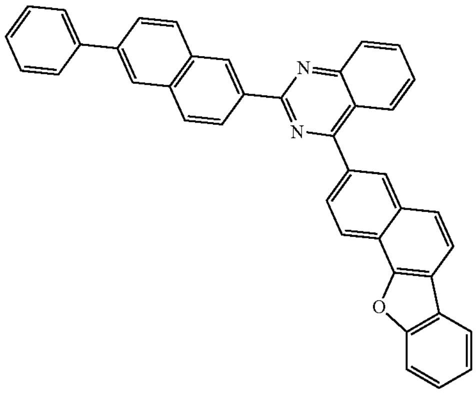
79
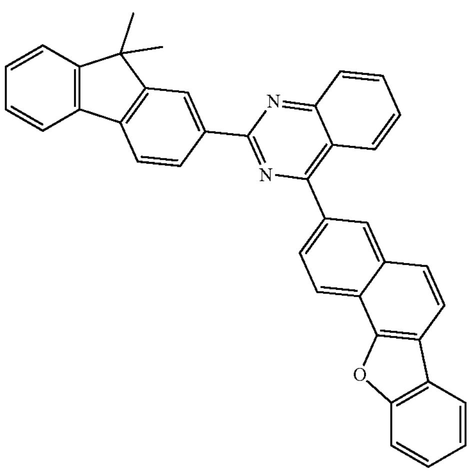
80
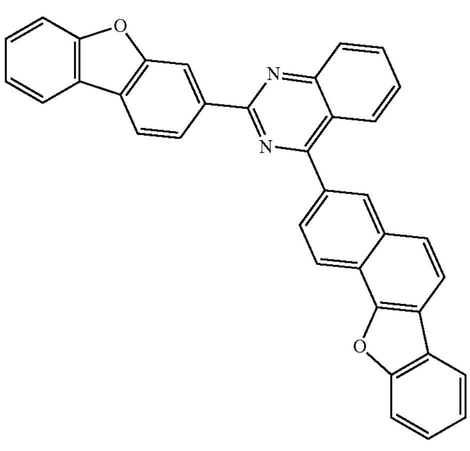
81
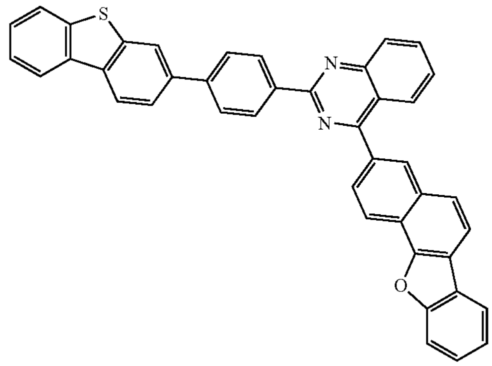
82
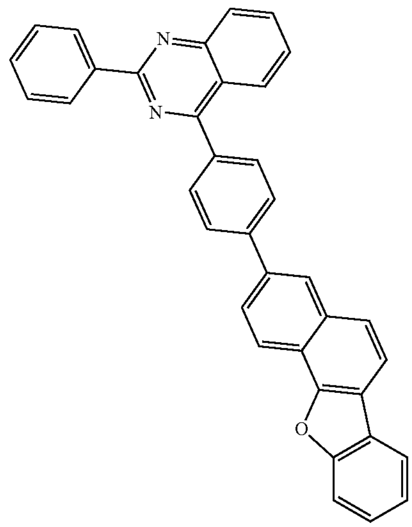
83
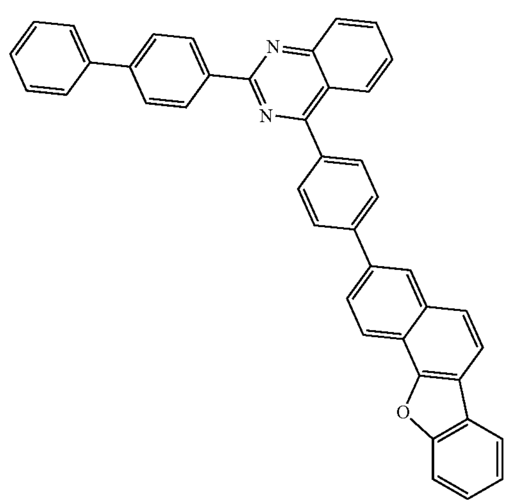

-continued
84
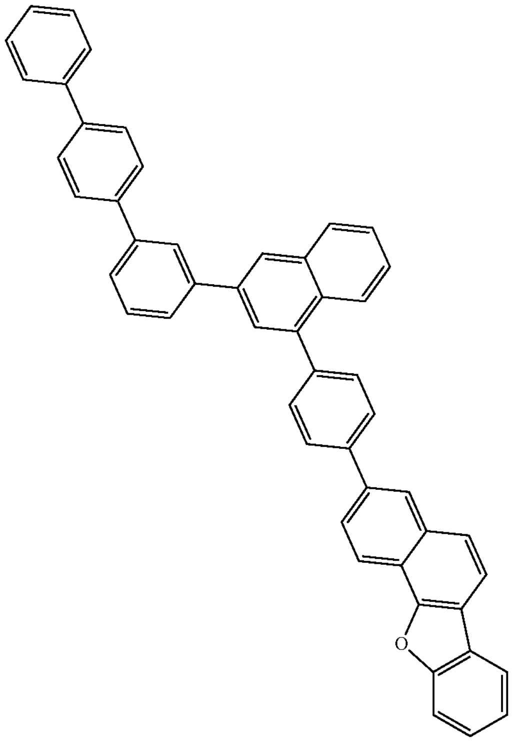
85
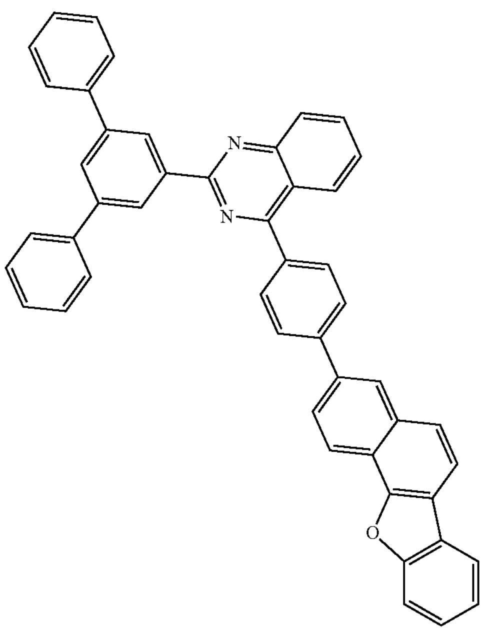
-continued
86
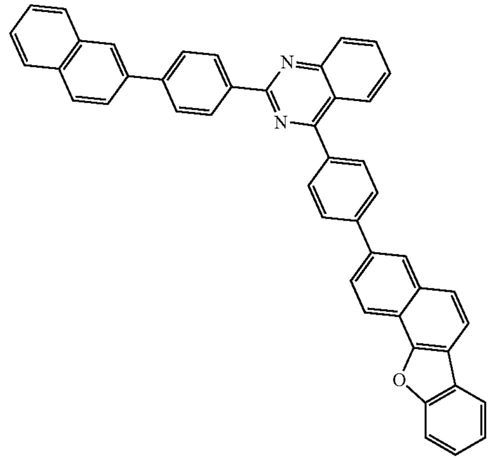
87
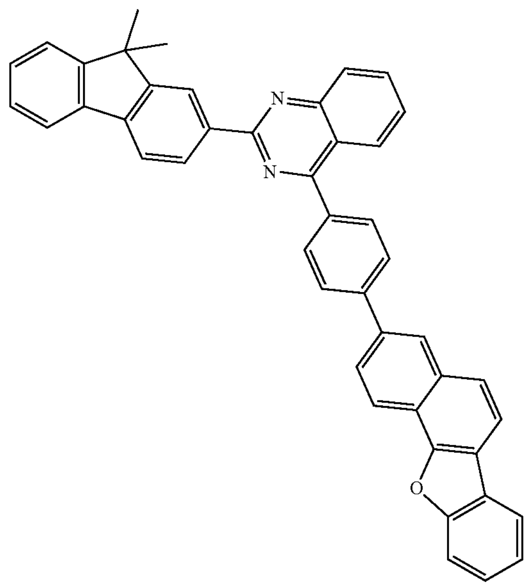
88
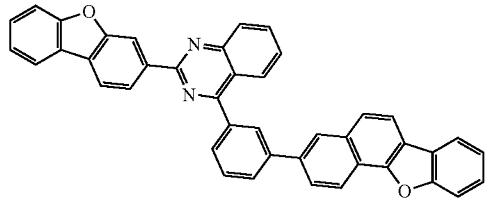

-continued
89
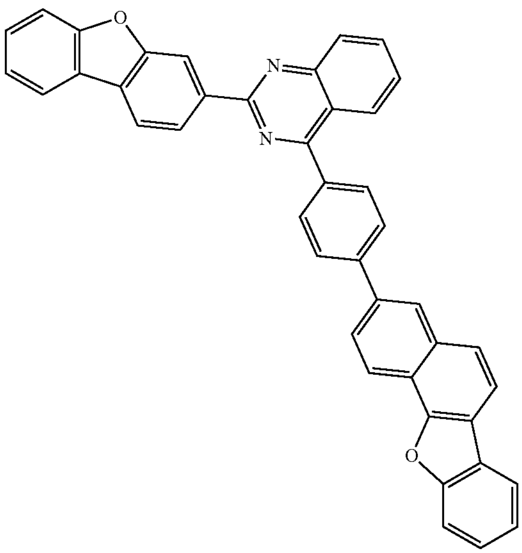
90
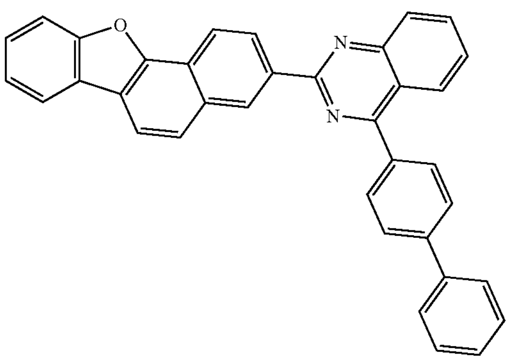
91
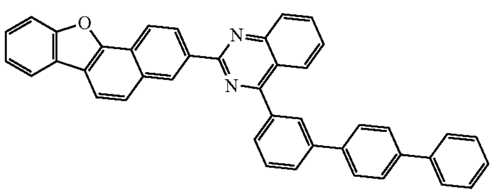
92
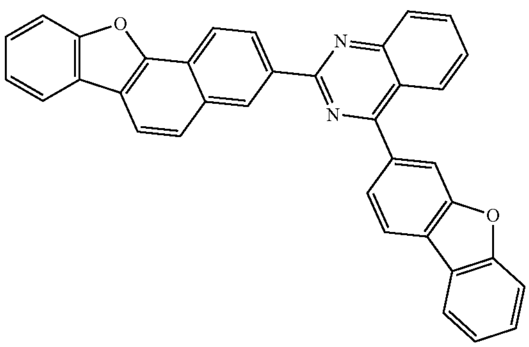
-continued
93
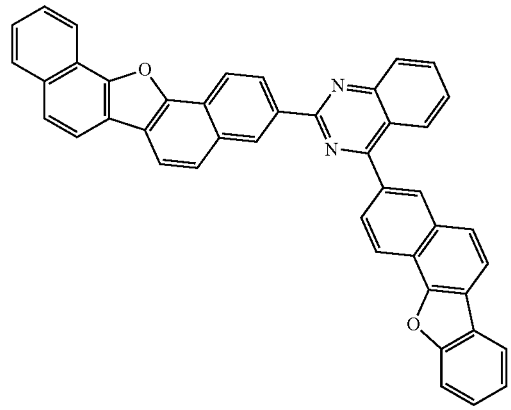
94
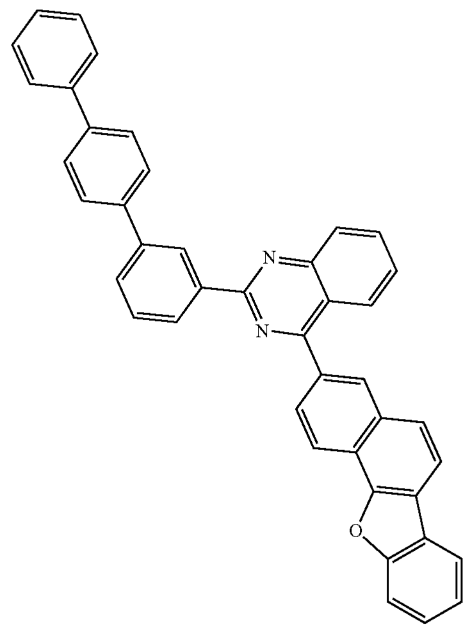
95
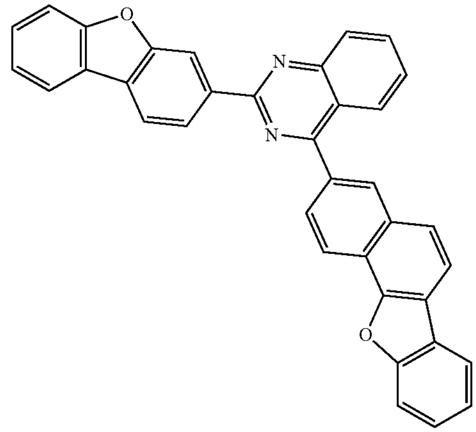

-continued
96
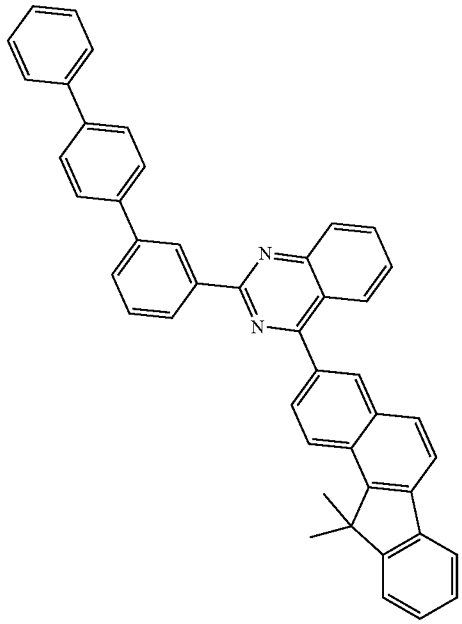
97
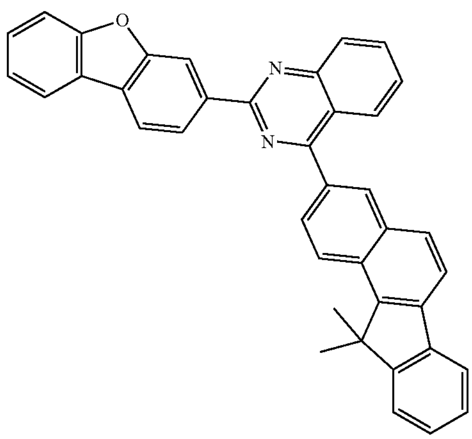
98
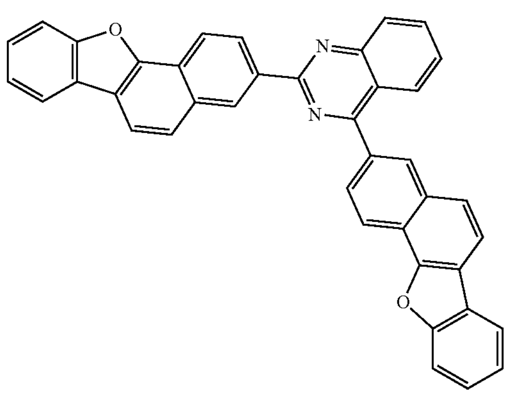
-continued
99
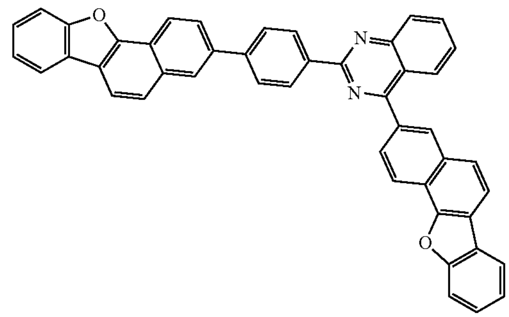
100
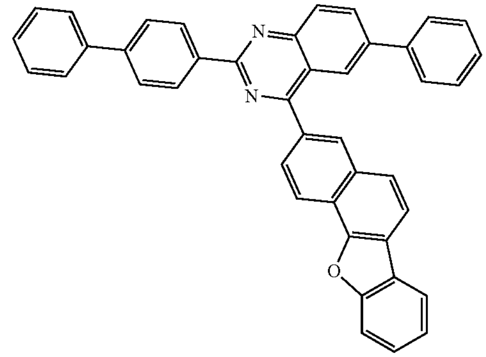
101
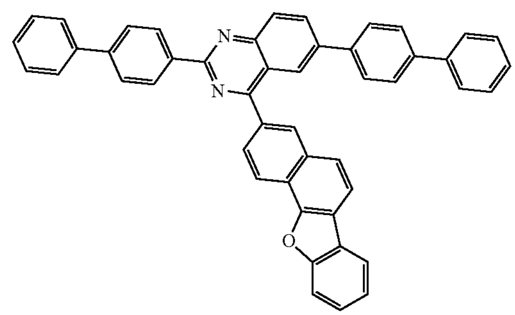
102
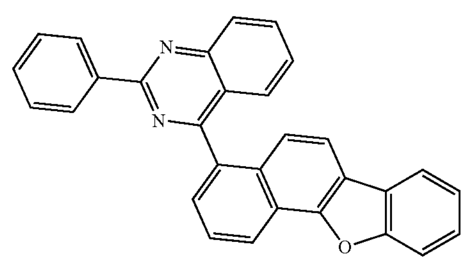
103
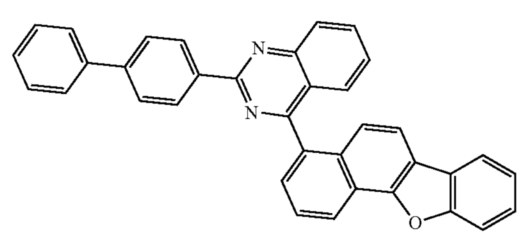

-continued
104
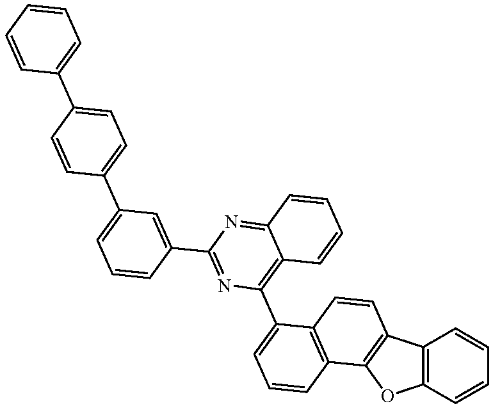
105
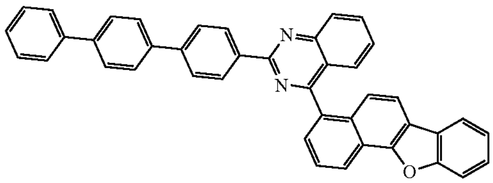
106
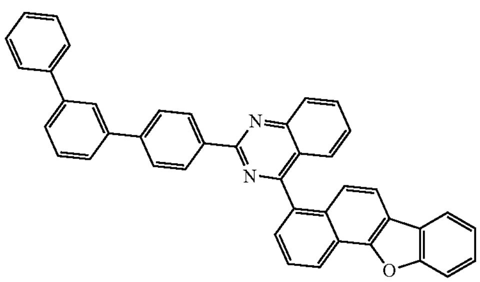
107
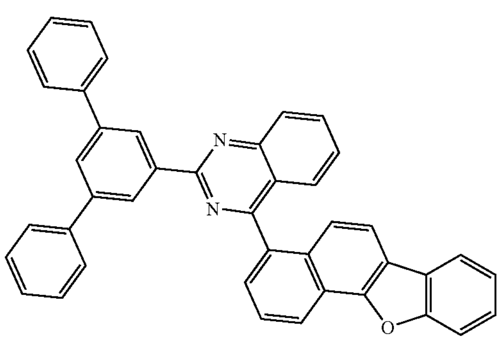
108
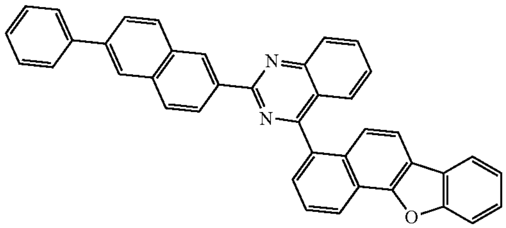
-continued
109
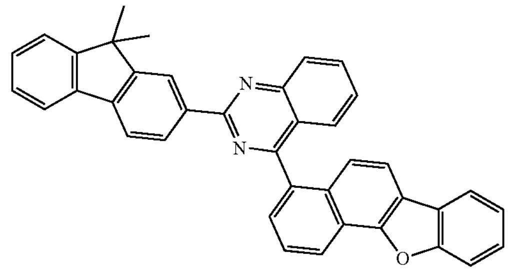
110
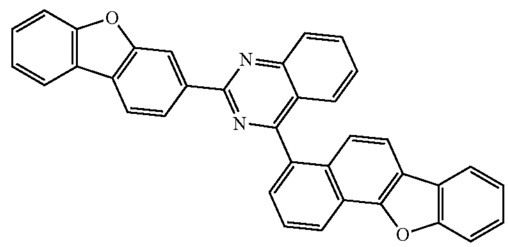
111
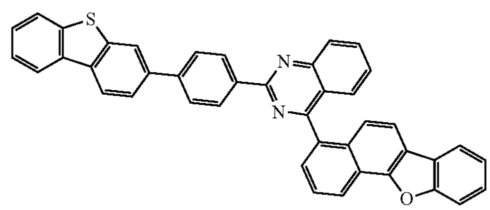
112
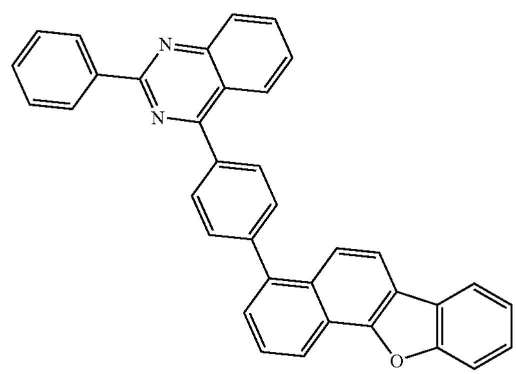
113
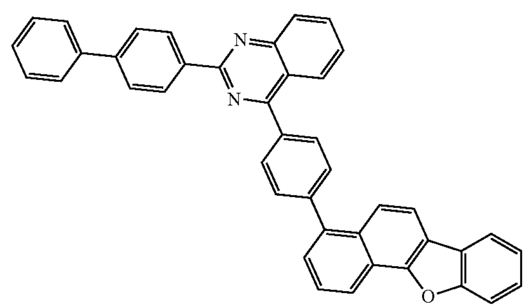

-continued
114
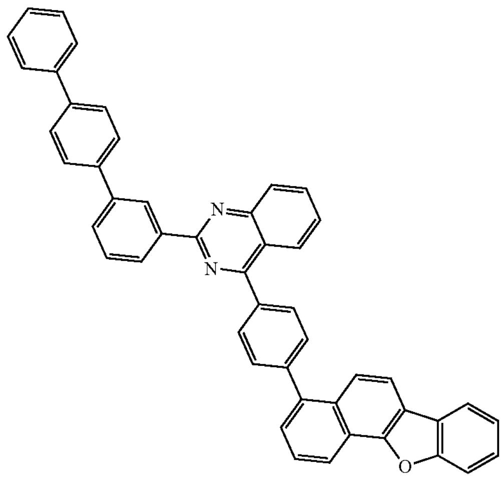
115
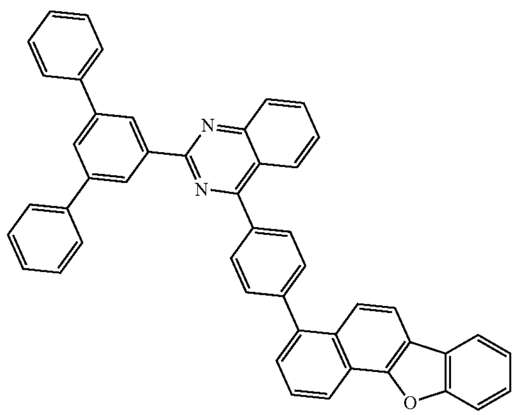
116
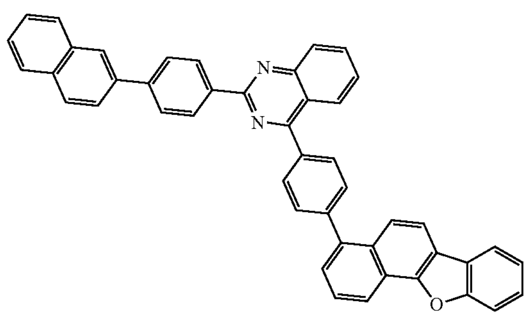
117
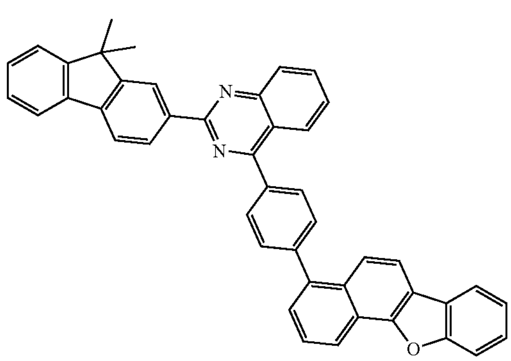
-continued
118
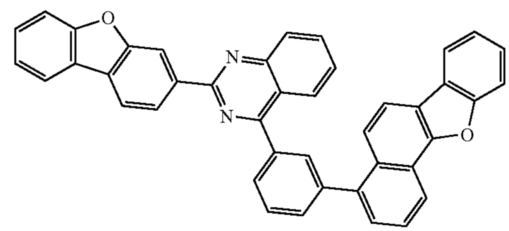
119
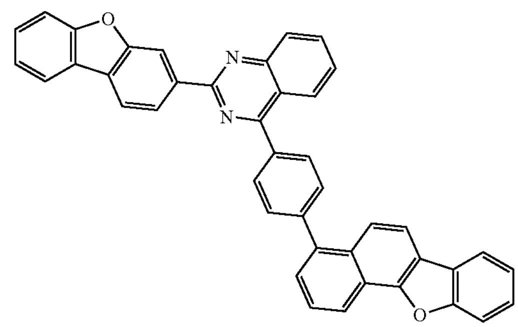
120
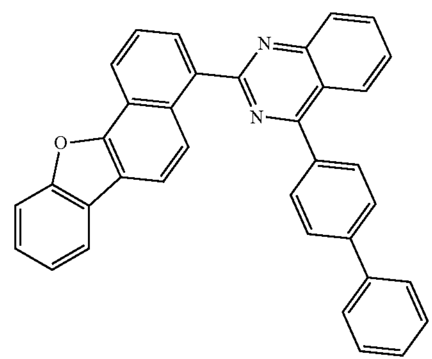
121
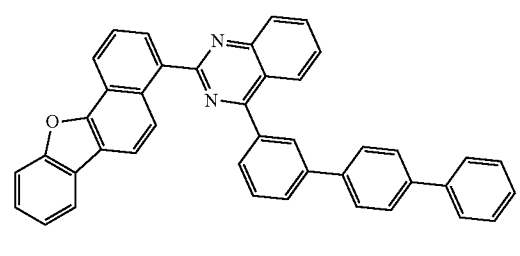
122
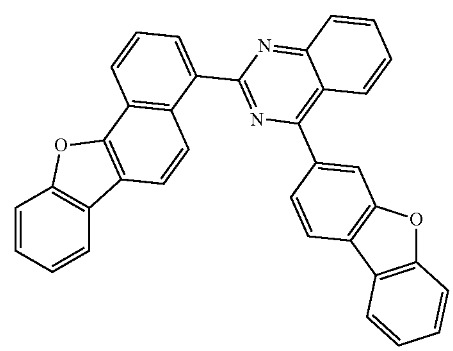

-continued

123

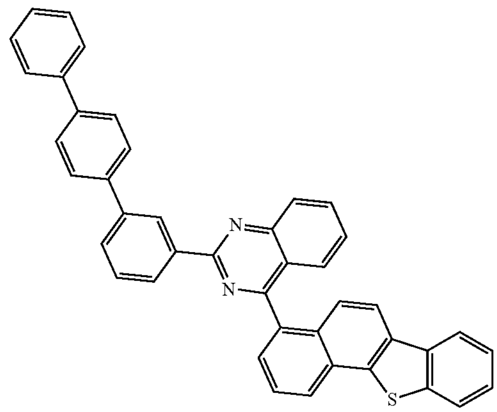

124

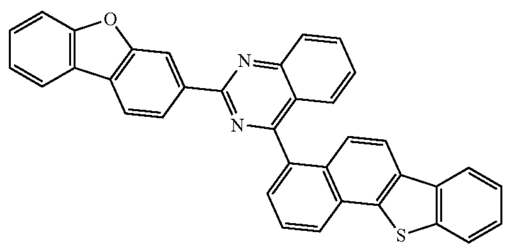

125

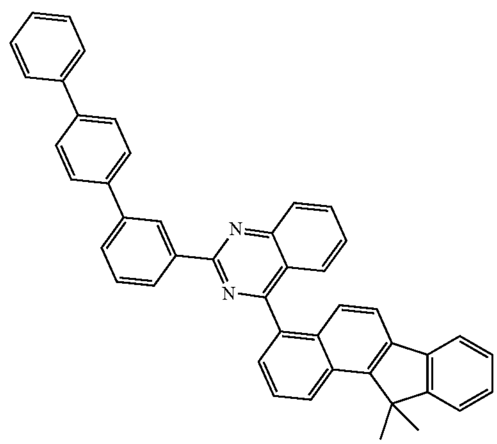

126

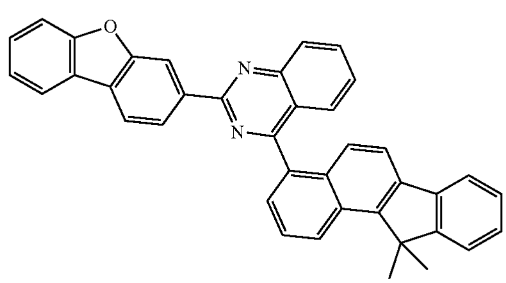

The aforementioned compound for the organic photoelectronic element may be applied in an organic photoelectronic element alone or with other compounds for an organic photoelectronic element. When the aforementioned compound for the organic photoelectronic element is applied with the compound for the organic photoelectronic element, they may be applied in a form of a composition.

In addition, the present invention provides a composition for an organic photoelectronic element including the aforementioned "compound represented by [Chemical Formula 1A] (first compound for an organic photoelectronic element)" and at least one compound of a compound represented by [Chemical Formula 2'] and at least one compound consisting of a moiety represented by [Chemical Formula 3] and a moiety represented by [Chemical Formula 4] as a second compound (second compound for an organic photoelectronic element).

[Chemical Formula 2']

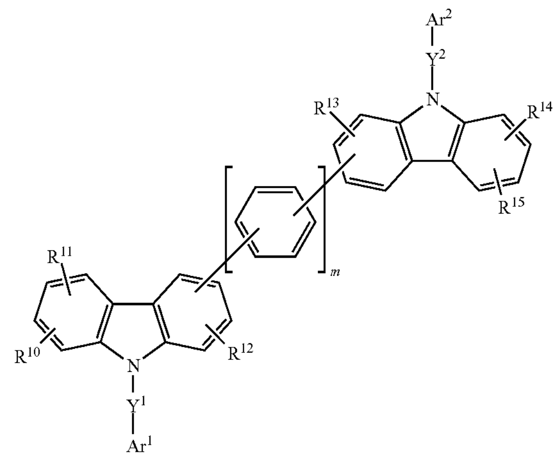

In Chemical Formula 2', $Y^1$ and $Y^2$ are independently a single bond, a substituted or unsubstituted C6 to C30 arylene group, a substituted or unsubstituted C2 to C30 heteroarylene group, or a combination thereof, $Ar^1$ and $Ar^2$ are independently a substituted or unsubstituted C6 to C30 aryl group, a substituted or unsubstituted C2 to C30 heterocyclic group, or a combination thereof, $R^{10}$ to $R^{15}$ are independently hydrogen, deuterium, a substituted or unsubstituted C1 to C20 alkyl group, a substituted or unsubstituted C6 to C30 aryl group, a substituted or unsubstituted C2 to C50 heterocyclic group, or a combination thereof, and m is one of integers from 0 to 2;

[Chemical Formula 3]

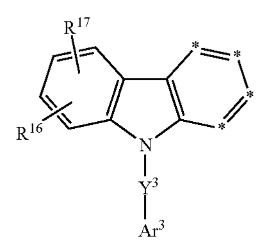

[Chemical Formula 4]

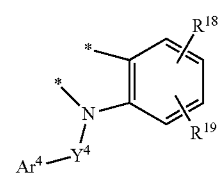

wherein, in Chemical Formulae 3 and 4, $Y^3$ and $Y^4$ are independently a single bond, a substituted or unsubstituted C6 to C30 arylene group, a substituted or unsubstituted C2 to C30 heteroarylene group, or a combination thereof, $Ar^3$ and $Ar^4$ are independently a substituted or unsubstituted C6 to C30 aryl group, a substituted or unsubstituted C2 to C30 heterocyclic group, or a combination thereof, $R^{16}$ to $R^{19}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof, adjacent two *'s of Chemical Formula 3 are linked with two *'s of Chemical Formula 4 to form a fused ring, and *'s which do not form a fused ring in Chemical Formula 3 are independently $CR^a$, and $R^a$ is hydrogen, deuterium, a substituted or unsubstituted C1 to C10 alkyl group, a substituted or unsubstituted C6 to C12 aryl group, a substituted or unsubstituted C2 to C12 heterocyclic group, or a combination thereof;

wherein the "substituted" refers to replacement of at least one hydrogen by deuterium, a C1 to C4 alkyl group, a C6 to C18 aryl group, or a C2 to C18 heteroaryl group.

An embodiment of the present invention may provide a composition for an organic light emitting diode including [Chemical Formula 1A] and [Chemical Formula 2'].

An embodiment of the present invention provides an organic light emitting diode including [Chemical Formula 1A] and [Chemical Formula 2'] as a red host and a red phosphorescent dopant.

In an embodiment of the present invention, in Chemical Formula 2', m may be 0 and Ar2 and Ar1 may be a substituted or unsubstituted C6 to C30 aryl group or a substituted or unsubstituted C3 to C30 heteroallyl group.

In an embodiment of the present invention, in Chemical Formula 2', m may be 0 and Ar2 and A1 may be a phenyl group, a biphenyl group, a terphenyl group, a quarterphenyl group, a naphthyl group, an anthracenyl group, a triphenylene group, a dibenzofuranyl group, a dibenzothiophenyl group, or a combination thereof.

In an embodiment of the present invention, $Y^1$ and $Y^2$ of Chemical Formula 2' may independently be a single bond, or a substituted or unsubstituted C6 to C18 arylene group.

In an embodiment of the present invention, $Ar^1$ and Are of Chemical Formula 2' may independently be a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted pyridinyl group, a substituted or unsubstituted pyrimidinyl group, a substituted or unsubstituted quinazolyl group, a substituted or unsubstituted isoquinazolyl group, a substituted or unsubstituted dibenzothiophenyl group, a substituted or unsubstituted dibenzofuranyl group, a substituted or unsubstituted carbazolyl group, a substituted or unsubstituted fluorenyl group, or a combination thereof.

In an embodiment of the present invention, $R^{10}$ to $R^{15}$ of Chemical Formula 2' may independently be hydrogen, deuterium, or a substituted or unsubstituted C6 to C12 aryl group.

In an embodiment of the present invention, m of Chemical Formula 2' may be 0 or 1.

In a specific embodiment of the present invention, Chemical Formula 2' may be one of structures of Group III and $*—Y^1—Ar^1$ and $*—Y^2—Ar^2$ may be one of substituents of Group IV.

[Group III]

C-1

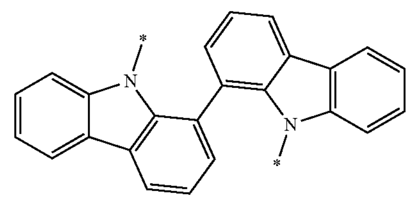

C-2

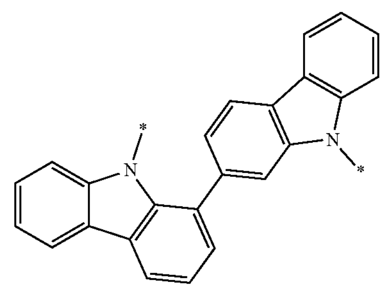

C-3

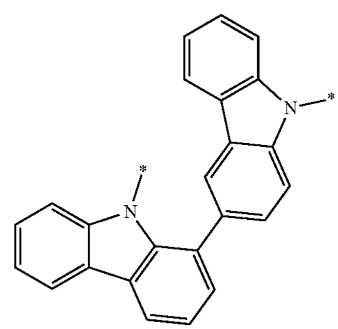

C-4

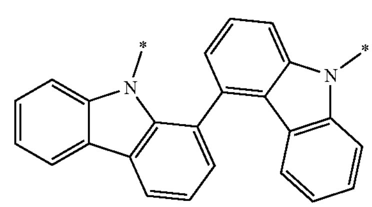

C-5

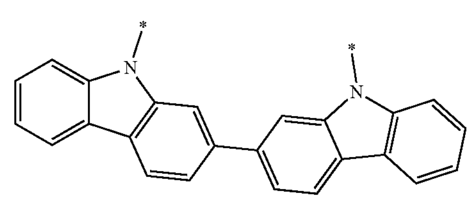

C-6

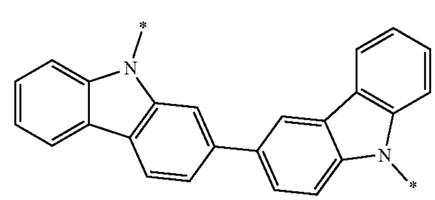

-continued
C-7
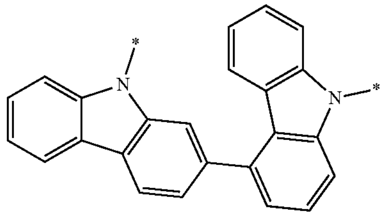
C-8
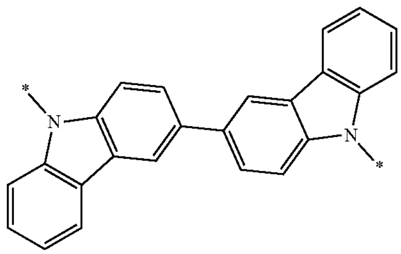
C-9
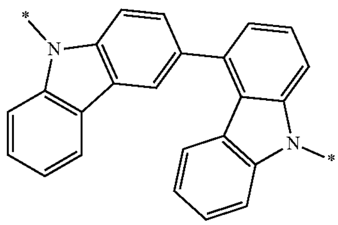
C-10
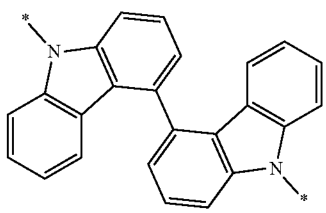
C-11
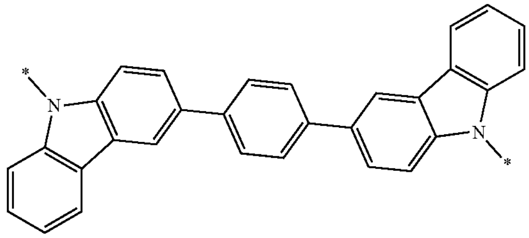
C-12
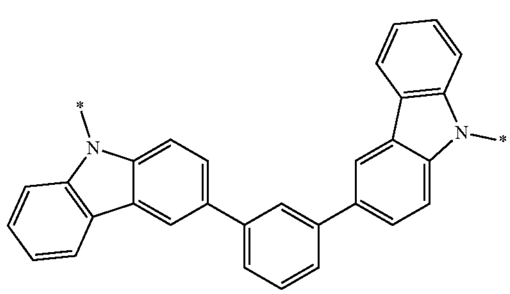
-continued
C-13
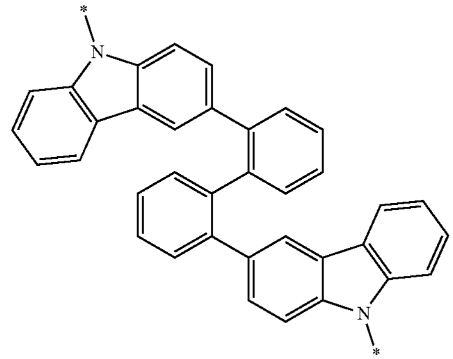
C-14
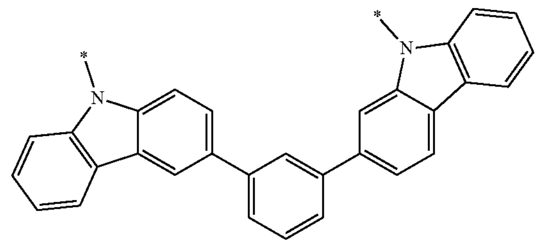
C-15
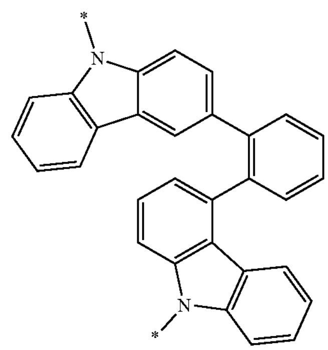
C-16
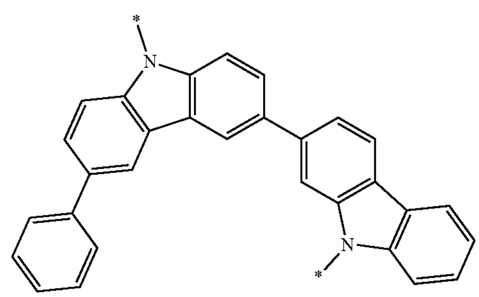
C-17
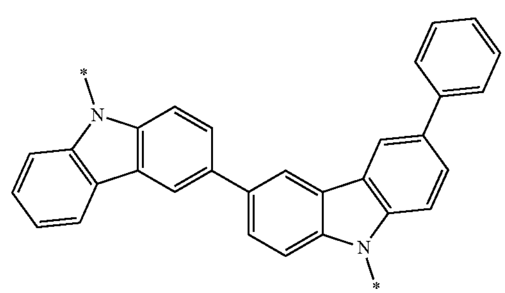

-continued
C-18
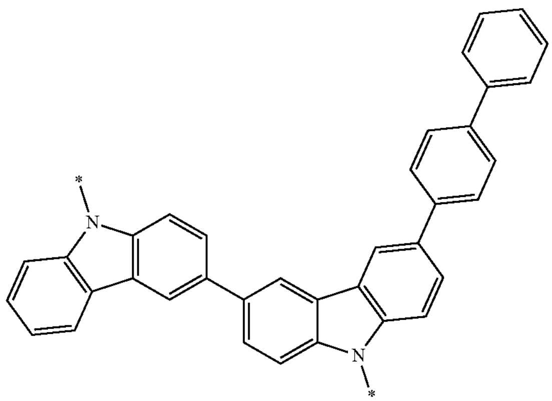
[Group IV]
B-1
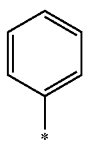
B-2
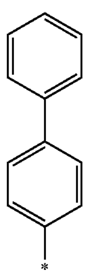
B-3
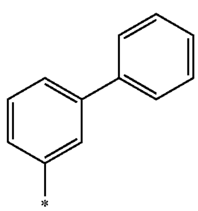
B-4
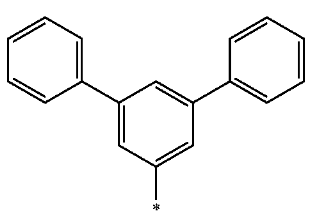
B-5
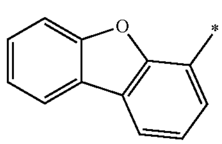
B-6
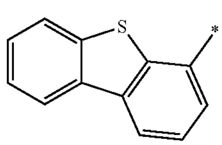
-continued
B-7
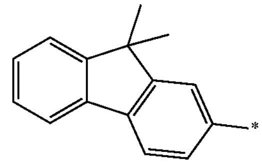
B-8
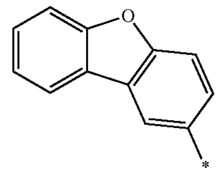
B-9
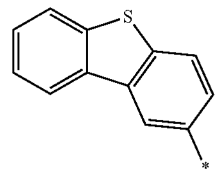
B-10
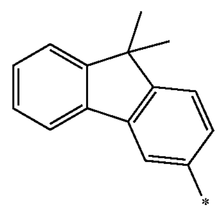
B-11
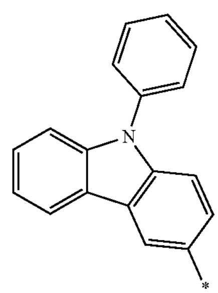
B-12
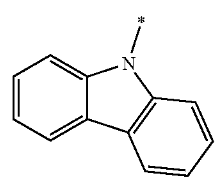
B-13
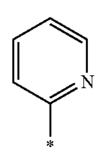
B-14
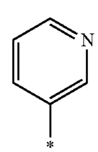

-continued
B-15
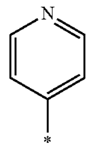
B-16
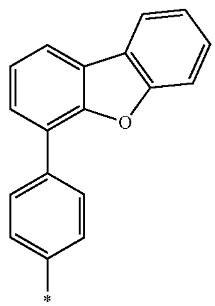
B-17
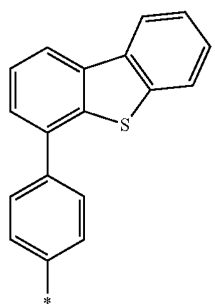
B-18
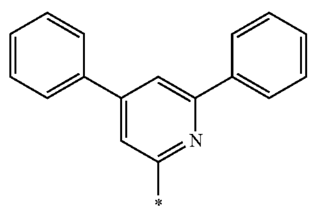
B-19
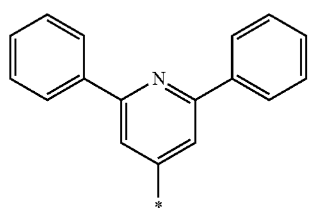
B-20
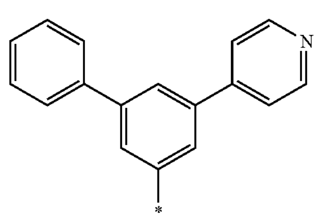
B-21
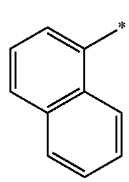
-continued
B-22
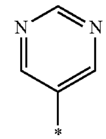
B-23
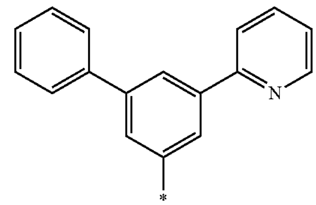
B-24
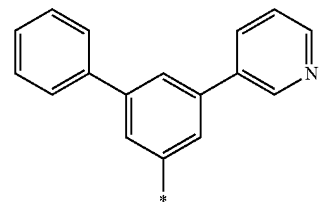
B-25
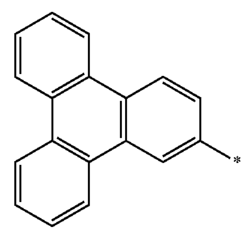
B-26
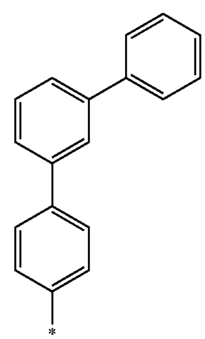
B-28
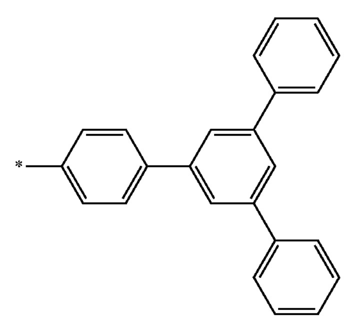
In Group III and Group IV, * is a linking point.
Specifically, Chemical Formula 2' may be represented by C-8 of Group III and *—$Y^1$—$Ar^1$ and *—$Y^2$—$Ar^2$ may be represented by one of B-1 to B-4 of Group IV.
More specifically, *—$Y^1$—$Ar^2$ and *—$Y^2$—$Ar^2$ may be selected from B-2, B-3, and a combination thereof of Group IV.

The second compound for the organic photoelectronic element represented by Chemical Formula 2' may be, for example, compounds of Group 2, but is not limited thereto.
[Group 2]
B-1
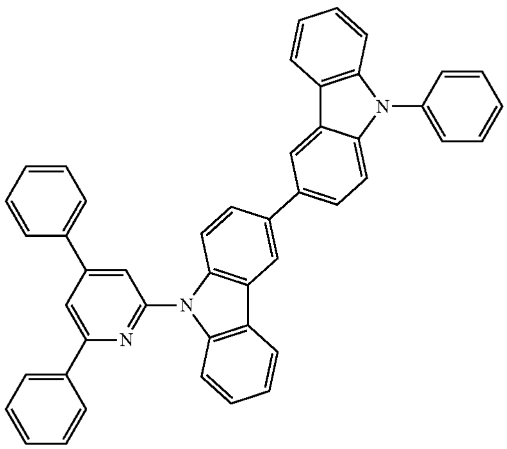
B-2
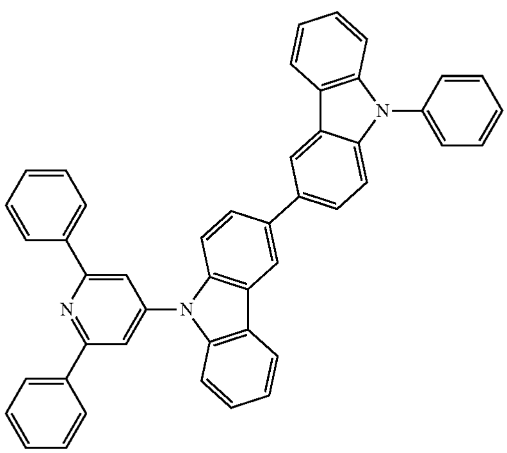
B-3
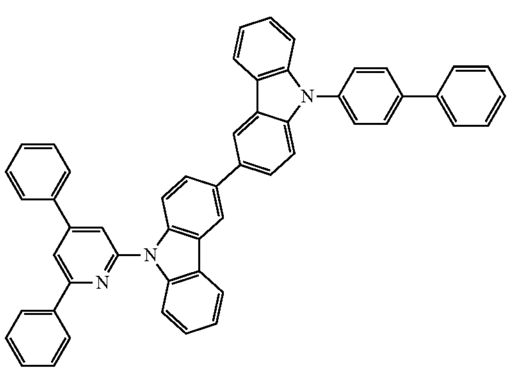
-continued
B-4
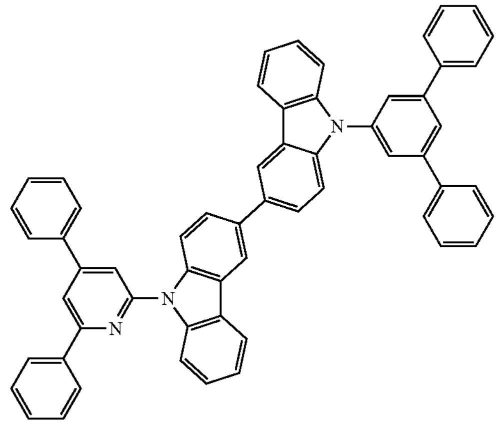
B-5
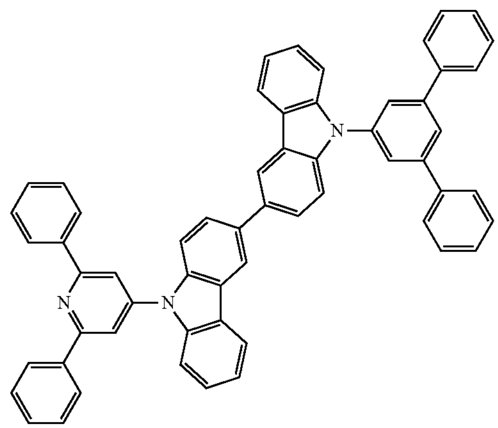
B-6
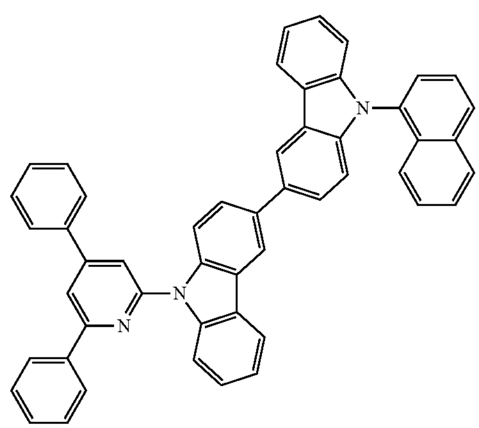

-continued
B-9
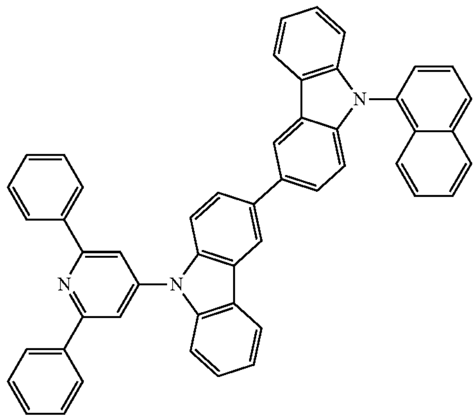
B-10
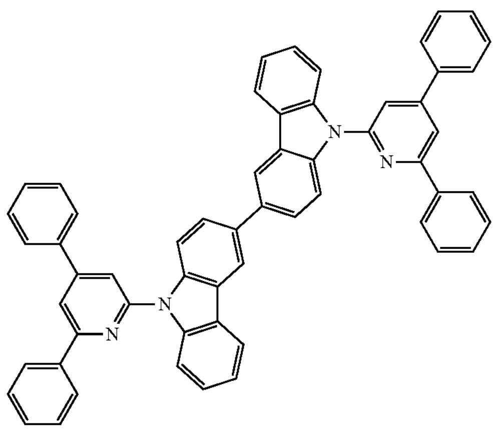
B-7
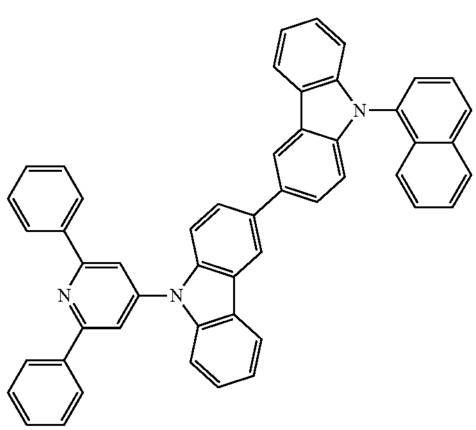
-continued
B-8
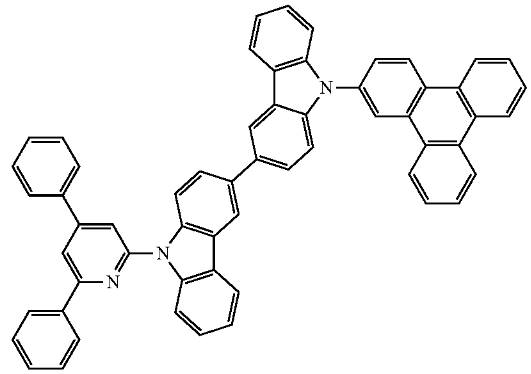
B-9
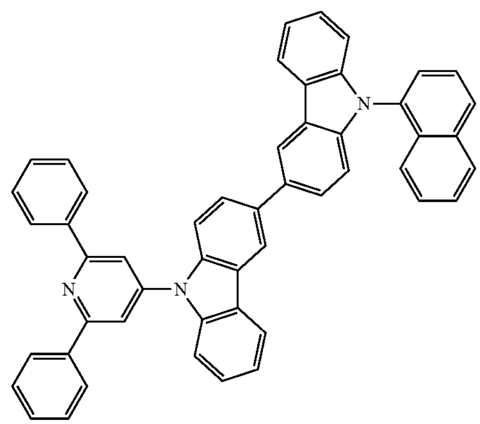
B-10
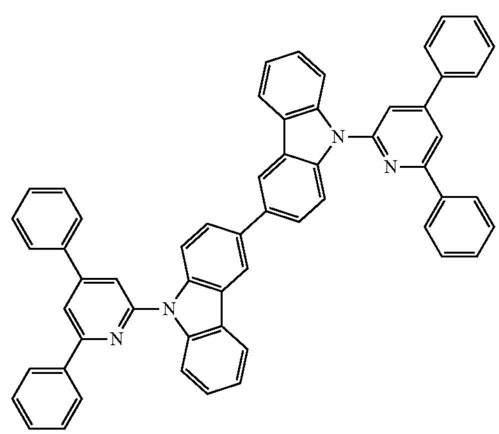

B-11
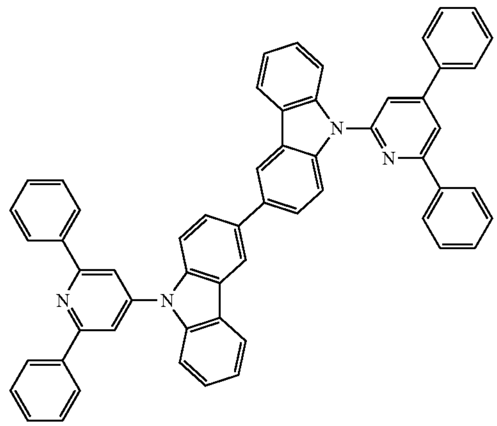
B-12
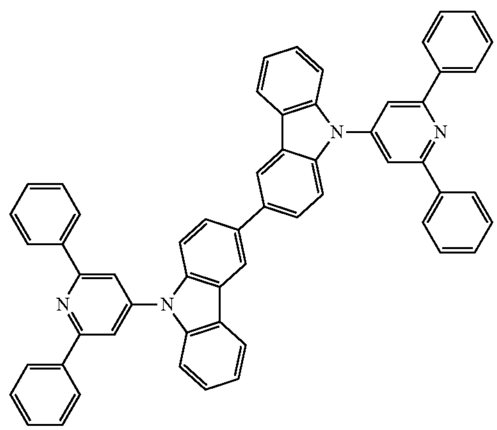
B-13
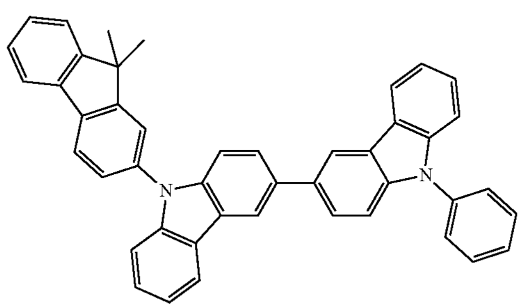
B-14
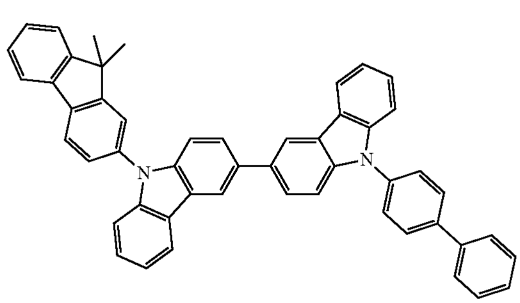
B-15
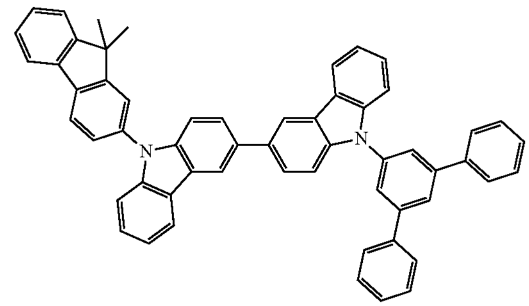
B-16
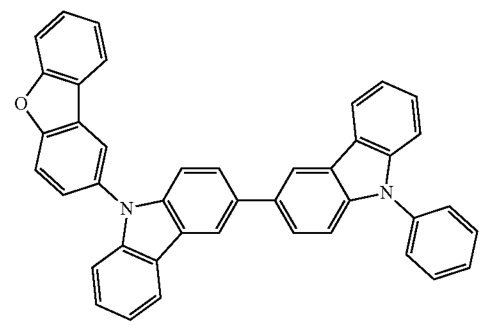
B-17
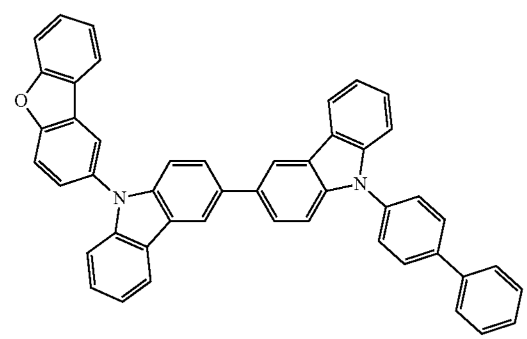
B-18
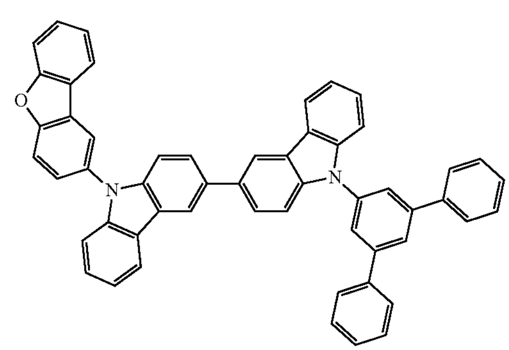

-continued
B-19
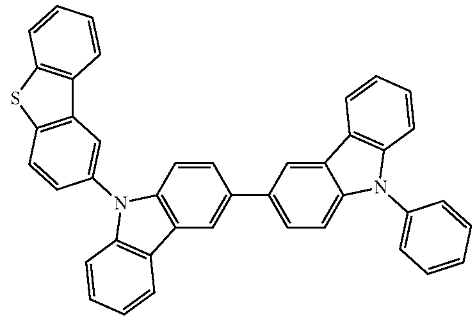
B-20
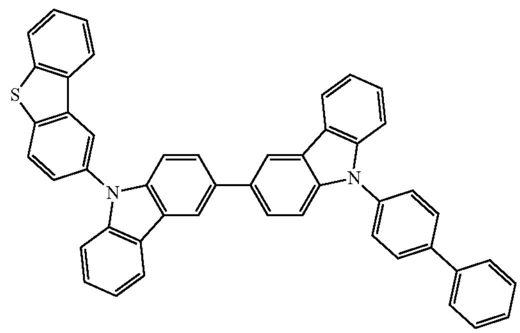
B-21
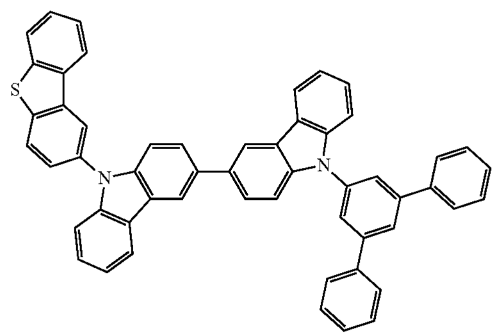
B-22
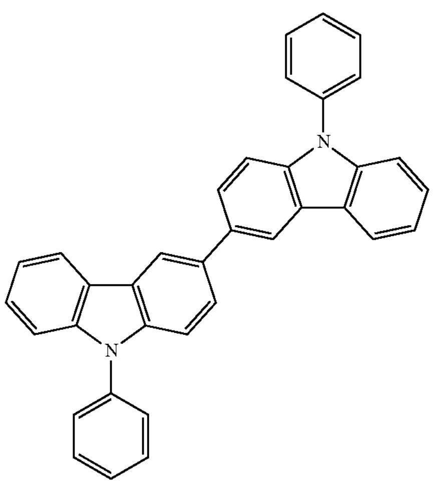
-continued
B-23
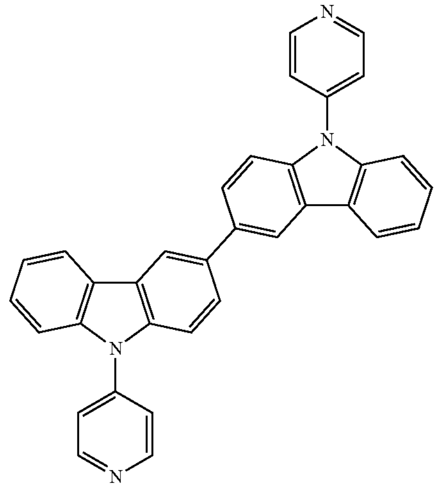
B-24
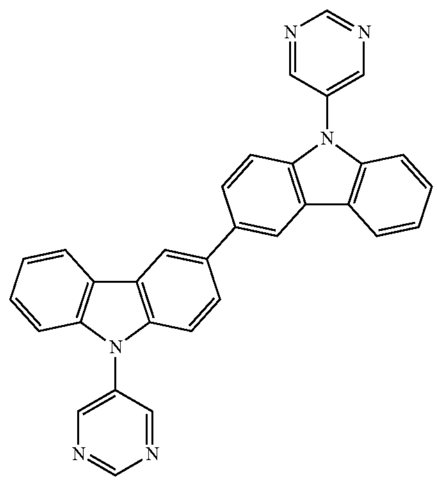
B-25
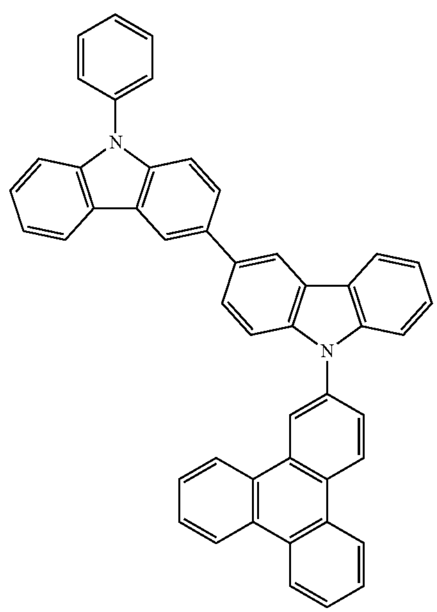

-continued
B-26
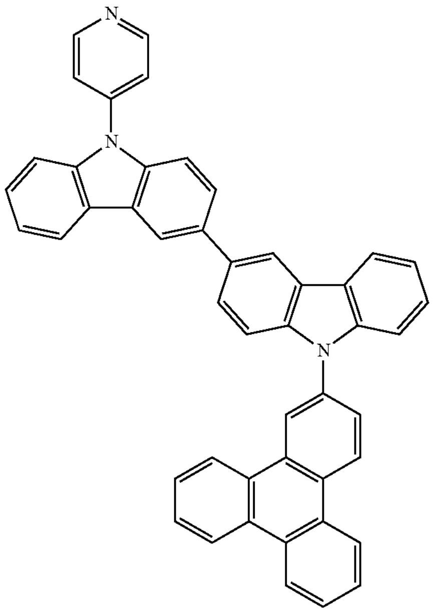
B-27
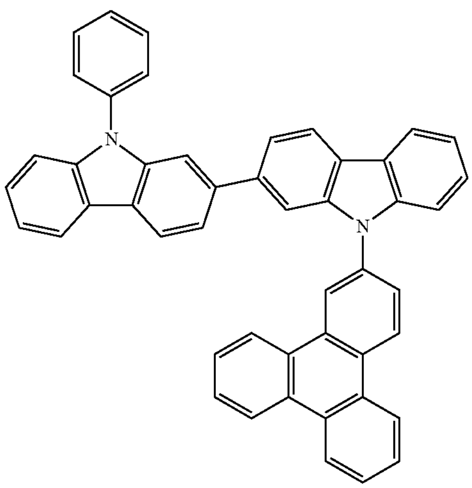
B-28
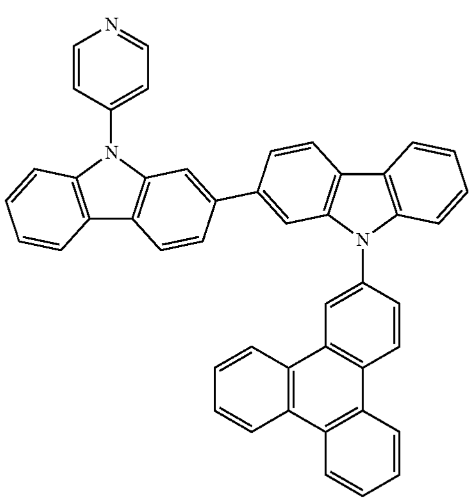
-continued
B-29
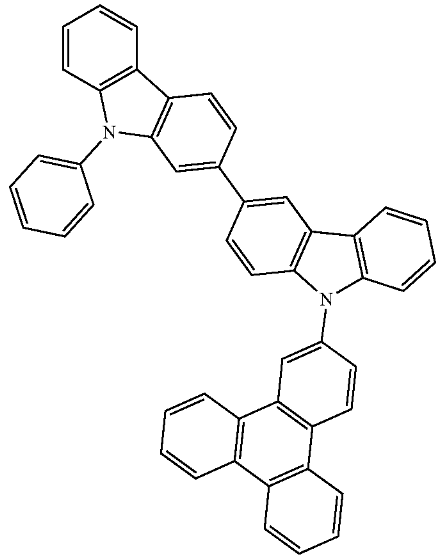
B-30
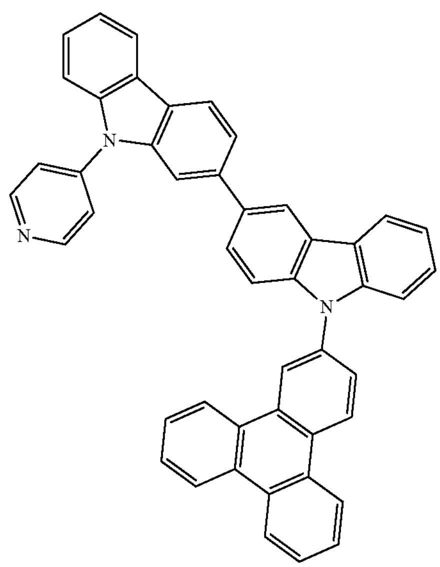

-continued
B-31
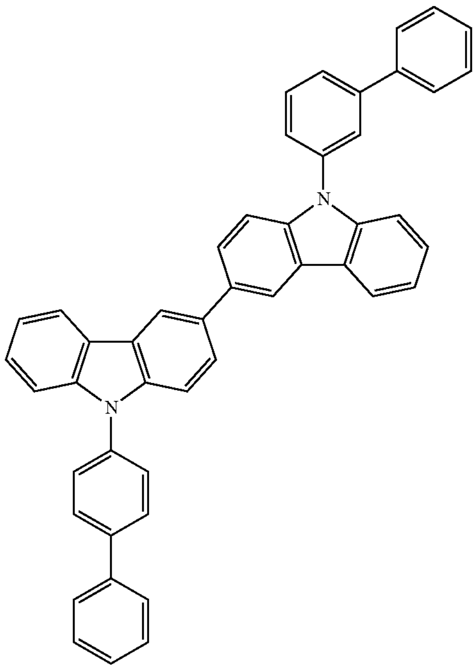
B-32
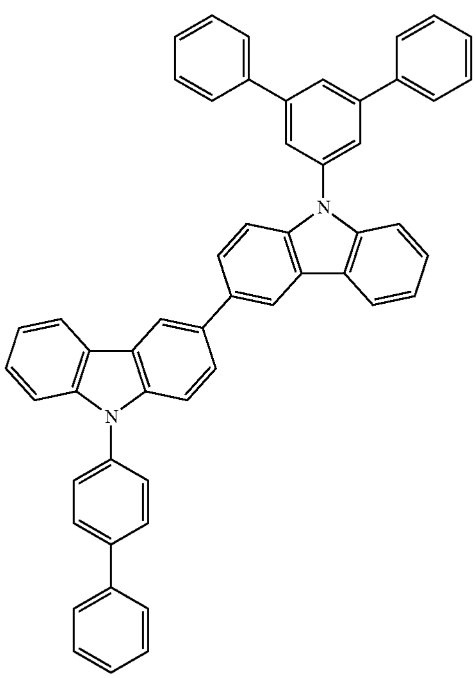
-continued
B-33
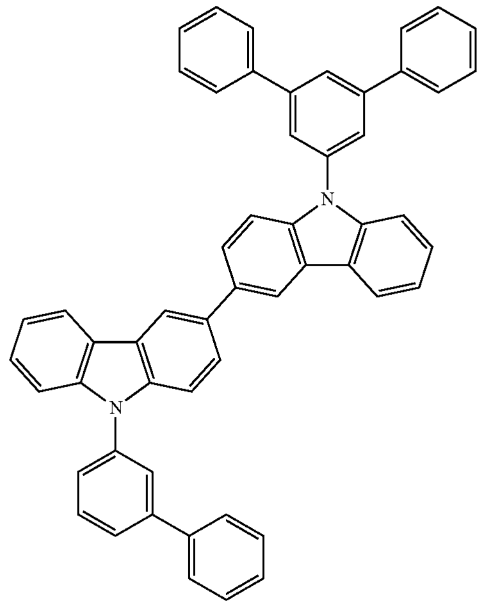
B-34
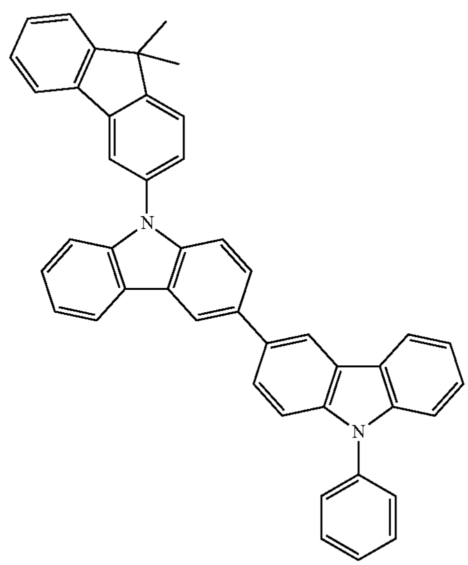

-continued
B-35
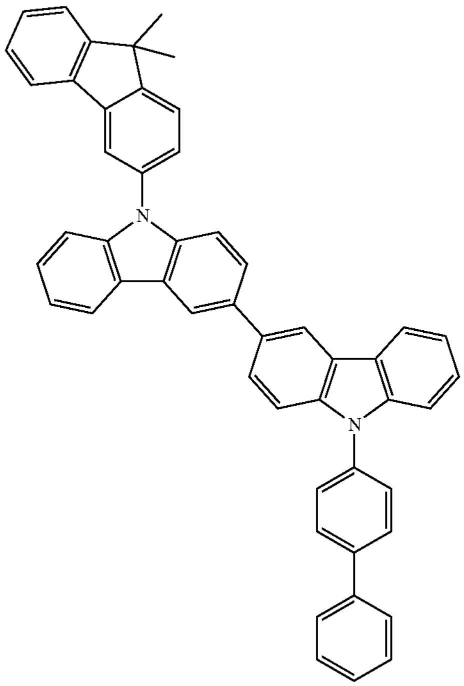
B-36
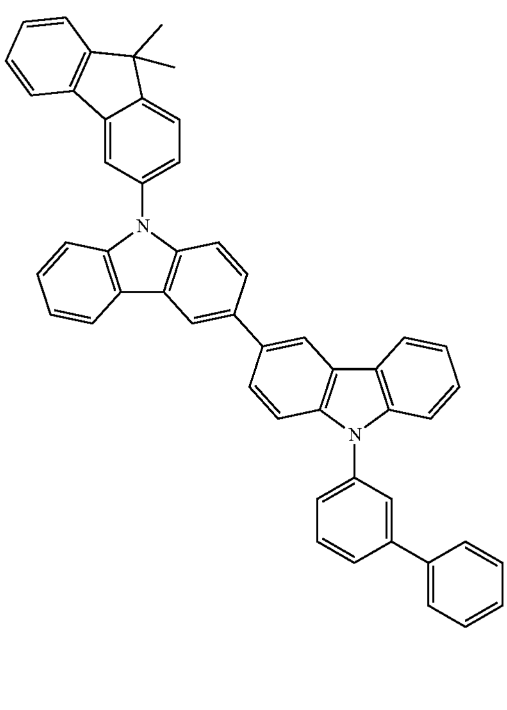
-continued
B-37
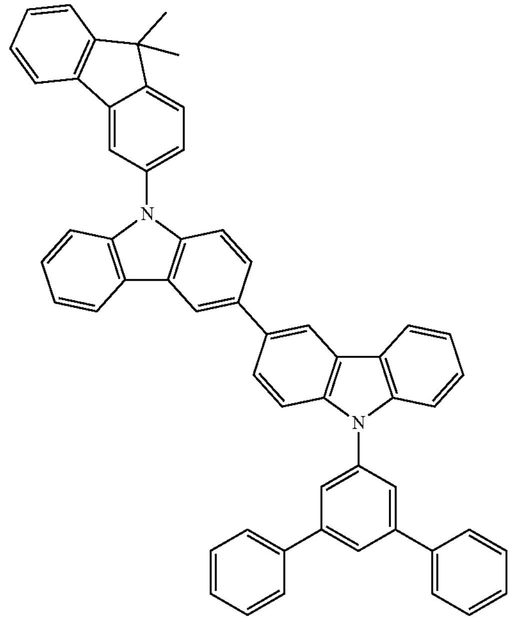
B-38
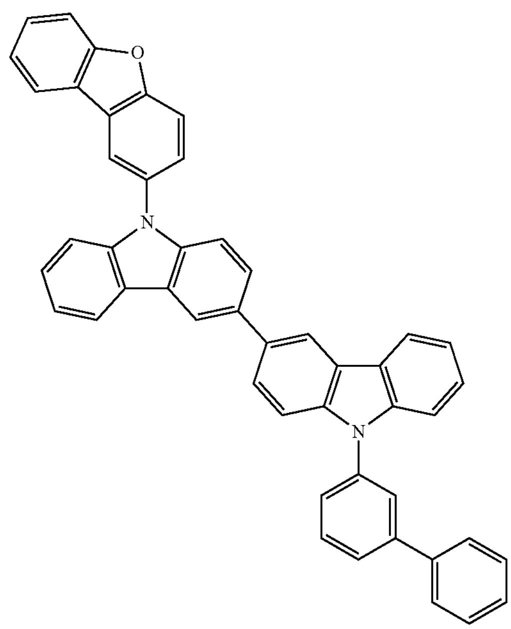

-continued
B-39
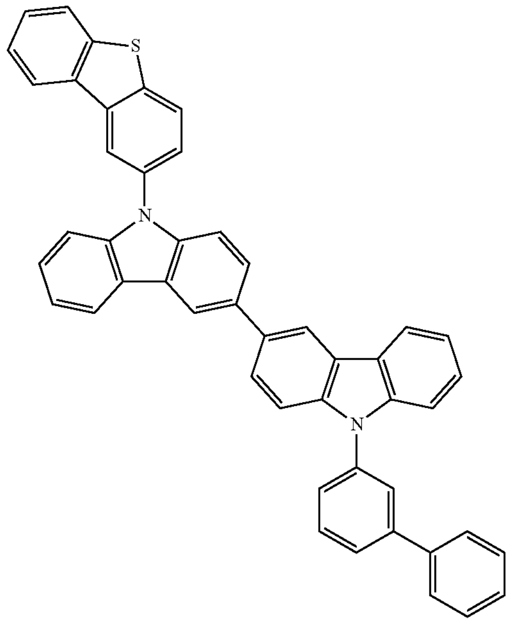
B-40
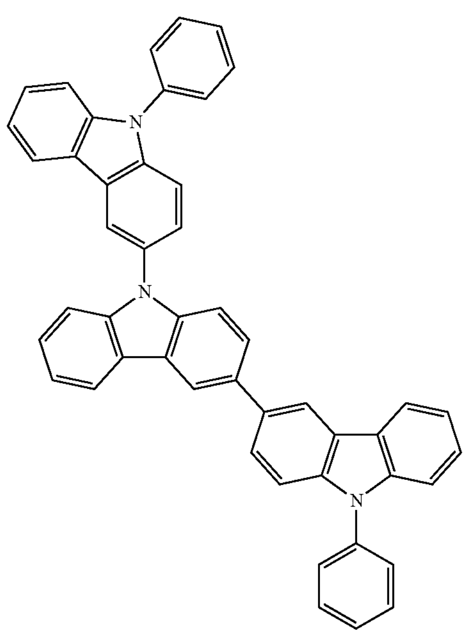
-continued
B-41
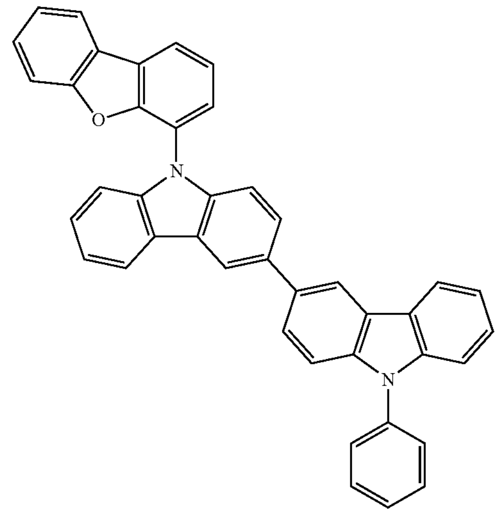
B-42
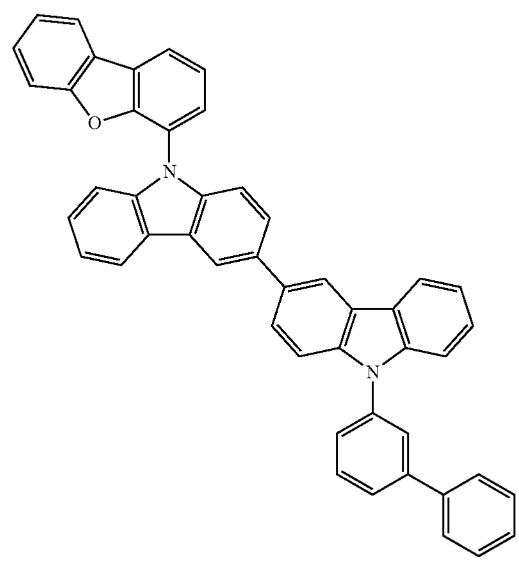

-continued
B-43
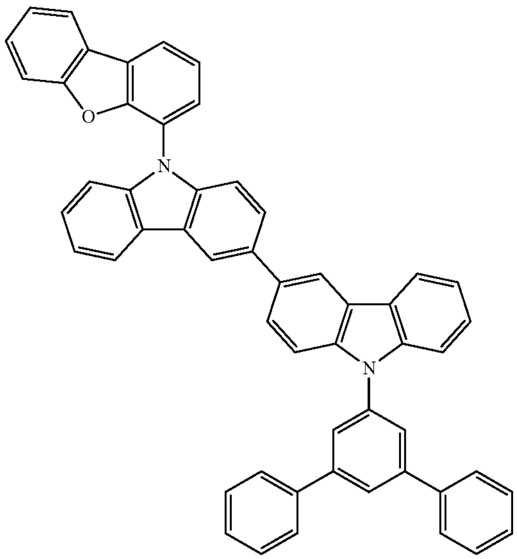
B-44
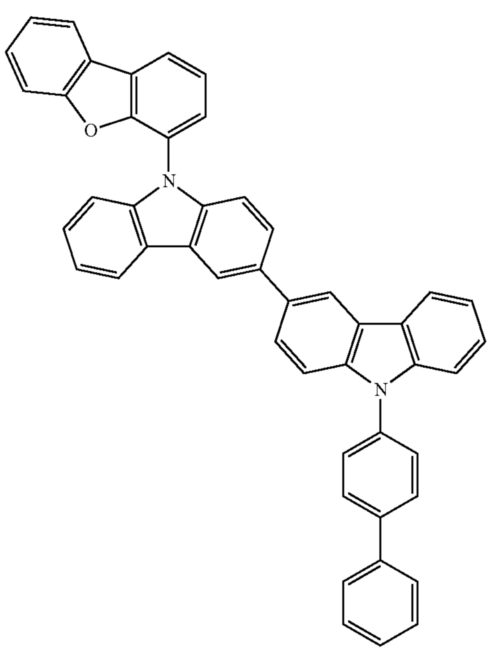
-continued
B-45
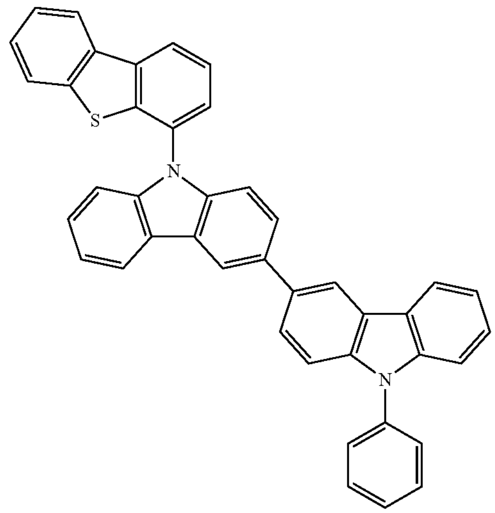
B-46
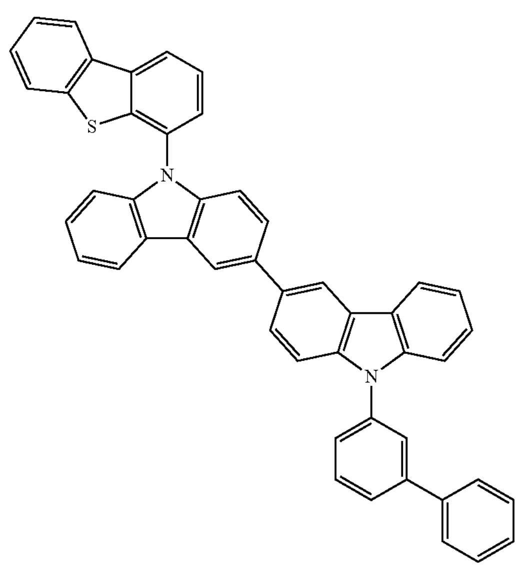

-continued
B-47
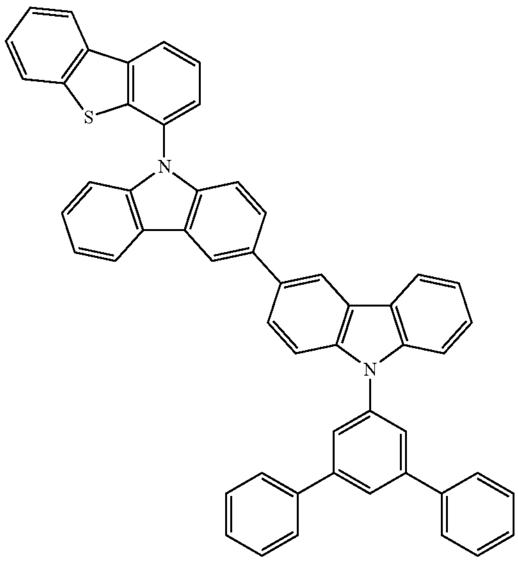
B-48
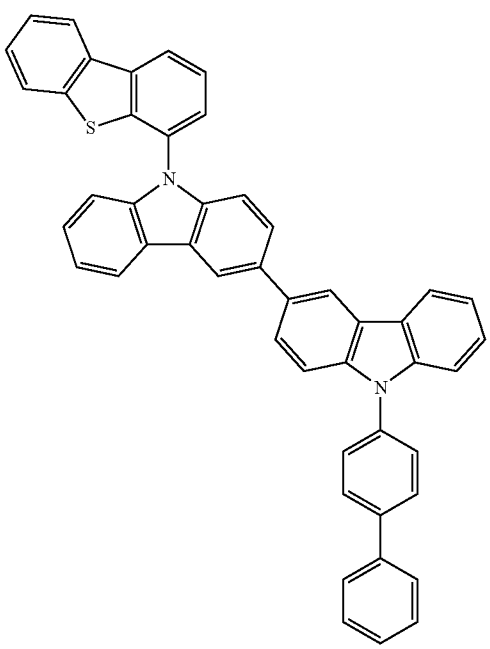
-continued
B-49
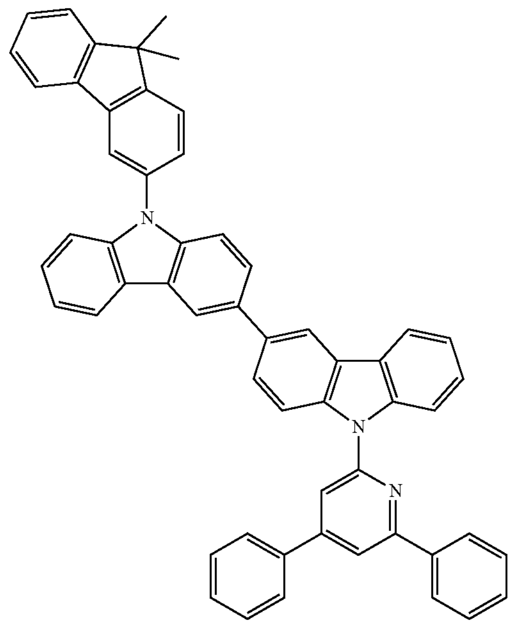
B-50
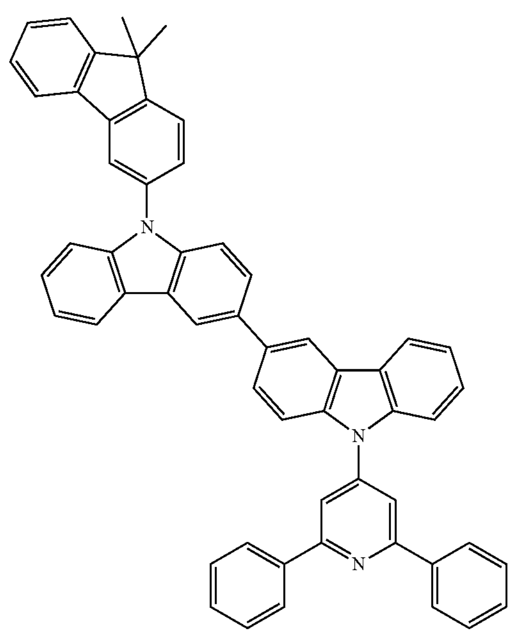

-continued
B-51
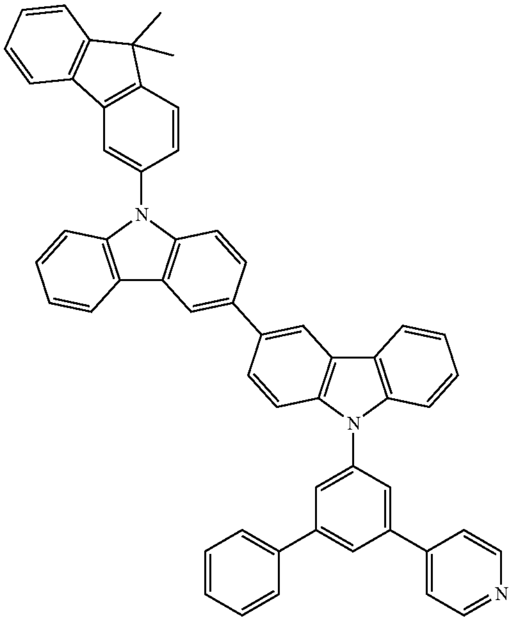
-continued
B-53
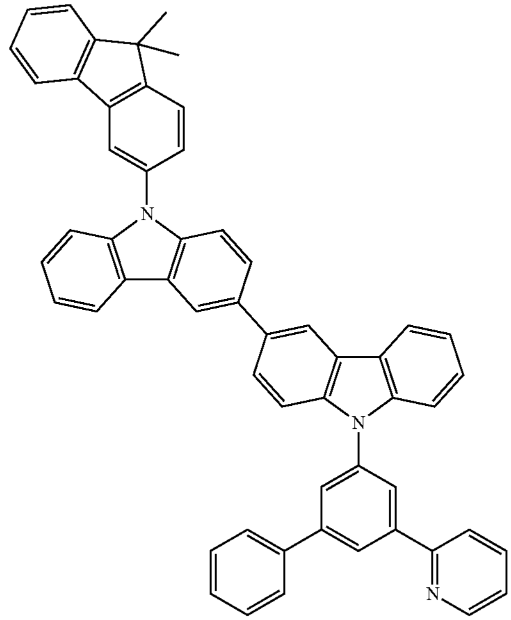
B-52
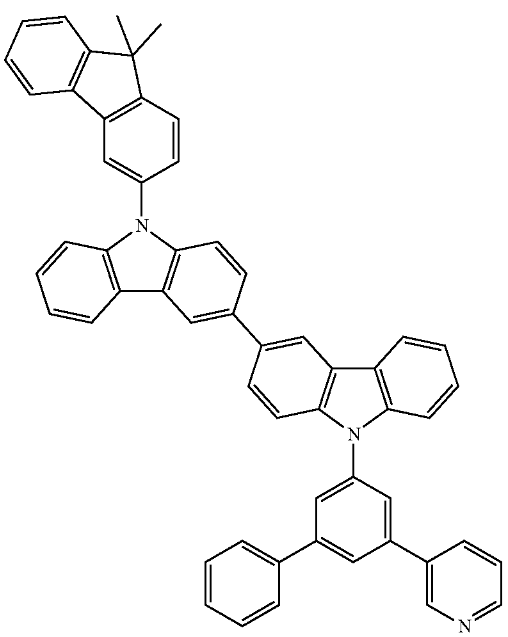
B-54
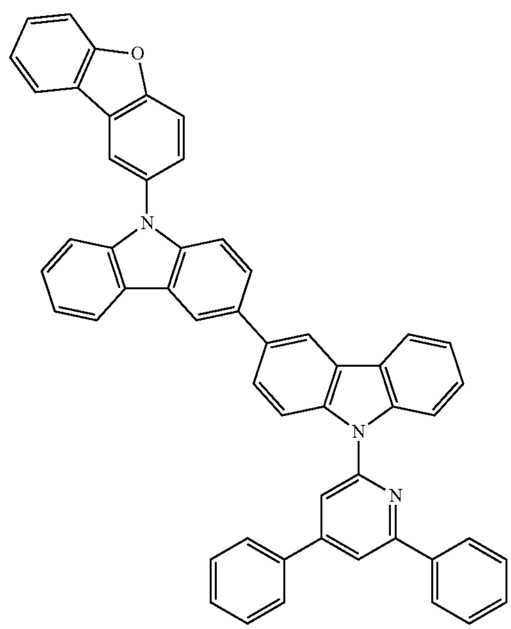

-continued
B-55
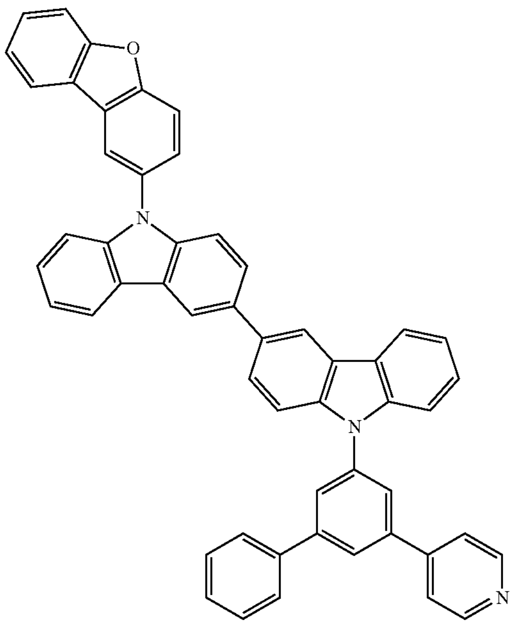
B-56
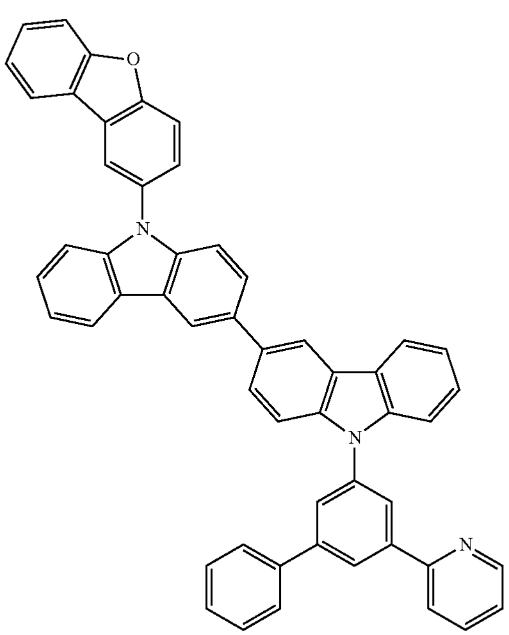
-continued
B-57
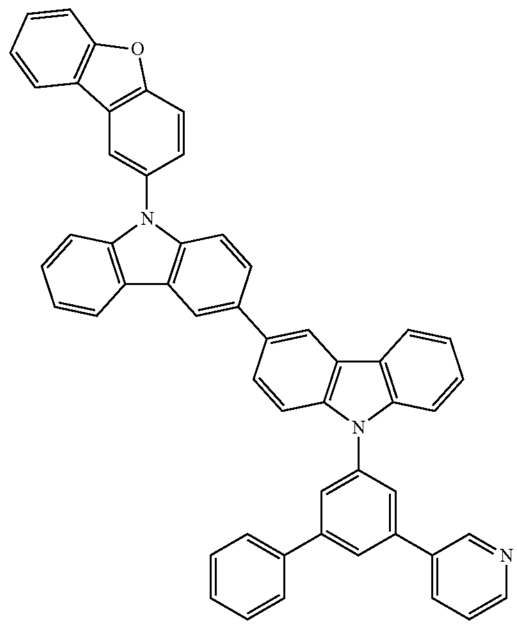
B-58
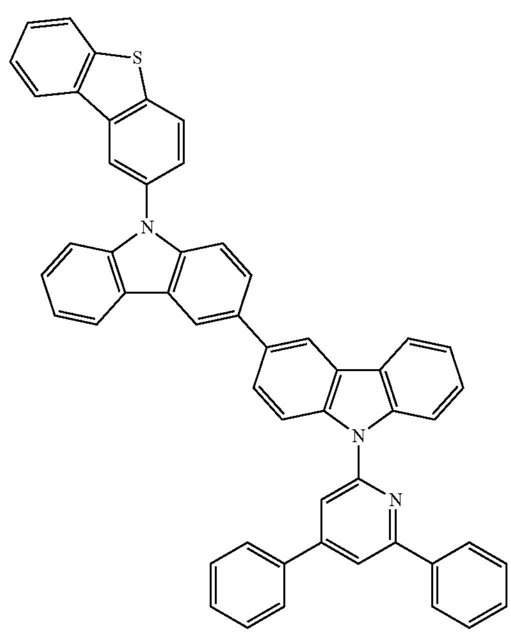

-continued
B-59
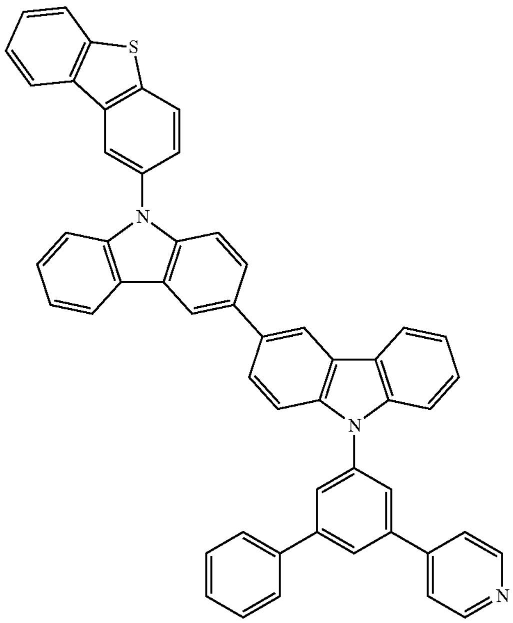
B-60
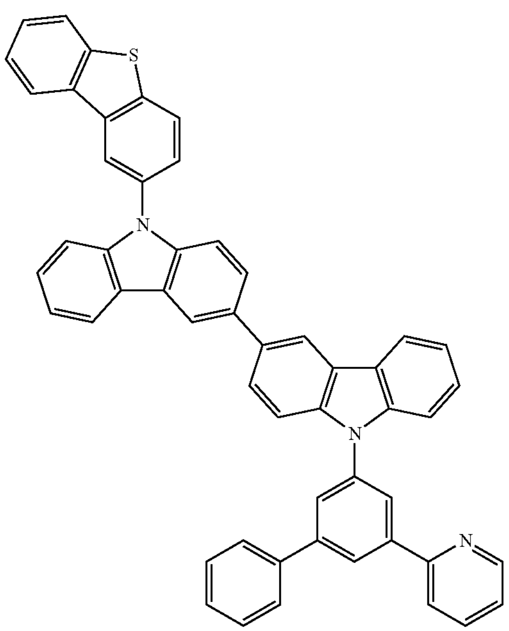
-continued
B-61
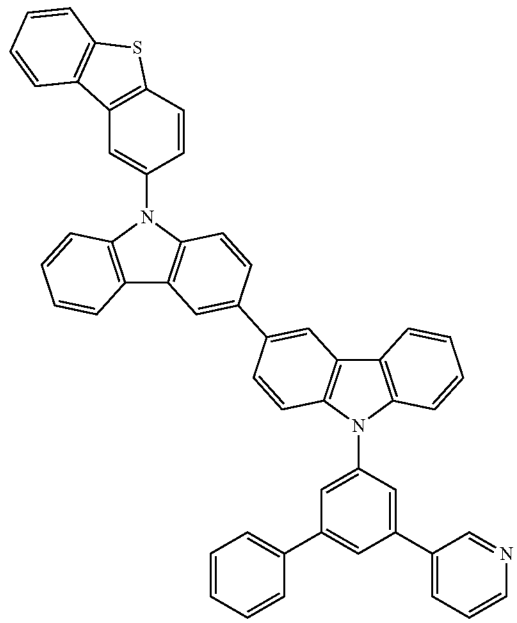
B-62
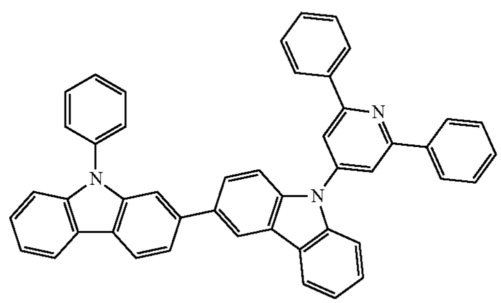
B-63
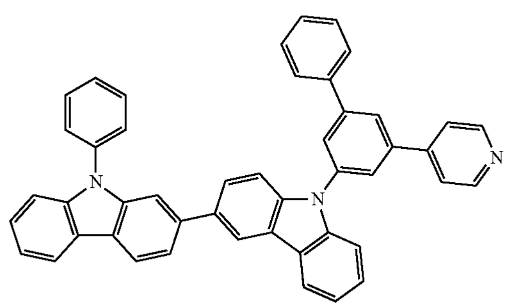
B-64
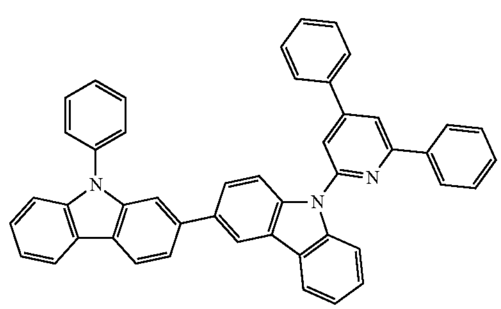

-continued
B-65
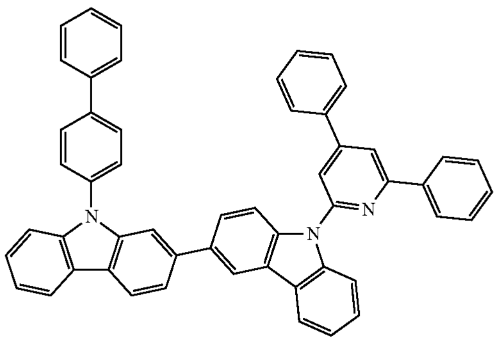
B-66
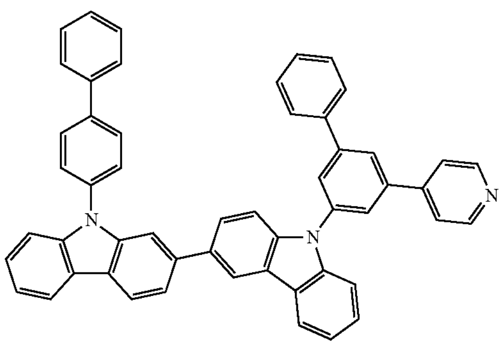
B-67
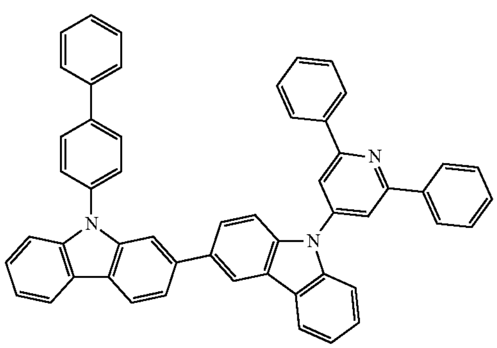
B-68
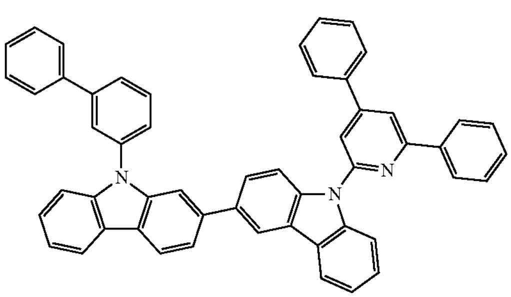
-continued
B-69
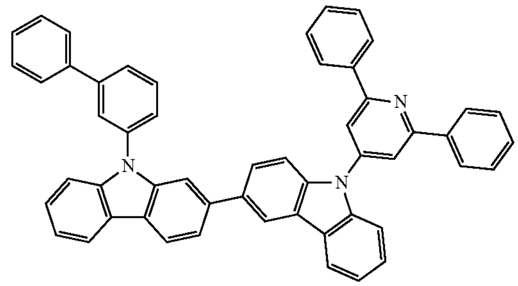
B-70
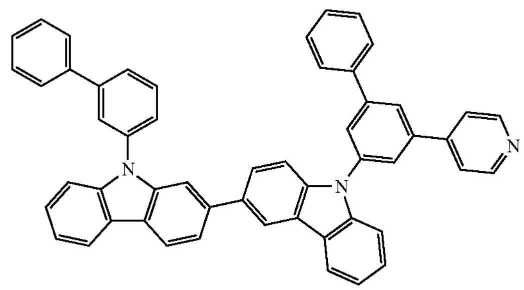
B-71
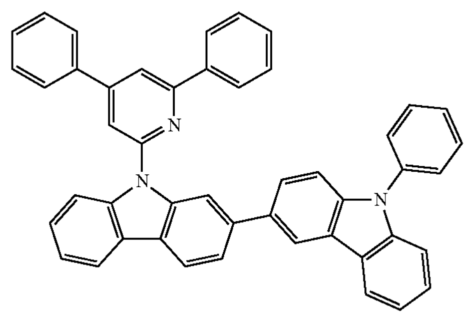
B-72
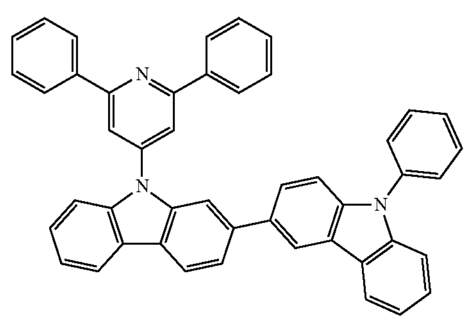
B-73
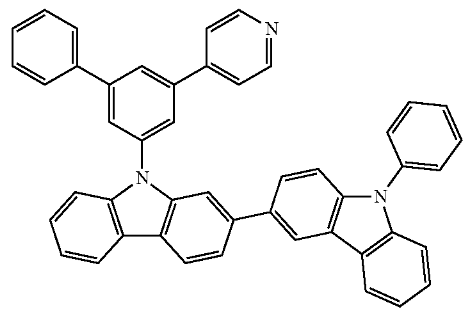

-continued
B-74
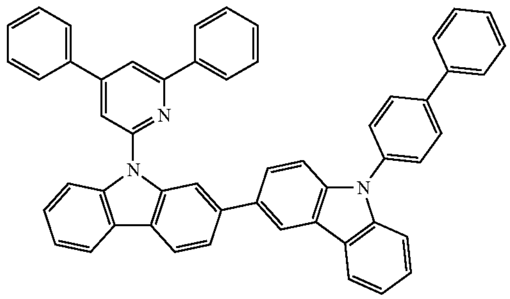
B-75
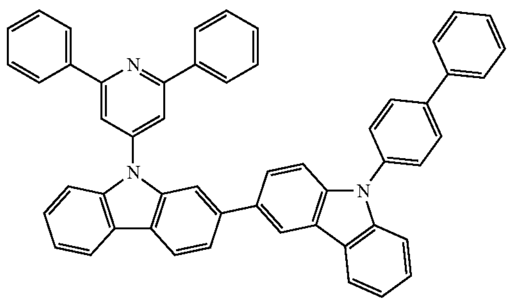
B-76
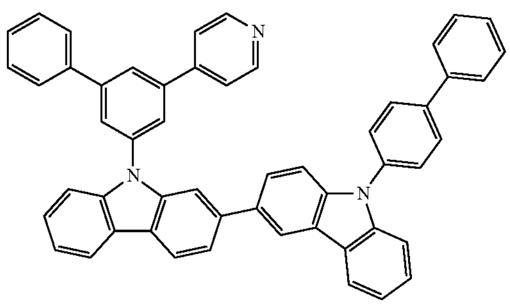
B-77
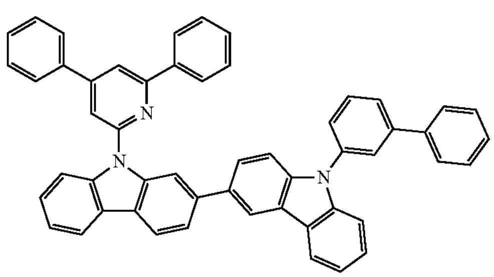
B-78
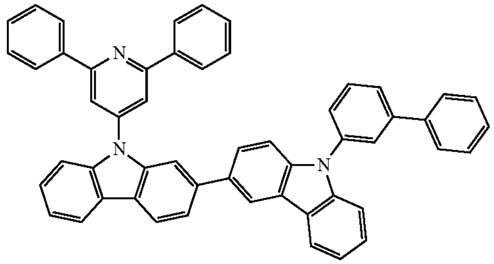
-continued
B-79
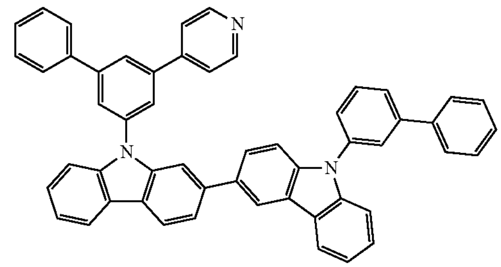
B-80
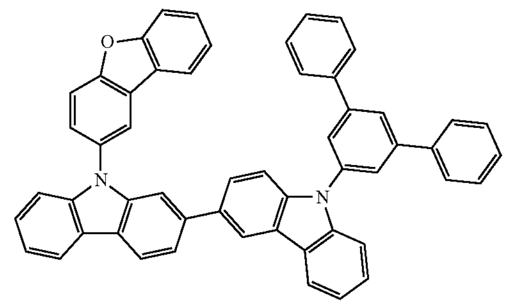
B-81
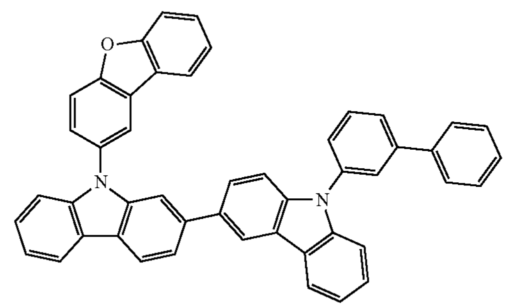
B-82
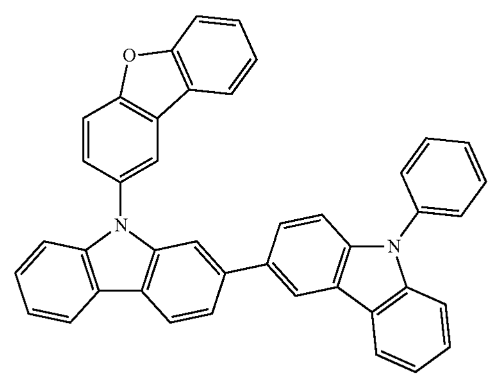

-continued
B-83
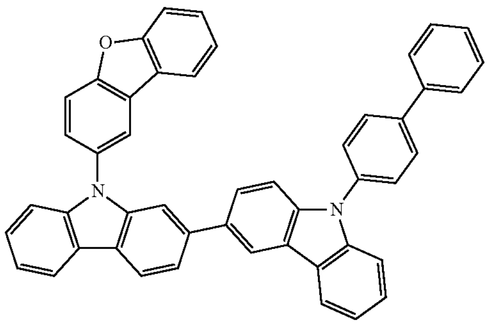
B-84
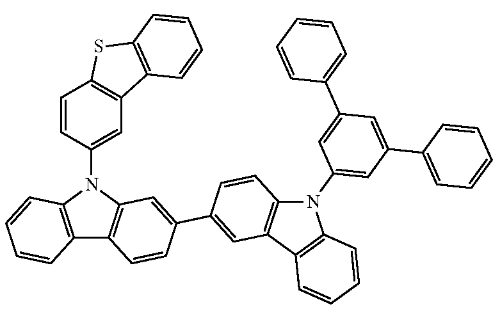
B-85
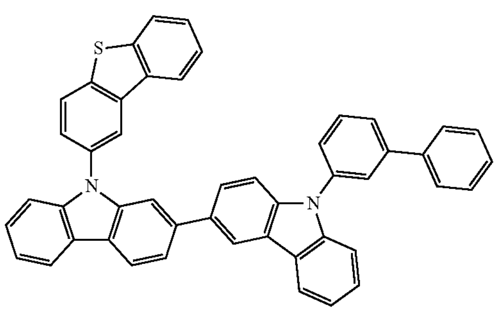
B-86
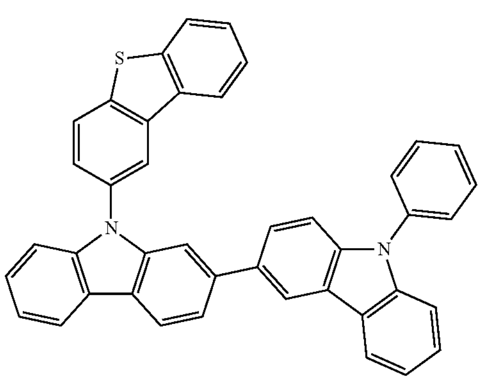
-continued
B-87
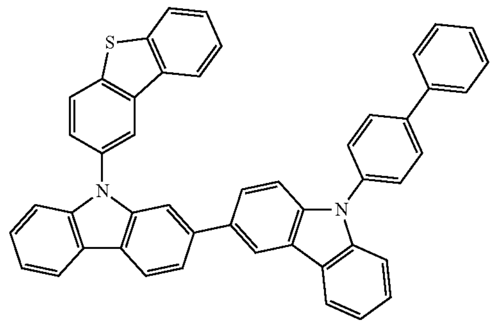
B-88
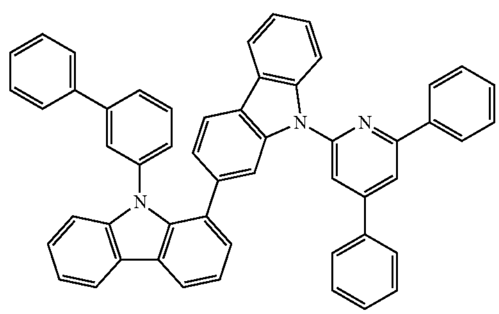
B-89
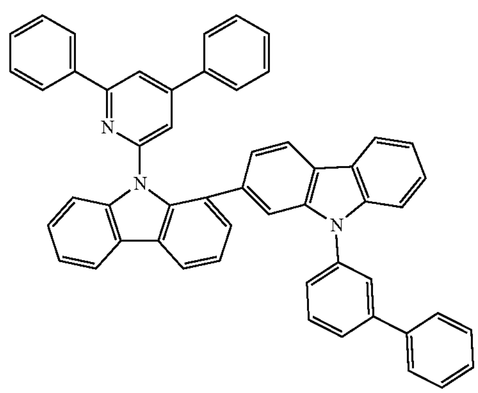
B-90
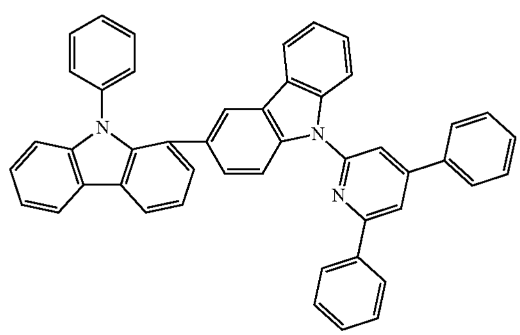

-continued
B-91
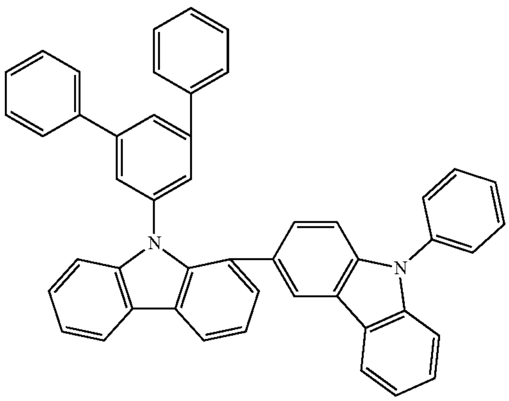
B-92
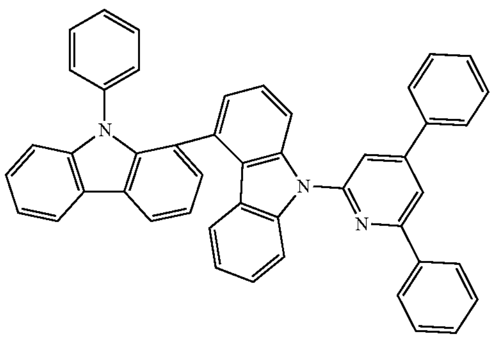
B-93
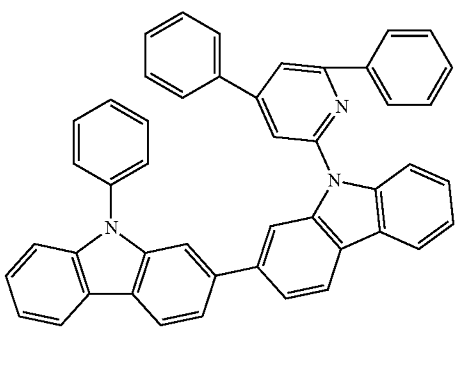
B-94
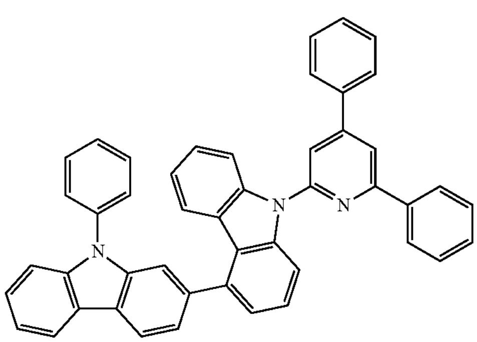
-continued
B-95
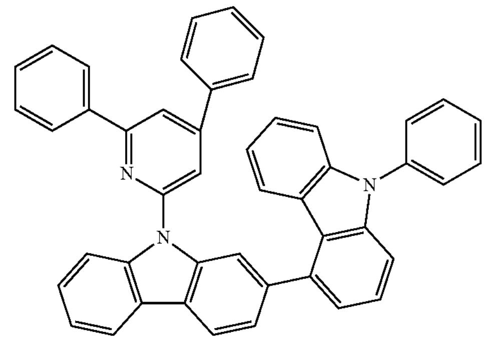
B-96
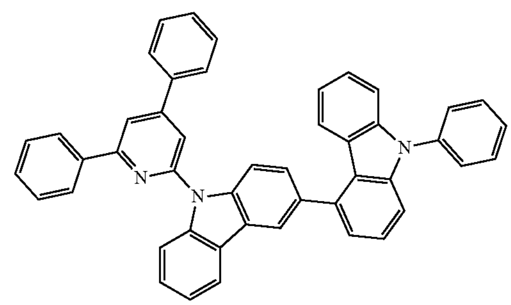
B-97
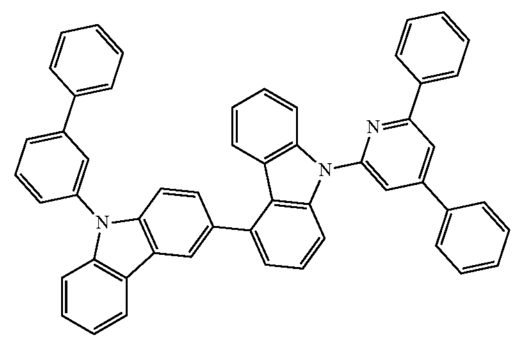
B-98
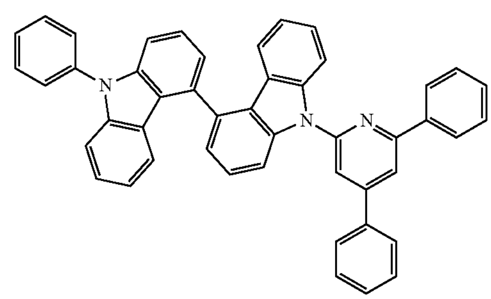

B-99
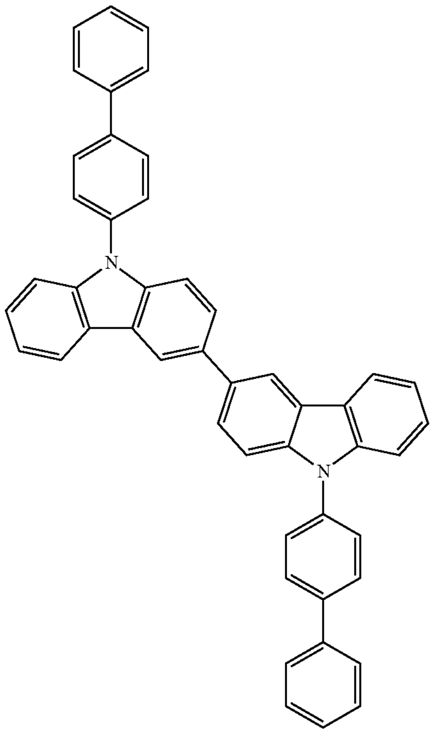
B-100
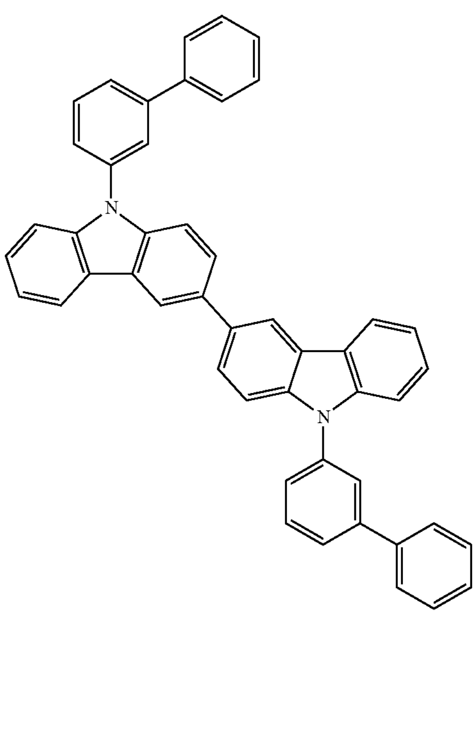
B-101
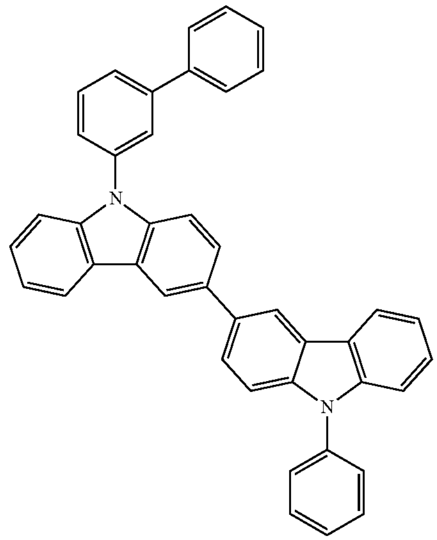
B-102
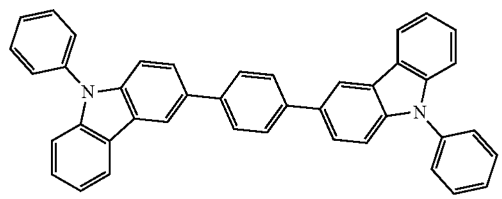
B-103
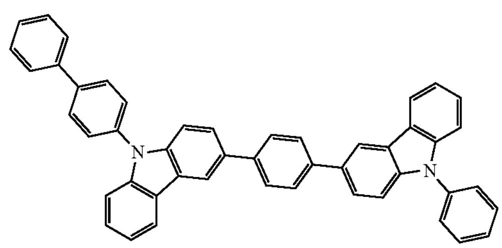
B-104
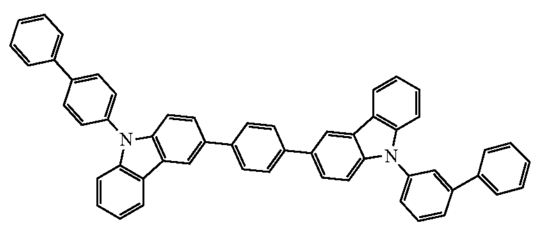
B-105
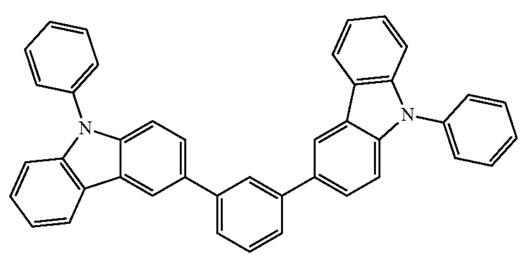

-continued
B-106
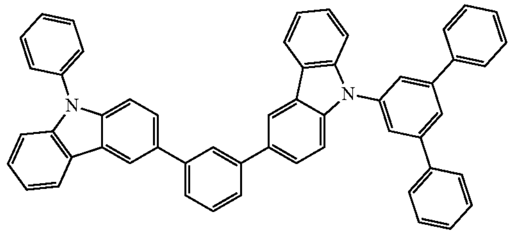
B-107
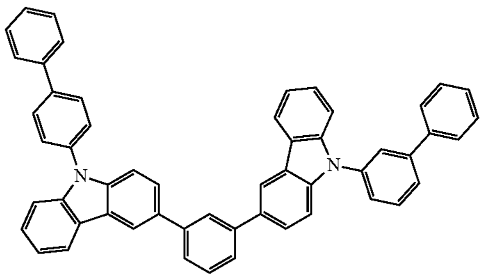
B-108
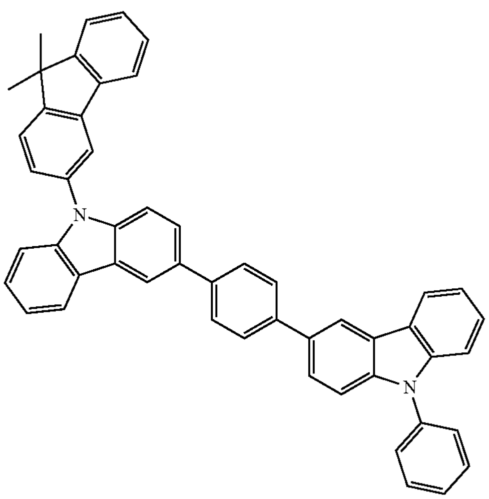
B-109
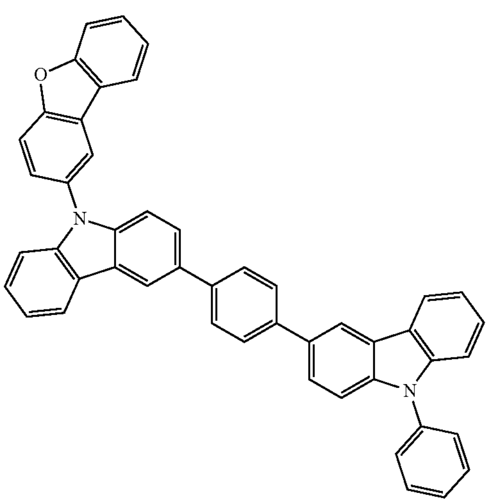
-continued
B-110
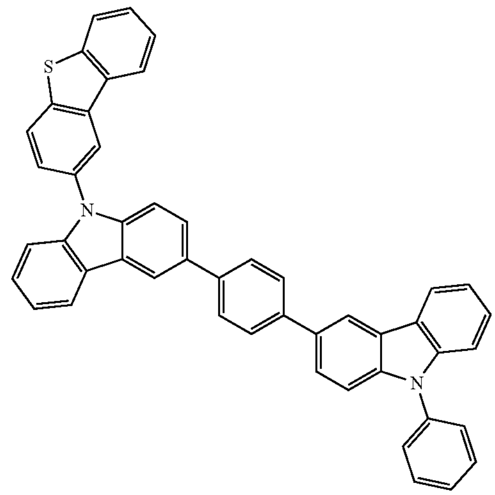
B-111
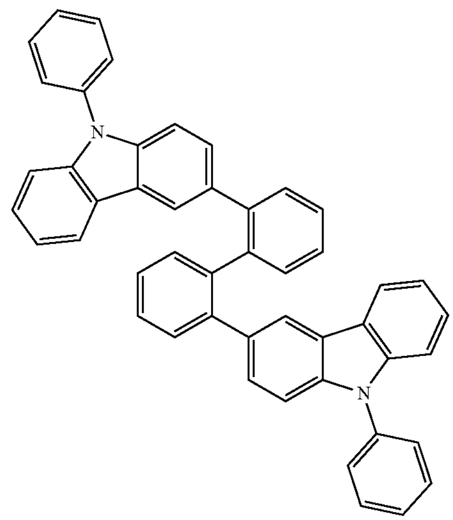
B-112
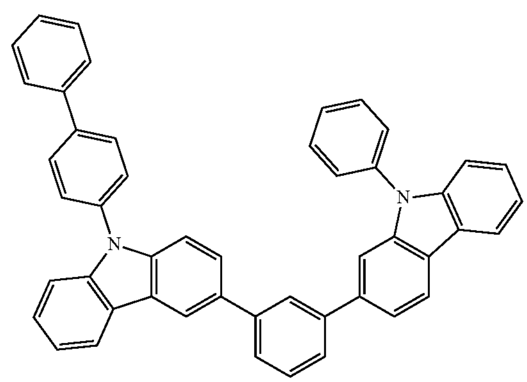

-continued
B-113
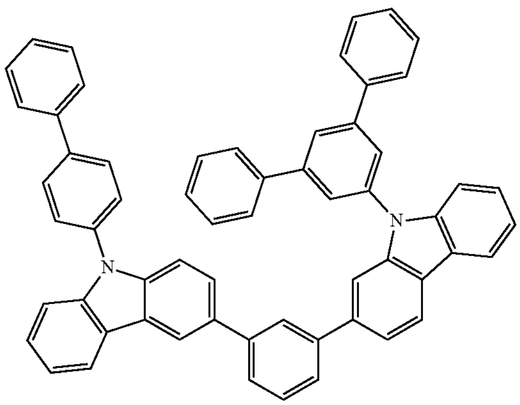
B-114
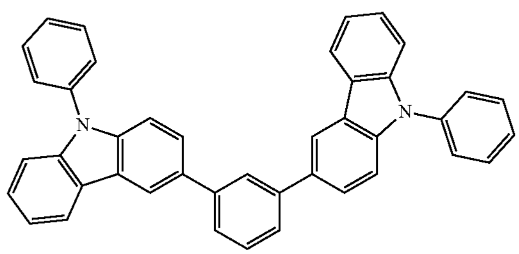
B-115
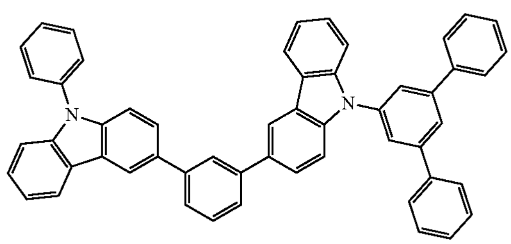
B-116
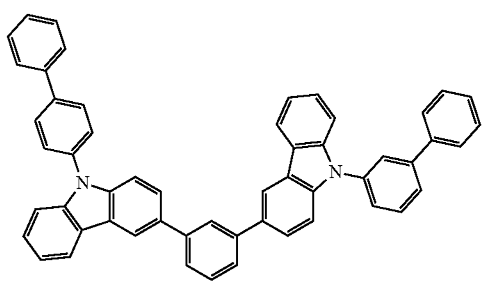
-continued
B-117
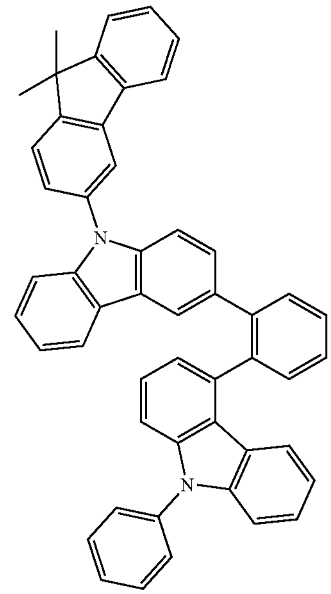
B-118
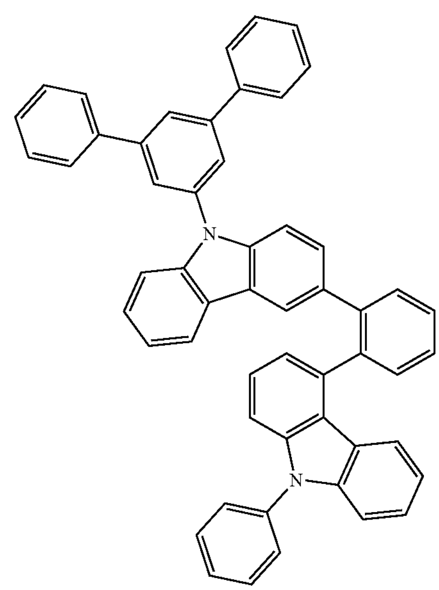

-continued
B-119
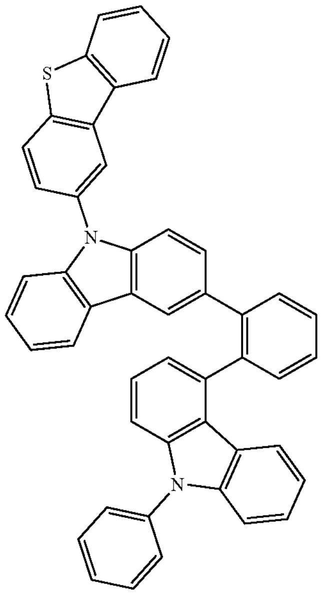
B-120
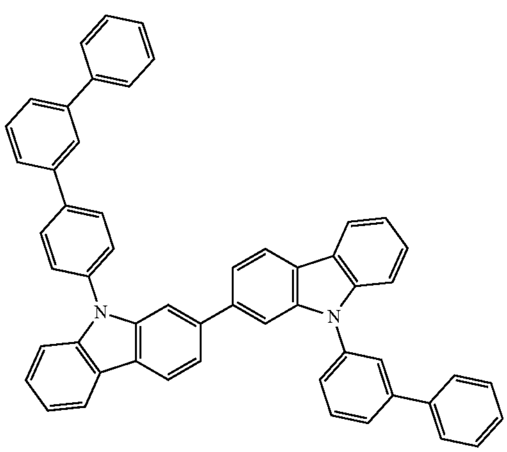
B-121
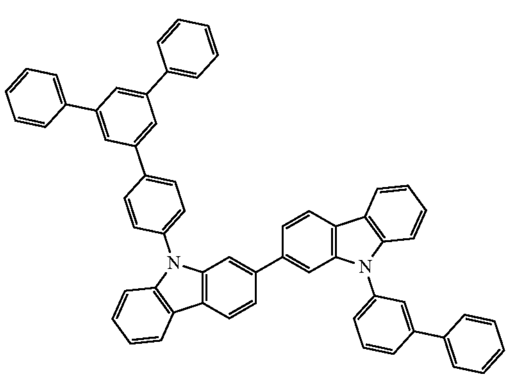
-continued
B-122
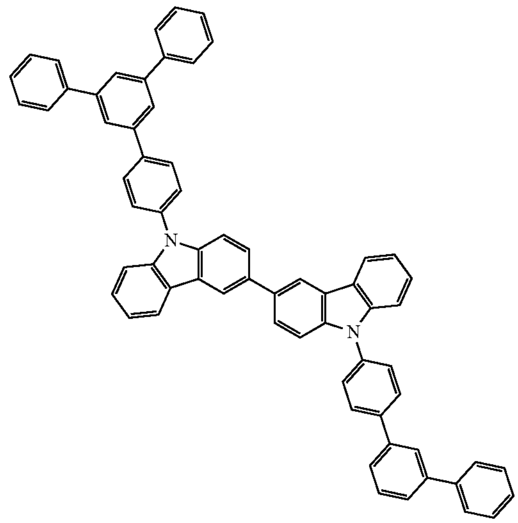
B-123
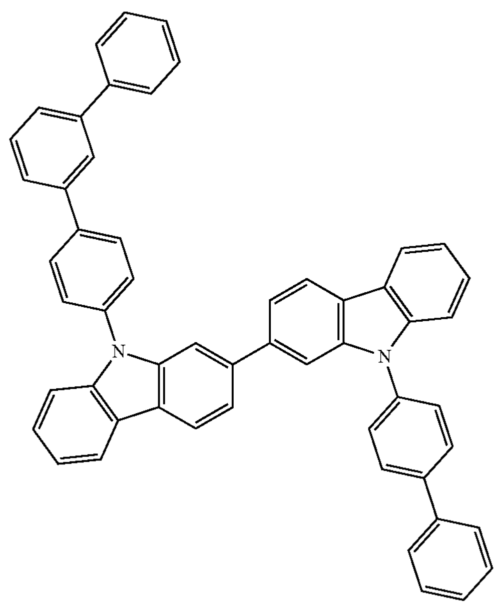
B-124
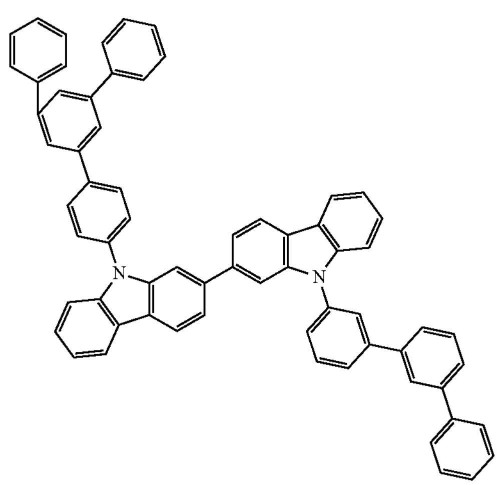

-continued
B-125
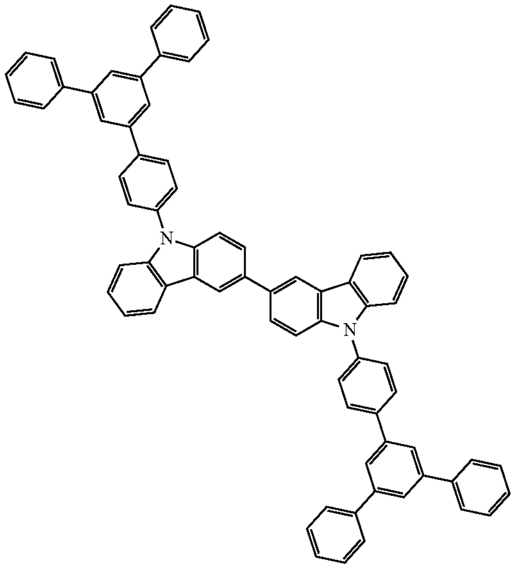
B-126
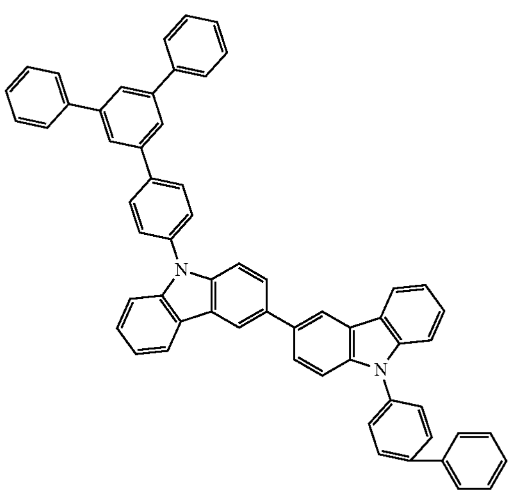
-continued
B-127
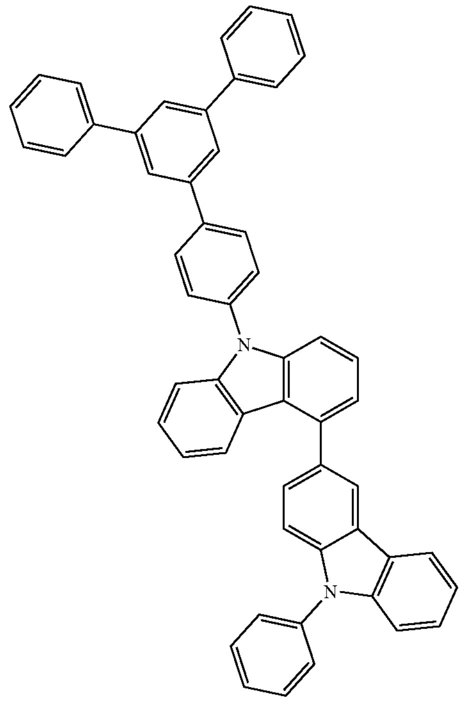
B-128
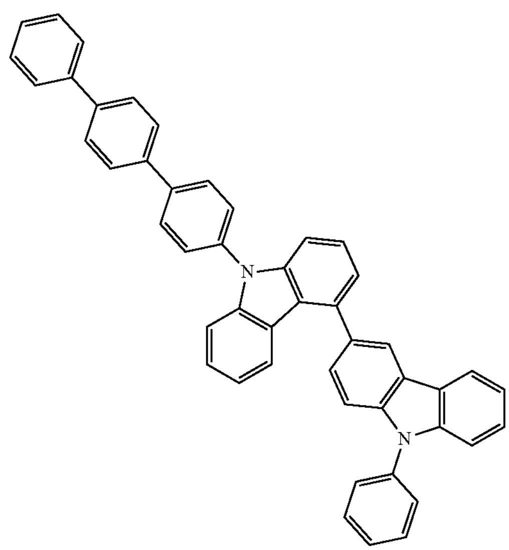

-continued
B-129
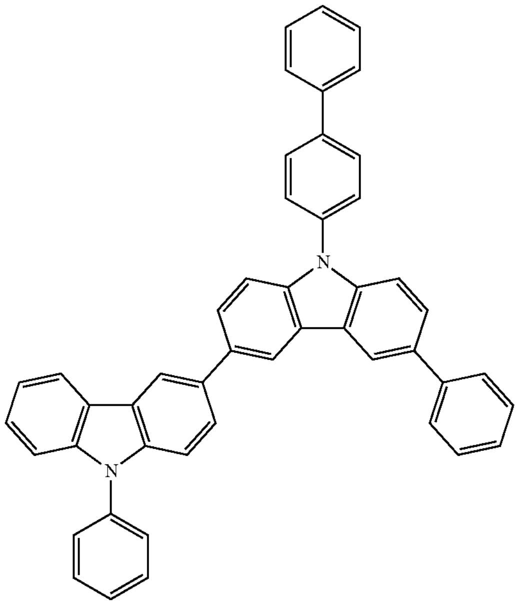
B-130
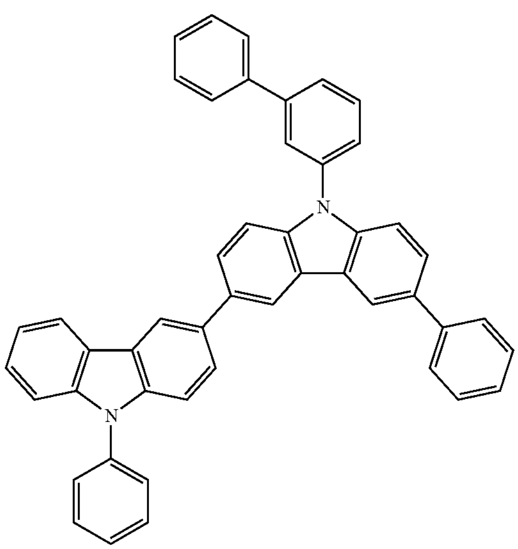
-continued
B-131
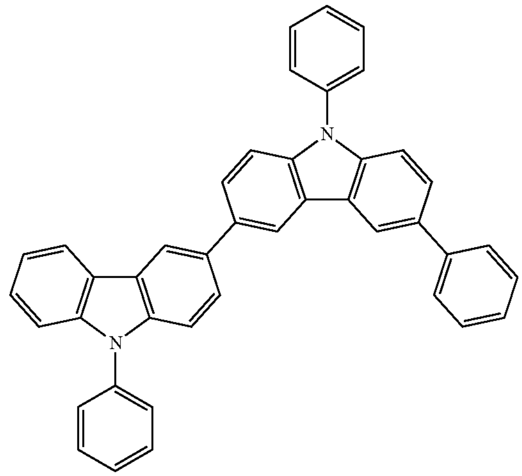
B-132
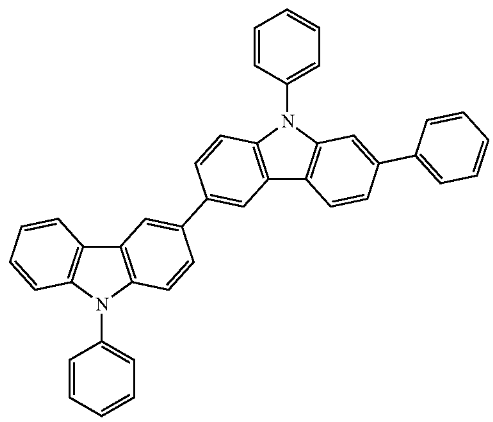
B-133
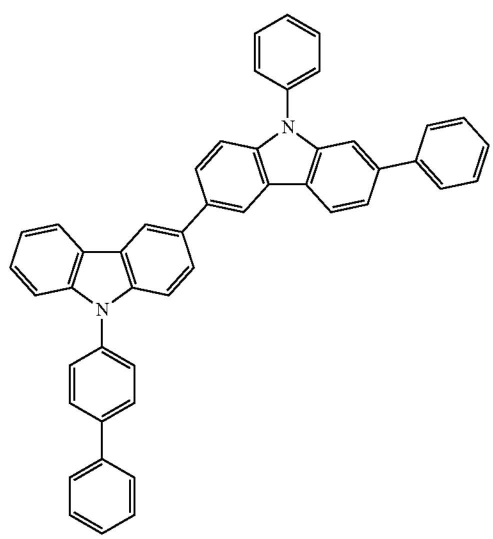

-continued
B-134
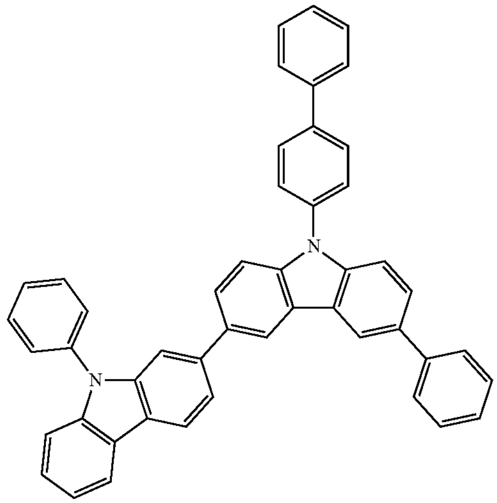
B-135
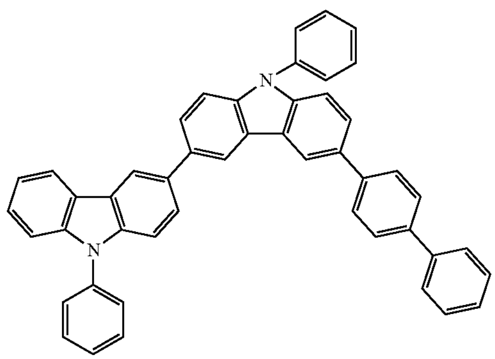
B-136
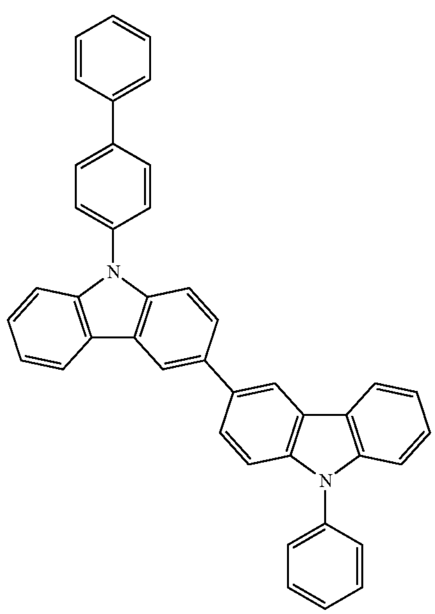
-continued
B-137
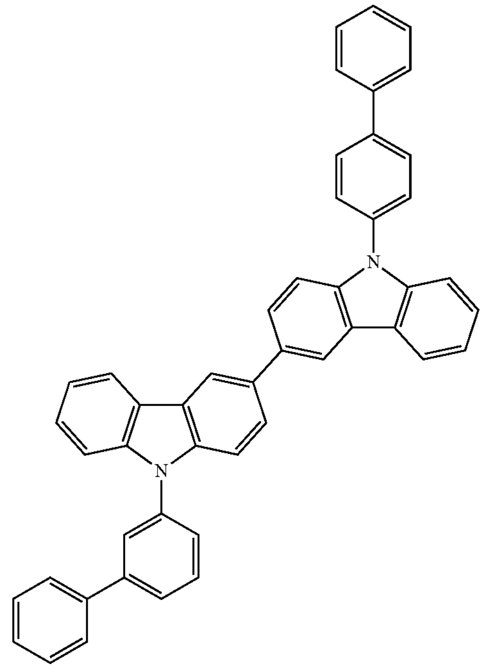
B-138
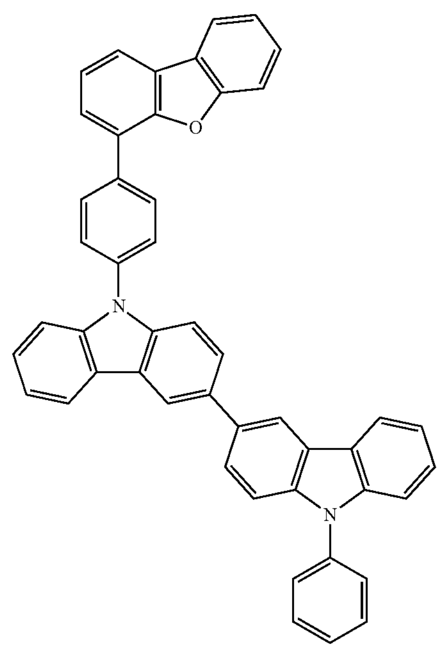

-continued

B-139

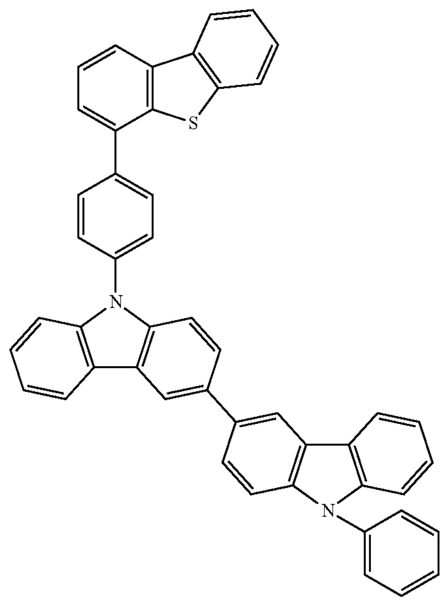

In an embodiment of the present invention, the second compound for the organic photoelectronic element including the combination of the moiety represented by Chemical Formula 3 and the moiety represented by Chemical Formula 4 may be represented by at least one of Chemical Formulae 3-I to 3-V.

[Chemical Formula 3-I]

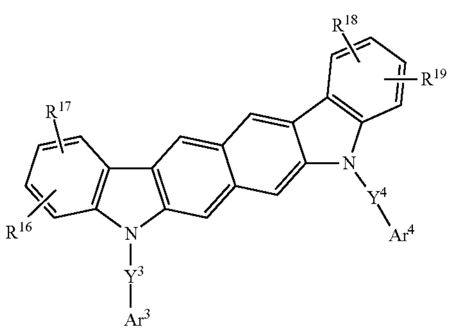

[Chemical Formula 3-II]

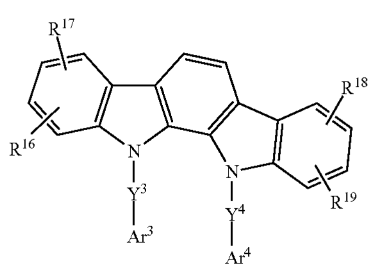

-continued

[Chemical Formula 3-III]

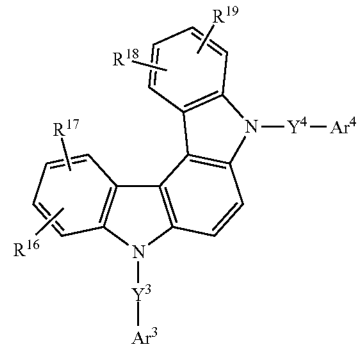

[Chemical Formula 3-IV]

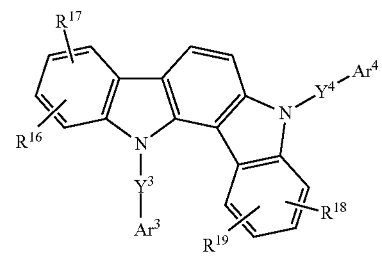

[Chemical Formula 3-V]

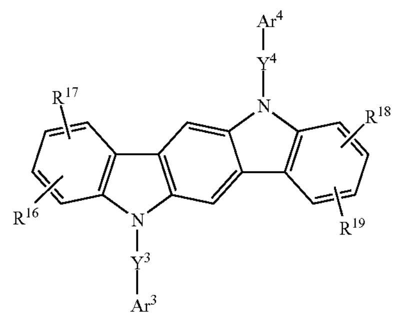

In Chemical Formulae 3-I to 3-V, Y3, Y4, Ar3, Ar4, and R16 to R19 are the same as described above.

In an embodiment of the present invention, Y3 and Y4 of Chemical Formulae 3-I to 3-V may be a single bond, a phenylene group, a biphenylene group, a pyridylene group, or a pyrimidinylene group.

In an embodiment of the present invention, Ar3 and Ar4 of Chemical Formulae 3-I to 3-V may be a substituted or unsubstituted phenyl group, a substituted or unsubstituted biphenyl group, a substituted or unsubstituted pyridyl group, a substituted or unsubstituted pyrimidinyl group, or a substituted or unsubstituted triazinyl group.

In an embodiment of the present invention, R16 to R19 of Chemical Formulae 3-I to 3-V may be hydrogen.

An embodiment of the present invention may be a composition for an organic light emitting diode including [Chemical Formula 1A] and [Chemical Formula 3-III].

An embodiment of the present invention provides an organic light emitting diode including [Chemical Formula 1A] and [Chemical Formula 3-III] as a red host and a red phosphorescent dopant.

The second compound for the organic photoelectronic element including the moiety represented by Chemical Formula 3 and the moiety represented by Chemical Formula 4 may be, for example, compounds of Group 3, but is not limited thereto.

[Group 3]
[E-1]
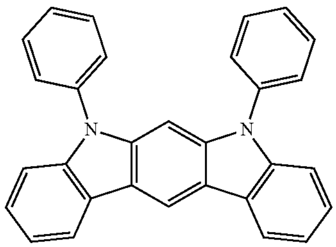
[E-2]
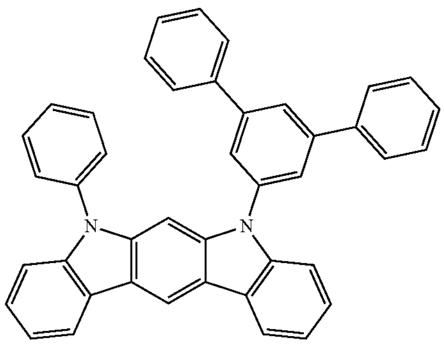
[E-3]
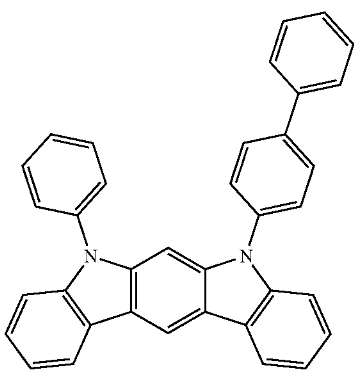
[E-4]
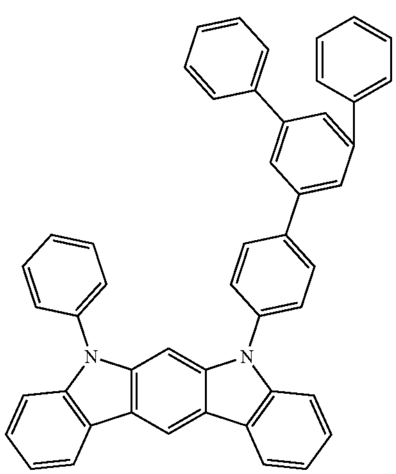
-continued
[E-5]
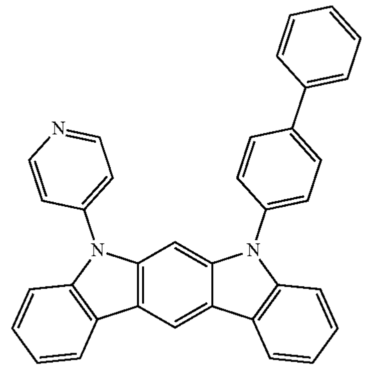
[E-6]
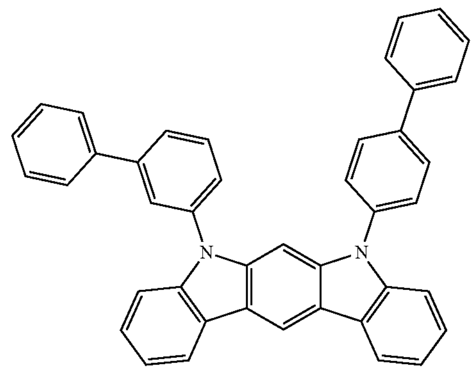
[E-7]
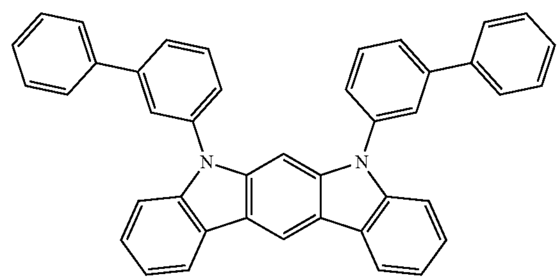
[E-8]
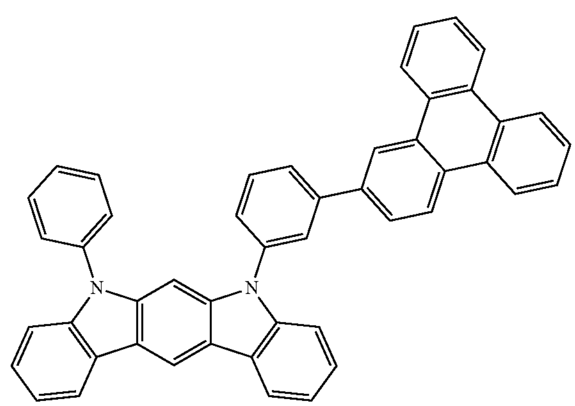

-continued
[E-9]
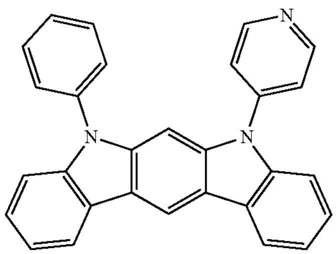
[E-10]
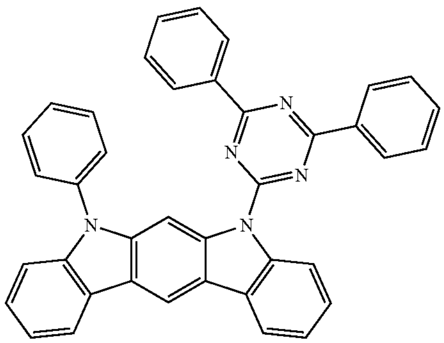
[E-11]
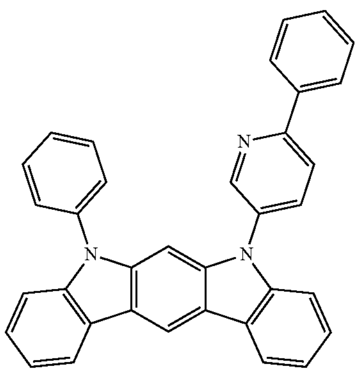
[E-12]
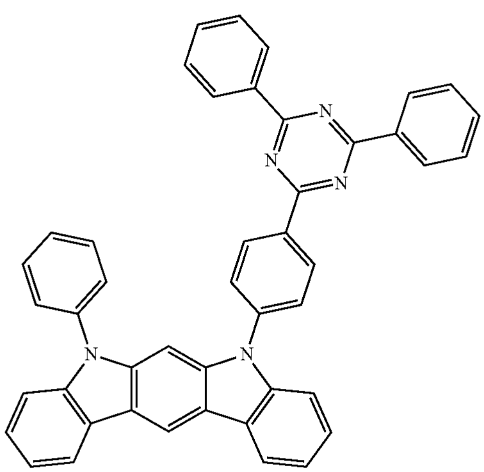
-continued
[E-13]
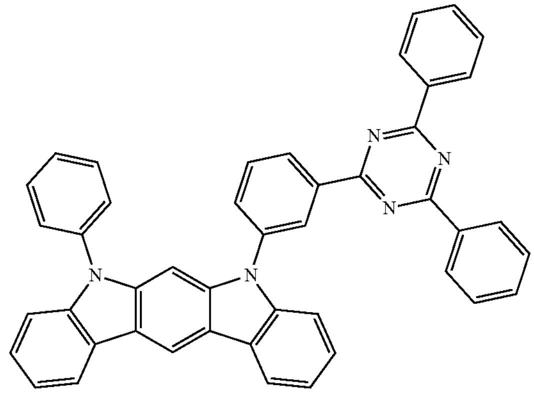
[E-14]
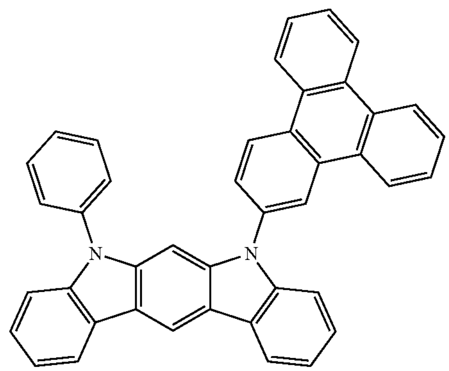
[E-15]
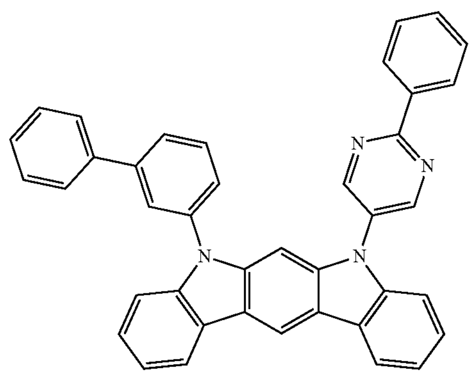
[E-16]
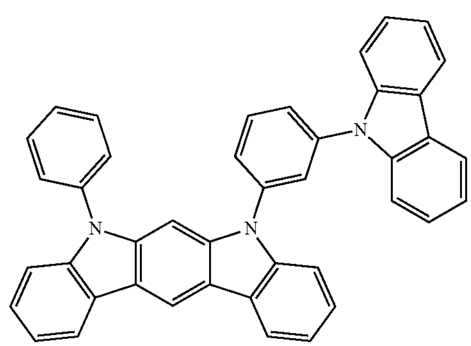

-continued
[E-17]
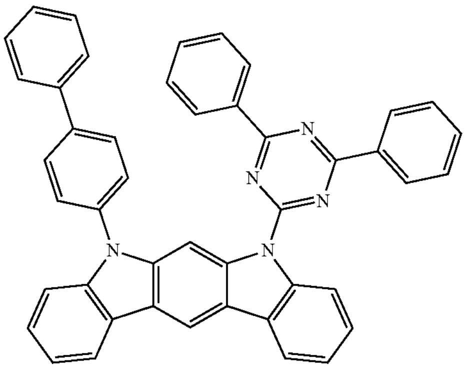
[E-18]
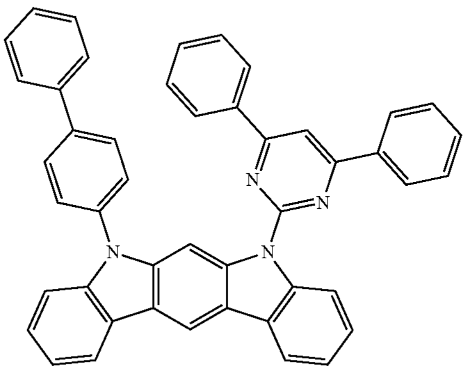
[E-19]
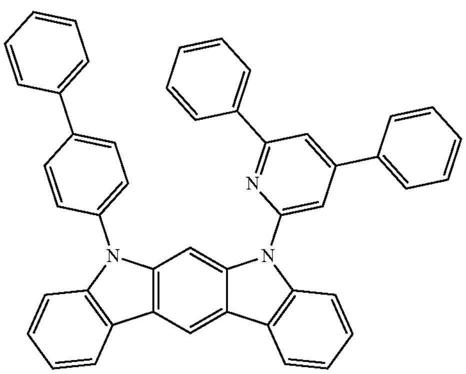
[E-20]
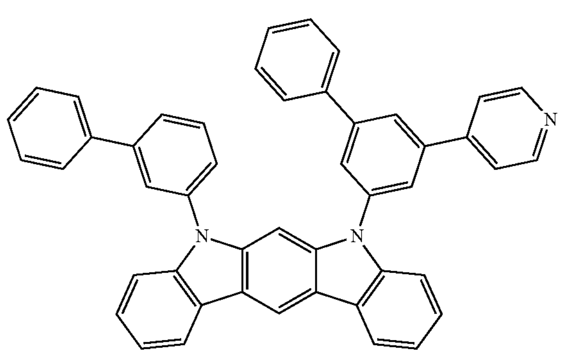
-continued
[E-21]
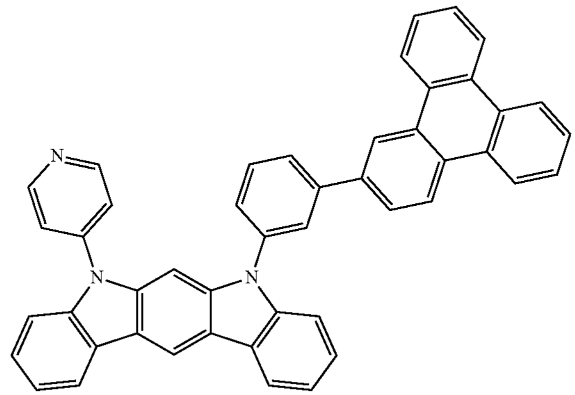
[E-22]
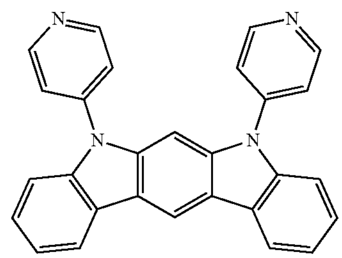
[E-23]
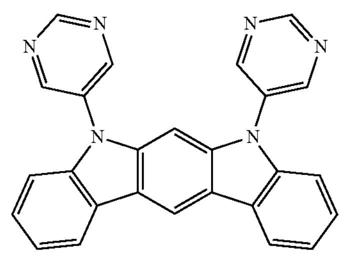
[E-24]
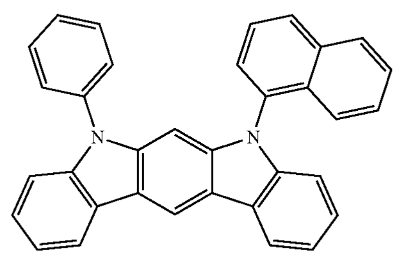
[E-25]
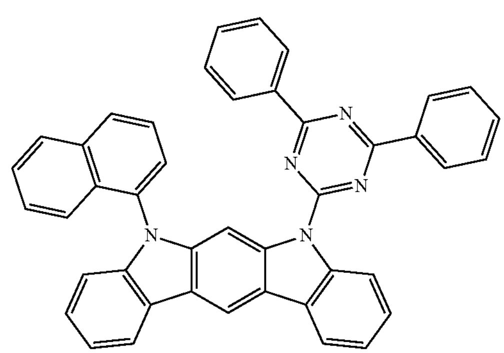

-continued
[E-26]
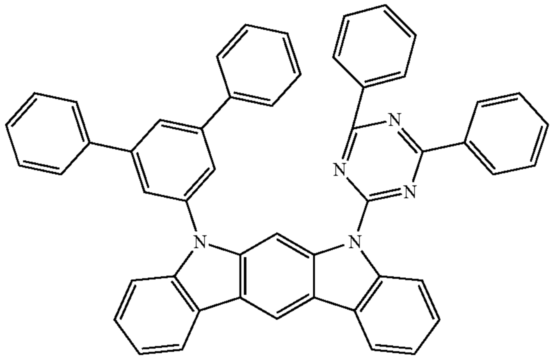
[E-27]
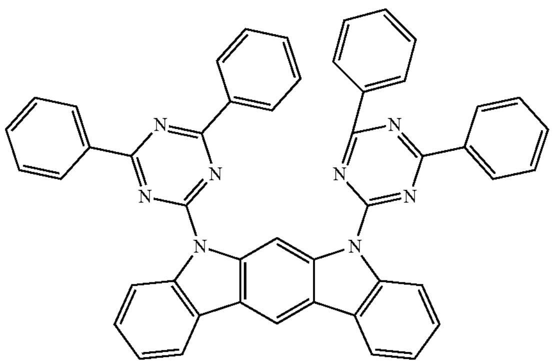
[E-28]
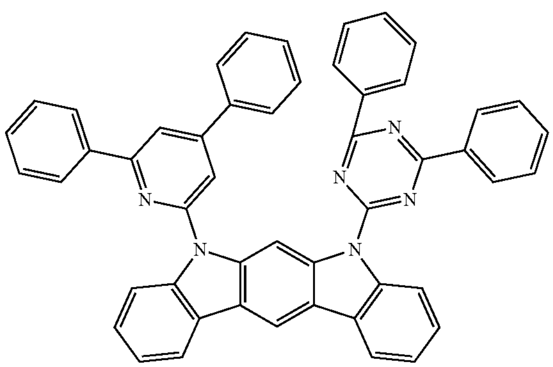
[E-29]
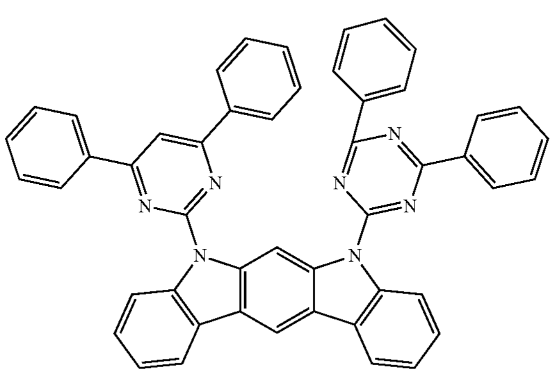
-continued
[E-30]
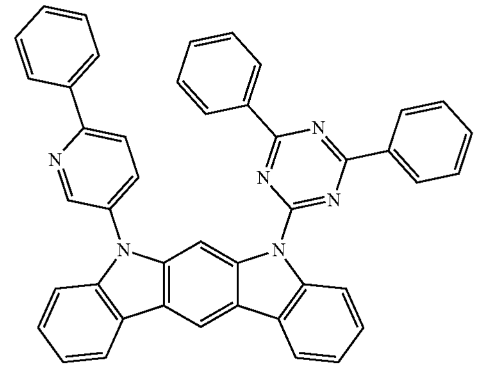
[E-31]
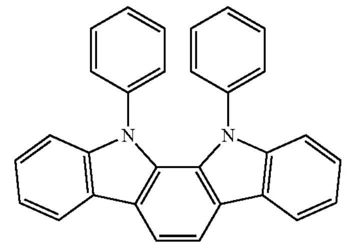
[E-32]
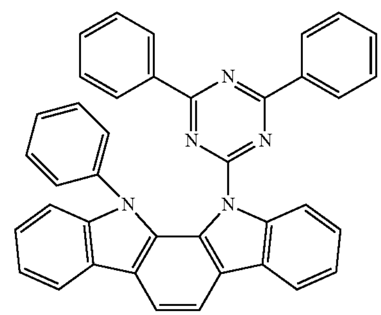
[E-33]
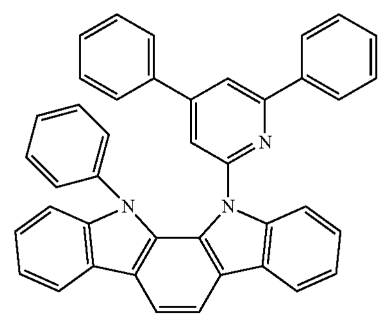
[E-34]
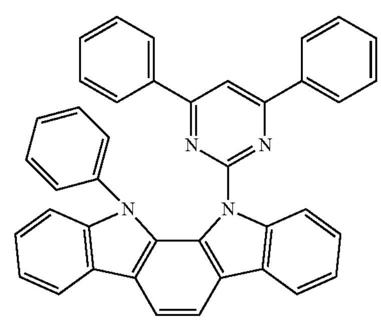

-continued
[E-35]
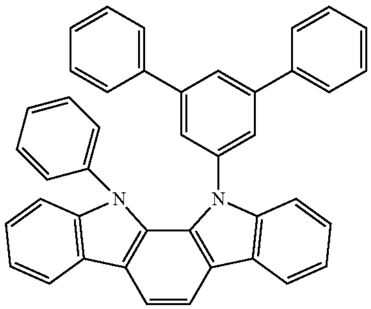
[E-36]
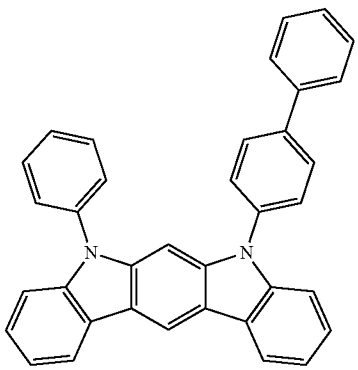
[E-37]
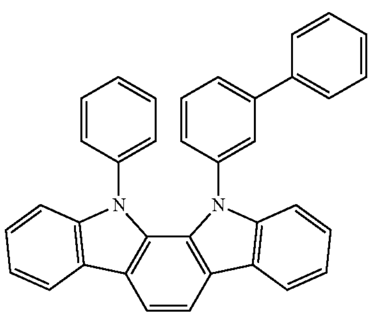
[E-38]
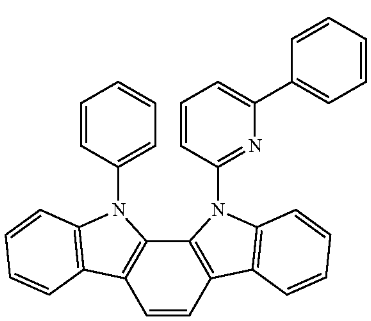
-continued
[E-39]
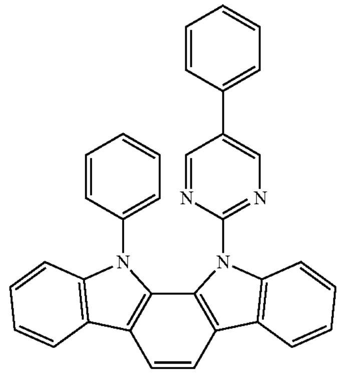
[E-40]
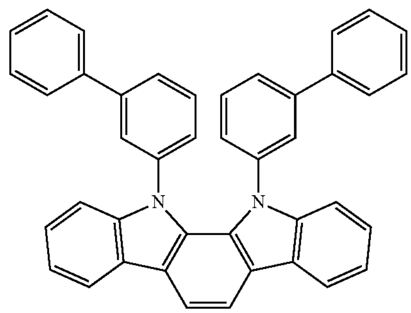
[E-41]
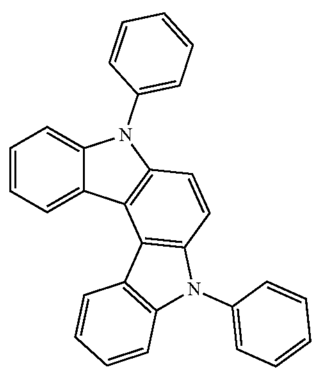
[E-42]
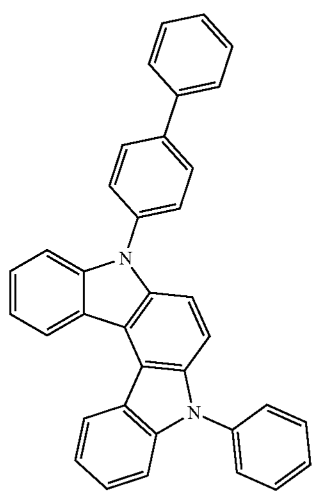

-continued
[E-43]
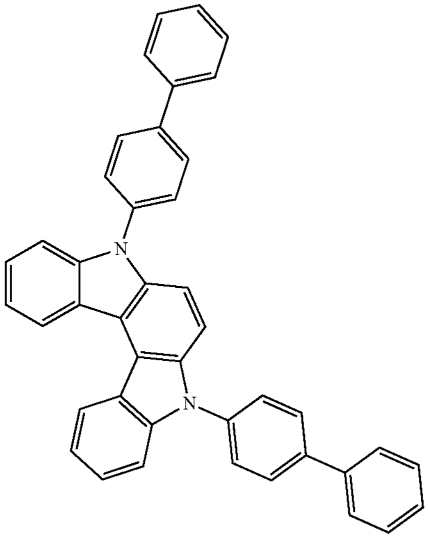
[E-44]
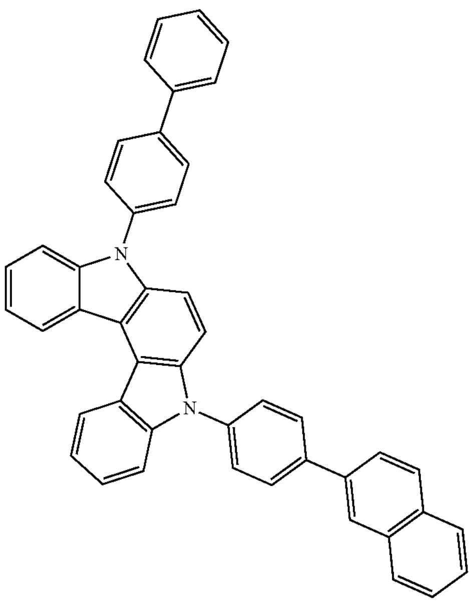
[E-45]
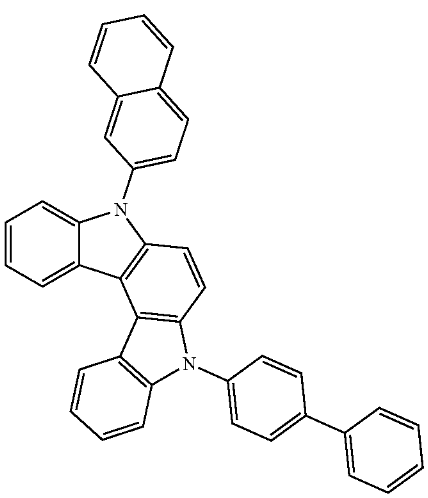
-continued
[E-46]
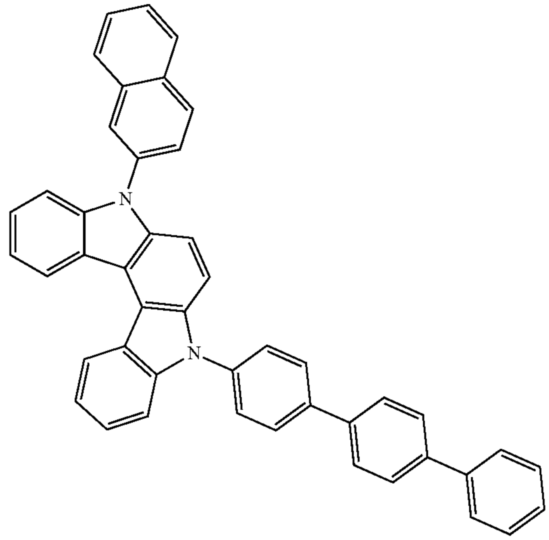
[E-47]
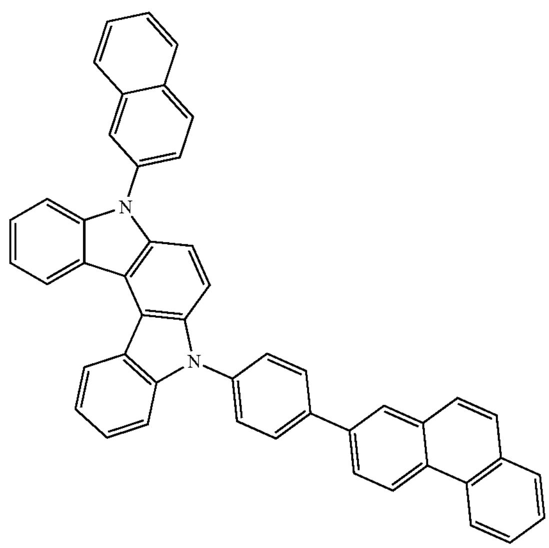

-continued

[E-48]

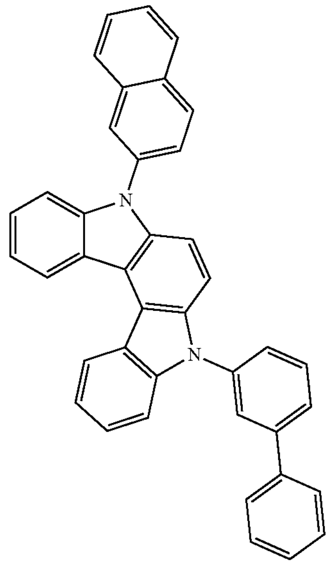

[E-49]

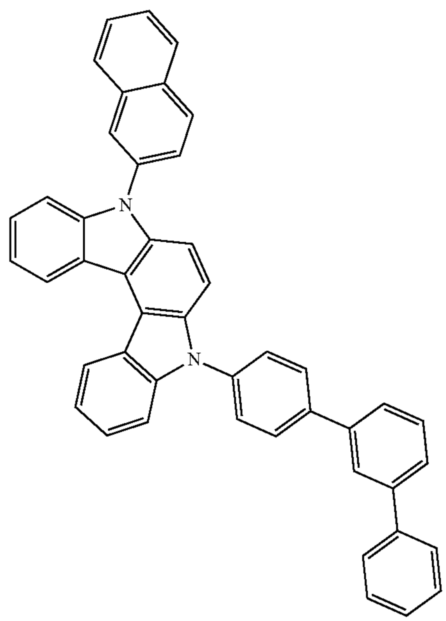

The second compound for the organic photoelectronic element may be used in the light emitting layer together with the first compound for an organic photoelectronic element to increase charge mobility and stability and thus improve luminous efficiency and life-span characteristics. In addition, the charge mobility may be controlled by adjusting a ratio of the second compound for the organic photoelectronic element and the first compound for the organic photoelectronic element.

In addition, the first compound for the organic photoelectronic element and the second compound for the organic photoelectronic element may be included in a weight ratio of, for example, about 1:9 to 9:1, 2:8 to 8:2, 3:7 to 7:3, 4:6 to 6 It may be included in a weight ratio of 4:4, and 5:5, and specifically, in a weight ratio of 1:9 to 8:2, 1:9 to 7:3, 1:9 to 6:4, 1:9 to 5:5. More specifically, it may be included in a weight ratio of 2:8 to 7:3, 2:8 to 6:4, and 2:8 to 5:5. It may also be included in a weight ratio of 3:7 to 6:4, and 3:7 to 5:5, and most specifically, in a weight ratio of 3:7, 4:6 or 5:5.

The composition for an organic photoelectronic element may be used as a host of green or red organic light emitting diodes.

The compound or composition for the organic photoelectronic element may further include one or more organic compounds in addition to the other compound for an organic photoelectronic element.

The compound or composition for the organic photoelectronic element may further include a dopant. The dopant may be a red, green or blue dopant.

The dopant may be a material in small amount to cause light emission and may generally be a material such as a metal complex that emits light by multiple excitation into a triplet or more. The dopant may be for example an inorganic, organic, or organic/inorganic compound and one or more types thereof may be used.

Examples of the dopant may be a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. The phosphorescent dopant may be, for example a compound represented by Chemical Formula Z, but is not limited thereto.

$$L_2MX \qquad \text{[Chemical Formula Z]}$$

In Chemical Formula Z, M is a metal, and L and X are the same or different and are a ligand to form a complex compound with M.

The M may be for example Ir, Pt, Os, Ti, Zr, Hf, Eu, Tb, Tm, Fe, Co, Ni, Ru, Rh, Pd, or a combination thereof and L and X may be for example a bidendate ligand.

Hereinafter, an organic photoelectronic element including the aforementioned compound for the organic photoelectronic element is described.

The organic photoelectronic element according to another embodiment may include an anode and a cathode facing each other, and at least one organic layer positioned between the anode and the cathode, and the organic layer may include the aforementioned compound for the organic photoelectronic element.

For example, the organic layer may include a light emitting layer, and the light emitting layer may include the compound for the organic photoelectronic element of the present invention.

Specifically, the compound for the organic photoelectronic element may be included as a host of the light emitting layer, for example, a green host or a red host.

In addition, the organic layer may include a light emitting layer; and at least one auxiliary layer selected from an electron transport layer, an electron injection layer, and a hole blocking layer, and the auxiliary layer may include the compound for the organic photoelectronic element.

The organic photoelectronic element may be any device to convert electrical energy into photoenergy and vice versa without particular limitation and may be for example an organic photoelectric device, an organic light emitting diode, an organic solar cell, an organic photo conductor drum, and the like.

Herein, an organic light emitting diode as an example of the organic photoelectronic element is described with reference to the drawings.

Figure 2:
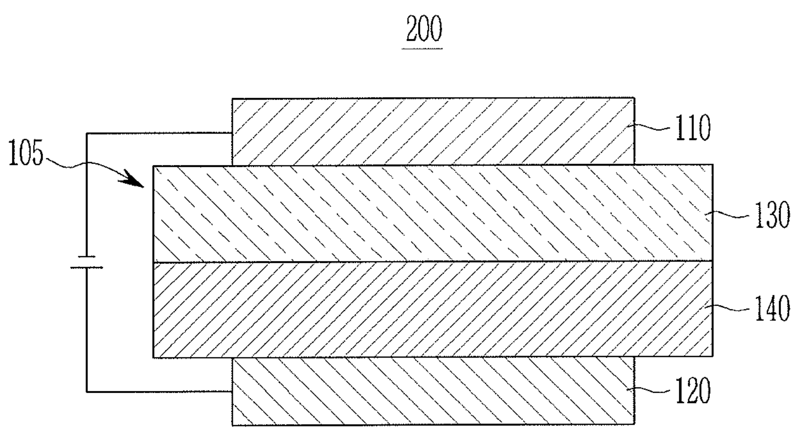

FIGS. 1 and 2 are cross-sectional views showing organic light emitting diodes according to embodiments.

Referring to FIG. 1, an organic photoelectronic element 100 according to an embodiment includes an anode 120 and a cathode 110 facing each other and an organic layer 105 disposed between the anode 120 and the cathode 110.

The anode 120 may be made of a conductor having a large work function to help hole injection, and may be for example a metal, a metal oxide, and/or a conductive polymer. The anode 120 may be, for example a metal such as nickel, platinum, vanadium, chromium, copper, zinc, gold, and the like or an alloy thereof; metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDT), polypyrrole, and polyaniline, but is not limited thereto.

The cathode 110 may be made of a conductor having a small work function to help electron injection, and may be for example a metal, a metal oxide, and/or a conductive polymer. The cathode 110 may be for example a metal such as magnesium, calcium, sodium, potassium, titanium, indium, yttrium, lithium, gadolinium, aluminum silver, tin, lead, cesium, barium, and the like or an alloy thereof; a multi-layer structure material such as LiF/Al, $LiO_2$/Al, LiF/Ca, LiF/Al and $BaF_2$/Ca, but is not limited thereto.

The organic layer 105 includes a light emitting layer 130 including the aforementioned compound for the organic photoelectronic element.

FIG. 2 is a cross-sectional view illustrating an organic light emitting diode according to another embodiment.

Referring to FIG. 2, an organic light emitting diode 200 further includes a hole auxiliary layer 140 in addition to the light emitting layer 130. The hole auxiliary layer 140 further increases hole injection and/or hole mobility and blocks electrons between the anode 120 and the light emitting layer 130. The hole auxiliary layer 140 may be, for example, a hole transport layer, a hole injection layer, and/or an electron blocking layer, and may include at least one layer.

The organic layer 105 of FIG. 1 or 2 may further include an electron injection layer, an electron transport layer, an electron transport auxiliary layer, a hole transport layer, a hole transport auxiliary layer, a hole injection layer, or a combination thereof even if they are not shown. The compound for the organic photoelectronic element of the present invention may be included in these organic layers. The organic light emitting diodes 100 and 200 may be manufactured by forming an anode or a cathode on a substrate, forming an organic layer using a dry film formation method such as a vacuum deposition method (evaporation), sputtering, plasma plating, and ion plating or a wet coating method such as spin coating, dipping, and flow coating, and forming a cathode or an anode thereon.

The aforementioned organic light emitting diode may be applied to an organic light emitting diode display.

Hereinafter, the embodiments are illustrated in more detail with reference to examples. These examples, however, are not in any sense to be interpreted as limiting the scope of the invention.

Hereinafter, starting materials and reactants used in Examples and Synthesis Examples were purchased from Sigma-Aldrich Co., Ltd. or TCI Inc. as far as there in no particular comment or were synthesized by known methods.

(Preparation of Compound for Organic Photoelectronic Element)

The compound as specific examples of the present invention was synthesized through the following steps.

(First Compound for Organic Photoelectronic Element)

Synthesis Example 1: Synthesis of Compound 3

[Reaction Scheme 1]

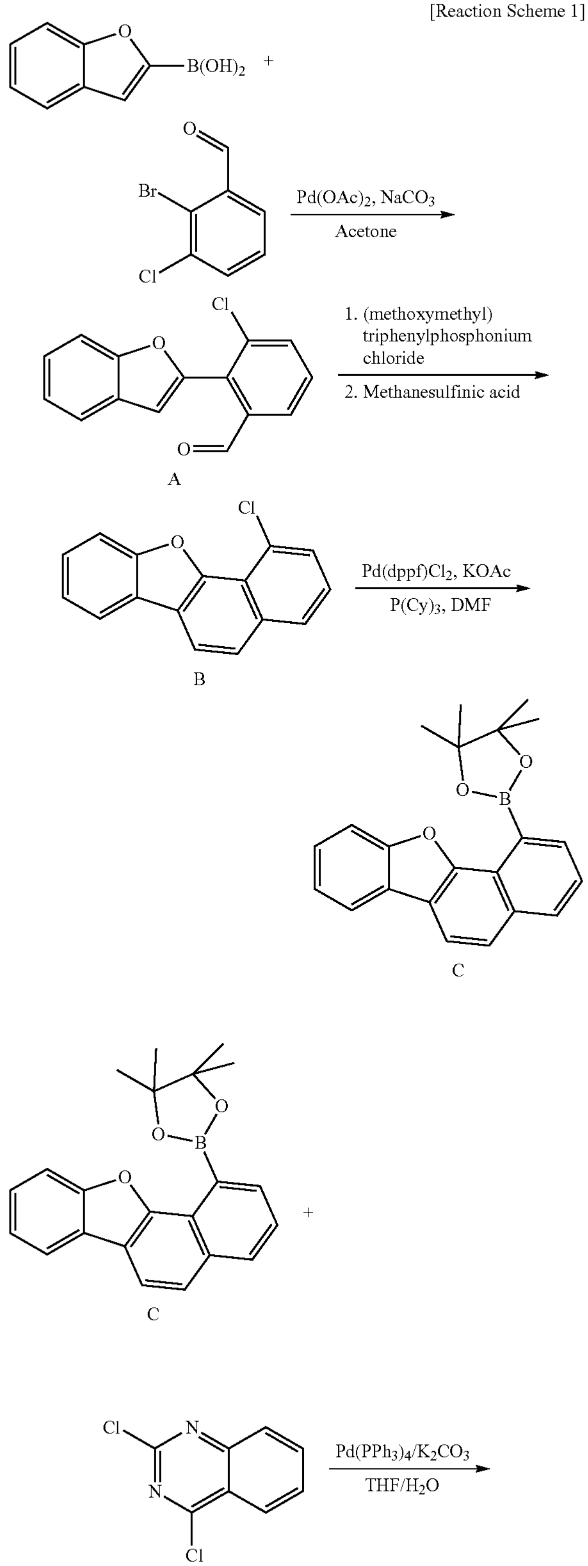

-continued

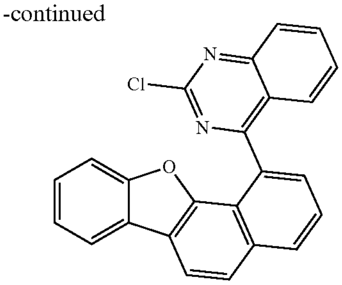

D

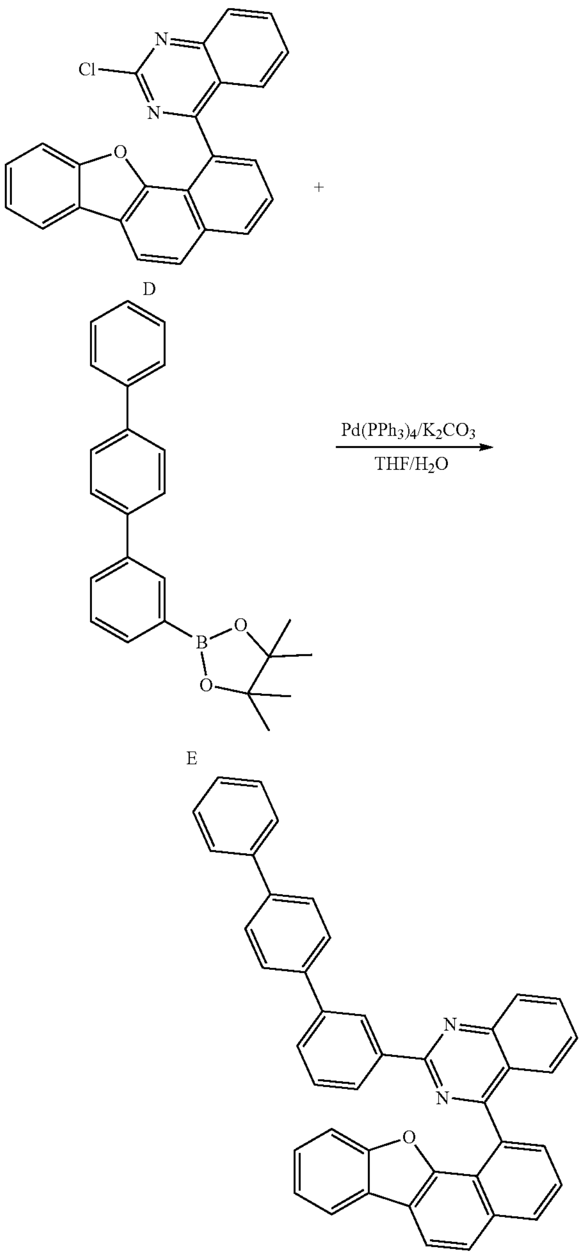

D + E → 3

Synthesis of Intermediate A 21.95 g (135.53 mmol) of 2-benzofuranylboronic acid, 26.77 g (121.98 mmol) of 2-bromo-3-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water in a round-bottomed flask and then, stirred at room temperature for 12 hours. When a reaction is complete, the resultant was concentrated and extracted with methylene chloride, and an organic layer therefrom was silica gel-columned to obtain 21.4 g (Yield=68%) of Intermediate A as a target compound.

Synthesis of Intermediate B 20.4 g (79.47 mmol) of Intermediate A and 29.97 g (87.42 mmol) of (methoxymethyl)triphenyl phosphonium chloride were suspended in 400 ml of THF, and 10.70 g (95.37 mmol) of potassium tert-butoxide was added thereto and then, stirred therewith at room temperature for 12 hours. When a reaction was complete, 400 ml of distilled water was added thereto for an extraction, an organic layer therefrom was concentrated and reextracted with methylene chloride, and after adding magnesium sulfate thereto, the organic layer was stirred for 30 minutes and filtered, and a filtrate therefrom is concentrated. Subsequently, 100 ml of methylene chloride was added to the concentrated filtrate, and 10 ml of methane sulfonic acid was added thereto and then, stirred for one hour.

When a reaction was complete, a solid generated therein was filtered and dried with distilled water and methyl alcohol to obtain 21.4 g (Yield=65%) of Intermediate B as a target compound.

Synthesis of Intermediate C 12.55 g (49.66 mmol) of Intermediate B, 2.43 g (2.98 mmol) of $Pd(dppf)Cl_2$, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and then, refluxed and stirred for 12 hours. When a reaction was complete, 200 ml of distilled water was added thereto, a solid generated therein was filtered and extracted with methylene chloride, and an organic layer therefrom was columned with hexane:EA=4:1(v/v) to obtain 13 g (Yield=76%) of Intermediate C as a target compound.

Synthesis of Intermediate D 10 g (29.05 mmol) of Intermediate C, 5.78 g (29.05 mmol) of 2,4-dichloroquinazoline, 1.01 g (0.87 mmol) of $Pd(PPh_3)_4$, and 8.03 g (58.10 mmol) of $K_2CO_3$ were suspended in 100 ml of THF and 50 ml of distilled water in a round-bottomed flask and then, refluxed and stirred for 12 hours. When a reaction was complete, the resultant was cooled down to room temperature, 300 ml of methyl alcohol was added thereto, and a solid generated therein was filtered and washed with distilled water and methyl alcohol. The solid was heated and dissolved in 400 ml of toluene, silica gel-filtered, and concentrated, and a solid generated therein was stirred with 100 ml of acetone for 30 minutes and filtered to obtain 8.00 g (Yield=72%) of Intermediate D as a target compound.

Synthesis of Compound 3

8.0 g (21.01 mmol) of Intermediate D, 7.48 g (21.01 mmol) of Intermediate E, 0.73 g (0.63 mmol) of $Pd(PPh_3)_4$, and 5.81 g (42.01 mmol) of $K_2CO_3$ were suspended in 100 ml of THF and 50 ml of distilled water in a round-bottomed flask and then, synthesized according to the same method as Intermediate D to obtain 10.0 g (Yield=83%) of Compound 3 as a target compound.

LC-Mass (theoretical value: 574.67 g/mol, measured value: M+=574.55 g/mol)

Synthesis Example 2: Synthesis of Compound 67
[Reaction Scheme 2]
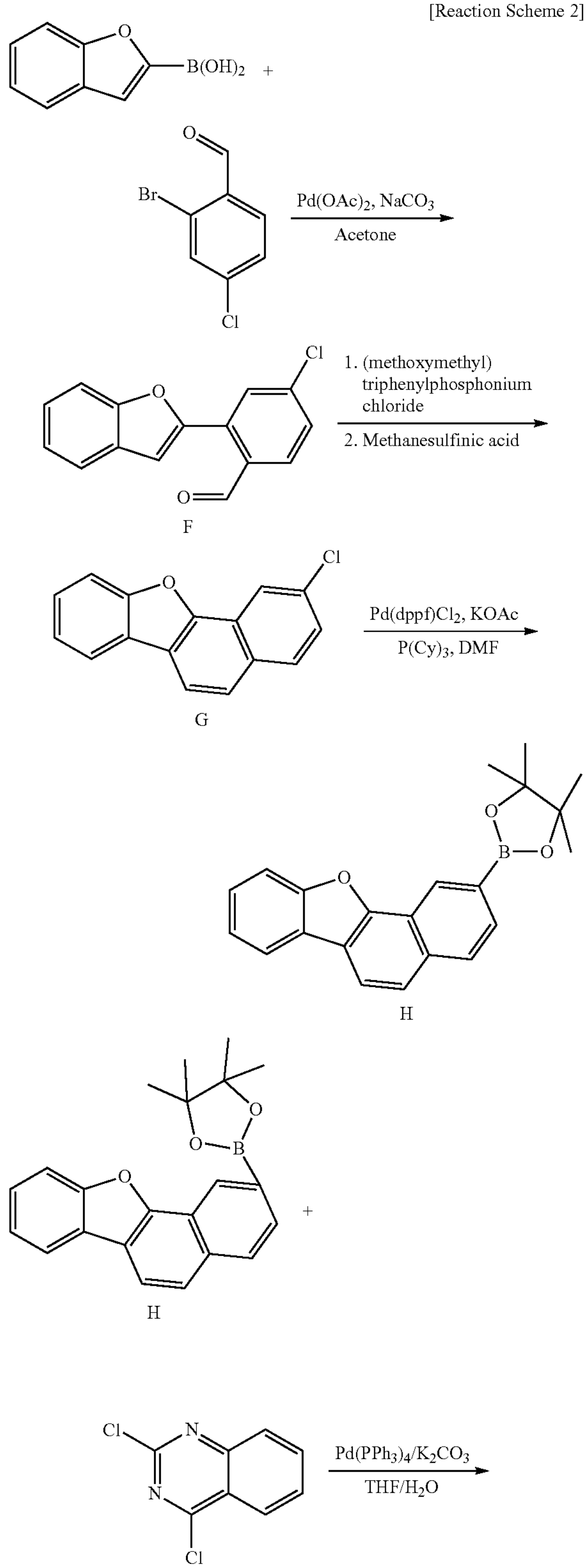
-continued
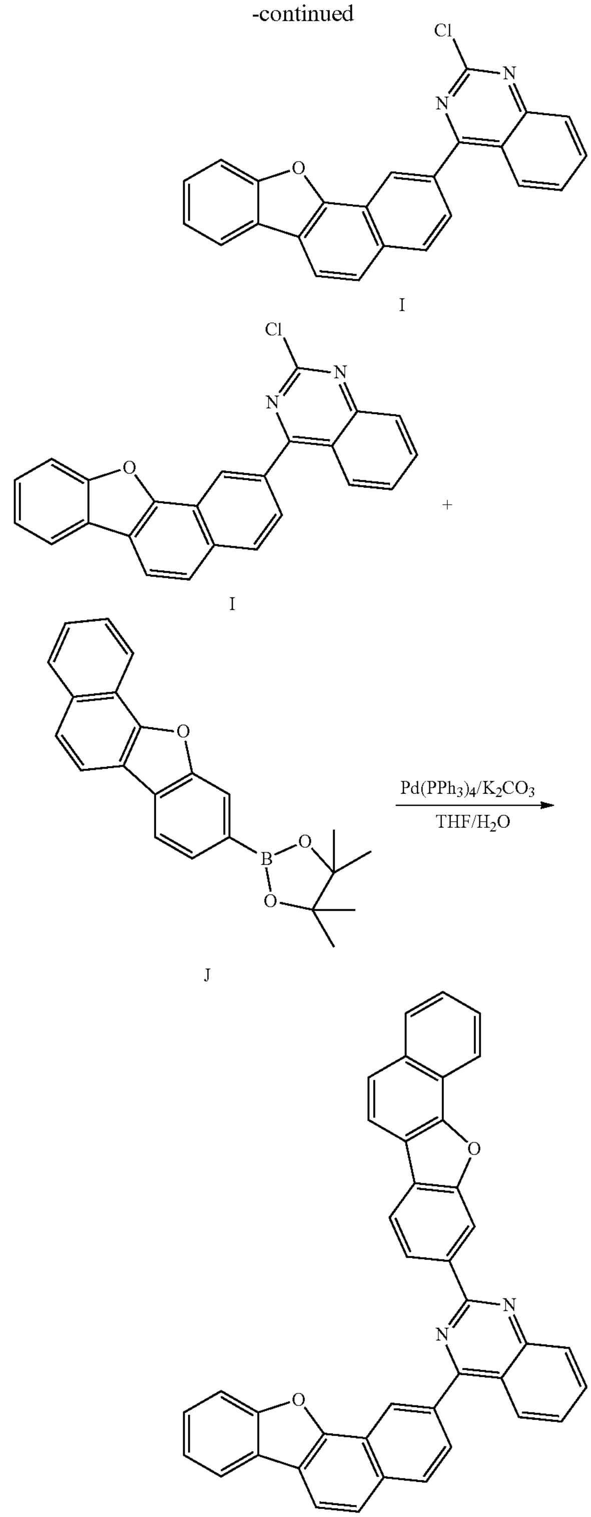
67
Synthesis of Intermediate F
21.95 g (135.53 mmol) of 2-benzofuranylboronic acid, 26.77 g (121.98 mmol) of 2-bromo-4-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water in a round-bottomed flask and then, synthesized according to the same method as Intermediate A to obtain 21.4 g (Yield=68%) of intermediate F as a target compound.

Synthesis of Intermediate G 20.4 g (79.47 mmol) of Intermediate F and 29.97 g (87.42 mmol) of (methoxymethyl)triphenyl phosphonium chloride were suspended in 400 ml of THF, 10.70 g (95.37 mmol) of potassium tert-butoxide was added thereto, and 21.4 g (Yield=65%) of Intermediate G was synthesized according to the same method as Intermediate B.

Synthesis of Intermediate H 12.55 g (49.66 mmol) of Intermediate G, 2.43 g (2.98 mmol) of Pd(dppf)C12, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and synthesized according to the same method as Intermediate C to obtain 13 g (Yield=76%) of Intermediate H as a target compound.

Synthesis of Intermediate I 10 g (29.05 mmol) of Intermediate H, 5.78 g (29.05 mmol) of 2,4-dichloroquinazoline, 1.01 g (0.87 mmol) of $Pd(PPh_3)_4$, and 8.03 g (58.10 mmol) of $K_2CO_3$ were suspended in 100 ml of THF and 50 ml of distilled water in a round-bottomed flask and then, synthesized according to the same method as Intermediate D to obtain 9.0 g (Yield=81%) of Intermediate I as a target compound.

Synthesis of Compound 67

9.0 g (23.63 mmol) of Intermediate I, 8.13 g (23.63 mmol) of Intermediate J, 0.82 g (0.71 mmol) of $Pd(PPh_3)_4$, and 6.53 g (47.27 mmol) of $K_2CO_3$ were suspended in 100 ml of THF and 50 ml of distilled water in a round-bottomed flask and then, synthesized according to the same method as Intermediate D to obtain 11.0 g (Yield=83%) of Compound 67 as a target compound.

LC-Mass (theoretical value: 562.61 g/mol, measured value: M+=562.45 g/mol)

Synthesis Example 3: Synthesis of Compound 74

[Reaction Scheme 3]

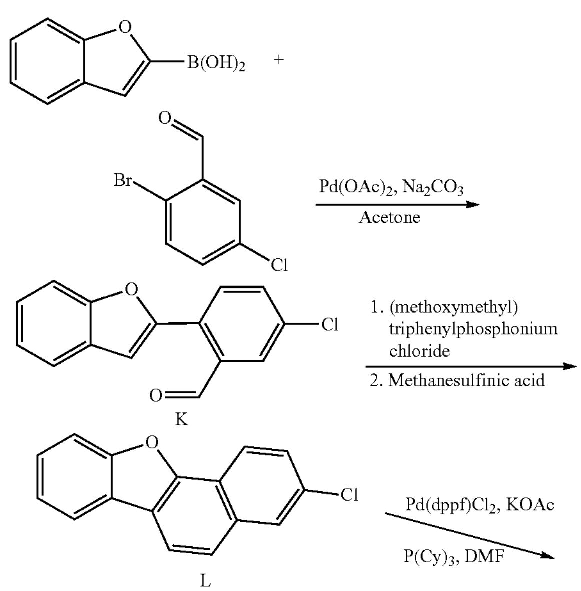

-continued

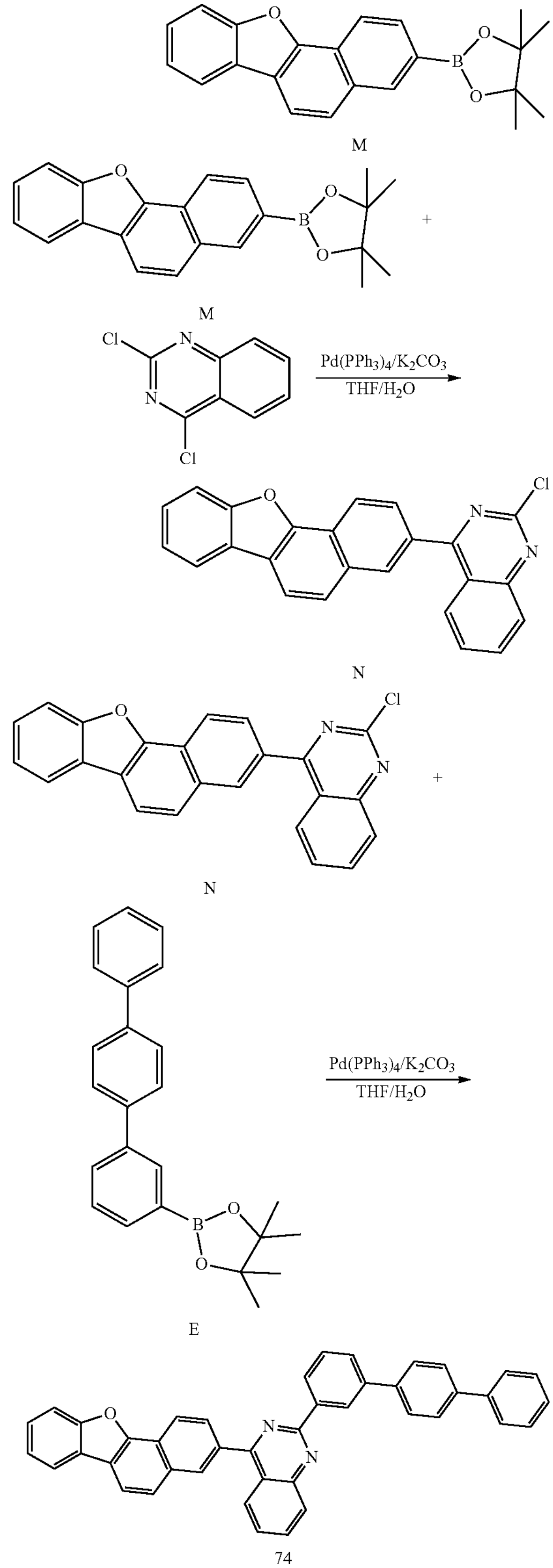

Synthesis of Intermediate K 21.95 g (135.53 mmol) of 2-benzofuranylboronic acid, 26.77 g (121.98 mmol) of 2-bromo-5-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water in a round-bottomed flask and then, synthesized according to the same method as Intermediate A to obtain 21.4 g (Yield=68%) of Intermediate K as a target compound.

Synthesis of Intermediate L 20.4 g (79.47 mmol) of Intermediate K and 29.97 g (87.42 mmol) of (methoxymethyl)triphenyl phosphonium chloride were suspended in 400 ml of THF, and 10.70 g (95.37 mmol) of potassium tert-butoxide was added thereto and then, synthesized according to the same method as Intermediate B to obtain 21.4 g (Yield=65%) of Intermediate Las a target compound.

Synthesis of Intermediate M 12.55 g (49.66 mmol) of Intermediate L, 2.43 g (2.98 mmol) of Pd(dppf)C12, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and then, synthesized according to the same synthesis as Intermediate C to obtain 13 g (Yield=76%) of Intermediate M as a target compound.

Synthesis of Intermediate N 13 g (37.77 mmol) of Intermediate M, 7.52 g (37.77 mmol) of 2,4-dichloroquinazoline, 1.31 g (1.13 mmol) of $Pd(PPh_3)_4$, and 10.44 g (75.54 mmol) of $K_2CO_3$ were suspended in 100 ml of THF and 50 ml of distilled water and then, synthesized according to the same method as Intermediate D to obtain 12.0 g (Yield=83%) of Intermediate N as a target compound.

Synthesis of Compound 74

10.0 g (26.26 mmol) of Intermediate N, 9.36 g (26.26 mmol) of Intermediate E, 0.91 g (0.79 mmol) of $Pd(PPh_3)_4$, and 7.26 g (52.52 mmol) of $K_2CO_3$ were suspend in 100 ml of THF and 50 ml of distilled water in a round-bottomed flask and then, synthesized according to the same method as Intermediate D to obtain 13.0 g (Yield=86%) of Compound 74 as a target compound.

LC-Mass (theoretical value: 574.67 g/mol, measured value: M+=574.60 g/mol)

Synthesis Example 4: Synthesis of Compound 77

[Reaction Scheme 4]

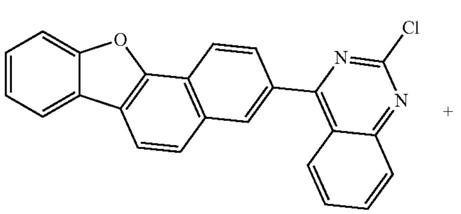

N

-continued

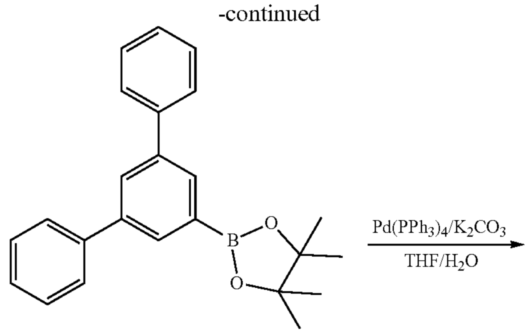

O

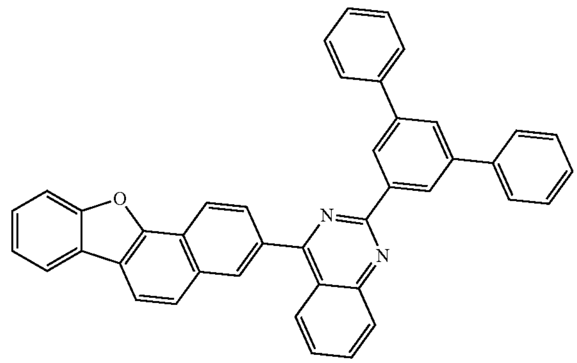

77

8.0 g (21.01 mmol) of Intermediate N, 7.48 g (21.01 mmol) of Intermediate O, 0.73 g (0.63 mmol) of $Pd(PPh_3)_4$, and 5.81 g (42.01 mmol) of $K_2CO_3$ were suspended in 100 ml of THF and 50 ml of distilled water in a round-bottomed flask and then, synthesized according to the same method as Intermediate D to obtain 9.0 g (Yield of 75%) of Compound 77 as a target compound.

LC-Mass (theoretical value: 574.67 g/mol, measured value: M+=574.56 g/mol)

Synthesis Example 5: Synthesis of Compound 78

[Reaction Scheme 5]

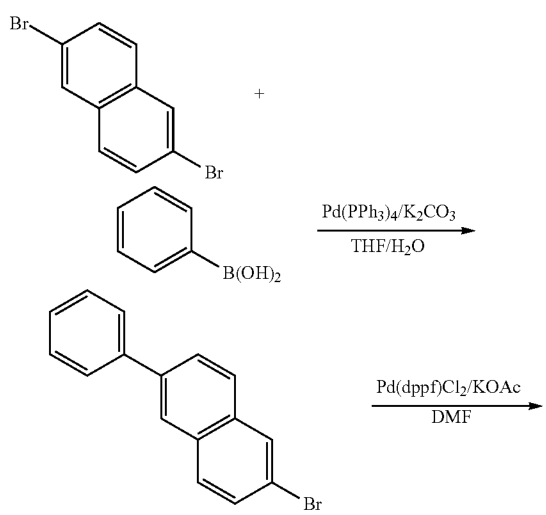

P

-continued
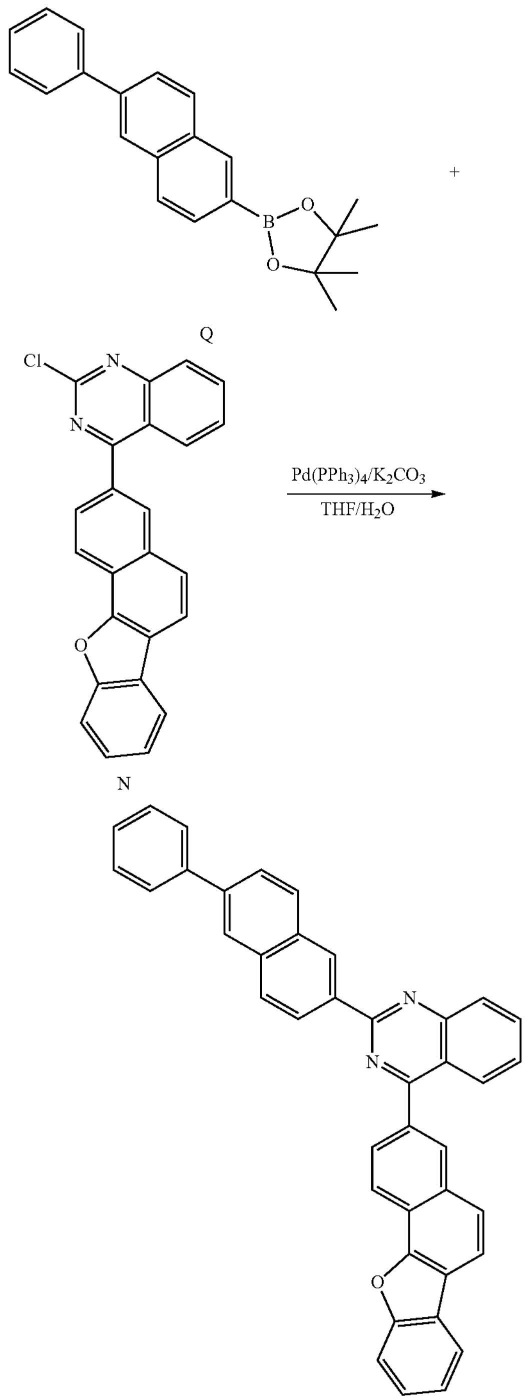
78
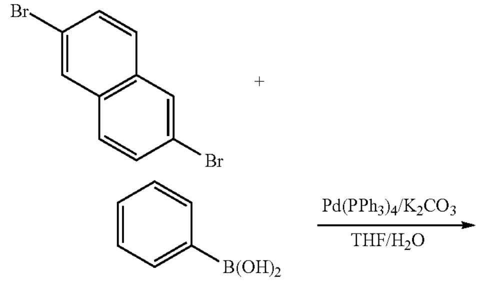
-continued
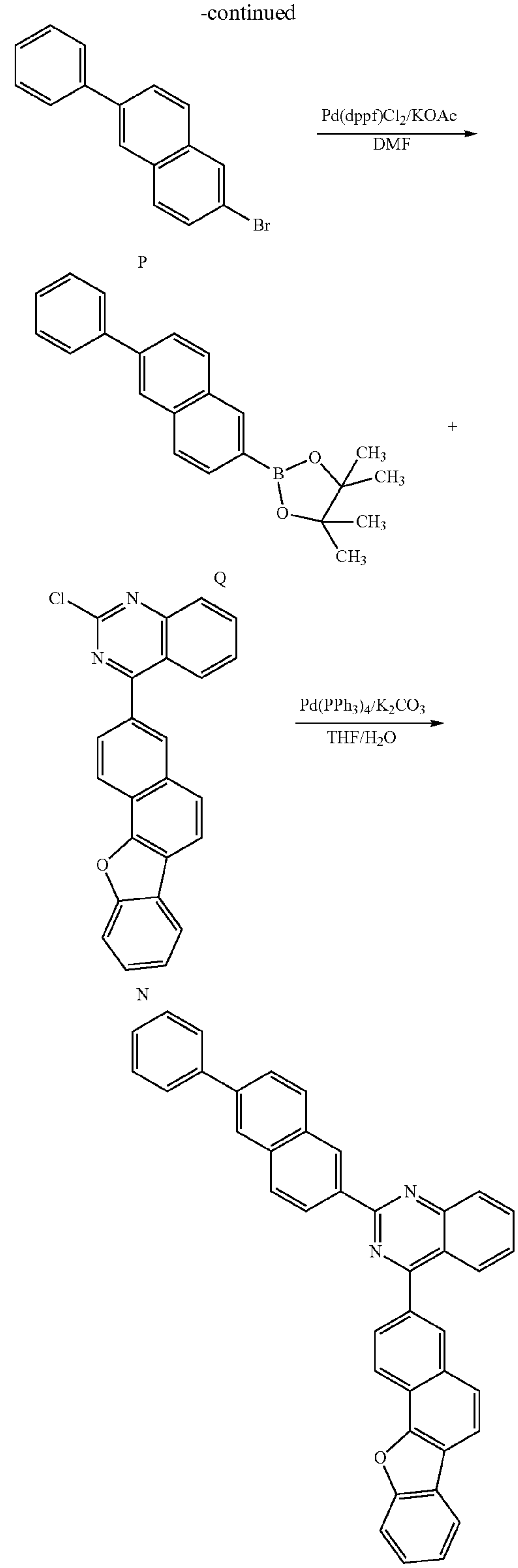
78

Synthesis of Intermediate P 50.0 g (174.85 mmol) of 2,6-dibromonaphthalene, 22.41 g (183.59 mmol) of phenylboronic acid, 6.06 g (5.25 mmol) of $Pd(PPh_3)_4$, and 48.33 g (349.70 mmol) of $K_2CO_3$ were suspended in 500 ml of THF and 250 ml of distilled water in a round-bottomed flask and then, refluxed and stirred for 12 hours. When a reaction is complete, the resultant was concentrated and extracted with methylene chloride, and an organic layer therefrom was silica gel columned to obtain 35.0 g (Yield=71%) of Compound P as a target compound.

Synthesis of Intermediate Q 2.60 g (3.18 mmol) of $PPd(dppf)Cl_2$ as an intermediate, 19.37 g (76.28 mmol) of bis(pinacolato)diboron, and 18.72 g (190.70 mmol) of KOAc were suspended in 200 ml of DMF and then, refluxed and stirred for 12 hours. When a reaction is complete, 200 ml of distilled water is added thereto, a solid generated therein was filtered and extracted with methylene chloride, and an organic layer therefrom was concentrated and columned with hexane:EA=10:1 (v/v) to obtain 15 g (Yield=71%) of Compound Q as a target compound.

Synthesis of Compound 78

10.0 g (26.26 mmol) of Intermediate N, 8.67 g (26.26 mmol) of Intermediate Q, 0.91 g (0.79 mmol) of $Pd(PPh_3)_4$, and 7.26 g (52.52 mmol) of $K_2CO_3$ were suspended in 100 ml of THF and 50 ml of distilled water in a round-bottomed flask and then, synthesized according to the same method as Intermediate D to obtain 11.0 g (Yield=76%) of Compound 78 as a target compound.

LC-Mass (theoretical value: 548.63 g/mol, measured value: M+=548.45 g/mol)

Synthesis Example 6: Synthesis of Compound 89

[Reaction Scheme 6]

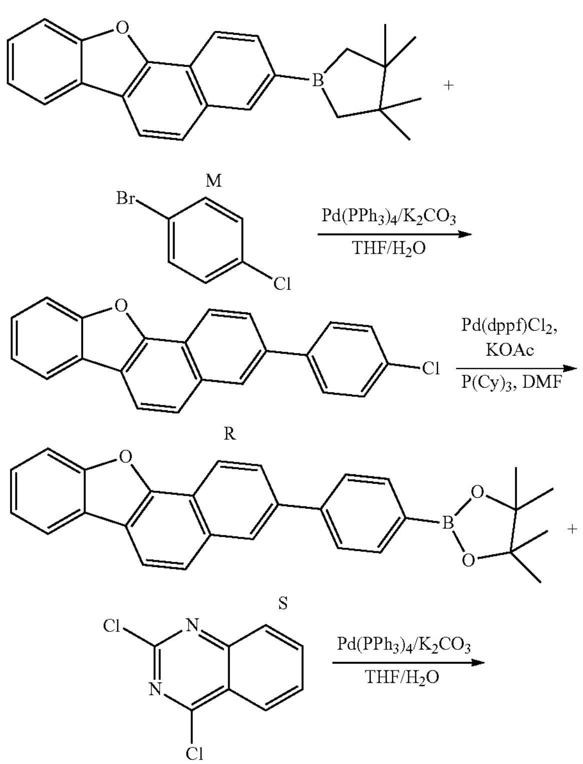

-continued

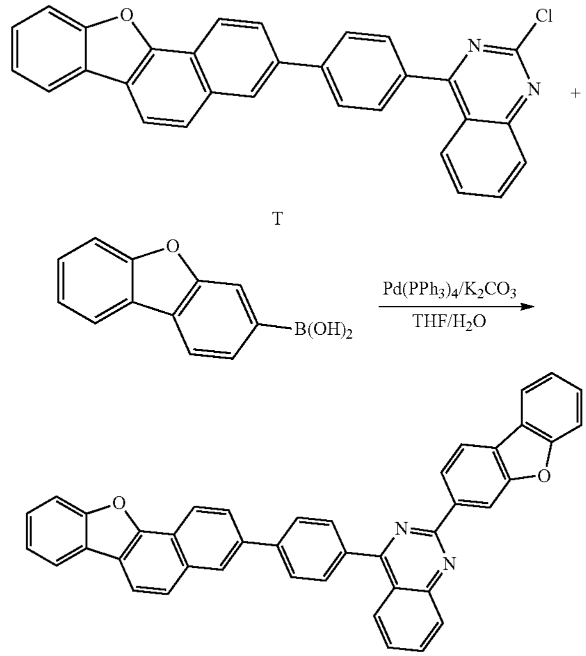

89

Synthesis of Intermediate R 30.0 g (87.16 mmol) of Intermediate M, 18.35 g (95.87 mmol) of 1-bromo-4-chlorobenzene, 3.02 g (2.61 mmol) of $Pd(PPh_3)_4$, and 24.09 g (174.31 mmol) of $K_2CO_3$ were suspended in 200 ml of THF and 100 ml of distilled water in a round-bottomed flask and then, synthesized according to the same method as Intermediate D to obtain 41.0 g (Yield=86%) of Intermediate R as a target compound.

Synthesis of Intermediate S 30.0 g (91.24 mmol) of Intermediate R, 4.47 g (5.47 mmol) of Pd(dppf)C12, 27.80 g (109.49 mmol) of bis (pinacolato)diboron, 26.87 g (273.73 mmol) of KOAc, and 6.14 g (21.90 mmol) of $P(Cy)_3$ were suspended in 300 ml of DMF and then, synthesized according to the same method as Intermediate C to obtain 29.0 g (Yield=76%) of Intermediate S as a target compound.

Synthesis of Intermediate T 20.0 g (47.58 mmol) of Intermediate S, 9.47 g (47.58 mmol) of 2,4-dichloroquinazoline, 1.65 g (1.43 mmol) of $Pd(PPh_3)_4$, and 13.15 g (95.17 mmol) of $K_2CO_3$ were suspended in 100 ml of THF and 50 ml of distilled water in a round-bottomed flask and then, synthesized according to the same method as Intermediate D to obtain 15.0 g (Yield=69%) of Intermediate T as a target compound.

Synthesis of Compound 89

10.0 g (21.89 mmol) of Intermediate T, 5.10 g (24.07 mmol) of dibenzo[b,d]furan-3-ylboronic acid, 0.76 g (0.66 mmol) of $Pd(PPh_3)_4$, and 6.05 g (43.77 mmol) of $K_2CO_3$ were suspended in 100 ml of THF and 50 ml of distilled water in a round-bottomed flask and then, synthesized according to the same method as Intermediate D to obtain 10.0 g (Yield=78%) of Compound 89 as a target compound.

LC-Mass (theoretical value: 588.65 g/mol, measured value: M+=588.58 g/mol)

Synthesis Example 7: Synthesis of Compound 94

[Reaction Scheme 7]

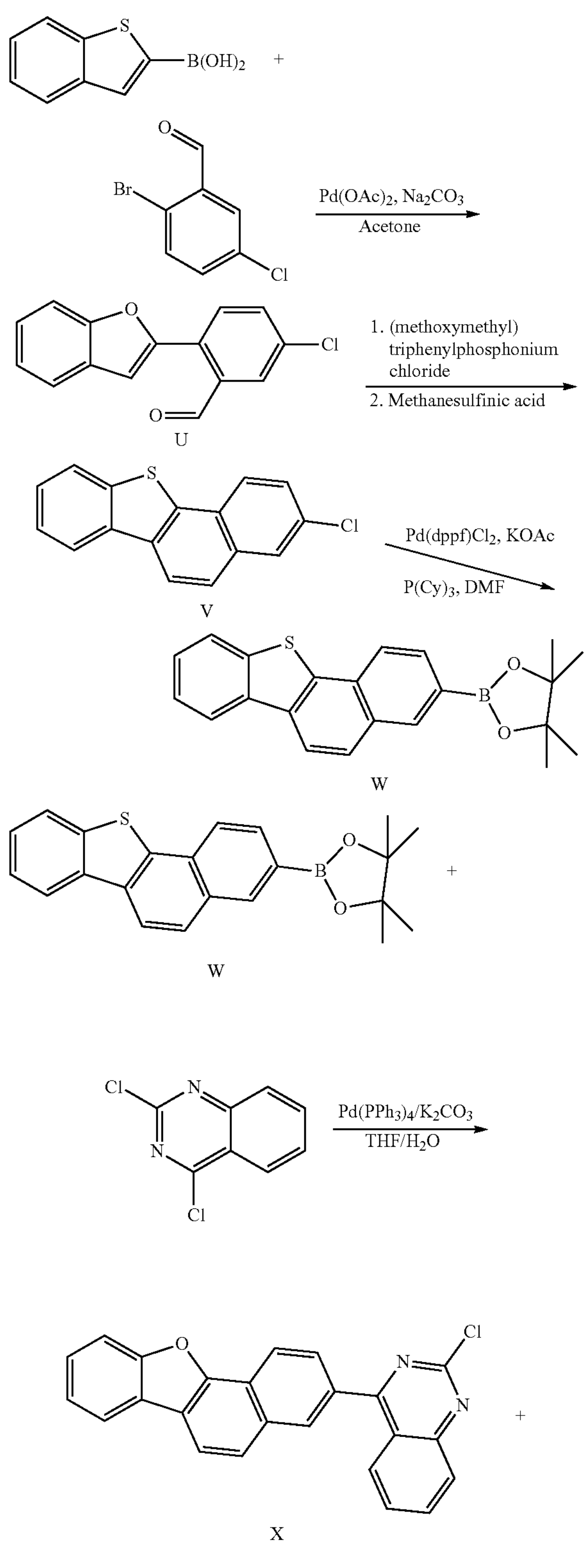

-continued

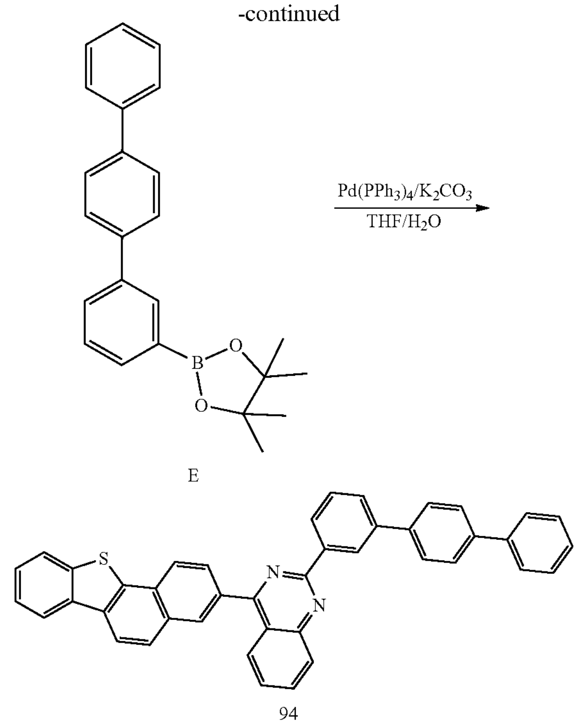

Synthesis of Intermediate U 21.95 g (135.53 mmol) of 2-benzothiophenylboronic acid, 26.77 g (121.98 mmol) of 2-bromo-5-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water in a round-bottomed flask and then, synthesized according to the same method as Intermediate A to obtain 21.4 g (Yield=68%) of Intermediate U as a target compound.

Synthesis of Intermediate V 20.4 g (79.47 mmol) of Intermediate U and 29.97 g (87.42 mmol) of (methoxymethyl)triphenyl phosphonium chloride were suspended in 400 ml of THF, 10.70 g (95.37 mmol) of potassium tert-butoxide was added thereto and then, synthesized according to the same method as Intermediate B to obtain 21.4 g (65% yield) of Intermediate V as a target compound.

Synthesis of Intermediate W 12.55 g (49.66 mmol) of Intermediate V, 2.43 g (2.98 mmol) of $Pd(dppf)Cl_2$, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and then, synthesized according to the same method as Intermediate C to obtain 13 g (Yield=76%) of Intermediate W as a target compound.

Synthesis of Intermediate X 13 g (36.08 mmol) of Intermediate W, 7.18 g (36.08 mmol) of 2,4-dichloroquinazoline, 1.25 g (1.08 mmol) of $Pd(PPh_3)_4$, and 9.97 g (72.17 mmol) of $K_2CO_3$ were suspended in 100 ml of THF and 50 ml of distilled water in a round-bottomed flask and then, synthesized according to the same method as Intermediate C to obtain 11.0 g (Yield=77%) of Intermediate X as a target compound.

Synthesis of Compound 94

10.0 g (25.20 mmol) of Intermediate X, 9.87 g (27.72 mmol) of intermediate E, 0.87 g (0.76 mmol) of $Pd(PPh_3)_4$, and 6.96 g (50.39 mmol) of $K_2CO_3$ were suspended in 100 ml of THF and 50 ml of distilled water in a round-bottomed flask and then, synthesized according to the same method as Intermediate D to obtain 12.0 g (Yield=81%) of Compound 94 as a target compound.

LC-Mass (theoretical value: 590.73 g/mol, measured value: M+=590.76 g/mol)

Synthesis Example 8: Synthesis of Compound 91

[Reaction Scheme 8]

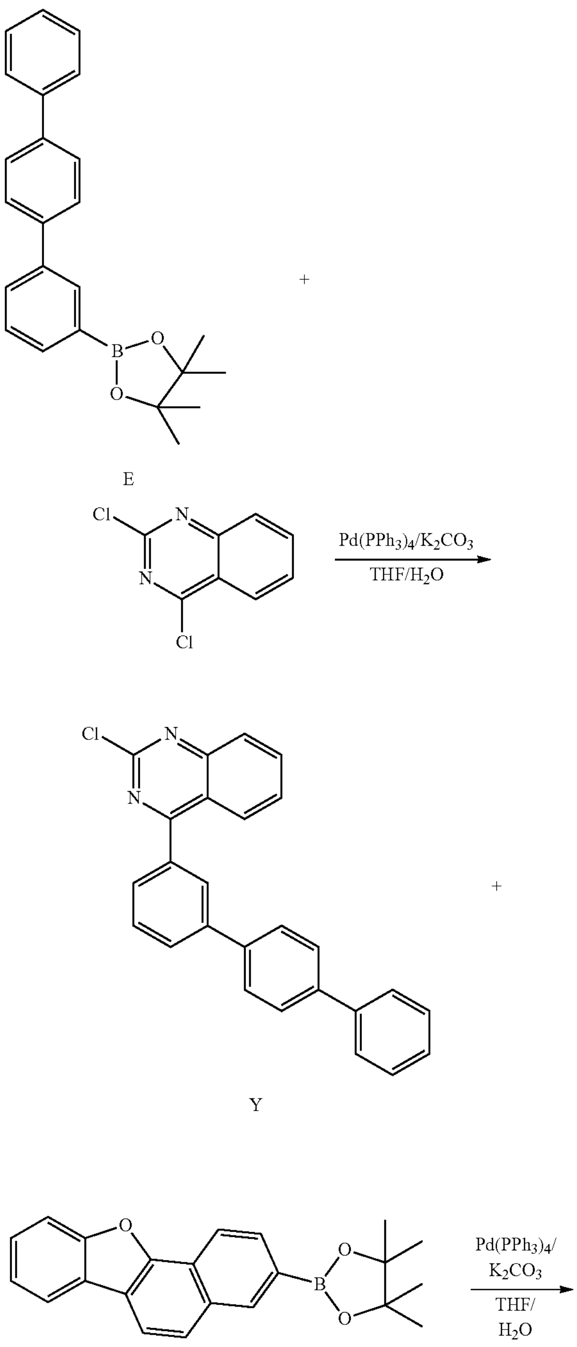

E, Y, M

-continued

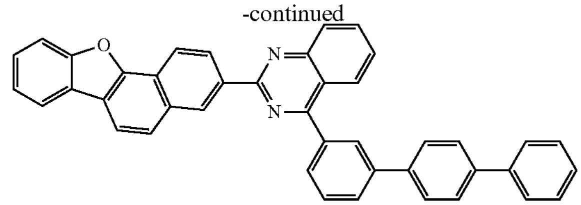

91

Synthesis of Intermediate Y 20.0 g (56.14 mmol) of Intermediate E, 11.17 g (56.14 mmol) of 2,4-dichloroquinazoline, 1.95 g (1.68 mmol) of $Pd(PPh_3)_4$, and 15.52 g (112.27 mmol) of $K_2CO_3$ were suspended in 200 ml of THF and 100 ml of distilled water in a round-bottomed flask and then, synthesized according to the same method as Intermediate D to obtain 18.0 g (Yield=82%) of Intermediate Y as a target compound.

Synthesis of Compound 91

10.0 g (25.45 mmol) of Intermediate Y, 9.64 g (28.00 mmol) of Intermediate M, 0.88 g (0.76 mmol) of $Pd(PPh_3)_4$, and 7.04 g (50.91 mmol) of $K_2CO_3$ were suspended in 100 ml of THF and 50 ml of distilled water in a round-bottomed flask and then, synthesized according to the same method as Intermediate D to obtain 10.0 g (Yield=68%) of Compound 91 as a target compound.

LC-Mass (theoretical value: 574.67 g/mol, measured value: M+=574.54 g/mol)

Synthesis Example 9: Synthesis of Compound 104

[Reaction Scheme 9]

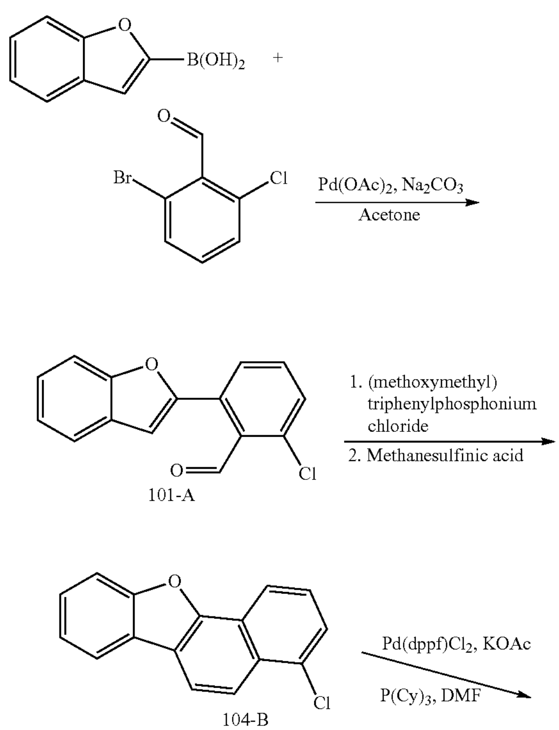

101-A, 104-B

-continued

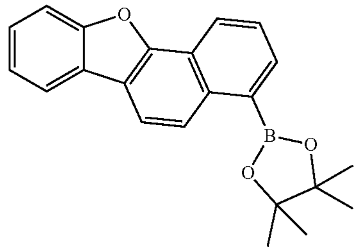

104-C

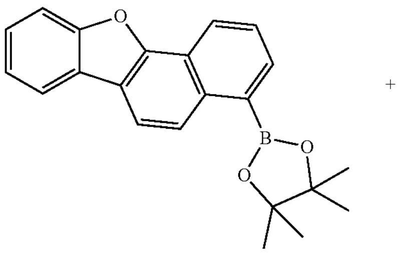

104-C

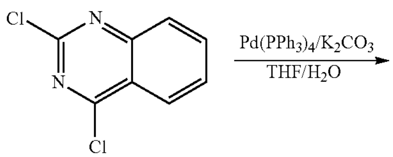

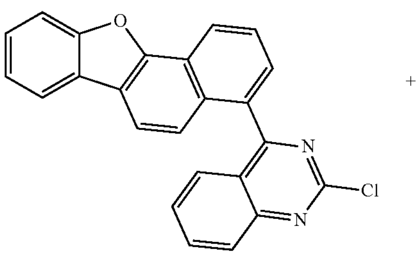

104-D

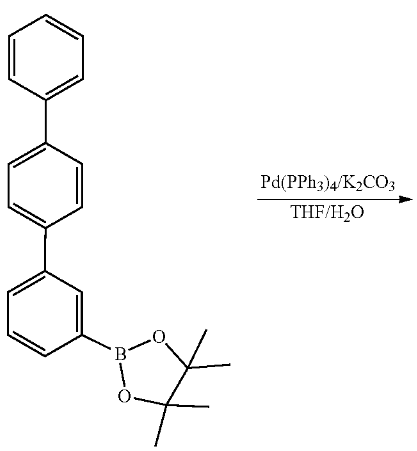

E

-continued

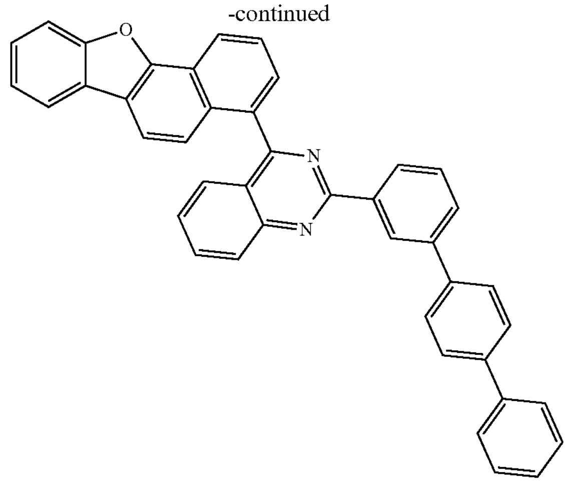

104

Synthesis of Intermediate 104-A 21.95 g (135.53 mmol) of 2-benzofuranylboronic acid, 26.77 g (121.98 mmol) of 2-bromo-6-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water in a round-bottomed flask and then, synthesized according to the same method as Intermediate A to obtain 21.4 g (Yield=68%) of Intermediate 104-A as a target compound.

Synthesis of Intermediate 104-B 20.4 g (79.47 mmol) of Intermediate 104-A and 29.97 g (87.42 mmol) of (methoxymethyl)triphenyl phosphonium chloride were suspended in 400 ml of THF, and 10.70 g (95.37 mmol) of potassium tert-butoxide was added thereto and then, synthesized according to the same method as Intermediate B to obtain 21.4 g (Yield=65%) of Intermediate 104-B as a target compound.

Synthesis of Intermediate 104-C 12.55 g (49.66 mmol) of Intermediate 104-B, 2.43 g (2.98 mmol) of $Pd(dppf)Cl_2$, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and then, synthesized according to the same method as Intermediate C to obtain 13 g (Yield=76%) of Intermediate 104-C as a target compound.

Synthesis of Intermediate 104-D 13 g (37.77 mmol) of Intermediate M, 7.52 g (37.77 mmol) of 2,4-dichloroquinazoline, 1.31 g (1.13 mmol) of $Pd(PPh_3)_4$, and 10.44 g (75.54 mmol) of $K_2CO_3$ were suspended in 100 ml of THF and 50 ml of distilled water in a round-bottomed flask and then, synthesized according to the same method as Intermediate D to obtain 12 g (Yield=83%) of Intermediate 104-D as a target compound.

Synthesis of Compound 104

10.0 g (26.26 mmol) of Intermediate N, 9.36 g (26.26 mmol) of Intermediate E, 0.91 g (0.79 mmol) of $Pd(PPh_3)_4$, and 7.26 g (52.52 mmol) of $K_2CO_3$ were suspended in 100 ml of THF and 50 ml of distilled water in a round-bottomed flask and then, synthesized according to the same method as Intermediate D to obtain 13 g (Yield=86%) of Intermediate 104 as a target compound.

LC-Mass (theoretical value: 574.67 g/mol, measured value: M+=574.58 g/mol)

Comparative Synthesis Example 1: Synthesis of Comparative Compound 1

[Comparative Compound 1]

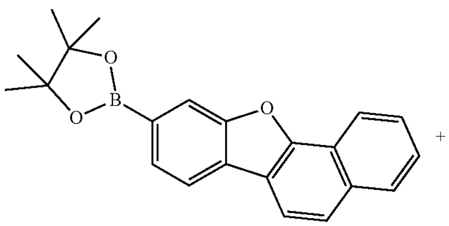

V-A

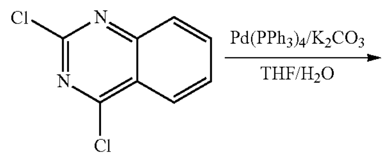

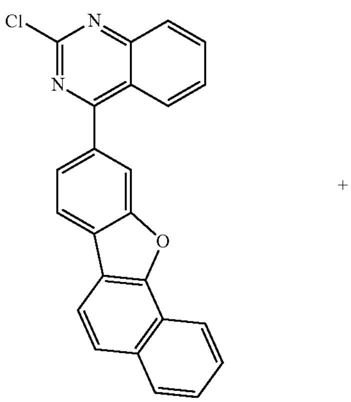

V-B

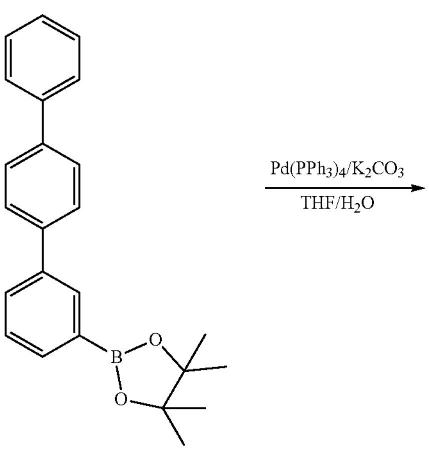

E

-continued

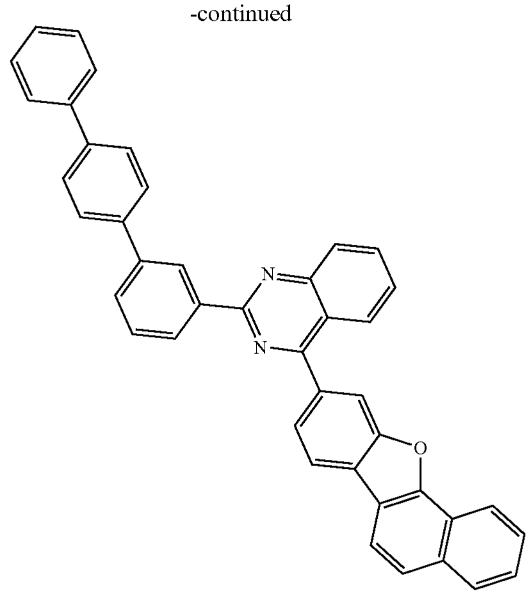

Synthesis of Intermediate V-B 8.0 g (21.01 mmol) of Intermediate V-A, 7.48 g (21.01 mmol) of 2,4-dichloroquinazoline, 0.73 g (0.63 mmol) of $Pd(PPh_3)_4$, and 5.81 g (42.01 mmol) of $K_2CO_3$ were suspended in 100 ml of THF and 50 ml of distilled water in a round-bottomed flask and then, synthesized according to the same method as Intermediate D to obtain 9.0 g (Yield=75%) of Intermediate V-B as a target compound.

Synthesis of Comparative Compound 1

9.0 g (23.63 mmol) of Intermediate V-B, 8.42 g (23.63 mmol) of Intermediate E, 0.82 g (0.71 mmol) of $Pd(PPh_3)_4$, and 6.53 g (47.27 mmol) of $K_2CO_3$ were suspended in 100 ml of THF and 50 ml of distilled water in a round-bottomed flask and then, synthesized according to the same method as Intermediate D to obtain 9.0 g (Yield=66%) of Comparative Compound 1 as a target compound.

LC-Mass (theoretical value: 574.67 g/mol, measured value: M+=574.55 g/mol)

Comparative Synthesis Example 2: Synthesis of Comparative Compound 2

[Comparative Compound 2]

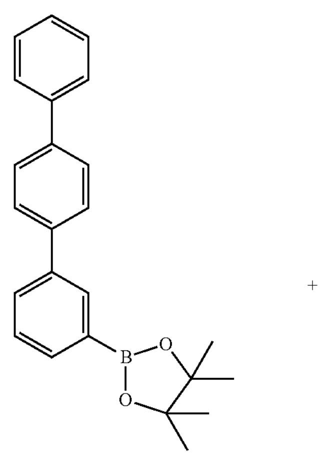

E

-continued

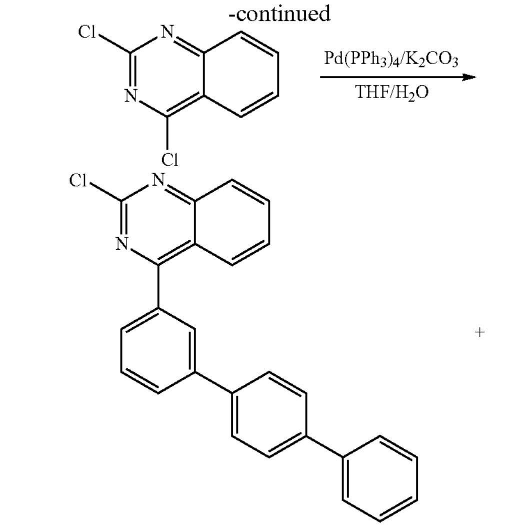

V-C

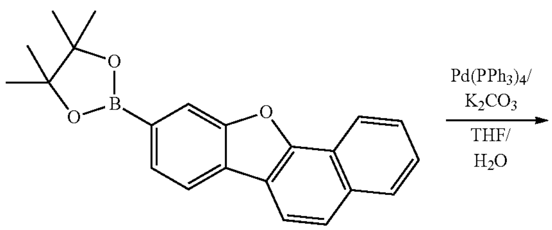

V-A

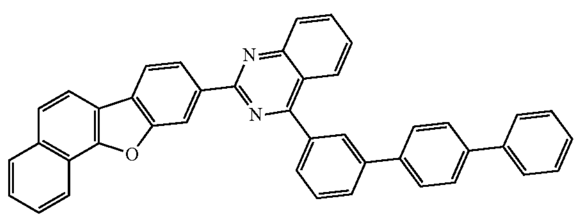

Synthesis of Intermediate V-C 20.0 g (56.14 mmol) of Intermediate E, 11.17 g (56.14 mmol) of 2,4-dichloroquinazoline, 1.95 g (1.68 mmol) of $Pd(PPh_3)_4$, and 15.52 g (112.27 mmol) of $K_2CO_3$ were suspended in 200 ml of THF and 100 ml of distilled water in a round-bottomed flask and then, synthesized according to the same method as Intermediate D to obtain 16.0 g (Yield=73%) of Intermediate V-C as a target compound.

Synthesis of Comparative Compound 2

10.0 g (25.45 mmol) of Intermediate V-C, 9.64 g (28.00 mmol) of Intermediate M, 0.88 g (0.76 mmol) of $Pd(PPh_3)_4$, and 7.04 g (50.91 mmol) of $K_2CO_3$ were suspended in 100 ml of THF and 50 ml of distilled water and then, synthesized according to the same method as Intermediate D to obtain 11.0 g (Yield=75%) of Comparative Compound 2 as a target compound.

LC-Mass (theoretical value: 574.67 g/mol, measured value: M+=574.57 g/mol)

Comparative Synthesis Example 3: Synthesis of Comparative Compound 3

[Comparative Compound 3]

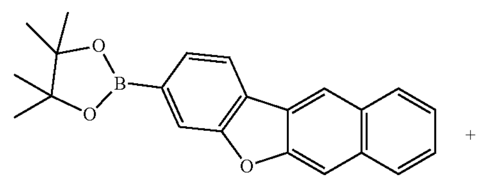

V-D

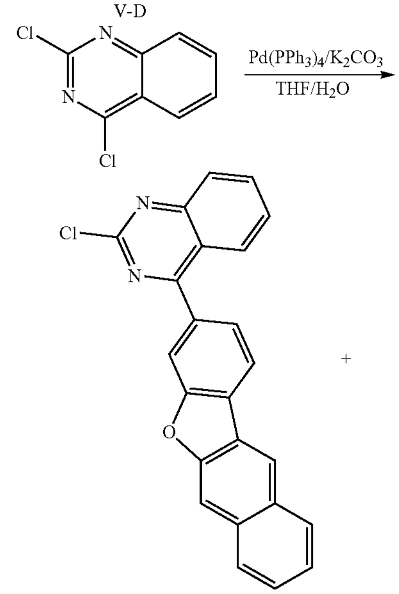

V-E

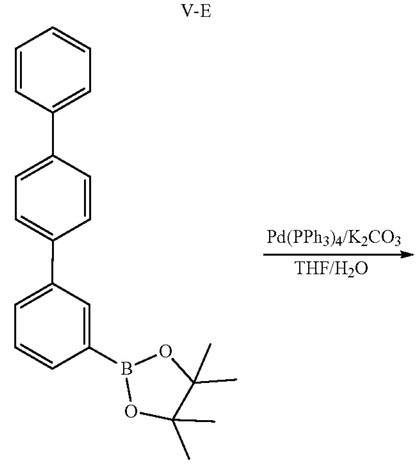

E

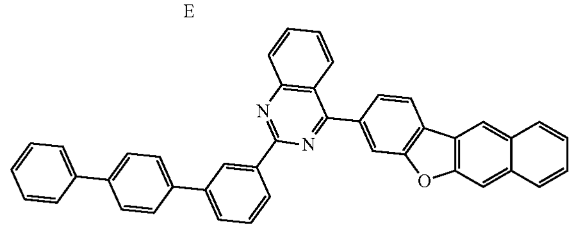

Synthesis of Intermediate V-E 10.0 g (29.05 mmol) of Intermediate V-D, 5.78 g (29.05 mmol) of 2,4-dichloroquinazoline, 1.01 g (0.87 mmol) of $Pd(PPh_3)_4$, and 8.03 g (58.10 mmol) of $K_2CO_3$ were suspended in 100 ml of THF and 50 ml of distilled water in a round-bottomed flask and then, synthesized according to the same method as Intermediate D to obtain 9.0 g (Yield=81%) of Intermediate V-E as a target compound.

Synthesis of Comparative Compound 3

9.0 g (23.63 mmol) of Intermediate V-E, 8.42 g (23.63 mmol) of Intermediate E, 0.82 g (0.71 mmol) of $Pd(PPh_3)_4$, and 6.53 g (47.27 mmol) of $K_2CO_3$ were suspended in 100 ml of THF and 50 ml of distilled water in a round-bottomed flask and then, synthesized according to the same method as Intermediate D to obtain 10.0 g (Yield=74%) of Comparative Compound 3 as a target compound.

LC-Mass (theoretical value: 574.67 g/mol, measured value: M+=574.62 g/mol)

(Manufacture of Organic Light Emitting Diode)

Red Light Emitting Diode

Example 1

A glass substrate coated with ITO (indium tin oxide) to have a thin-film thickness of 1500 Å was washed with distilled water. After washing with the distilled water, the glass substrate was ultrasonic wave-washed with a solvent such as isopropyl alcohol, acetone, methanol, and the like and dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, Compound B was deposited to be 50 Å thick on the injection layer, and Compound C was deposited to be 1020 Å thick to form a hole transport layer. Compound 74 of Synthesis Example 3 was used as a host on the hole transport layer and doped with 5 wt % of $[Ir(piq)_2acac]$ to form a 400 Å-thick light emitting layer by vacuum deposition. Compound 1 and Compound B-99 were used in a weight ratio of 3:7, and then a vacuum deposition of Compound D and Liq at a ratio of 1:1 at the same time was performed on the light emitting layer to form a 300 Å-thick electron transport layer and Liq 15 Λ and Al 1200 Å were sequentially vacuum-deposited on the electron transport layer to form a cathode, manufacturing an organic light emitting diode.

The organic light emitting diode has a structure having five organic thin film layers, specifically as follows.

- Compound A: N4,N4'-diphenyl-N4,N4'-bis (9-phenyl-9H-carbazol-3-yl)biphenyl-4,4'-diamine
- Compound B: 1,4,5,8,9,11-hexaazatriphenylene-hexacarbonitrile (HAT-CN),
- Compound C: N-(biphenyl-4-yl)-9,9-dimethyl-N-(4-(9-phenyl-9H-carbazol-3-yl)phenyl)-9H-fluoren-2-amine
- Compound D: 8-(4-(4,6-di(naphthalen-2-yl)-1,3,5-triazin-2-yl)phenyl)quinoline Examples 2 to 4

The organic light emitting diodes of Examples 2 to 4 were manufactured in the same method as in Example 1, except that Compounds 77, 78, and 89 were used instead of Compound 74, respectively.

Example 5

An organic light emitting diode was manufactured in the same method as in Example 1, except that Compound 74 and Compound B-99 were used as a host compound in the light emitting layer.

Examples 6 to 8

The organic light emitting diodes of Examples 6 to 8 were manufactured in the same method as in Example 5, except that Compounds 77, 78, and 89 were used instead of Compound 74, respectively.

Example 9

An organic light emitting diode was manufactured in the same method as in Example 1, except that Compound 3 and Compound E-46 were used as a host as the compound of the light emitting layer.

Examples 10 to 13

The organic light emitting diodes according to Examples 10 to 13 were manufactured according to the same method as in Example 9 except that Compounds 74, 77, 78, and 89 were respectively used instead of Compound 3 for the light emitting layer.

Comparative Examples 1 to 2

The organic light emitting diodes according to Examples 10 to 13 were manufactured according to the same method as in Example 1 except that Comparative Compounds 1 and 3 were respectively used instead of Compound 74 for the light emitting layer.

Comparative Example 3

The organic light emitting diode was manufactured according to the same method as in Example 1 except that Comparative compound 1 and Compound B-99 as a host were used instead of the compound of the light emitting layer.

Comparative Example 4

The organic light emitting diode was manufactured according to the same method as in Example 1 except that Comparative Compound 1 and Compound E-46 as a host were used instead of the compound of the light emitting layer.

Comparative Example 5 to 6

The organic light emitting diodes according to Examples 5 to 6 were manufactured according to the same method as in Comparative Example 4 except that Comparative Compounds 2 and 3 were respectively used instead of Comparative Compound 1 for the light emitting layer.

Evaluation

The luminous efficiency and life-span characteristics of the organic light emitting diodes according to Examples 1 to 13 and Comparative Examples 1 to 6 were evaluated. Specific measurement methods are as follows, and the results are shown in Table 1.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000 A), while the voltage of the organic light emitting diodes was increased from 0 V to 10 V.

(3) Measurement of Luminous Efficiency

Current efficiency (cd/A) at the same current density (10 $mA/cm^2$) were calculated by using the luminance, current density, and voltages (V) from the items (1) and (2).

(4) Measurement of Life-Span

T97 life-spans of the organic light emitting diodes according to Example 1 to 9 and Comparative Examples 1 to Comparative Example 4 were measured as a time when their luminance decreased to 97% relative to the initial luminance ($cd/m^2$) after emitting light with 9000 $cd/m^2$ as the initial luminance ($cd/m^2$) and measuring their luminance decrease depending on a time with a Polanonix life-span measurement system.

(5) Measurement of Driving Voltage

A driving voltage of each diode was measured using a current-voltage meter (Keithley 2400) at 15 $mA/cm^2$ to obtain the results.

TABLE 1

| Red device | First host | Second host | Efficiency Cd/A | Life-span (T97, h) | Driving voltage (V) |
|---|---|---|---|---|---|
| Example 1 | Compound 74 | — | 20.4 | 64 | 4.21 |
| Example 2 | Compound 77 | — | 20.1 | 47 | 4.20 |
| Example 3 | Compound 78 | — | 20.2 | 50 | 4.23 |
| Example 4 | Compound 89 | — | 21.1 | 72 | 4.13 |
| Comparative Example 1 | Comparative Compound 1 | — | 19.1 | 20 | 4.28 |
| Comparative Example 2 | Comparative Compound 3 | — | 17.5 | 10 | 4.36 |
| Example 5 | Compound 74 | Compound B-99 | 21.2 | 98 | 4.02 |
| Example 6 | Compound 77 | Compound B-99 | 21.6 | 105 | 3.97 |
| Example 7 | Compound 78 | Compound B-99 | 21.5 | 100 | 4.00 |
| Example 8 | Compound 89 | Compound B-99 | 21.8 | 110 | 3.92 |
| Example 9 | Compound 3 | Compound E-46 | 21.0 | 80 | 4.05 |
| Example 10 | Compound 74 | Compound E-46 | 22.2 | 110 | 3.89 |
| Example 11 | Compound 77 | Compound E-46 | 21.4 | 107 | 3.86 |
| Example 12 | Compound 78 | Compound E-46 | 21.3 | 102 | 3.95 |
| Example 13 | Compound 89 | Compound E-46 | 22.4 | 111 | 3.85 |
| Comparative Example 3 | Comparative Compound 1 | Compound B-99 | 19.5 | 38 | 4.12 |
| Comparative Example 4 | Comparative Compound 1 | Compound E-46 | 20.1 | 40 | 4.08 |
| Comparative Example 5 | Comparative Compound 2 | Compound E-46 | 19.6 | 35 | 4.15 |
| Comparative Example 6 | Comparative Compound 3 | Compound E-46 | 18.0 | 20 | 4.2 |

Referring to Table 1, the organic light emitting diodes according to Examples 1 to 4 exhibited simultaneously improved luminous efficiency and life-span characteristics and particularly, a superbly improved life-span, compared with the organic light emitting diodes according to Comparative Examples 1 and 2.

Referring to Table 1, the organic light emitting diodes according to Examples 5 to 13 exhibited improved luminous efficiency and life-span characteristics simultaneously and particularly, a superbly improved life-span compared with the organic light emitting diodes according to Comparative Examples 3 and 6. In addition, when the compounds as a host was mixed with a second host having strong hole characteristics, hole/electron movement characteristics were balanced, and efficiency and life-span characteristics were improved compared with when used as a single host.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

DESCRIPTION OF SYMBOLS

100, 200: organic light emitting diode
105: organic layer
110: cathode
120: anode
130: light emitting layer
140: hole auxiliary layer

The invention claimed is:

1. A compound for an organic photoelectronic element represented by a combination of Chemical Formula 1 and Chemical Formula 2:

[Chemical Formula 1]

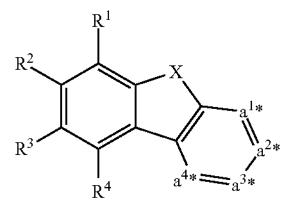

[Chemical Formula 2]

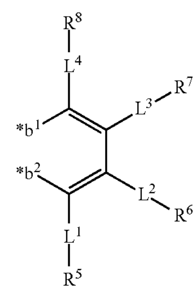

wherein, in Chemical Formula 1 and Chemical Formula 2,

X is O, S, or $CR^aR^b$, adjacent two of $a^{1*}$, $a^{2*}$, $a^{3*}$, and $a^{4*}$ are C and binding portions with $*b^1$ and $*b^2$, two of $a^{1*}$, $a^{2*}$, $a^{3*}$, and $a^{4*}$ that are not bound to $*b^1$ and $*b^2$ are independently $CR^c$, $R^1$ to $R^4$, $R^a$, $R^b$, and $R^C$ are independently hydrogen, deuterium, a cyano group, a substituted or unsubstituted C1 to C30 silyl group, a substituted or unsubstituted C1 to C30 alkyl group, or a substituted or unsubstituted C6 to C30 aryl group, $L^1$ to $L^4$ are independently a single bond, a substituted or unsubstituted C6 to C30 arylene group or a quinazolinylene group, $R^5$ to $R^8$ are independently hydrogen, deuterium, a cyano group, a substituted or unsubstituted C1 to C30 silyl group, a substituted or unsubstituted C1 to C30 alkyl group, a substituted or unsubstituted C6 to C30 aryl group, an oxygen-containing C2 to C30 heterocyclic group, or a sulfur-containing C2 to C30 heterocyclic group, and at least one of $L^1$ to $L^4$ is a quinazolinylene group or at least one of $R^5$ to $R^8$ is a substituted or unsubstituted quinazolinyl group, wherein the "substituted" refers to replacement of at least one hydrogen by deuterium, a C1 to C10 alkyl group, a C6 to C30 aryl group, a C2 to C20 heterocycle, or a cyano group.

2. The compound of claim 1, which is represented by Chemical Formula 1A:

[Chemical Formula 1A]

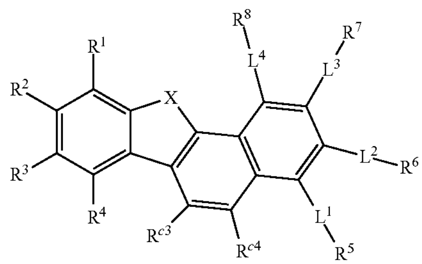

wherein, in Chemical Formula 1A,

X is O, S, or $CR^aR^b$, $R^1$ to $R^4$, $R^a$, $R^{c3}$, and $R^{c4}$ are independently hydrogen, deuterium, a cyano group, a substituted or unsubstituted C1 to C30 silyl group, a substituted or unsubstituted C1 to C30 alkyl group, or a substituted or unsubstituted C6 to C30 aryl group, $L^1$ to $L^4$ are independently a single bond or a substituted or unsubstituted C6 to C30 arylene group or a quinazolinylene group, $R^5$ to $R^8$ are independently hydrogen, deuterium, a cyano group, a substituted or unsubstituted C1 to C30 silyl group, a substituted or unsubstituted C1 to C30 alkyl group, a substituted or unsubstituted C6 to C30 aryl group, an oxygen-containing C2 to C30 heterocyclic group, or a sulfur-containing C2 to C30 heterocyclic group, and at least one of $R^5$ to $R^8$ is a substituted or unsubstituted quinazolinyl group, wherein the "substituted" refers to replacement of at least one hydrogen by deuterium, a C1 to C10 alkyl group, a C6 to C30 aryl group, or a C2 to C20 heterocyclic group.

3. The compound of claim 1, which is represented by Chemical Formula 1A-a:

[Chemical Formula 1A-a]

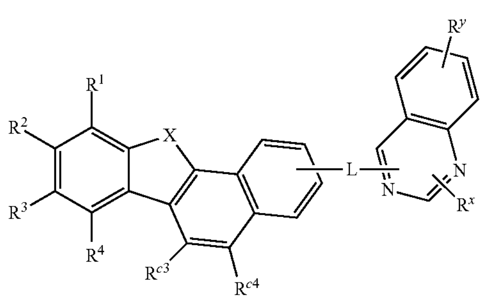

wherein, in Chemical Formula 1A-a,

X is O, S, or $CR^aR^b$, $R^1$ to $R^4$, $R^a$, $R^b$, $R^{c3}$, and $R^{c4}$ are independently hydrogen, deuterium, or a substituted or unsubstituted C1 to C30 alkyl group, L is a single bond, a substituted or unsubstituted C6 to C30 arylene group or a quinazolinylene group, and $R^x$ and $R^y$ are independently hydrogen, deuterium, a cyano group, a substituted or unsubstituted C1 to C30 alkyl group, a substituted or unsubstituted C6 to C30 aryl group, an oxygen-containing C2 to C30 heterocyclic group, or a sulfur-containing C2 to C30 heterocyclic group.

4. The compound of claim 1, which is represented by one of Chemical Formula 1A-a-1 to Chemical Formula 1A-a-8:

[Chemical Formula 1A-a-1]

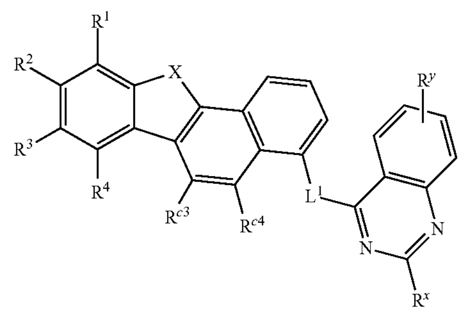

[Chemical Formula 1A-a-2]

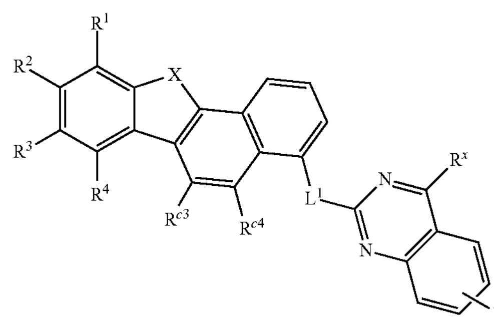

[Chemical Formula 1A-a-3]

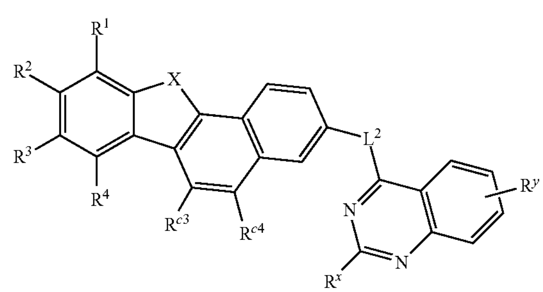

[Chemical Formula 1A-a-4]

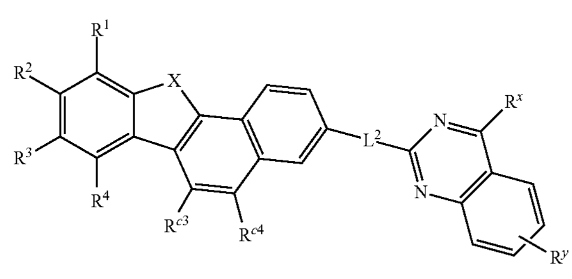

-continued

[Chemcial Formula 1A-a-5]

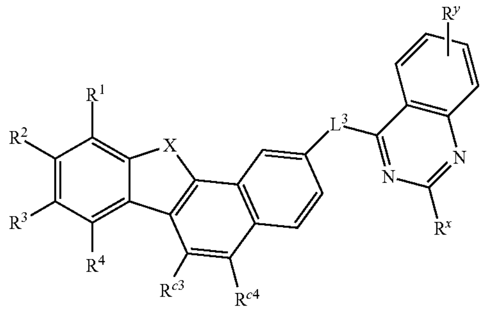

[Chemical Formula 1A-a-6]

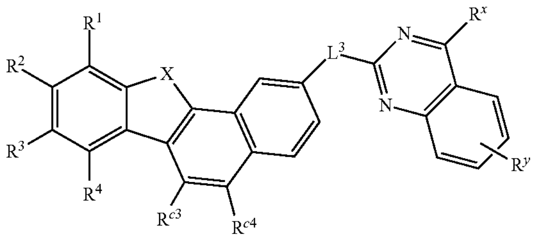

[Chemical Formula 1A-a-7]

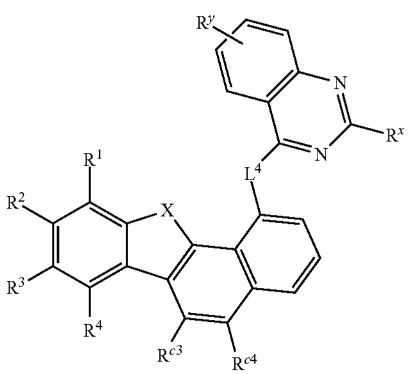

[Chemical Formula 1A-a-8]

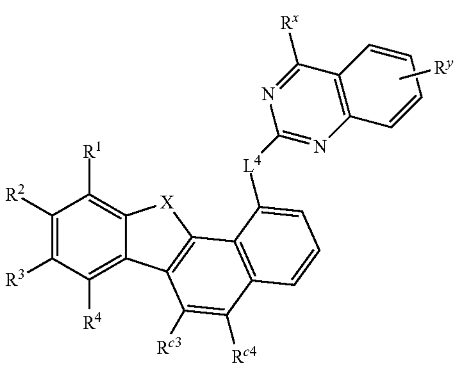

wherein, in Chemical Formula 1A-a-1 to Chemical Formula 1A-a-8,

X is O, S, or $CR^aR^b$, $R^1$ to $R^4$, $R^a$, $R^{c3}$, and $R^{c4}$ are independently hydrogen, deuterium, or a substituted or unsubstituted C1 to C30 alkyl group, $L^1$ to $L^4$ are independently a single bond, a substituted or unsubstituted C6 to C30 arylene group or a quinazolinylene group, and $R^x$ and $R^y$ are independently hydrogen, deuterium, a cyano group, a substituted or unsubstituted C1 to C30 alkyl group, a substituted or unsubstituted C6 to C30 aryl group, an oxygen-containing C2 to C30 heterocyclic group, or a sulfur-containing C2 to C30 heterocyclic group.

5. The compound of claim 4, wherein the $R^x$ and $R^y$ are independently hydrogen, deuterium, a cyano group, a substituted or unsubstituted C6 to C30 aryl group, an oxygen-containing C2 to C30 heterocyclic group, or a sulfur-containing C2 to C30 heterocyclic group.

6. A composition for an organic photoelectronic element, the composition comprising:

a first compound, the first compound being the compound for an organic photoelectronic element as claimed in claim 1; and a second compound comprising a compound represented by Chemical Formula 2' or a compound consisting of a moiety represented by Chemical Formula 3 and a moiety represented by Chemical Formula 4:

[Chemical Formula 2']

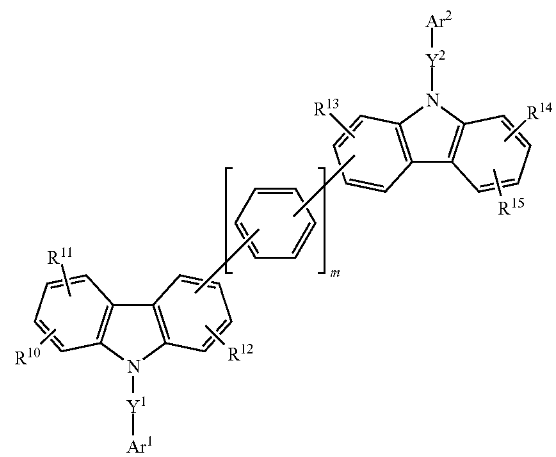

wherein in Chemical Formula 2', $Y^1$ and $Y^2$ are independently a single bond, a substituted or unsubstituted C6 to C30 arylene group, a substituted or unsubstituted C2 to C30 heteroarylene group, or a combination thereof, $Ar^1$ and $Ar^2$ are independently a substituted or unsubstituted C6 to C30 aryl group, a substituted or unsubstituted C2 to C30 heterocyclic group, or a combination thereof, $R^{10}$ to $R^{15}$ are independently hydrogen, deuterium, a substituted or unsubstituted C1 to C20 alkyl group, a substituted or unsubstituted C6 to C30 aryl group, a substituted or unsubstituted C2 to C50 heterocyclic group, or a combination thereof, and m is one of integers from 0 to 2;

[Chemical Formula 3]

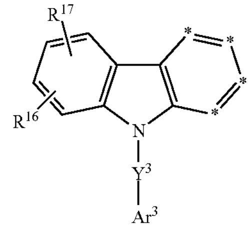

-continued

[Chemical Formula 4]

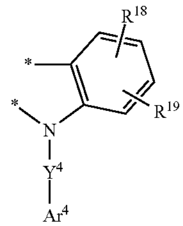

wherein, in Chemical Formulae 3 and 4, $Y^3$ and $Y^4$ are independently a single bond, a substituted or unsubstituted C6 to C30 arylene group, a substituted or unsubstituted C2 to C30 heteroarylene group, or a combination thereof, $Ar^3$ and $Ar^4$ are independently a substituted or unsubstituted C6 to C30 aryl group, a substituted or unsubstituted C2 to C30 heterocyclic group, or a combination thereof, $R^{16}$ to $R^{19}$ are independently hydrogen, deuterium, a substituted or unsubstituted C1 to C20 alkyl group, a substituted or unsubstituted C6 to C50 aryl group, a substituted or unsubstituted C2 to C50 heterocyclic group, or a combination thereof, adjacent two *'s of Chemical Formula 3 are linked with two *'s of Chemical Formula 4 to form a fused ring, and *'s which do not form a fused ring in Chemical Formula 3 are independently $CR^a$, and $R^a$ is hydrogen, deuterium, a substituted or unsubstituted C1 to C10 alkyl group, a substituted or unsubstituted C6 to C12 aryl group, a substituted or unsubstituted C2 to C12 heterocyclic group, or a combination thereof;

wherein, in Chemical Formulae 2', 3, and 4, the "substituted" refers to replacement of at least one hydrogen by deuterium, a C1 to C4 alkyl group, a C6 to C18 aryl group, or a C2 to C18 heteroaryl group.

7. The composition of claim 6, wherein:

the second compound is represented by Chemical Formula 2', and $Ar^1$ and $Ar^2$ of Chemical Formula 2' are independently a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted pyridinyl group, a substituted or unsubstituted pyrimidinyl group, a substituted or unsubstituted quinazolyl group, a substituted or unsubstituted isoquinazolyl group, a substituted or unsubstituted dibenzothiophenyl group, a substituted or unsubstituted dibenzofuranyl group, a substituted or unsubstituted carbazolyl group, a substituted or unsubstituted fluorenyl group, or a combination thereof.

8. The composition of claim 6, wherein:

the second compound is the compound consisting of the combination of the moiety represented by Chemical Formula 3 and the moiety represented by Chemical Formula 4, and the compound consisting of the combination of the moiety represented by Chemical Formula 3 and the moiety represented by Chemical Formula 4 is represented by at least one of Chemical Formulae 3-I to 3-V:

[Chemical Formula 3-I]

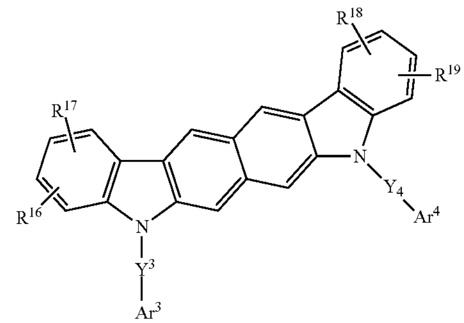

[Chemical Formula 3-II]

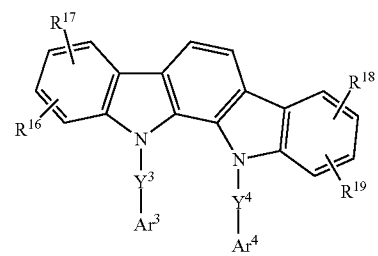

[Chemical Formula 3-III]

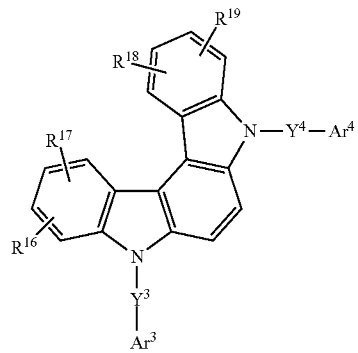

[Chemical Formula 3-IV]

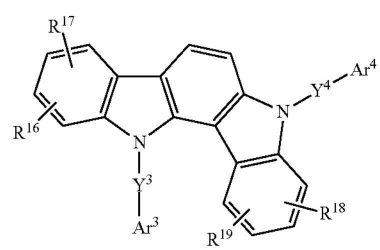

[Chemical Formula 3-V]

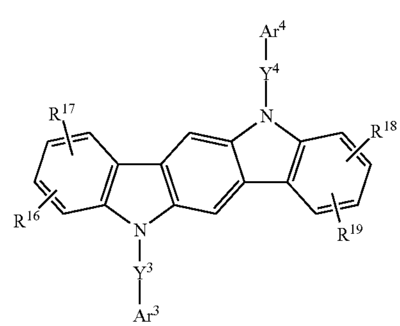

wherein, in Chemical Formulae 3-I to 3-V, $Y^3$ and $Y^4$ are as single bond, a phenylene group, a biphenylene group, a pyridylene group, or a pyrimidinylene group, $Ar^1$ and $Ar^4$ are a substituted or unsubstituted phenyl group, a substituted or unsubstituted biphenyl group, a substituted or unsubstituted pyridyl group, a substituted or unsubstituted pyrimidinyl group, or a substituted or unsubstituted triazinyl group, and $R^{16}$ to $R^{19}$ are hydrogen.

9. An organic photoelectronic element, comprising:

an anode and a cathode facing each other, and at least one organic layer disposed between the anode and the cathode, wherein the organic layer comprises the composition for the organic photoelectronic element according to claim 6.

10. The organic photoelectronic element of claim 9, wherein:

the organic layer comprises a light emitting layer, wherein the light emitting layer comprises the composition for the organic photoelectronic element.

11. A display device comprising the organic photoelectronic element of claim 9.

12. The composition of claim 6, wherein:

the second compound is represented by Chemical Formula 2', and

Chemical Formula 2' is one of the structures of Group III and *—$Y^1$—$Ar^1$ and *—$Y^2$—$Ar^2$ is one of the substituents of Group IV:

[Group III]

C-1

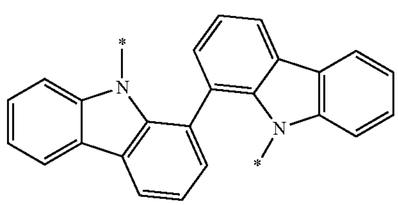

C-2

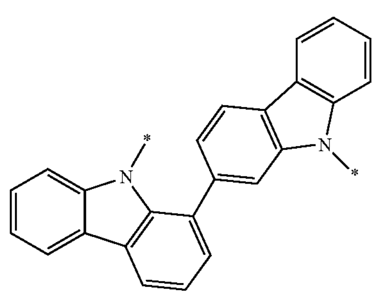

C-3

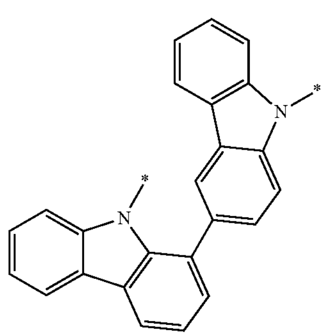

-continued

C-4

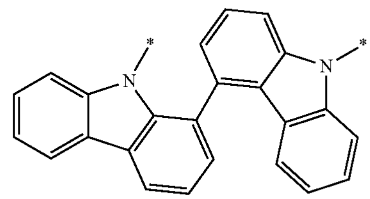

C-5

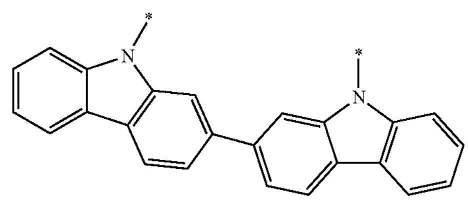

C-6

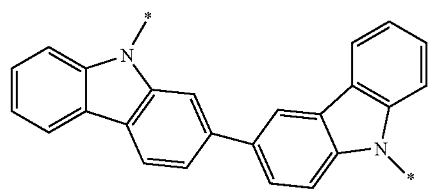

C-7

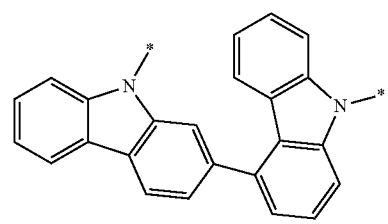

C-8

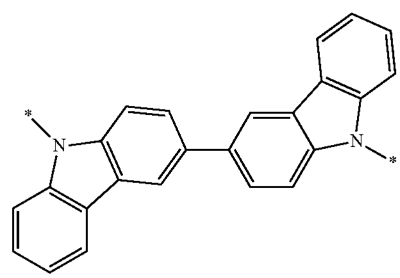

C-9

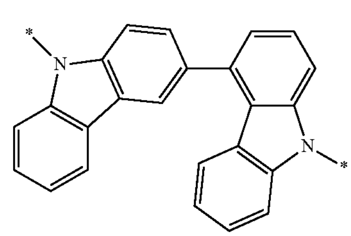

C-10

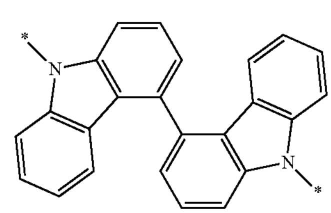

-continued
C-11
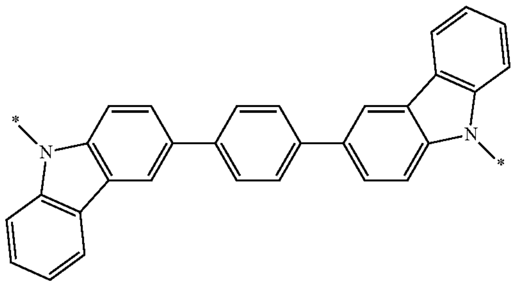
C-12
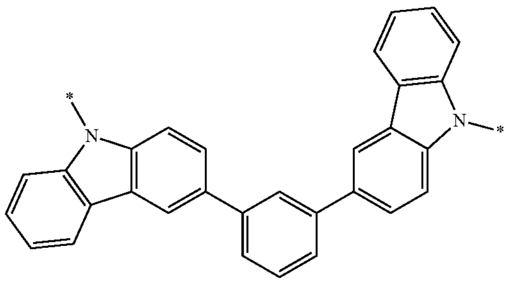
C-13
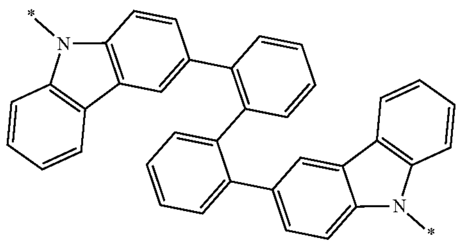
C-14
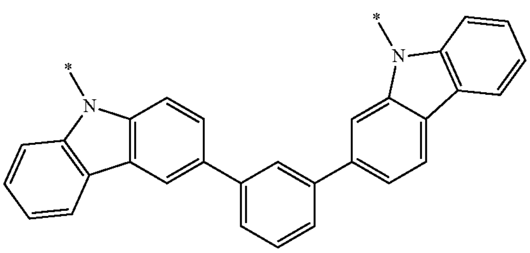
C-15
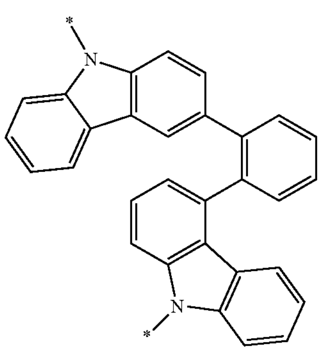
-continued
C-16
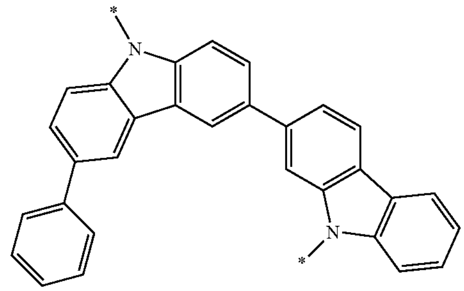
C-17
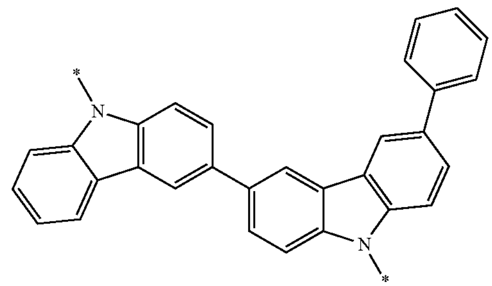
C-18
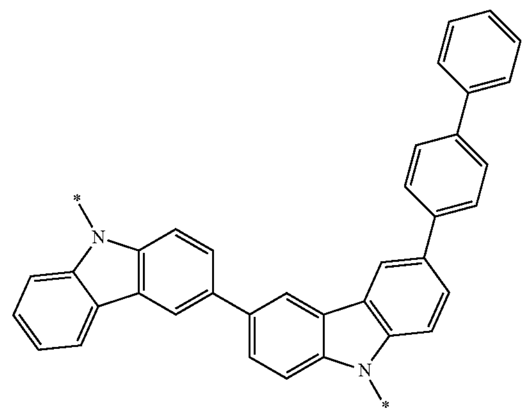
[Group IV]
B-1
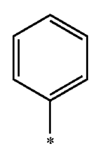
B-2
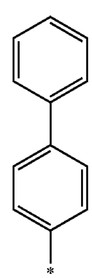

B-3
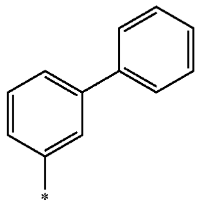
B-4
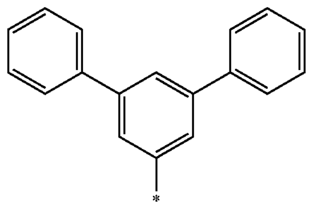
B-5
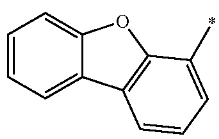
B-6
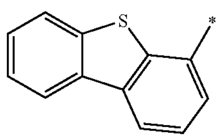
B-7
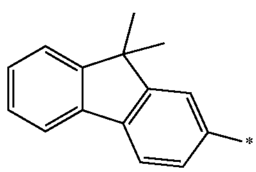
B-8
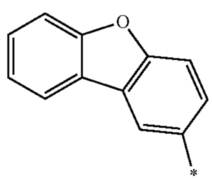
B-9
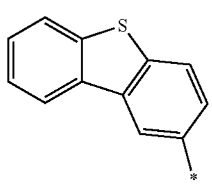
B-10
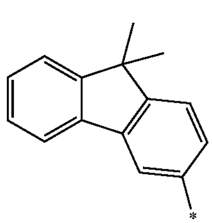
B-11
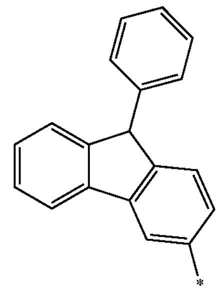
B-12
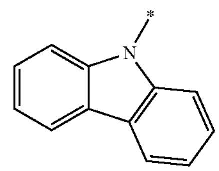
B-13
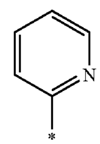
B-14
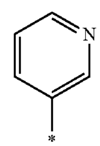
B-15
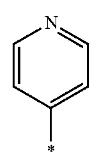
B-16
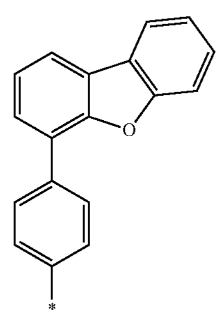
B-17
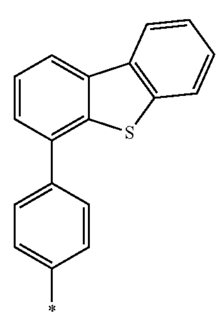

-continued

B-18

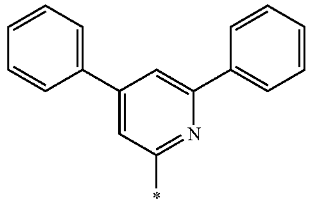

B-19

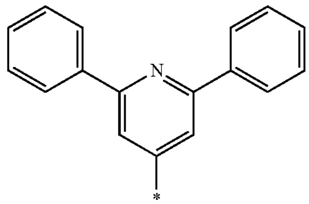

B-20

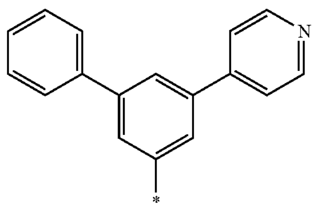

B-21

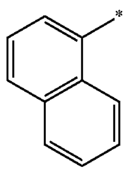

B-22

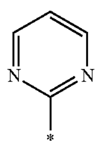

B-23

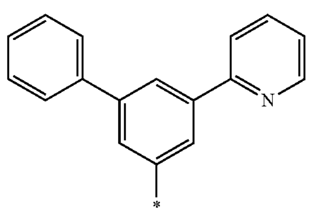

B-24

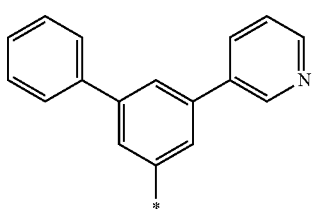

B-25

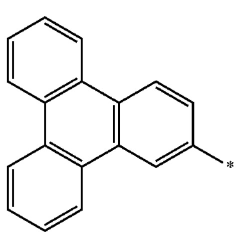

-continued

B-26

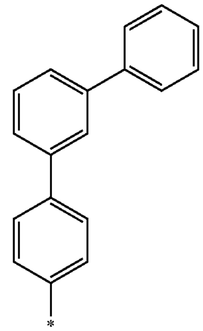

B-27

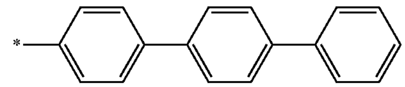

B-28

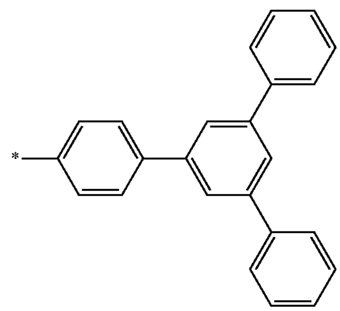

wherein, in Group III and Group IV, * is a linking point.

13. The composition of claim 12, wherein Chemical Formula 2' is represented by C-8 of Group III and *—$Y^1$—$Ar^1$ and *—$Y^2$—$Ar^2$ are independently one of B-1 to B-4 of Group IV.

14. An organic photoelectronic element, comprising:

an anode and a cathode facing each other, and at least one organic layer disposed between the anode and the cathode, wherein the organic layer comprises the compound for the organic photoelectronic element according to claim 1.

15. The organic photoelectronic element of claim 14, wherein:

the organic layer comprises a light emitting layer, wherein the light emitting layer comprises the compound for the organic photoelectronic element.

16. The organic photoelectronic element of claim 15, wherein the compound for the organic photoelectronic element is a host of the light emitting layer.

17. The organic photoelectronic element of claim 15, wherein:

the organic layer comprises a light emitting layer; and at least one auxiliary layer selected from an electron transport layer, an electron injection layer, and a hole blocking layer, wherein the auxiliary layer comprises the compound for the organic photoelectronic element.

18. The organic photoelectronic element of claim 15, wherein the organic layer comprises a light emitting layer; and at least one auxiliary layer selected from an electron transport layer, an electron injection layer, and a hole blocking layer, wherein the auxiliary layer comprises the composition for the organic photoelectronic element.

19. A display device comprising the organic photoelectronic element of claim 14.
20. The compound of claim 1, which is selected from compounds of Group 1:
1
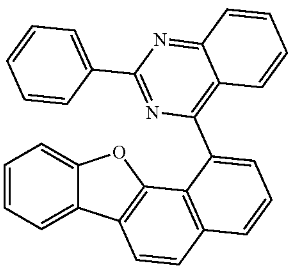
2
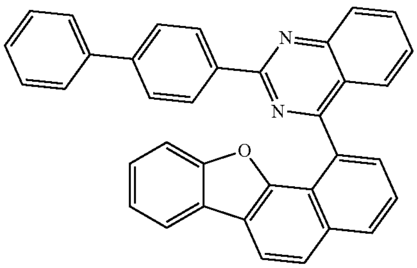
3
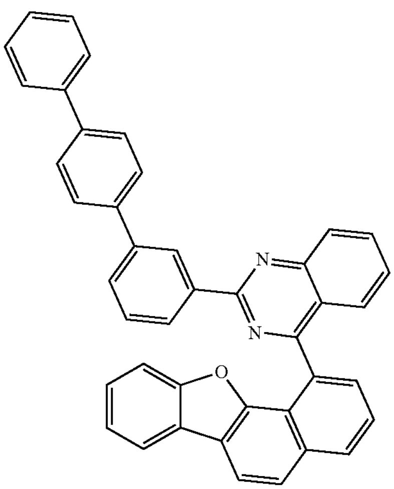
4
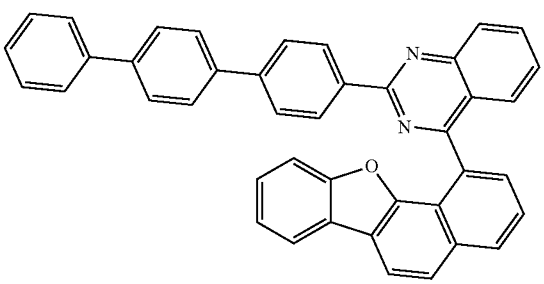
-continued
5
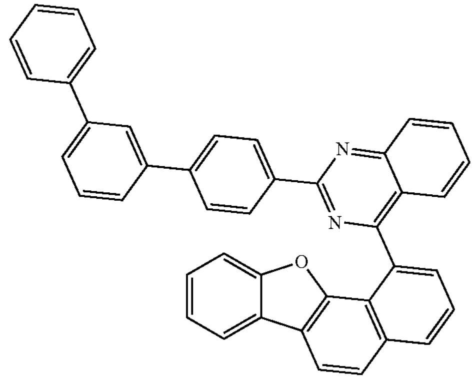
6
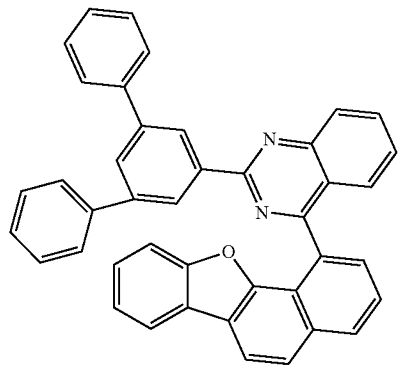
7
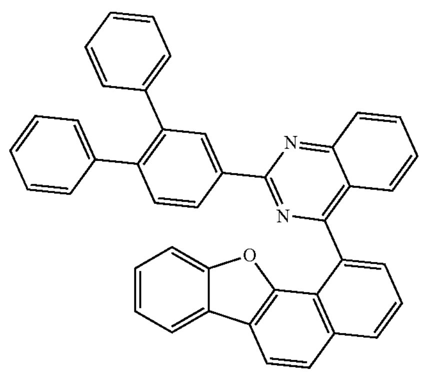
8
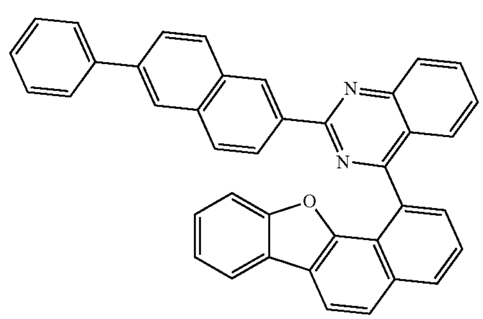

-continued
9
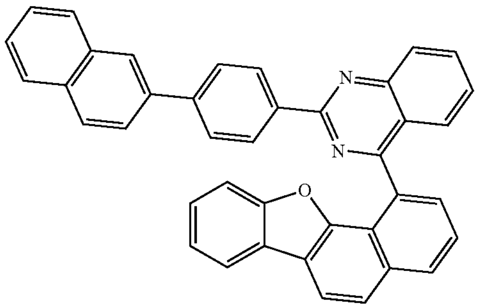
10
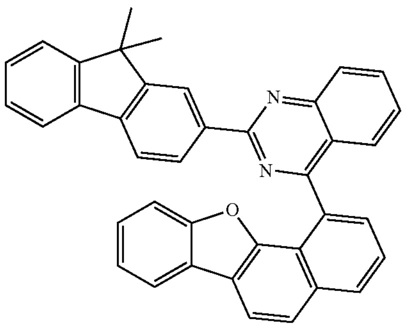
11
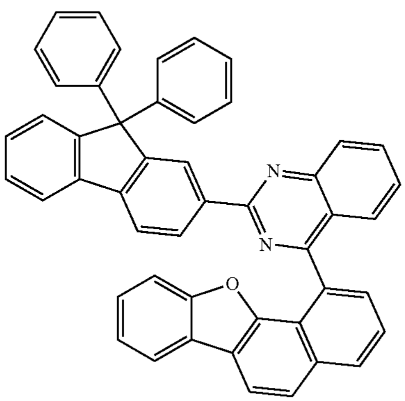
12
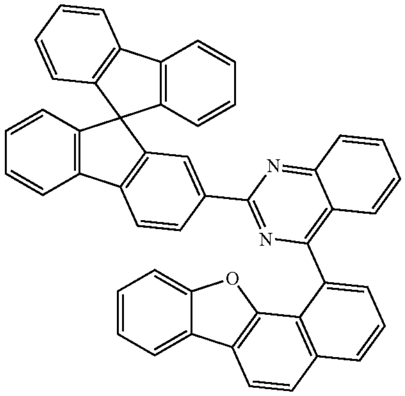
-continued
13
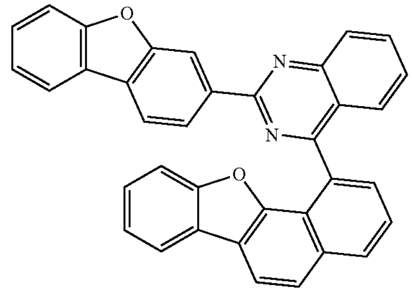
14
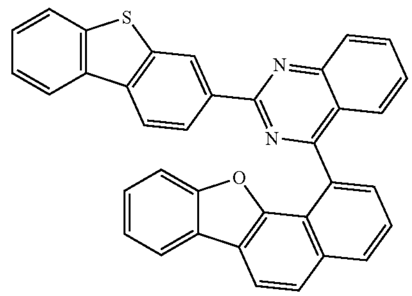
15
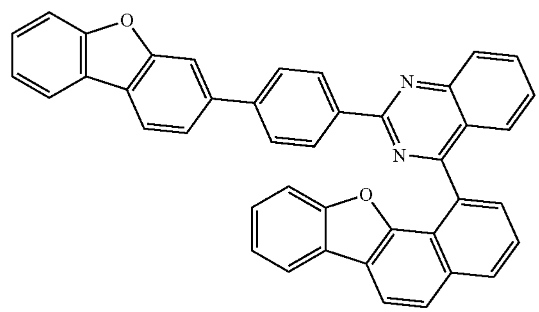
16
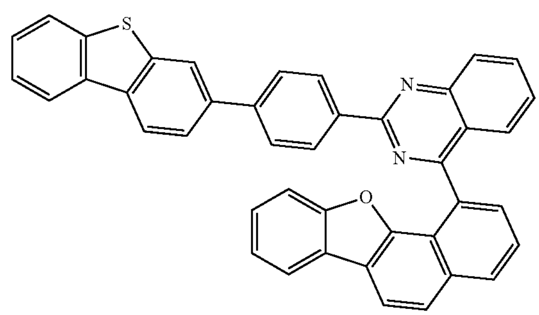
17
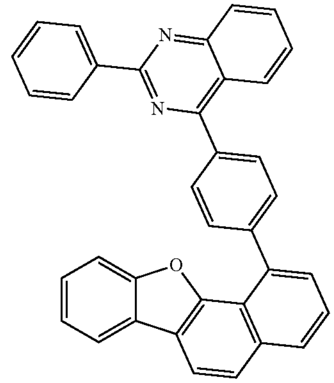

18
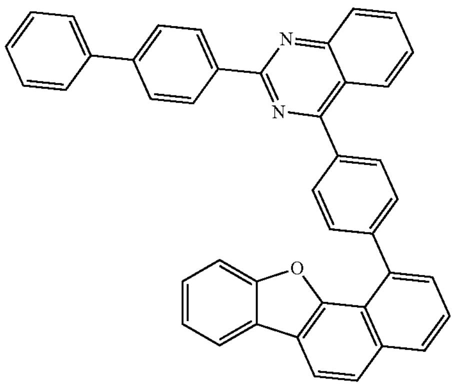
19
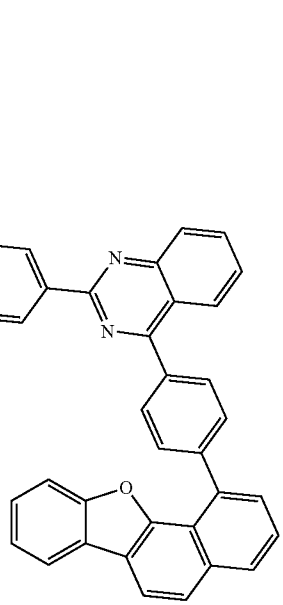
20
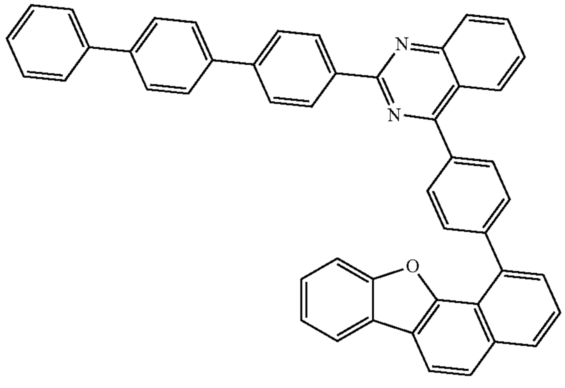
21
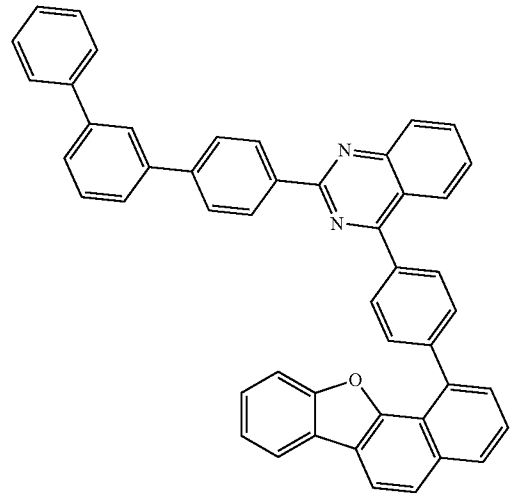
22
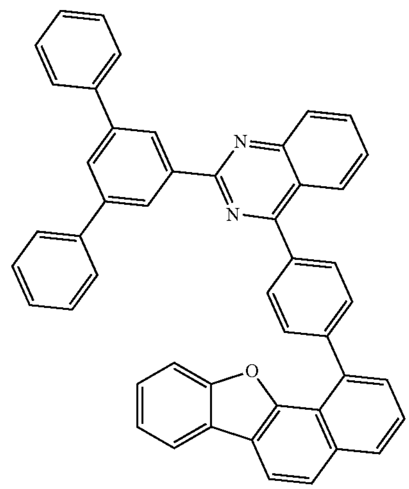
23
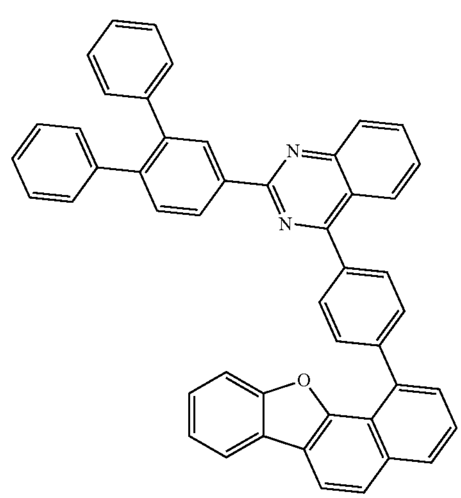

24
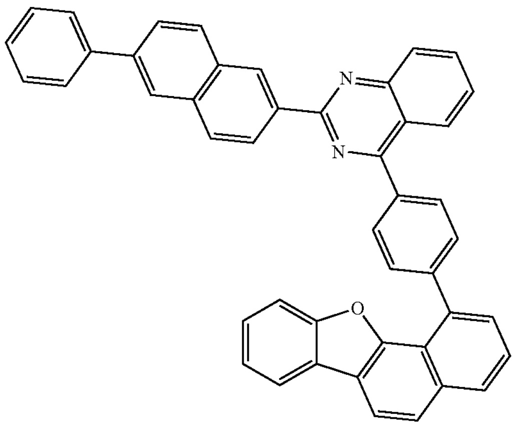
25
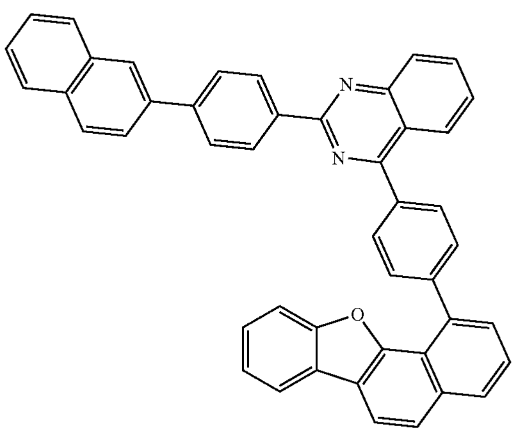
26
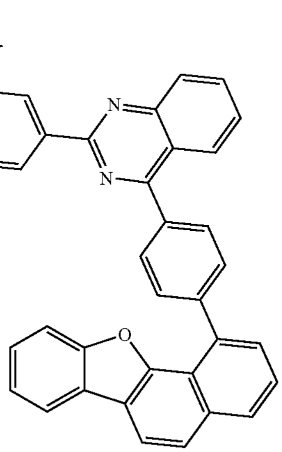
27
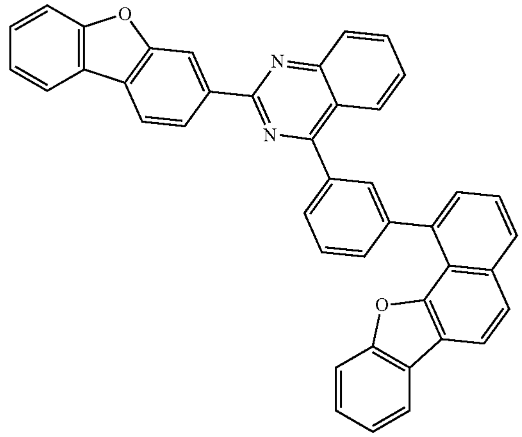
28
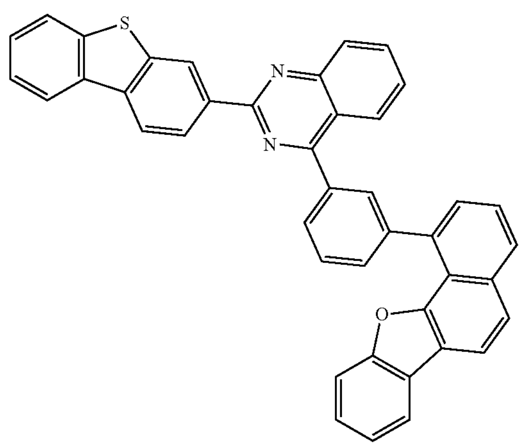
29
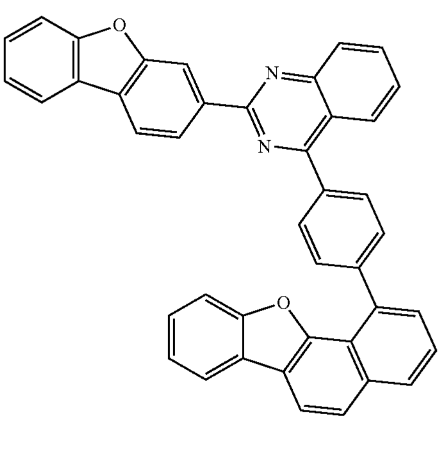

30
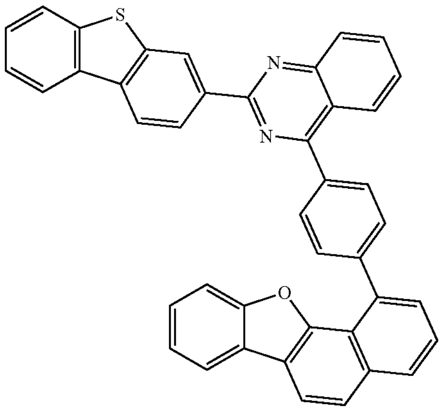
31
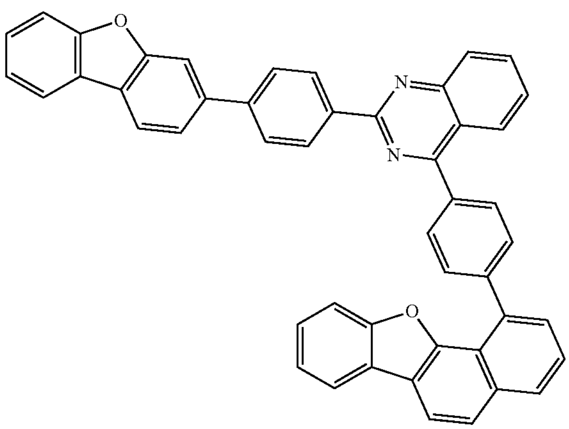
32
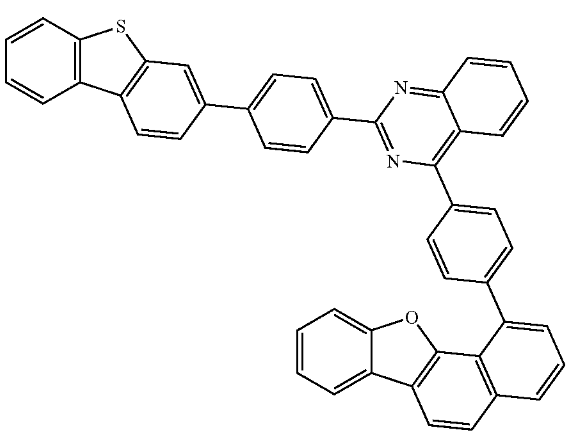
33
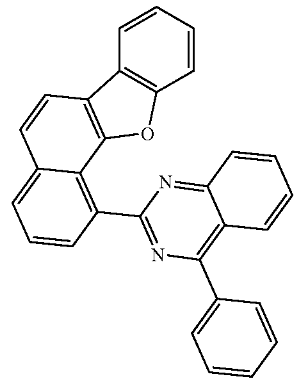
34
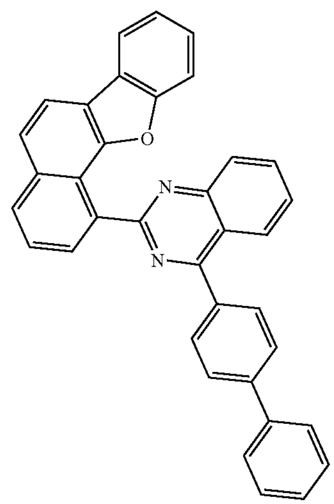
35
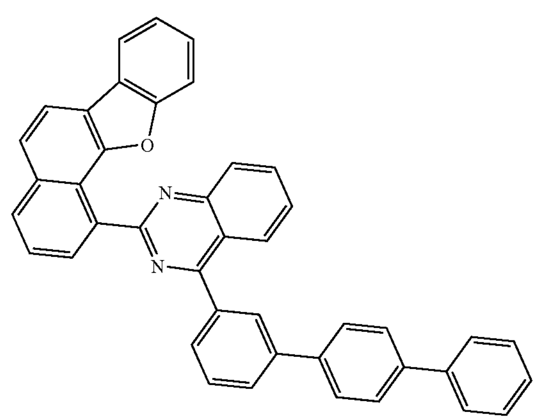

-continued
36
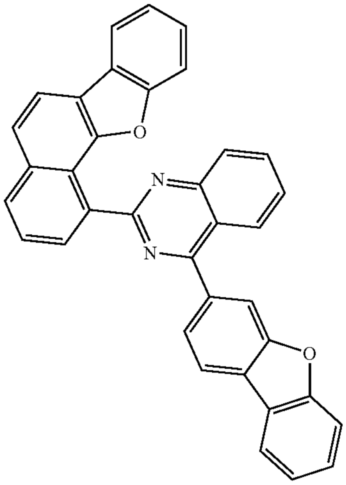
37
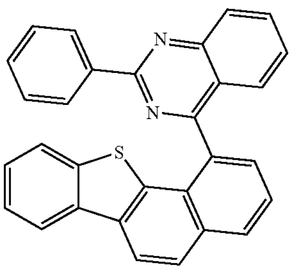
38
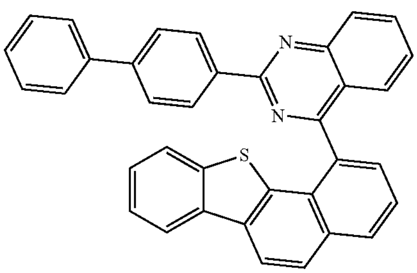
39
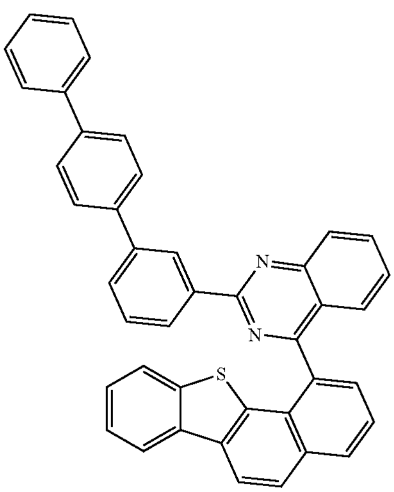
-continued
40
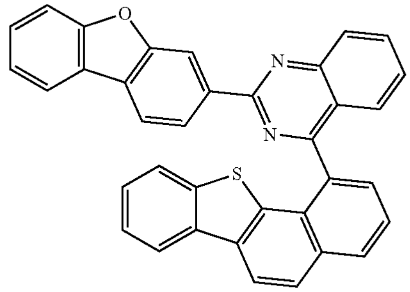
41
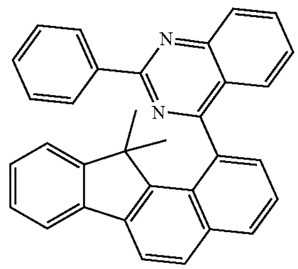
42
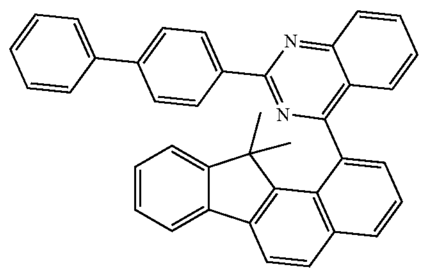
43
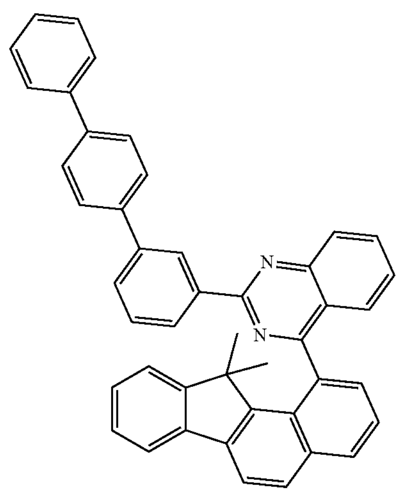
44
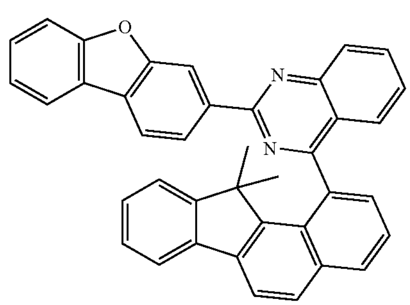

-continued
45
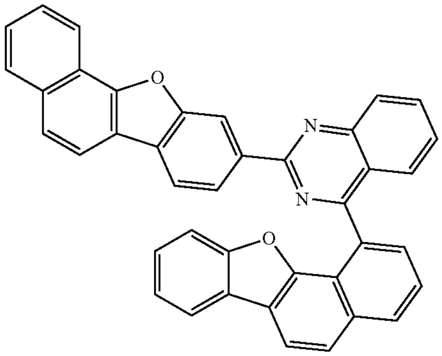
46
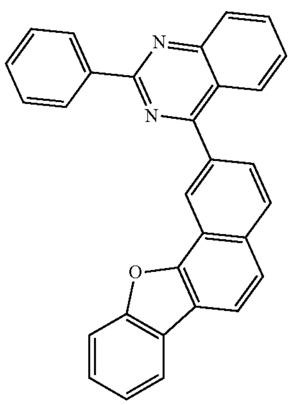
47
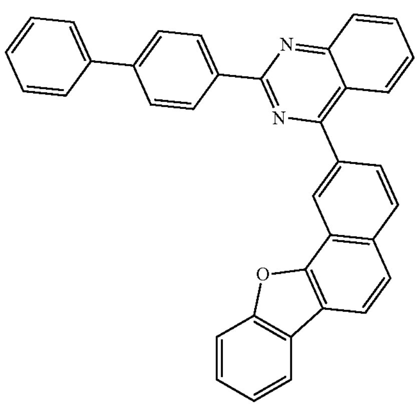
-continued
48
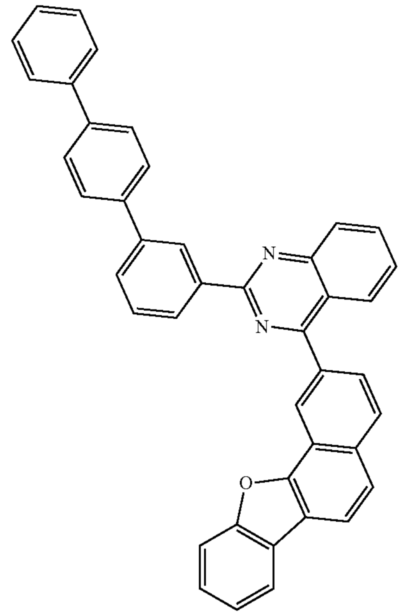
49
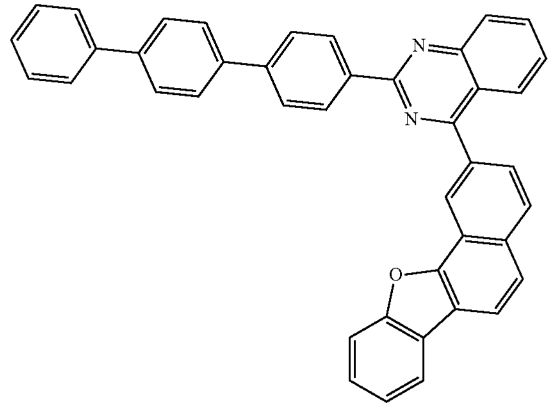
50
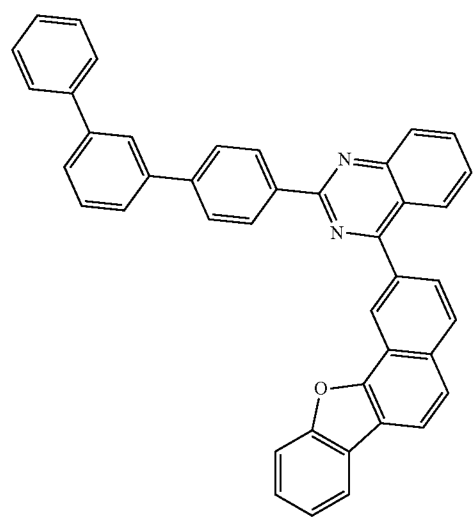

-continued
51
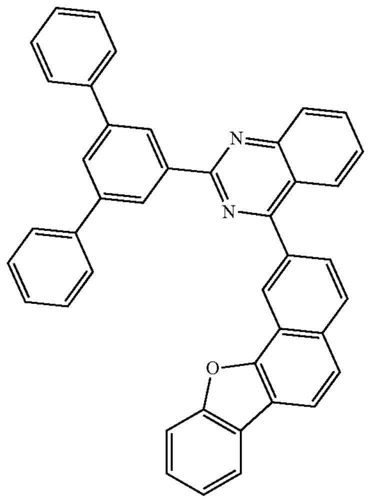
52
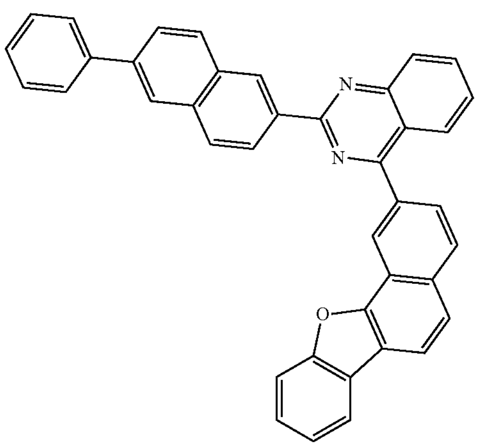
53
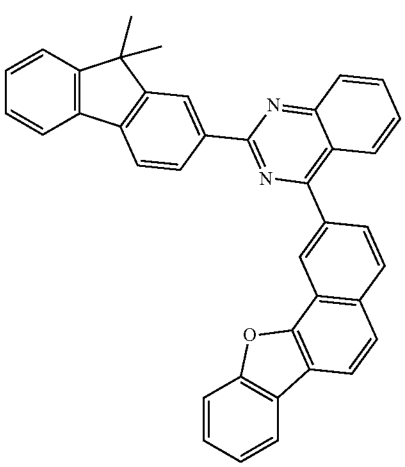
-continued
54
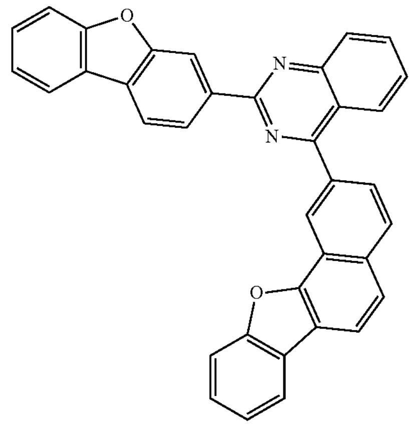
55
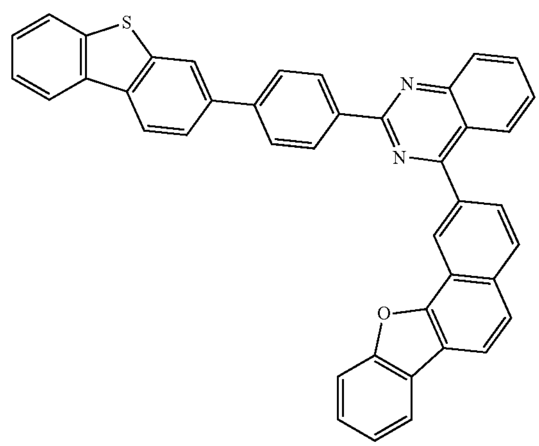
56
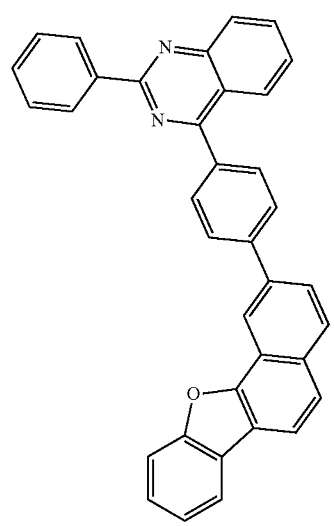

57
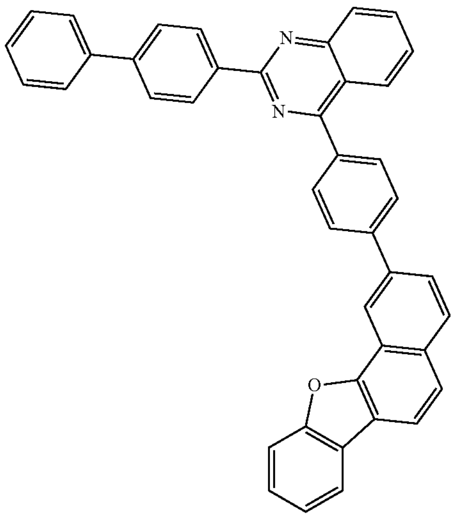
58
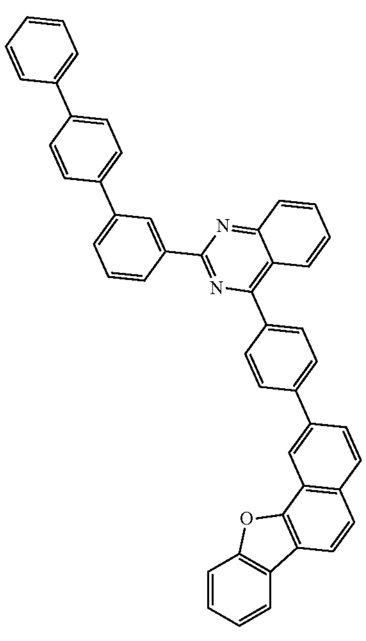
59
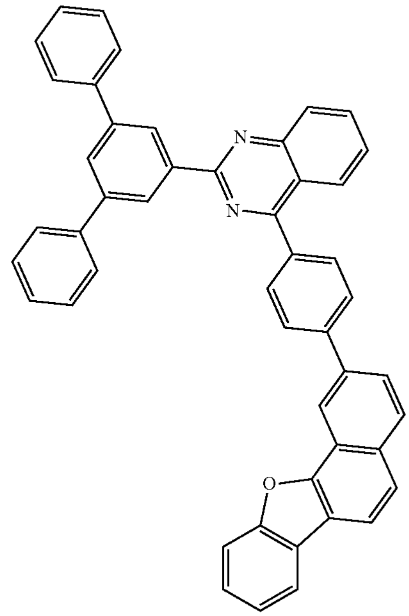
60
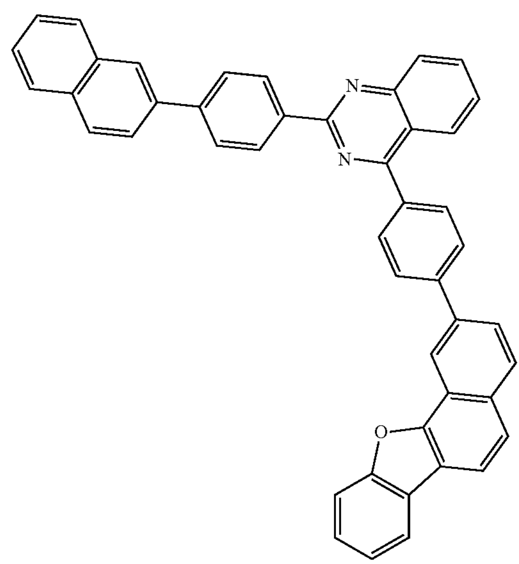

-continued
61
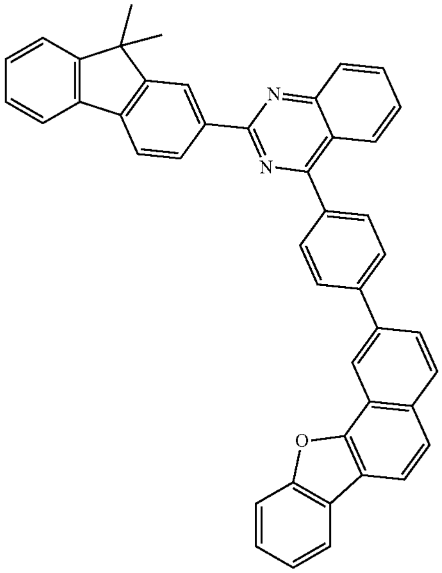
62
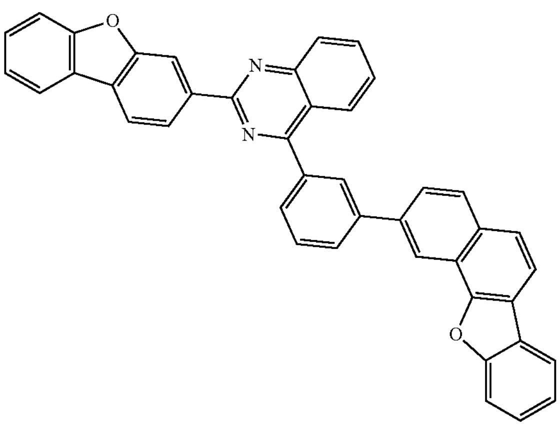
63
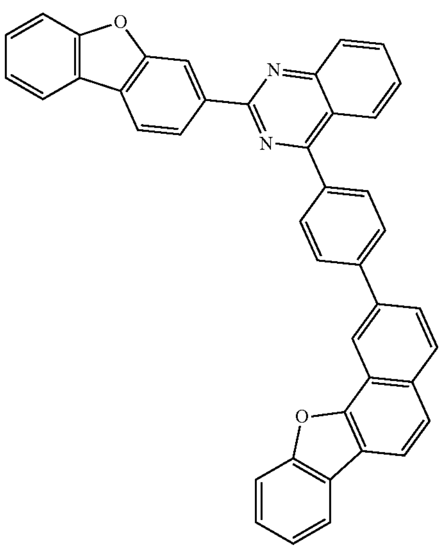
-continued
64
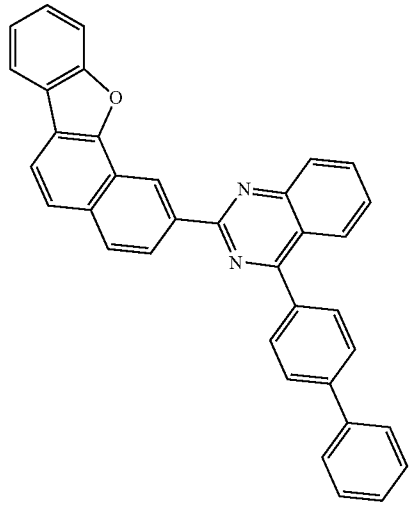
65
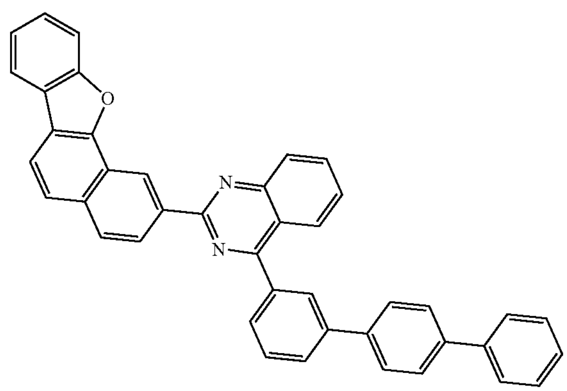
66
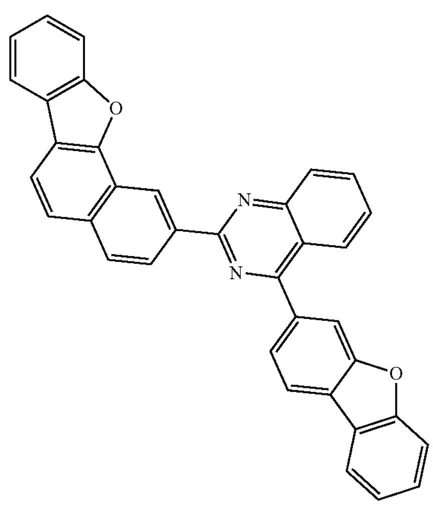

-continued
67
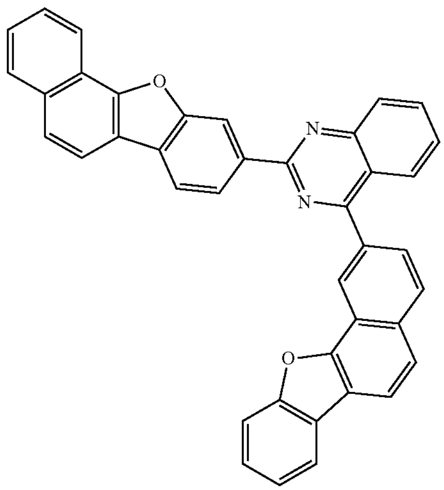
68
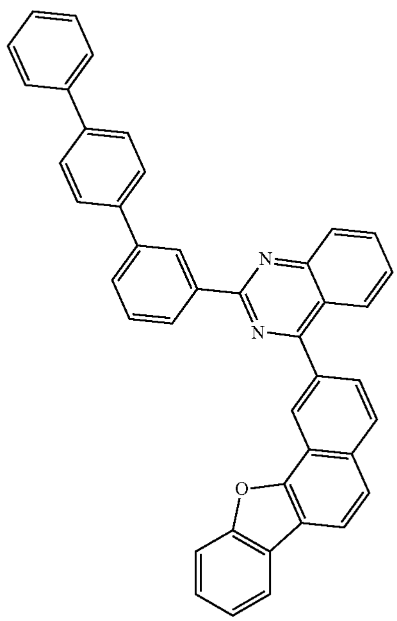
69
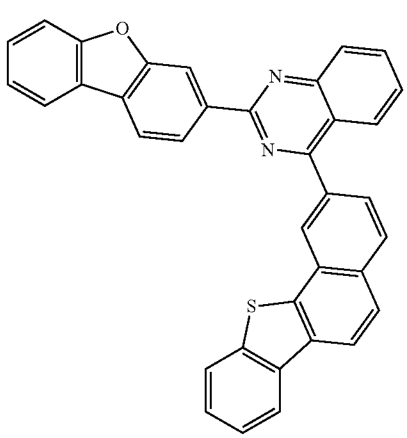
-continued
70
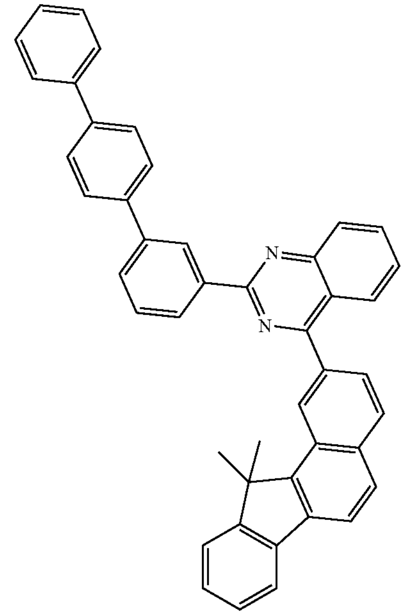
71
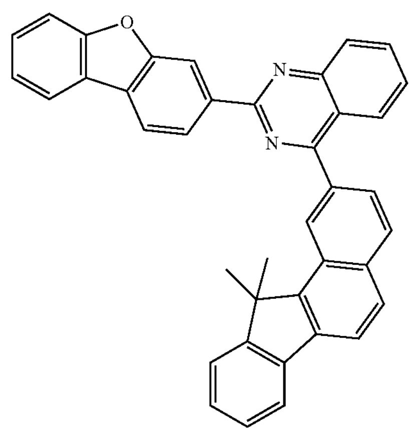
72
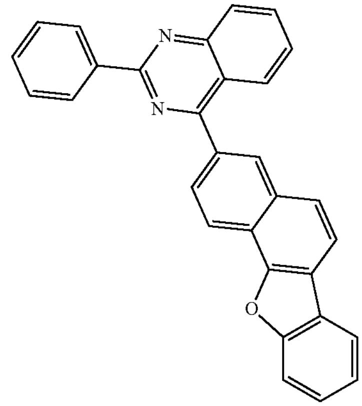

-continued
73
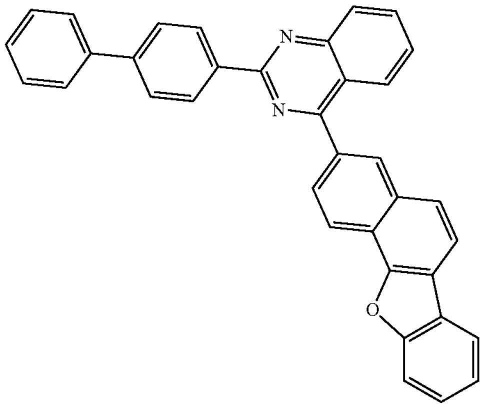
74
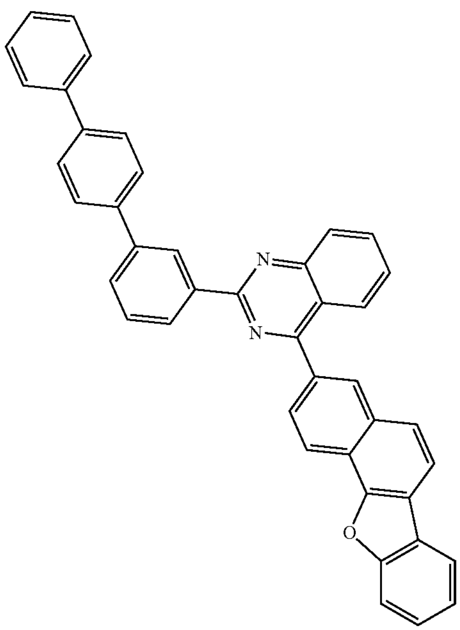
75
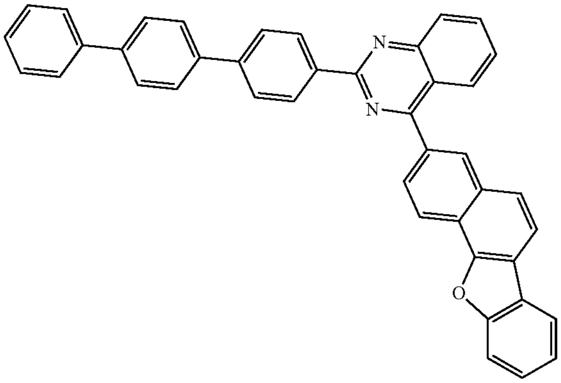
-continued
76
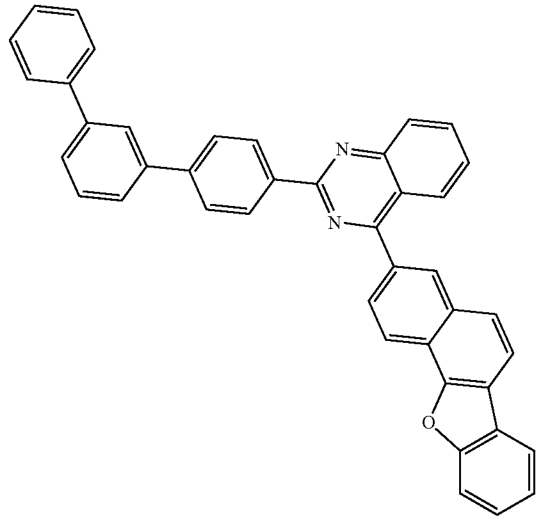
77
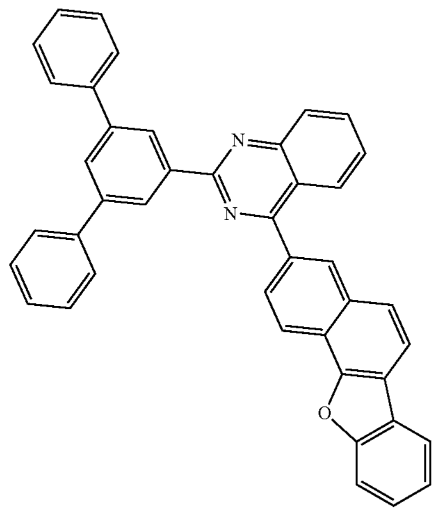
78
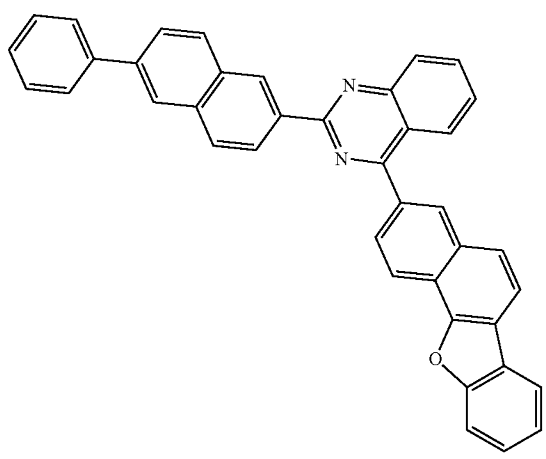

79
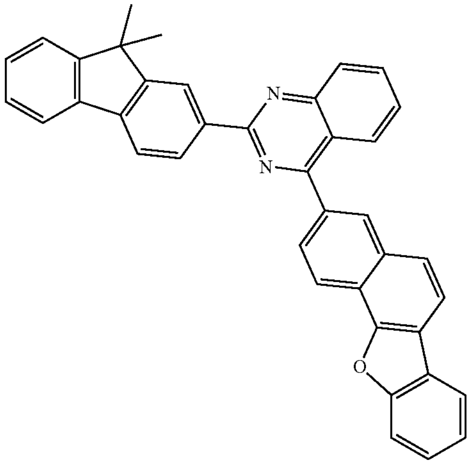
80
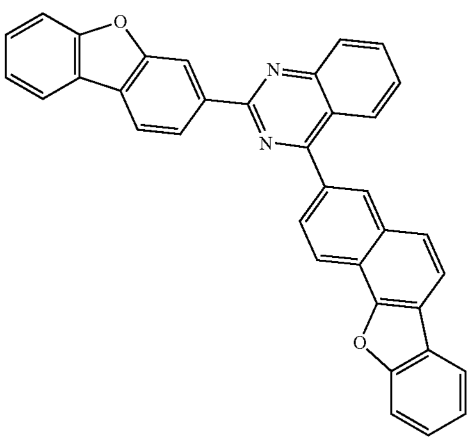
81
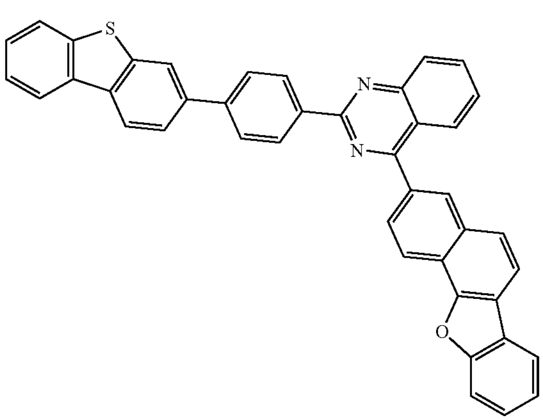
82
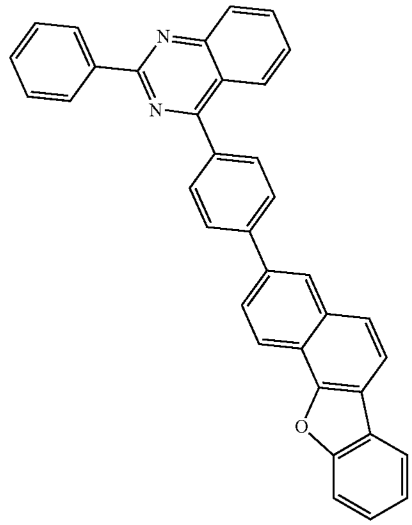
83
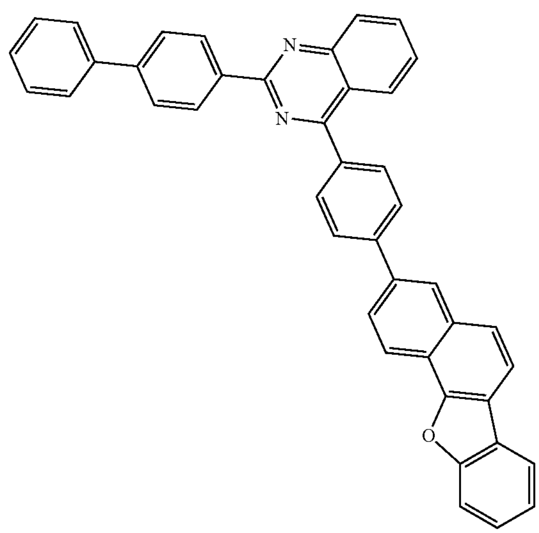

-continued
84
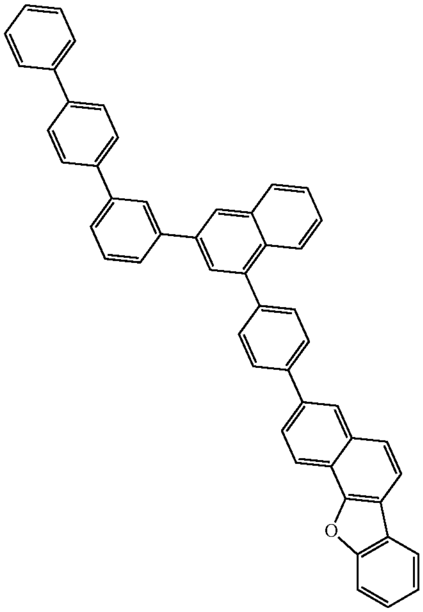
85
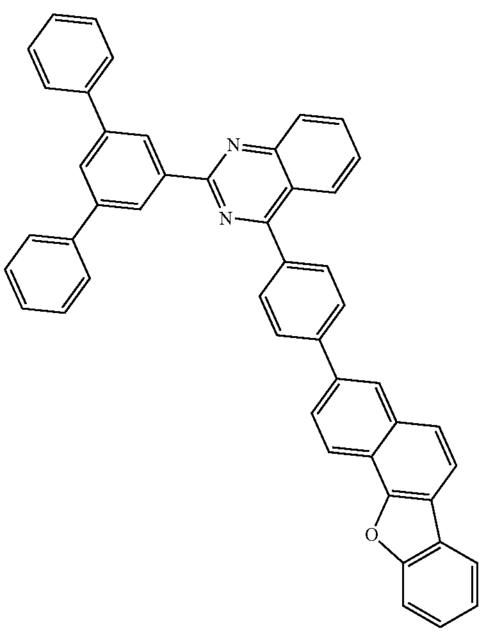
-continued
86
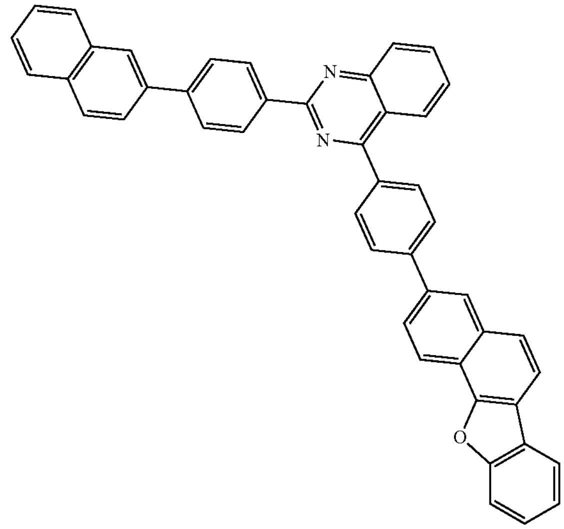
87
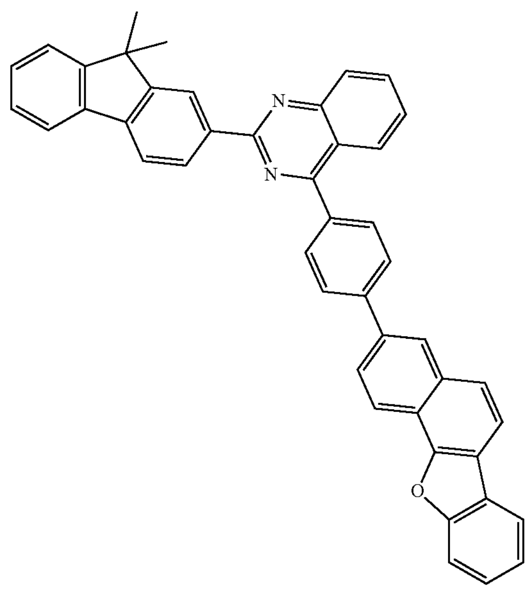
88
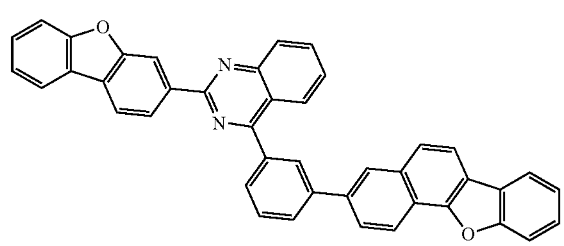

89
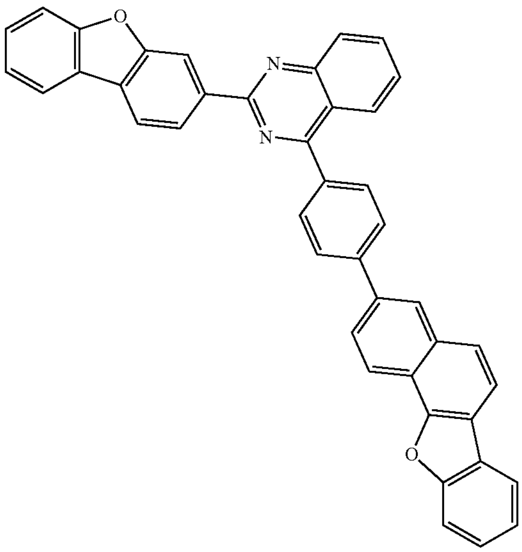
90
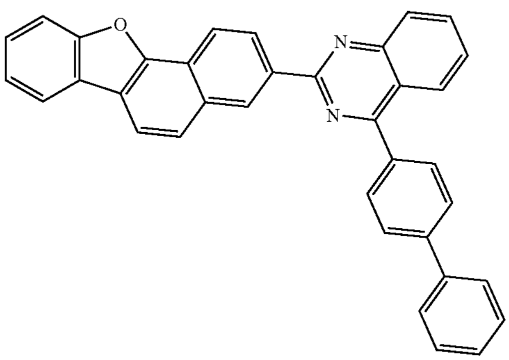
91
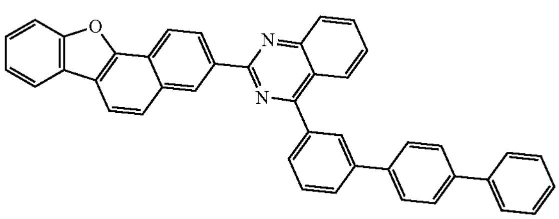
92
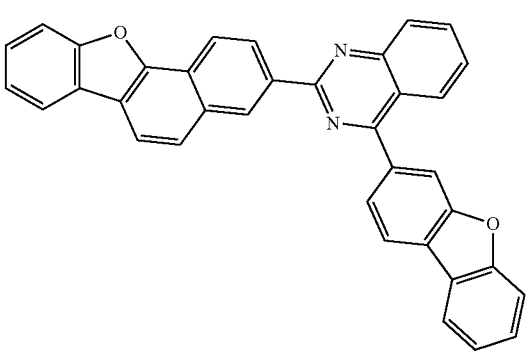
93
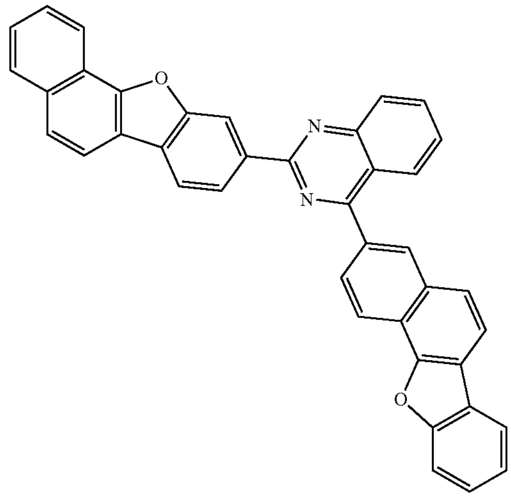
94
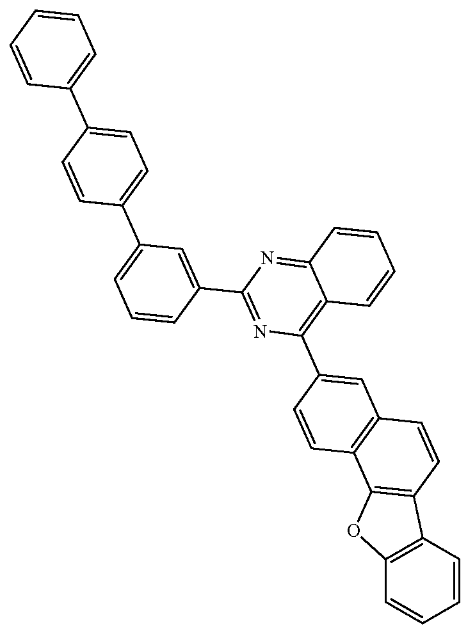
95
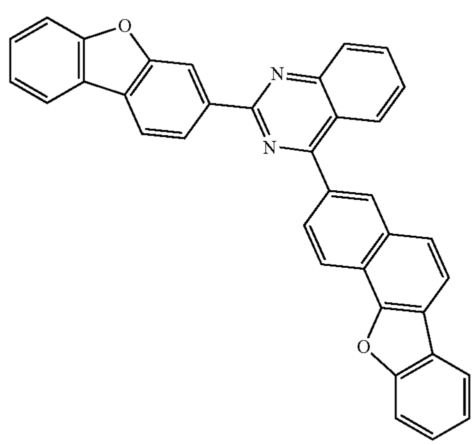

-continued
96
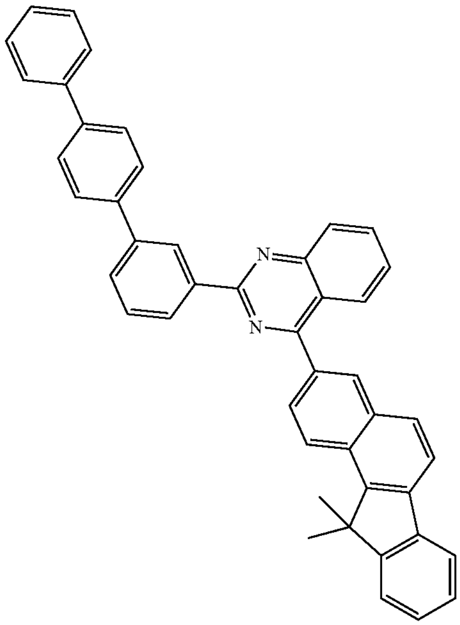
97
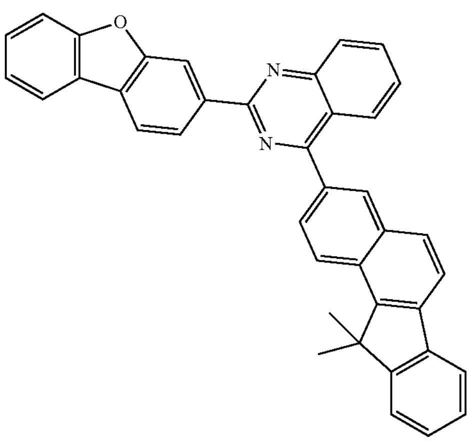
98
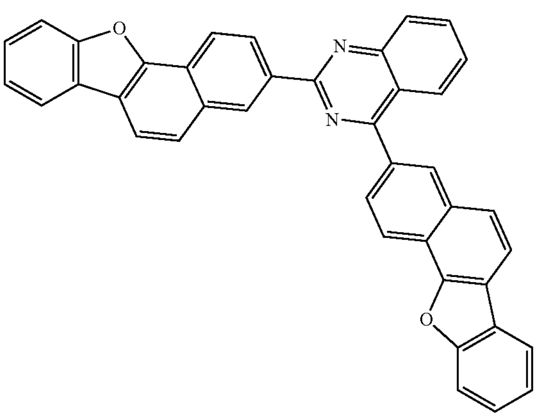
-continued
99
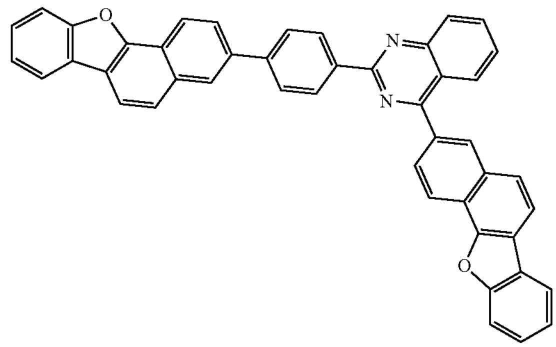
100
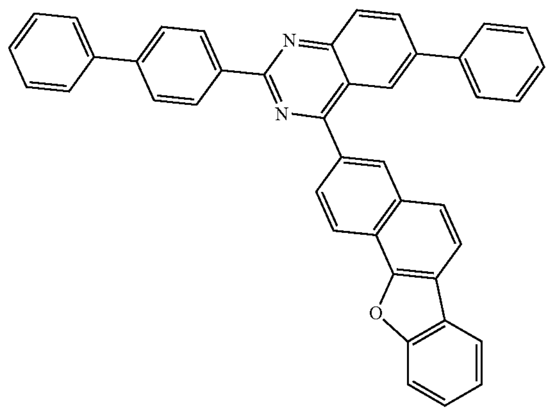
101
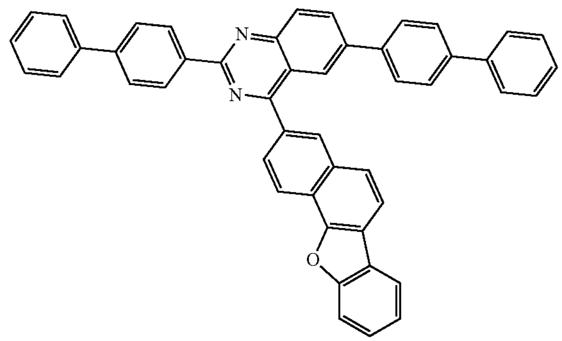
102
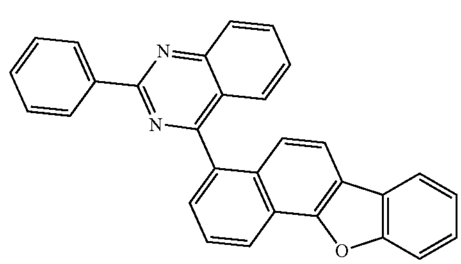

-continued
103
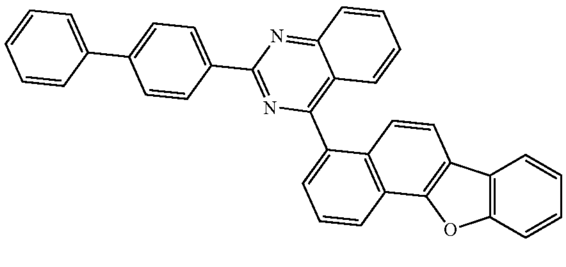
104
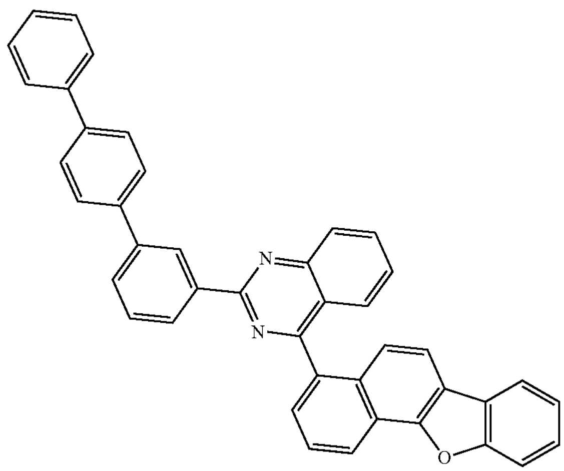
105
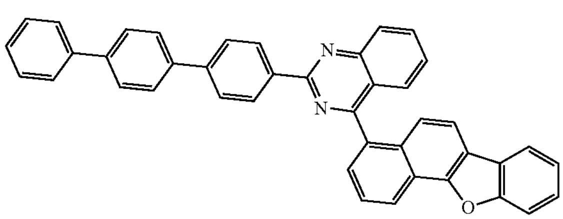
106
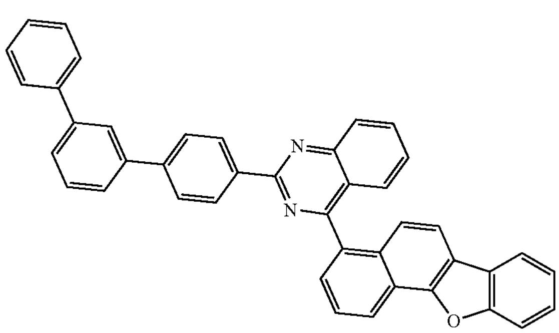
-continued
107
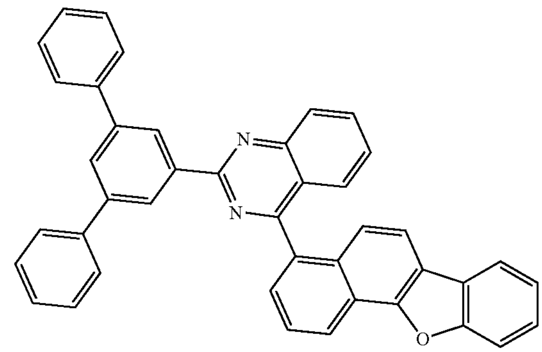
108
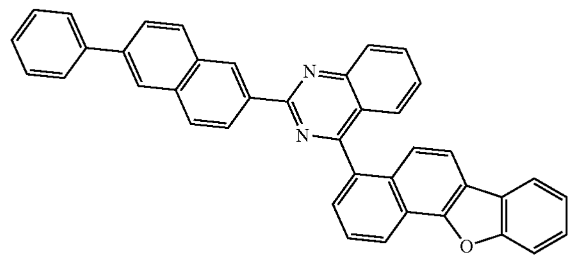
109
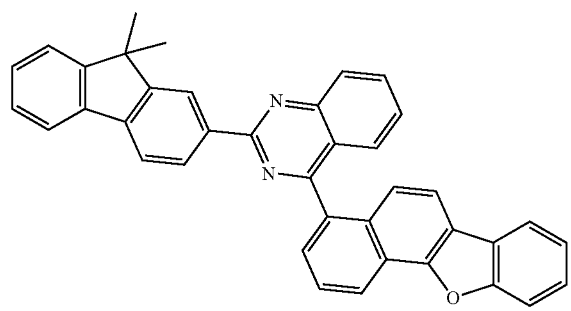
110
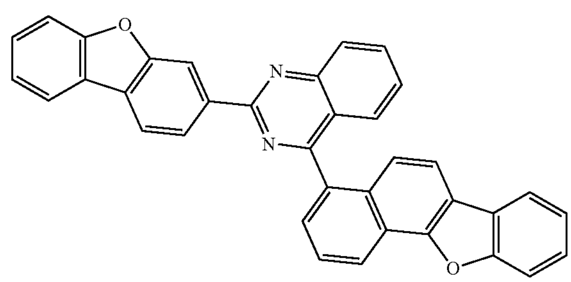
111
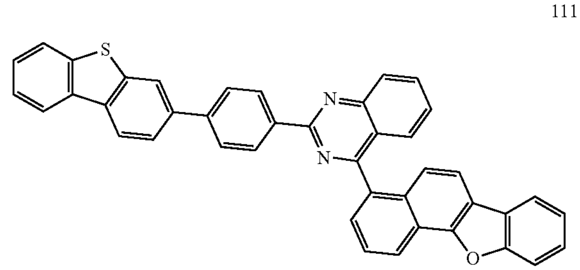

-continued
112
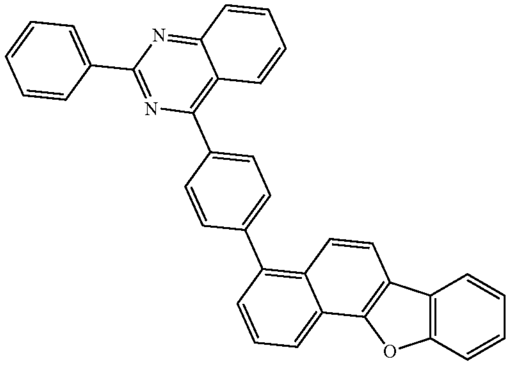
113
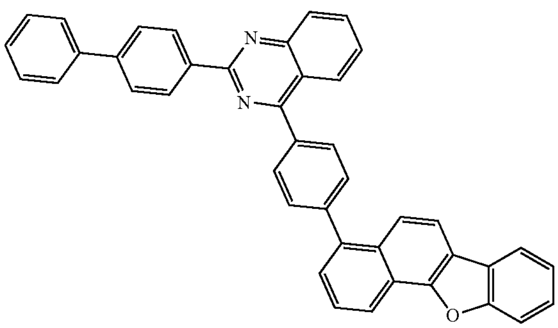
114
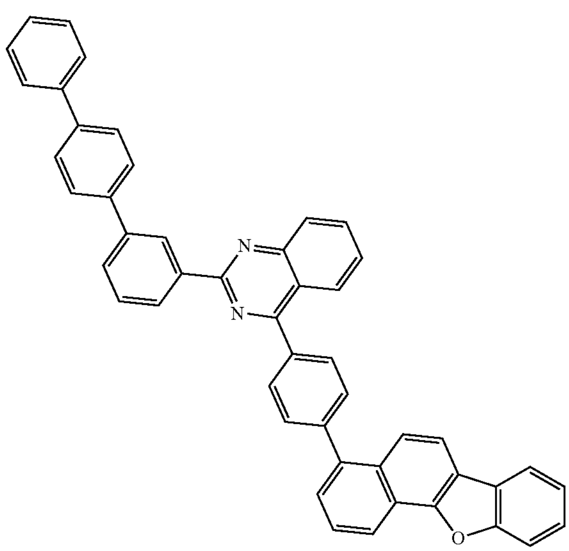
-continued
115
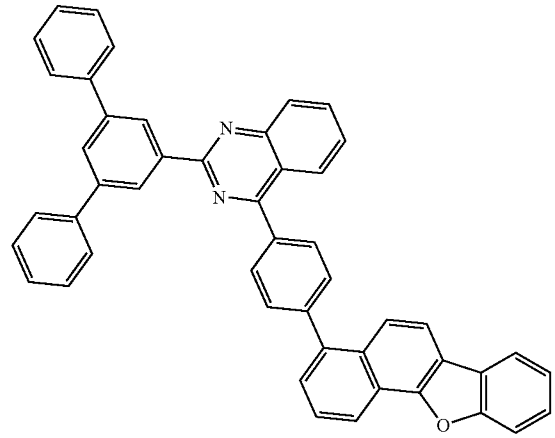
116
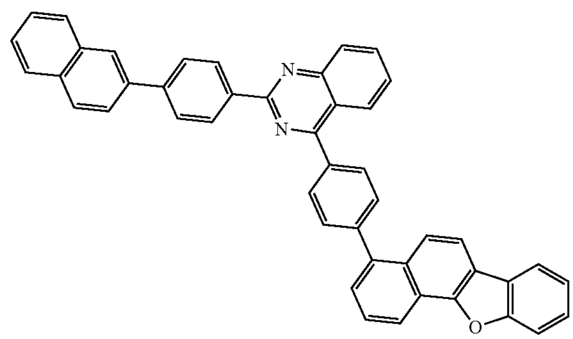
117
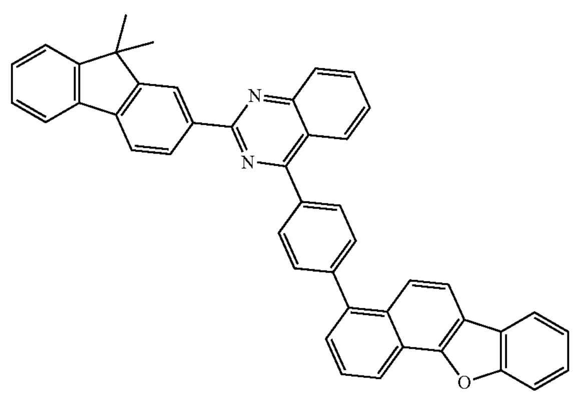
118
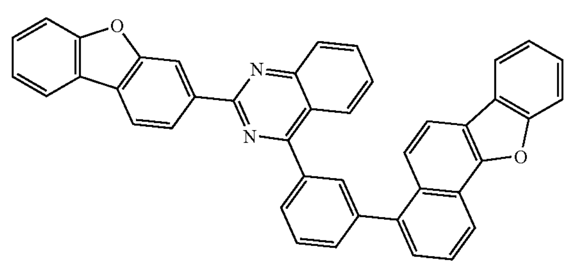

-continued
119
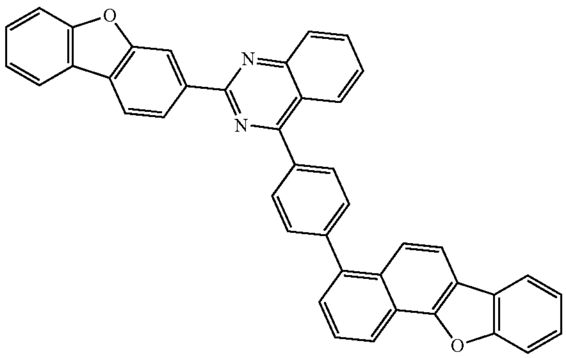
120
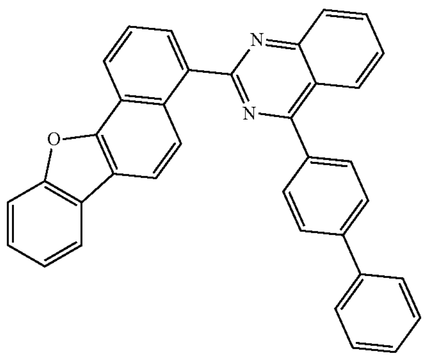
121
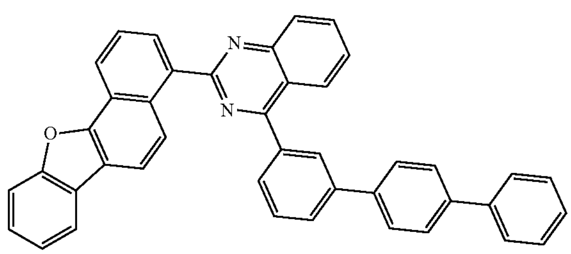
122
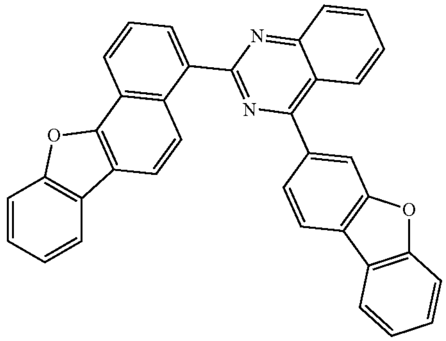
-continued
123
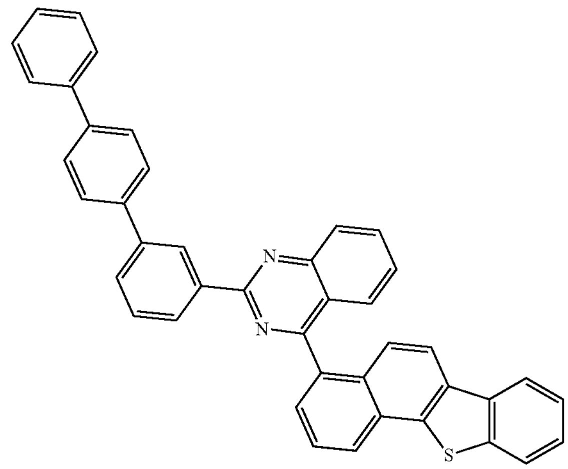
124
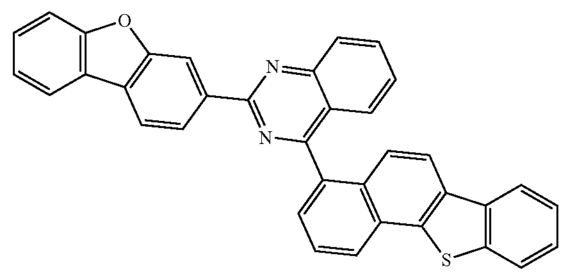
125
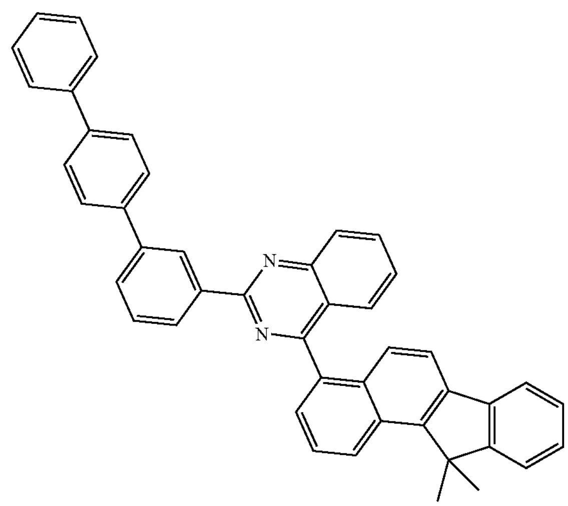
126
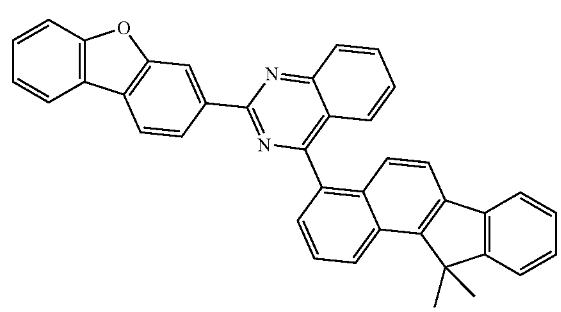
* * * * *